(12) United States Patent
Yaegashi et al.

(10) Patent No.: US 6,495,896 B1
(45) Date of Patent: Dec. 17, 2002

(54) SEMICONDUCTOR INTEGRATED CIRCUIT DEVICE WITH HIGH AND LOW VOLTAGE WELLS

(75) Inventors: Toshitake Yaegashi; Seiichi Aritome, both of Yokohama; Yuji Takeuchi, Kawasaki; Kazuhiro Shimizu, Yokohama, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/407,401

(22) Filed: Sep. 28, 1999

(30) Foreign Application Priority Data

Sep. 29, 1998 (JP) ............................................. 10-276128

(51) Int. Cl.$^7$ ............................................. H01L 29/00
(52) U.S. Cl. ..................... 257/500; 257/501; 257/505; 257/506; 257/553
(58) Field of Search ................................ 257/370, 511, 257/553, 568–570, 256, 272, 288, 398–400, 500, 504, 505, 506

(56) References Cited

U.S. PATENT DOCUMENTS

| | | | |
|---|---|---|---|
| 4,859,619 A | * 8/1989 | Wu et al. | ...................... 437/43 |
| 5,990,535 A | * 11/1999 | Palara | ......................... 257/500 |
| 6,005,284 A | * 12/1999 | Ejiri et al. | .................. 257/588 |
| 6,258,641 B1 | * 7/2001 | Wong et al. | ................. 438/199 |

* cited by examiner

Primary Examiner—Jerome Jackson, Jr.
Assistant Examiner—Jesse A. Fenty
(74) Attorney, Agent, or Firm—Hogan & Hartson L.L.P.

(57) ABSTRACT

A semiconductor integrated circuit device comprises an n-type well 8-1 formed in a p-type silicon substrate 1, an n-type well 8-2 formed so as to surround a part of the substrate 1, in which a p$^-$-type well is formed, a p$^-$-type well 15-1 formed in the substrate 1, a p$^-$-type well 15-2 formed in a part of the substrate 1, which is surrounded by the n-type well, an embedded n-type well 12-1 formed below the p$^-$-type well 15-1, and an n-type well 12-2 which is formed below the p$^-$-type well 15-2 and which is connected to the n-type well 8-2. Thus, it is possible to provide a semiconductor integrated circuit device capable of suppressing the increase of the number of photolithography steps and reducing the manufacturing costs.

Alternatively, low-voltage n-channel MOS transistors QN1, QN2 and low-voltage p-channel MOS transistors QP1, QP2 are formed in a p-type well 214 and n-type well 213 of a p$^-$-type silicon substrate 211, respectively, and high-voltage n-channel MOS transistors QN3, QN4 are formed in the substrate 211. The p-type well 214, in which the transistors QN1, QN2 are formed, and the p-type element isolating layer 215 of the element isolating regions for the transistors QN3, QN4 are simultaneously formed by ion implantation using a resist mask by the lithography on a flat surface having no step. The p-type well 214 and the p-type element isolating layer 215 have the same depth from the substrate surface of the element regions and the same impurity density. Thus, it is possible to provide a semiconductor integrated circuit device capable of achieving good element isolation characteristics, and a method for producing the same.

9 Claims, 96 Drawing Sheets

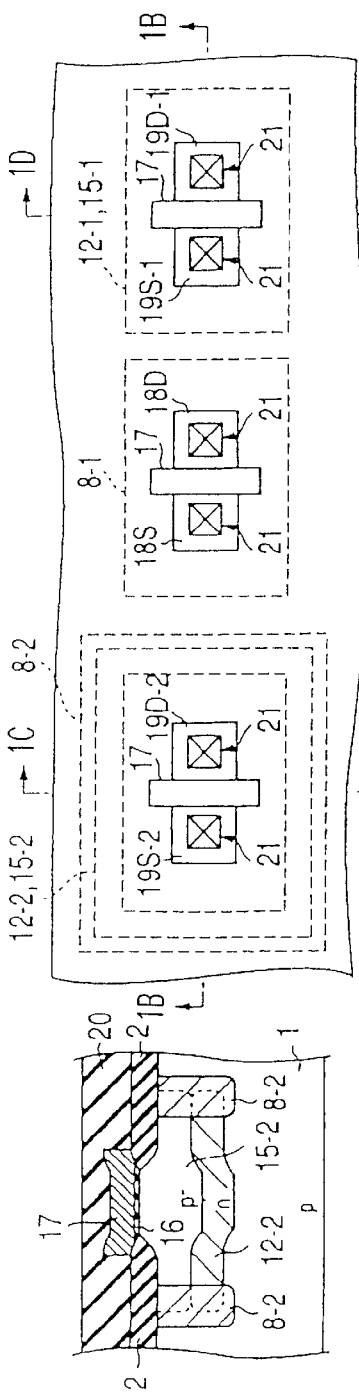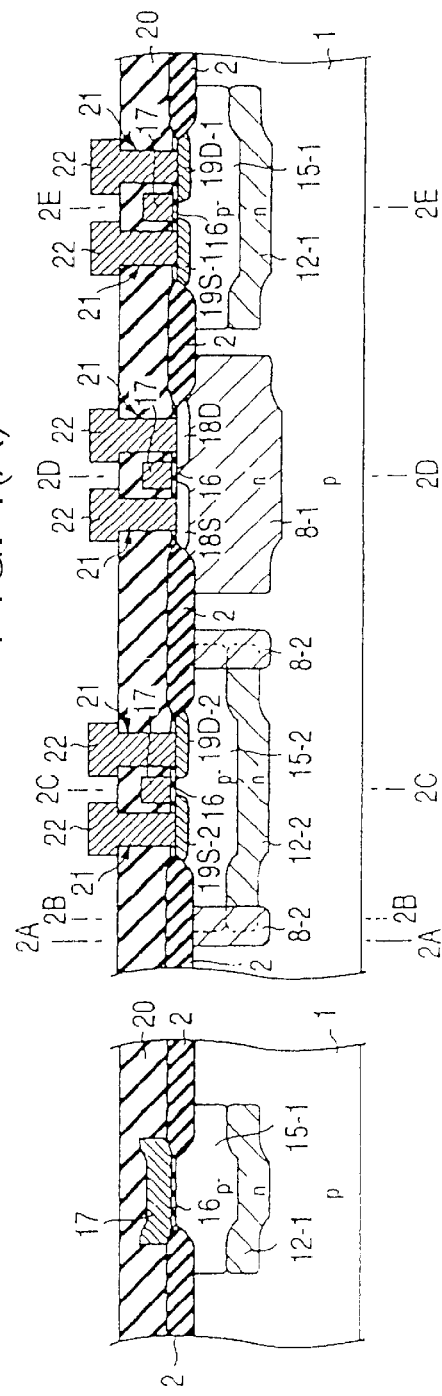
FIG. 1(A)
FIG. 1(B)
FIG. 1(C)
FIG. 1(D)

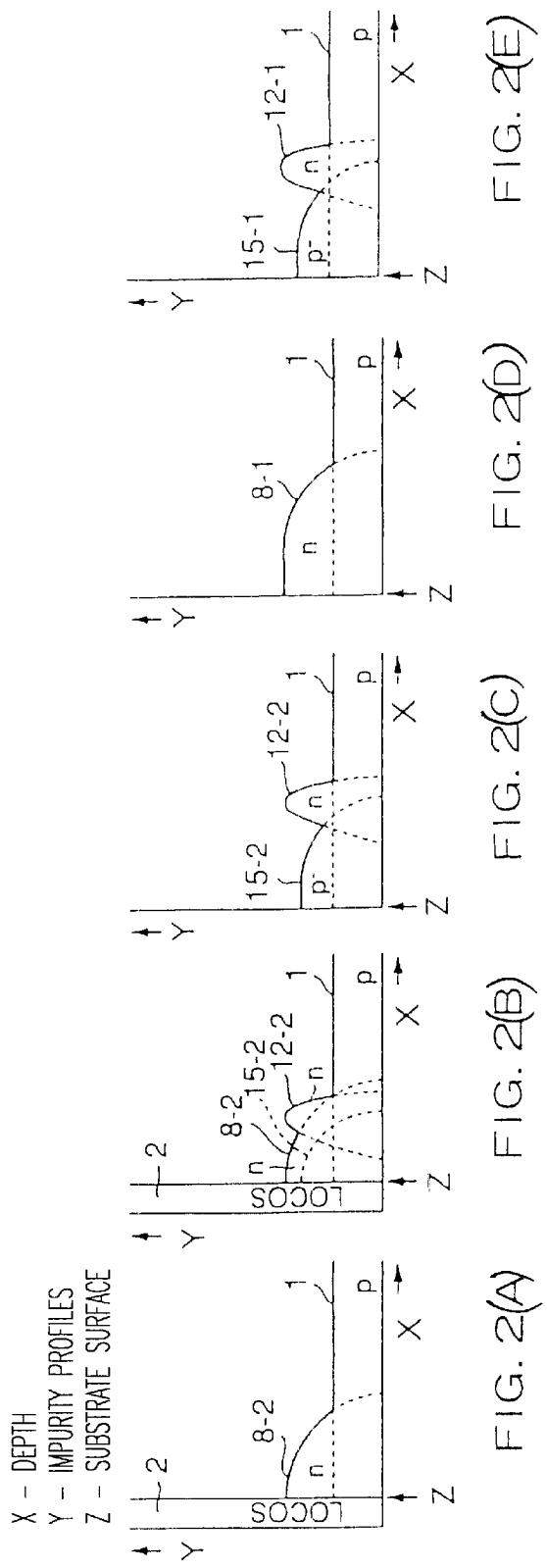

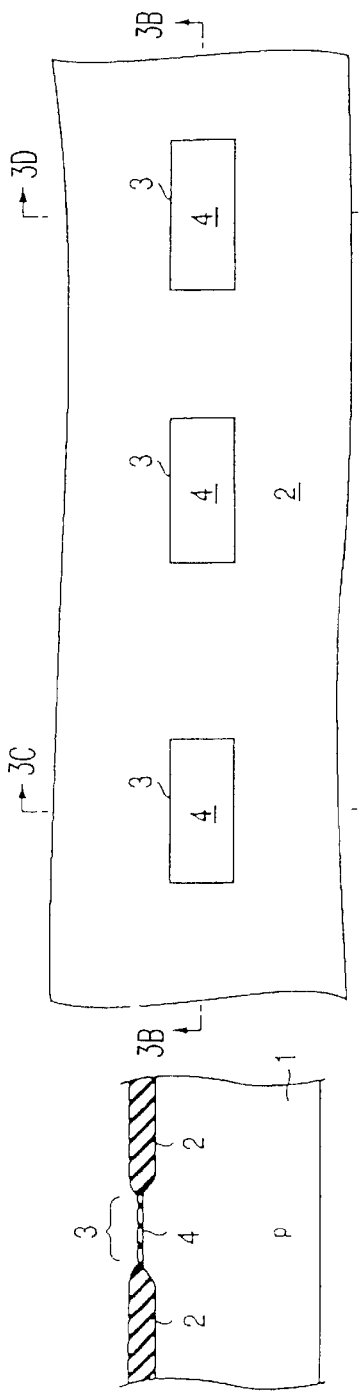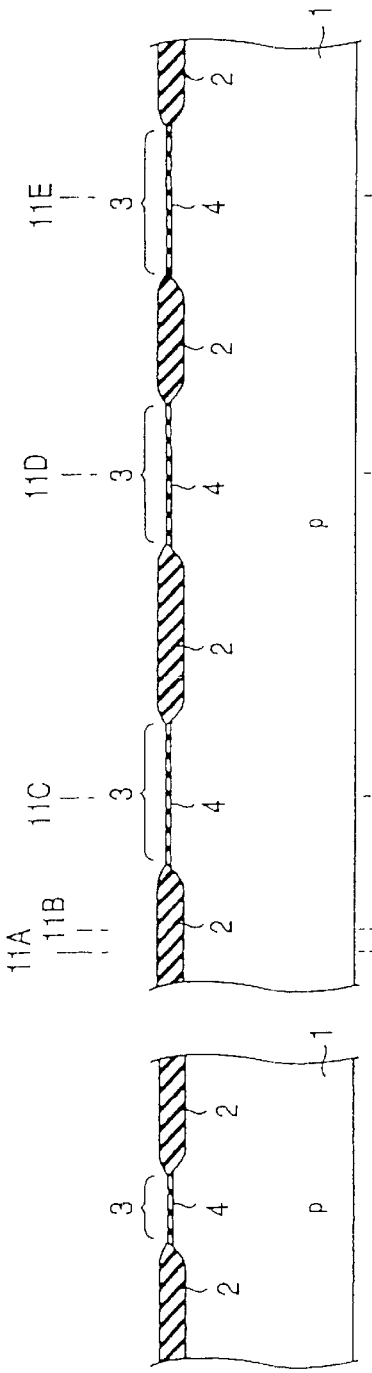

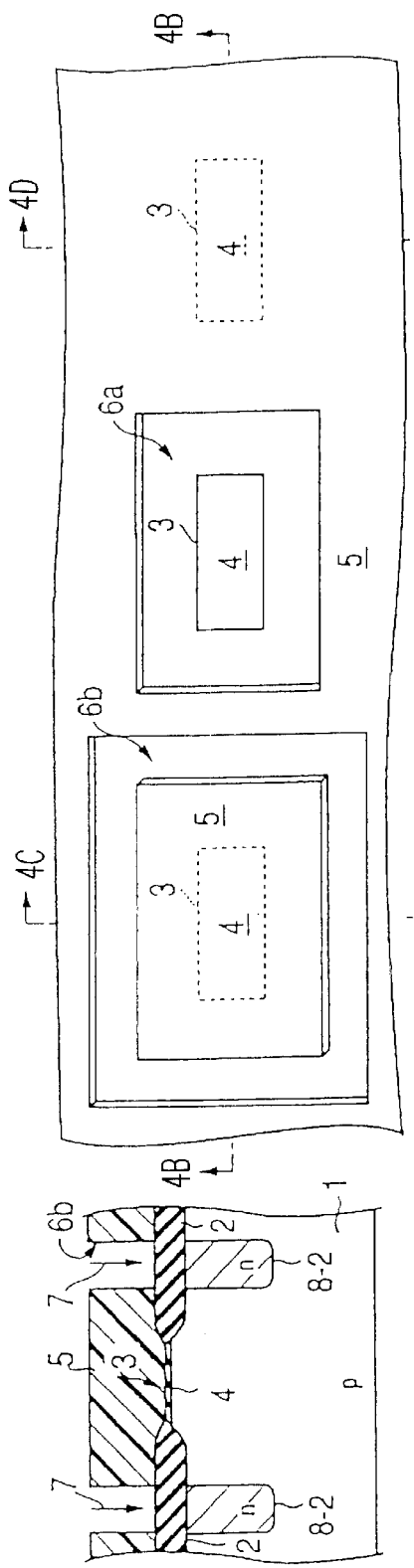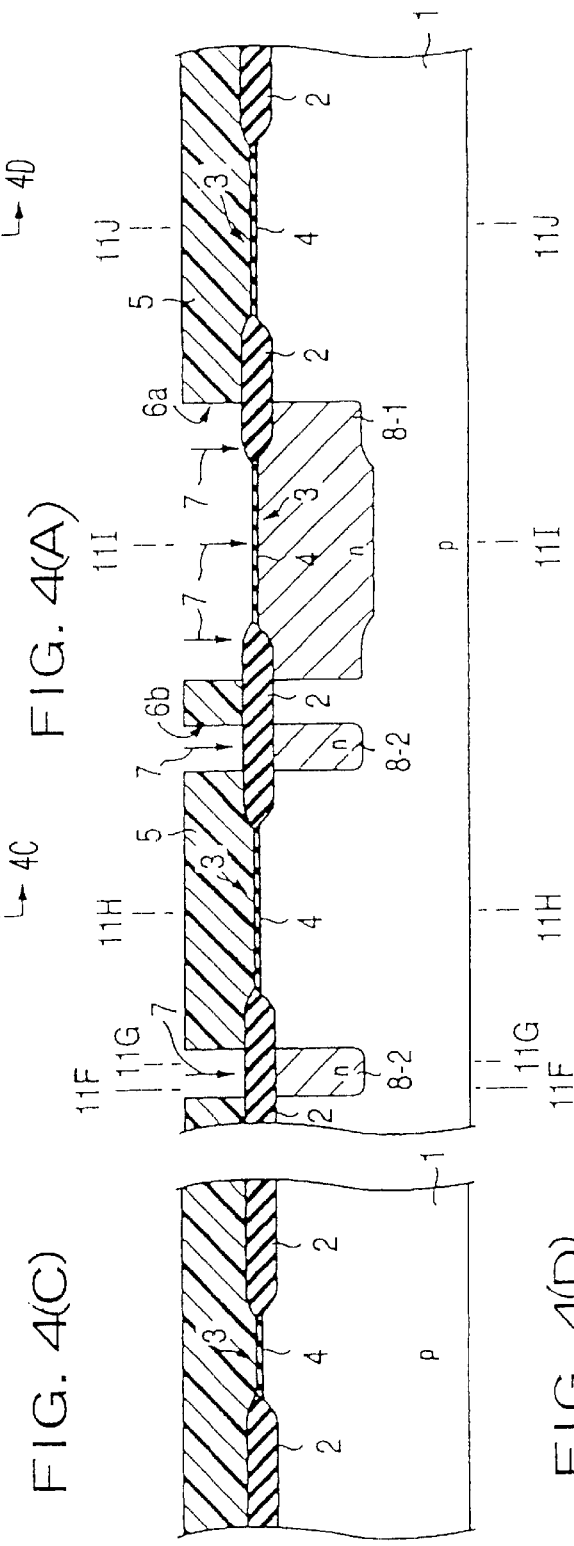

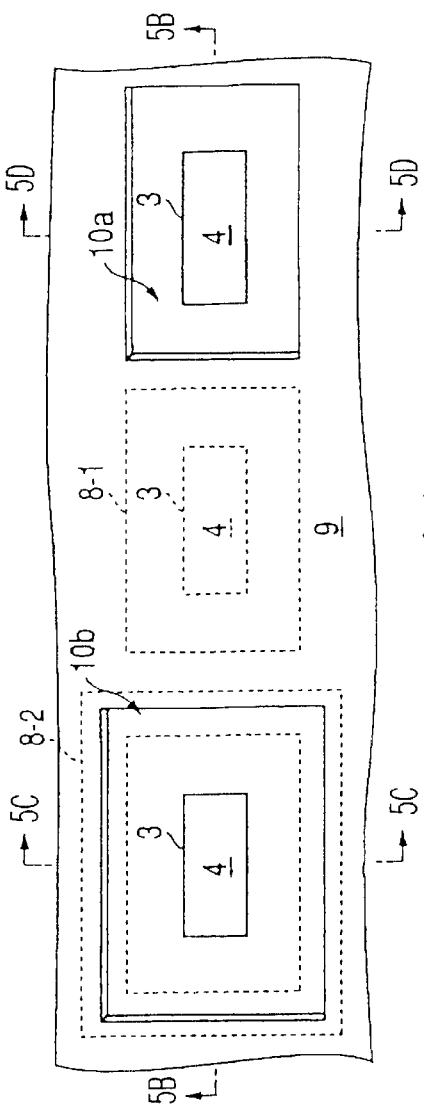
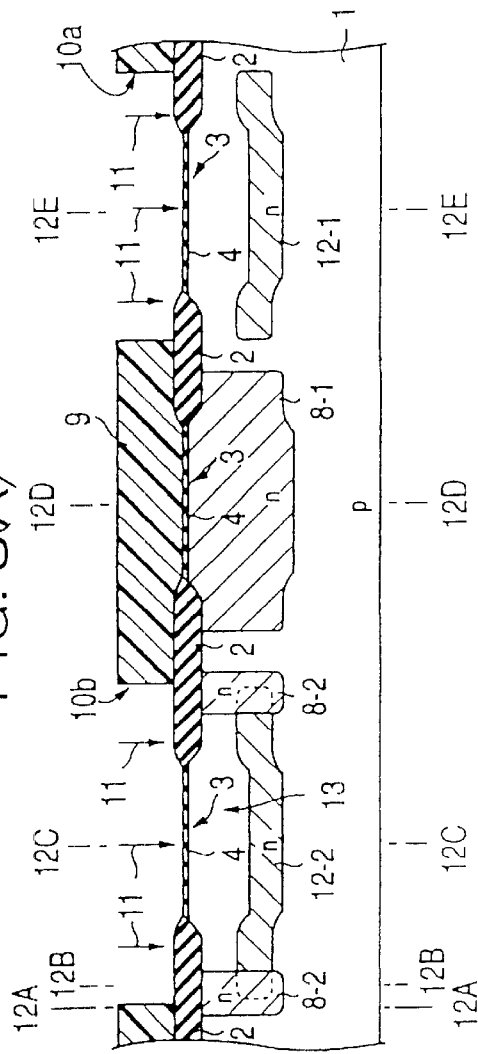
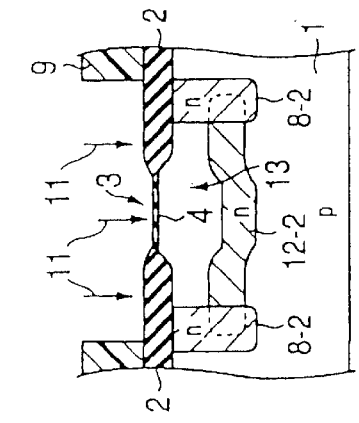
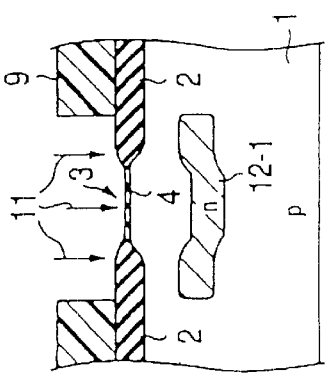
FIG. 5(A)
FIG. 5(B)
FIG. 5(C)
FIG. 5(D)

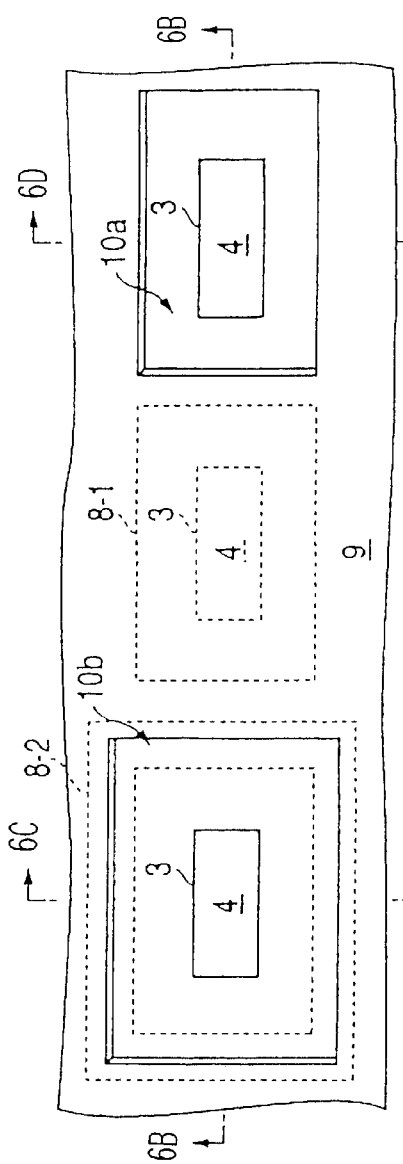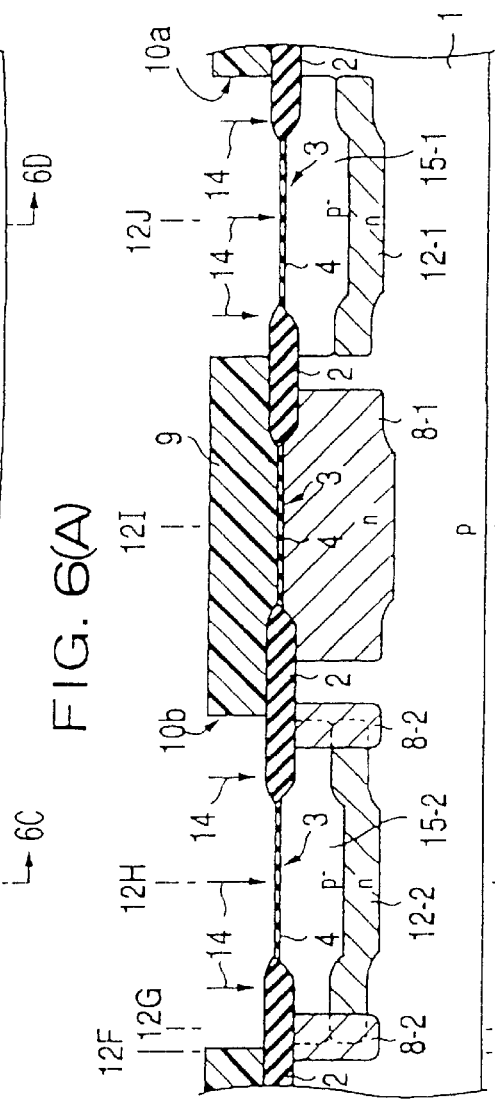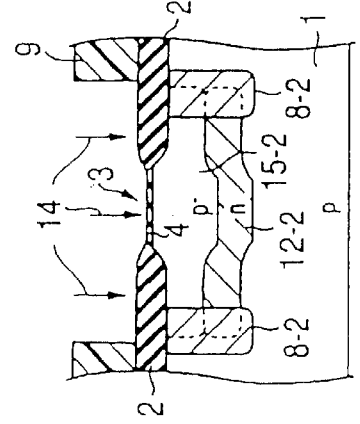
FIG. 6(A)
FIG. 6(B)
FIG. 6(C)
FIG. 6(D)

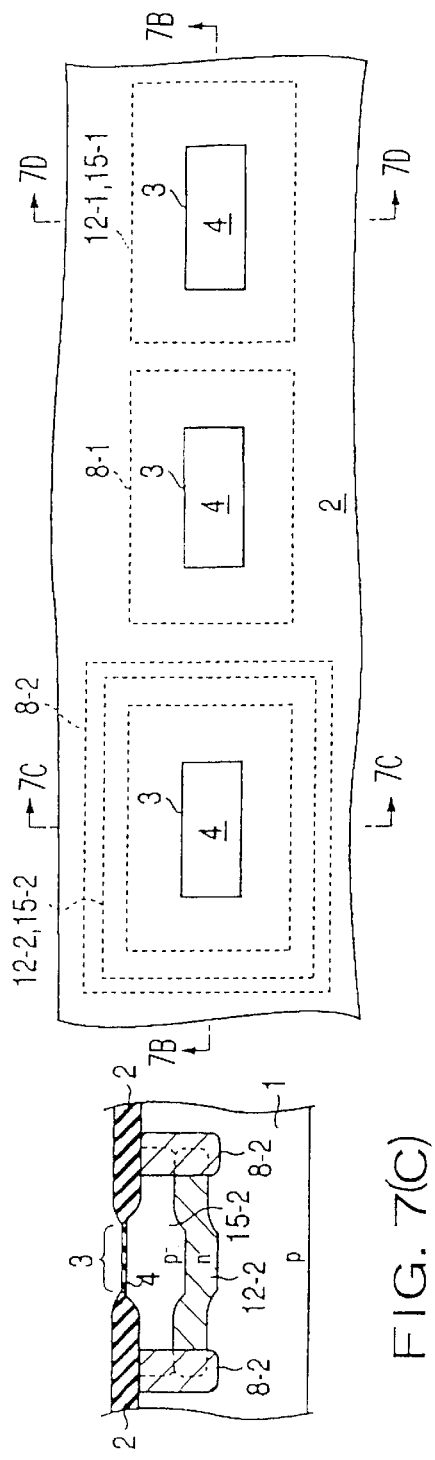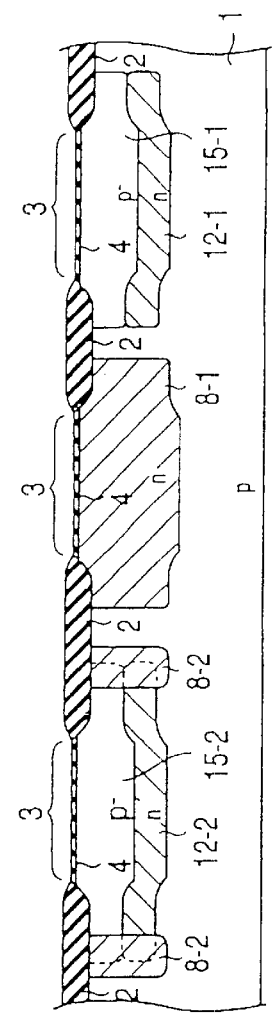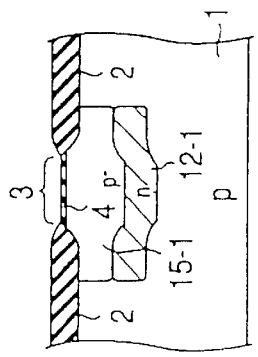

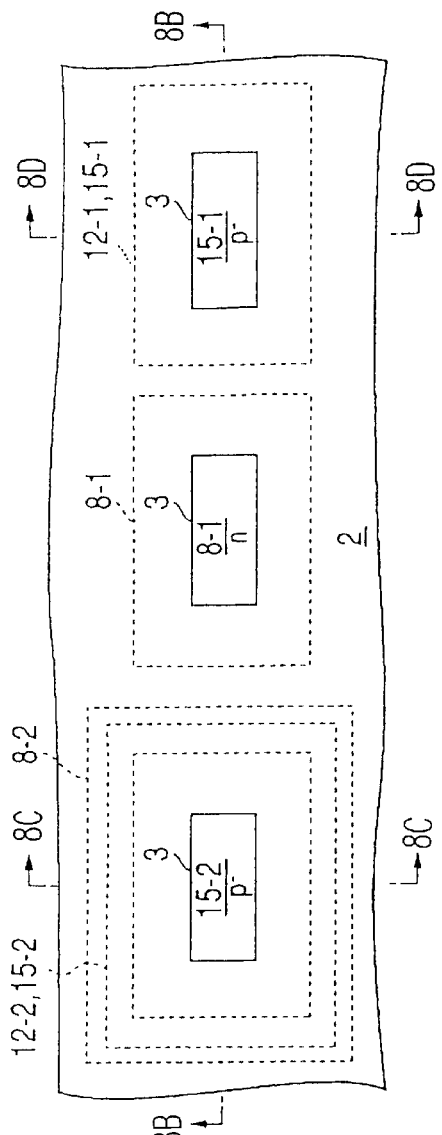
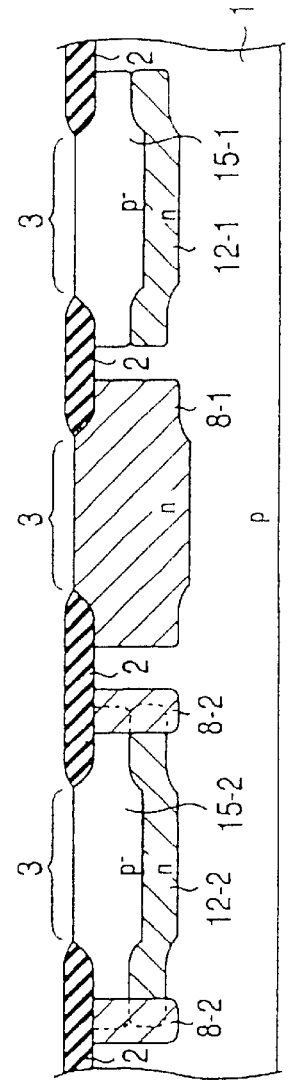
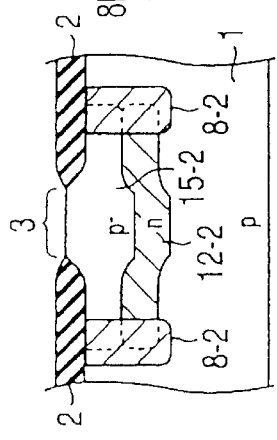
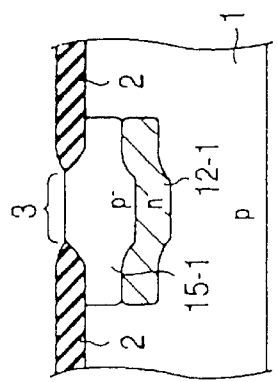
FIG. 8(A)
FIG. 8(B)
FIG. 8(C)
FIG. 8(D)

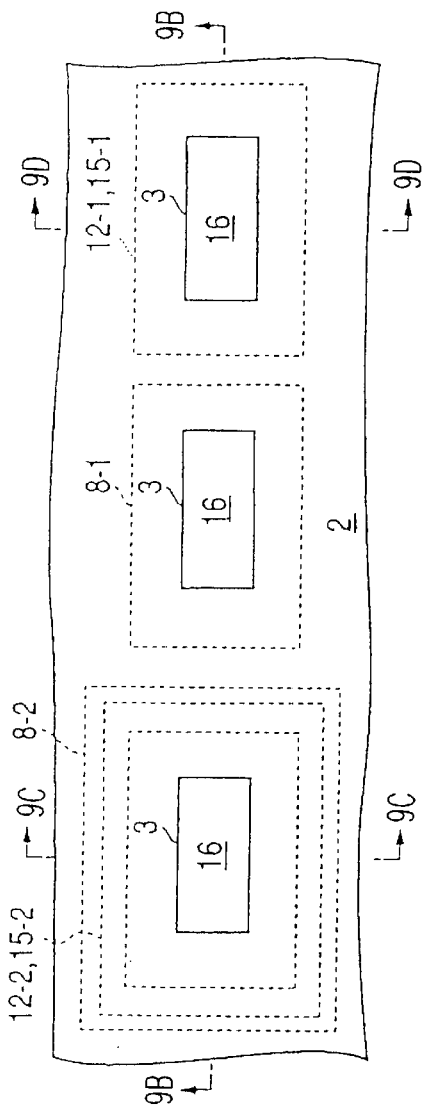
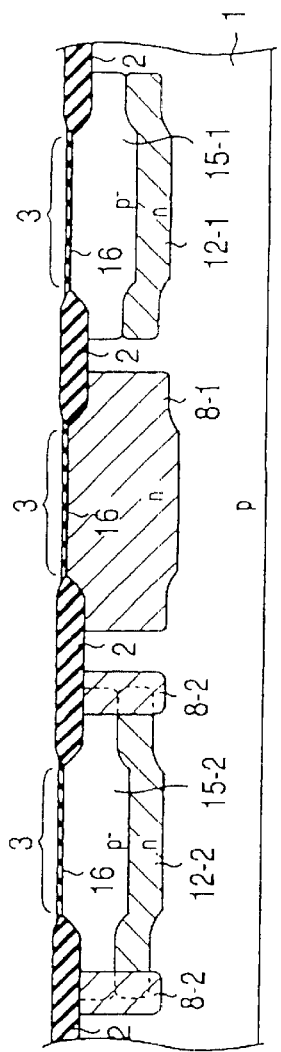
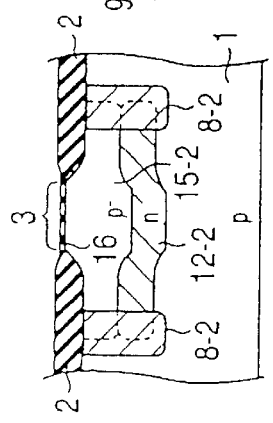
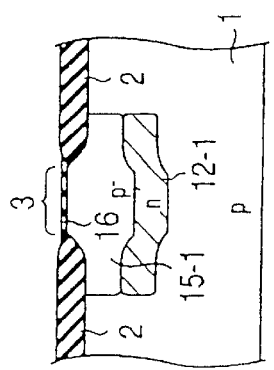
FIG. 9(A)
FIG. 9(B)
FIG. 9(C)
FIG. 9(D)

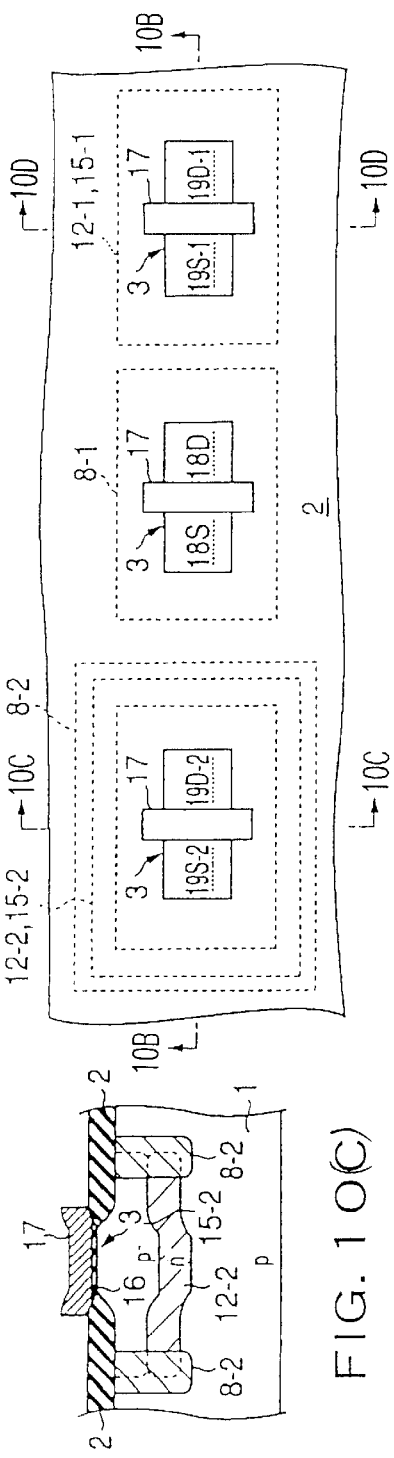
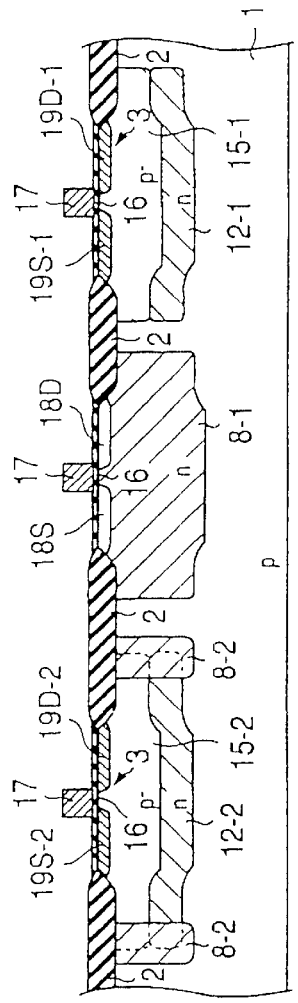
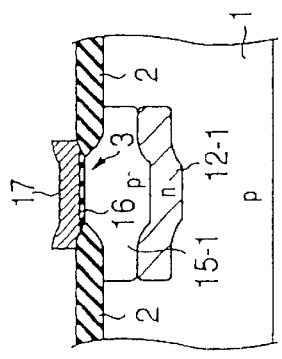
FIG. 10(A)
FIG. 10(B)
FIG. 10(C)
FIG. 10(D)

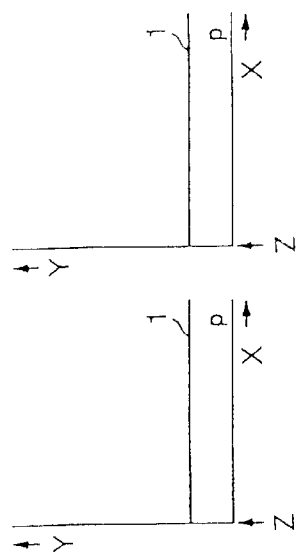
FIG. 11(A)
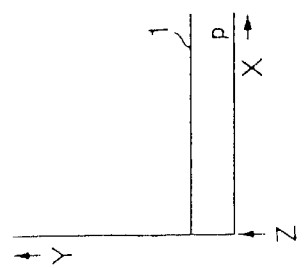
FIG. 11(B)
FIG. 11C
FIG. 11D
FIG. 11E
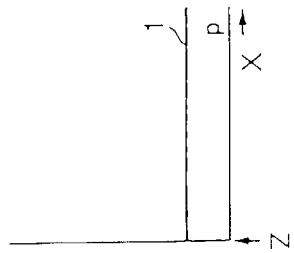
FIG. 11(F)
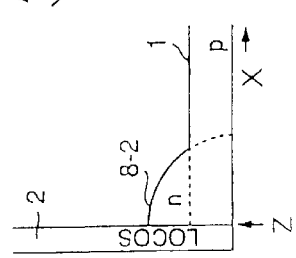
FIG. 11(G)
FIG. 11(H)
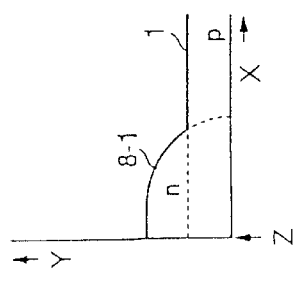
FIG. 11(I)
FIG. 11(J)

X – DEPTH
Y – IMPURITY PROFILES
Z – SUBSTRATE SURFACE

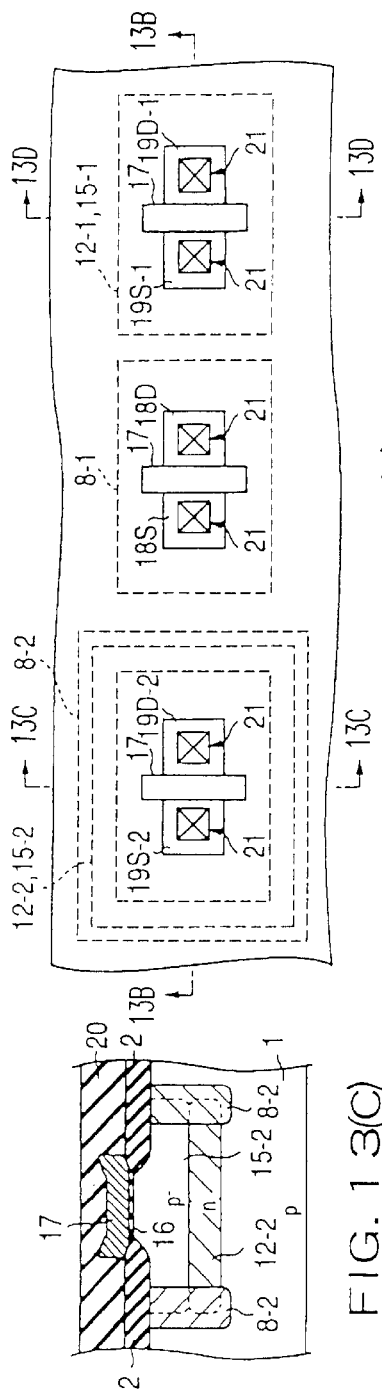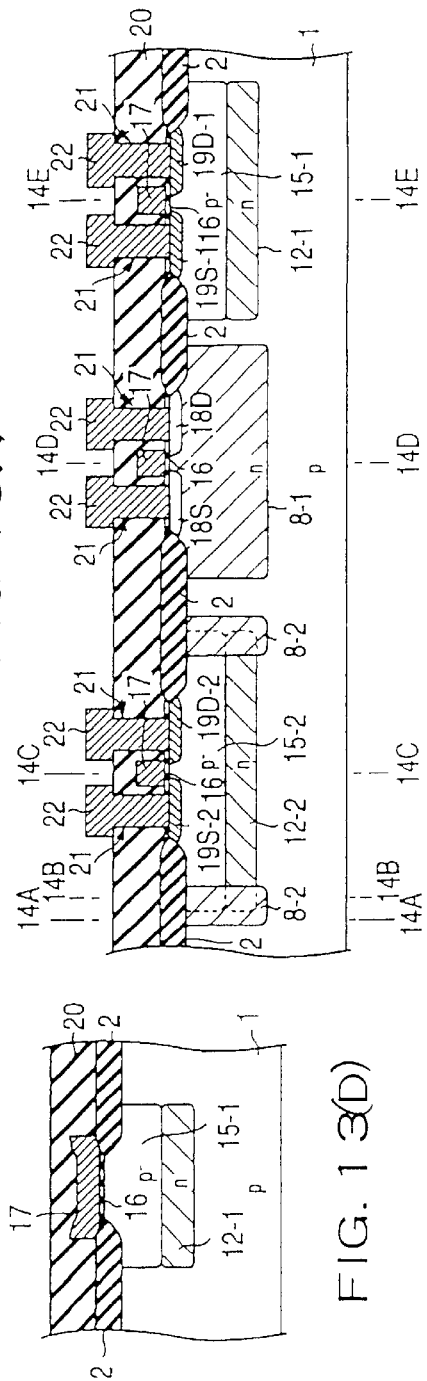
FIG. 13(A)
FIG. 13(B)
FIG. 13(C)
FIG. 13(D)

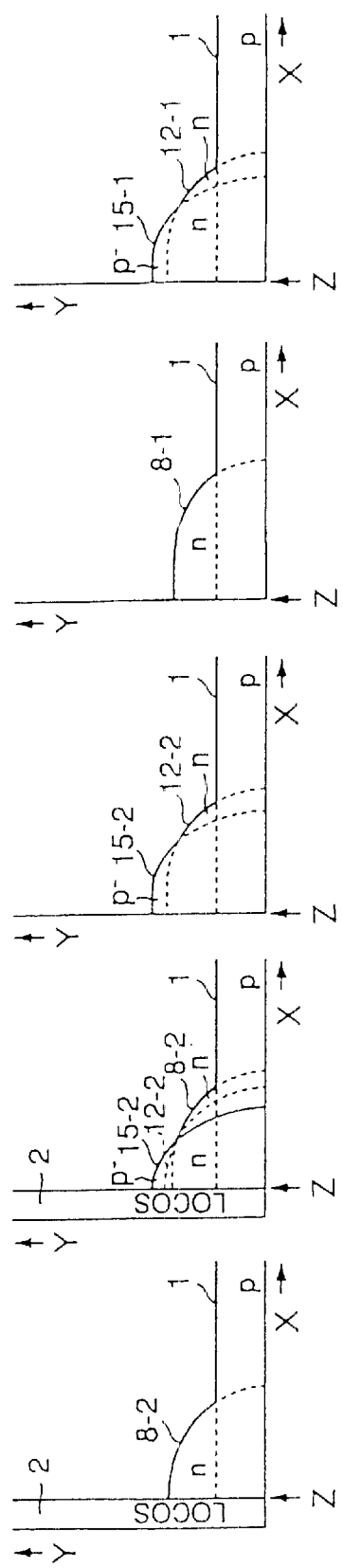

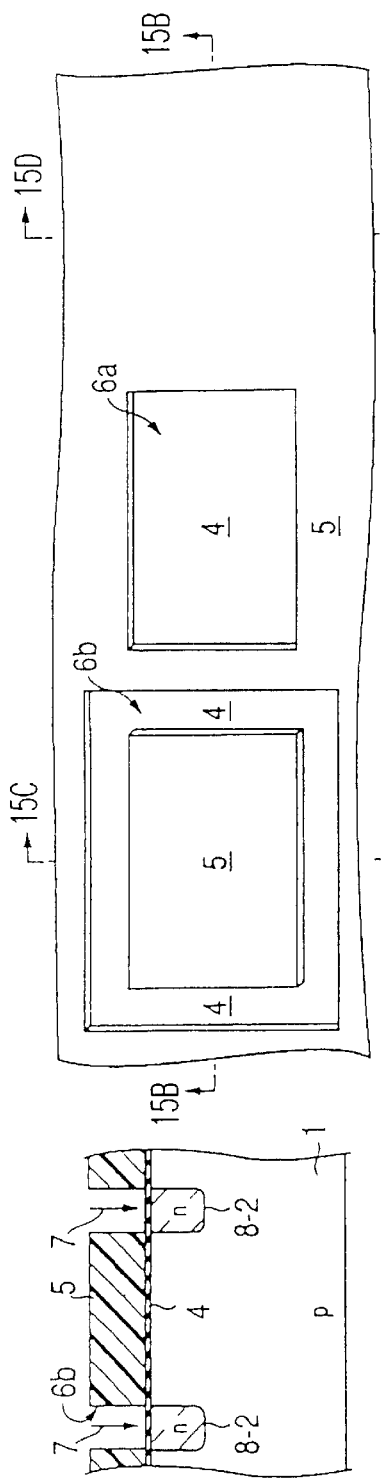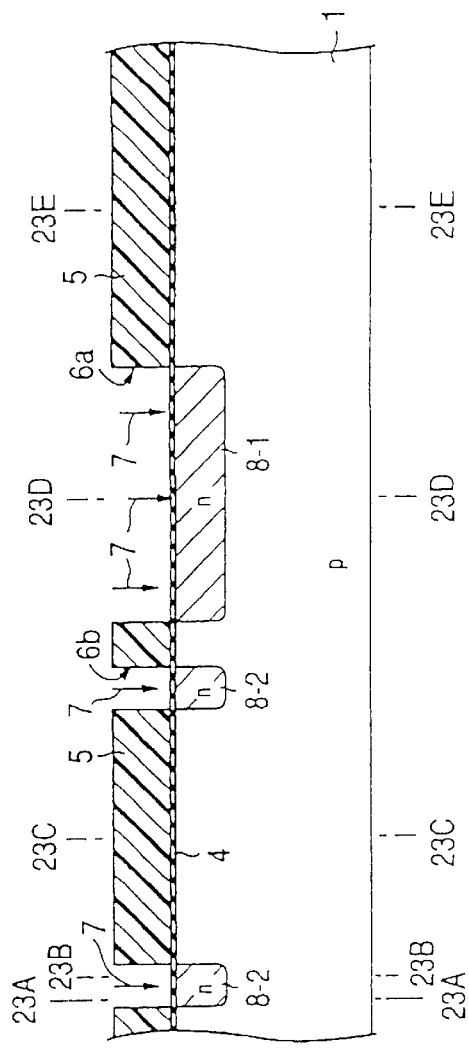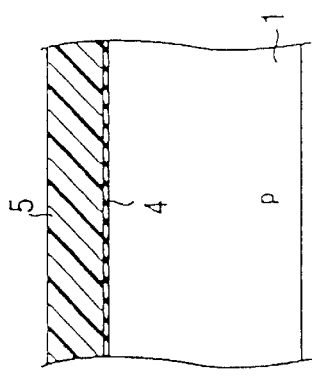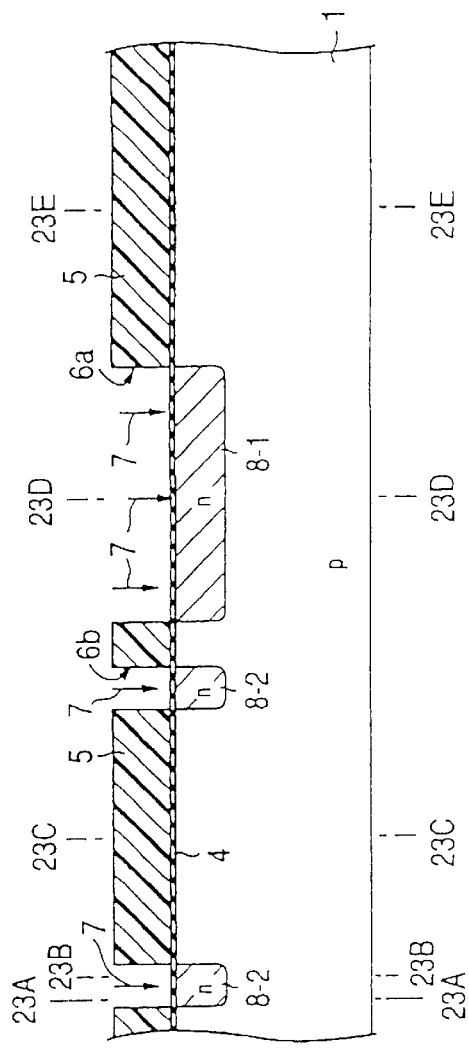
FIG. 15(A)
FIG. 15(B)
FIG. 15(C)
FIG. 15(D)

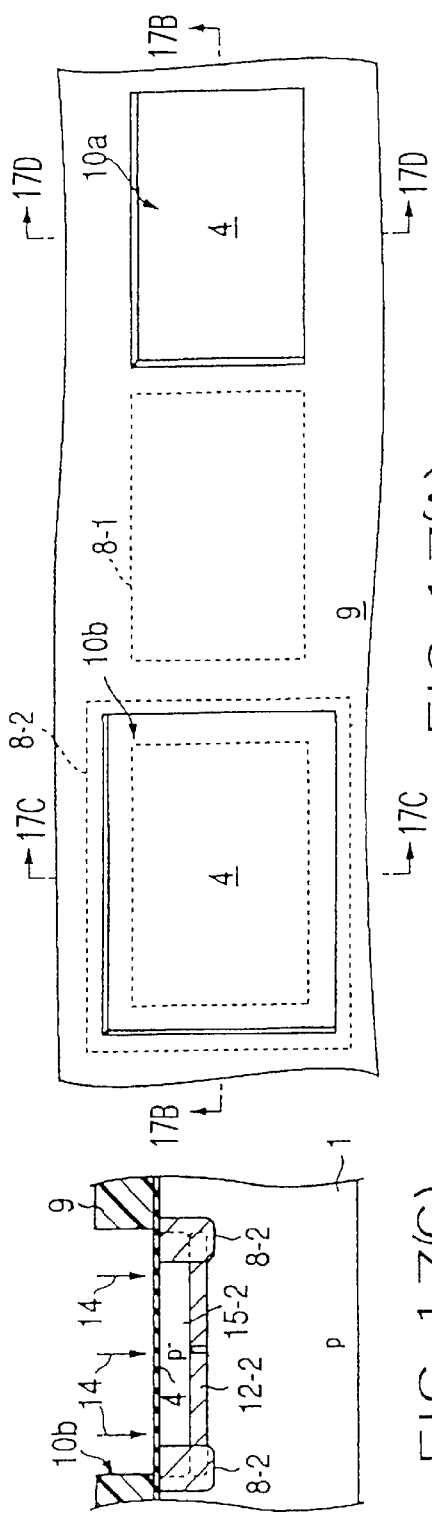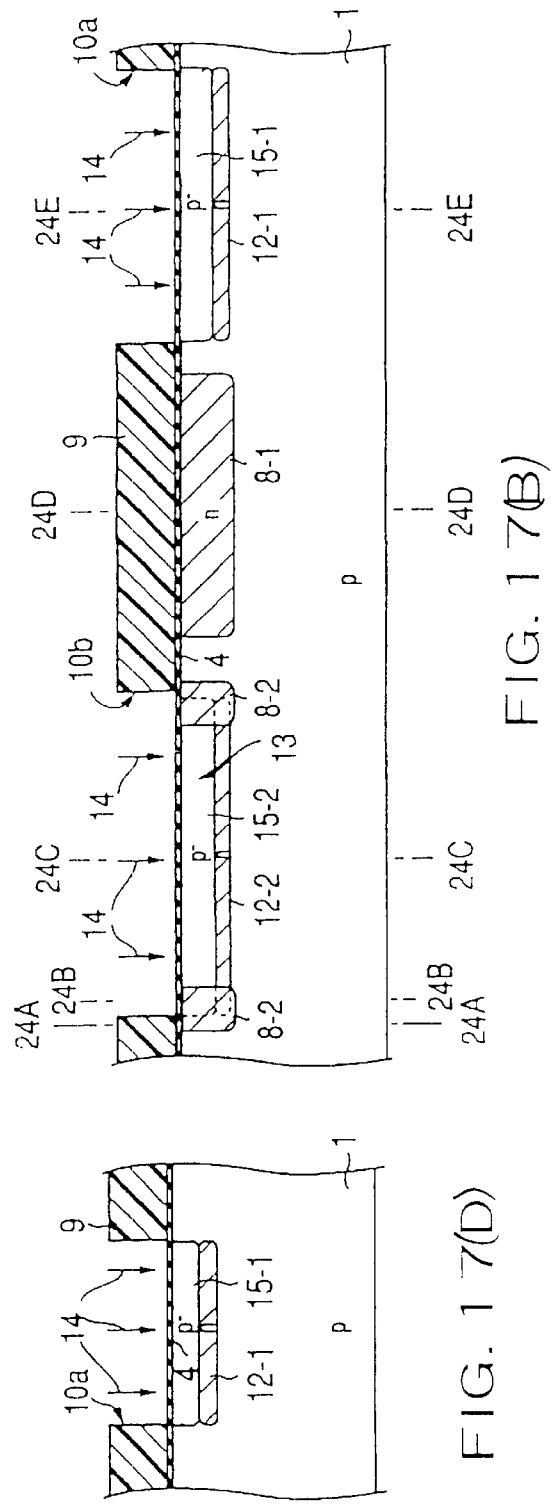
FIG. 17(A) FIG. 17(B) FIG. 17(C) FIG. 17(D)

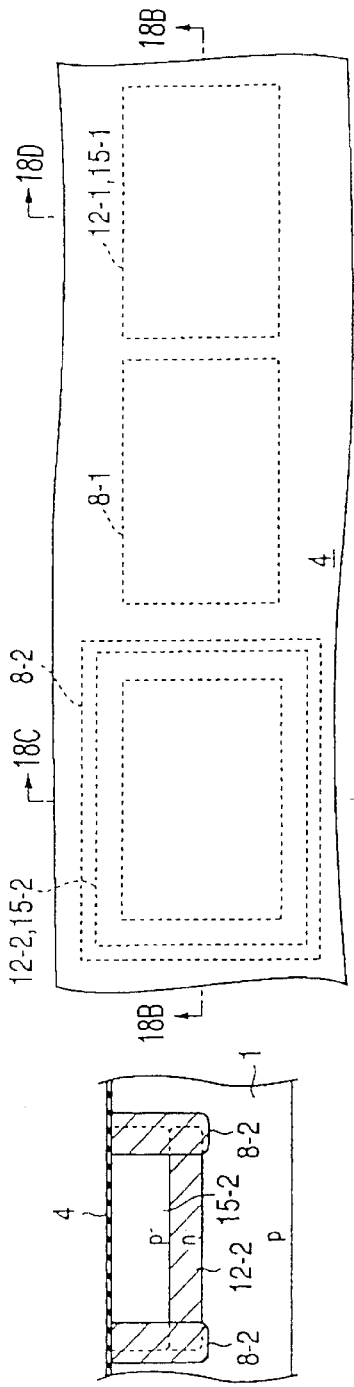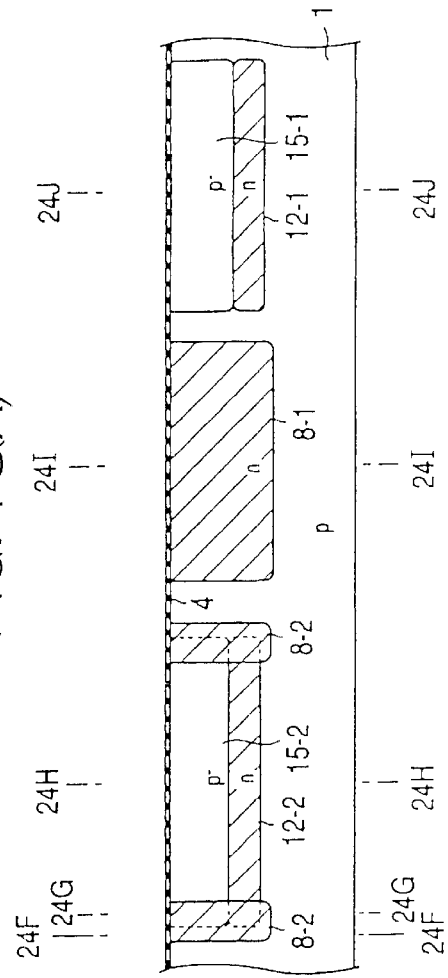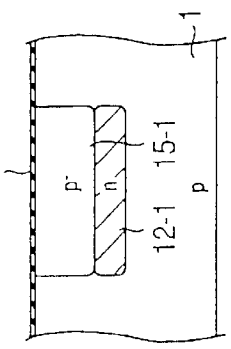

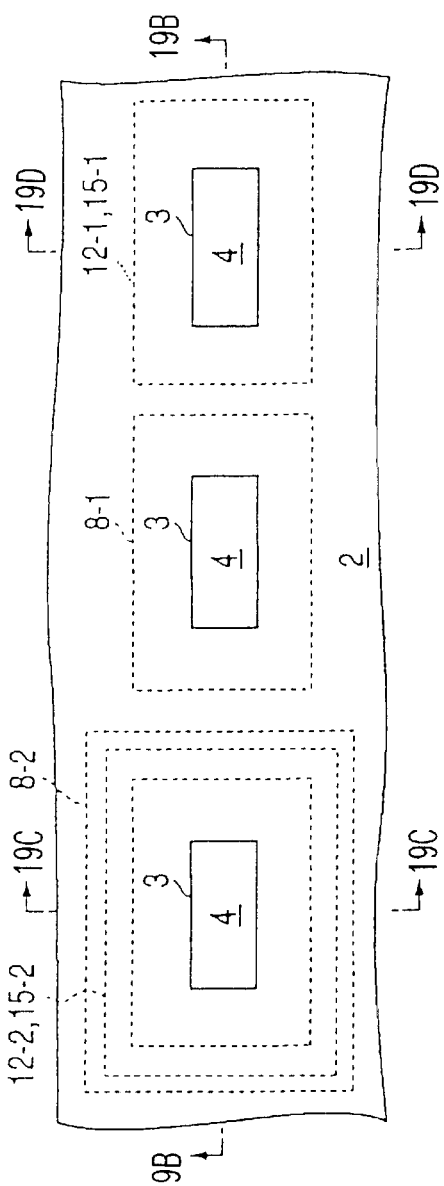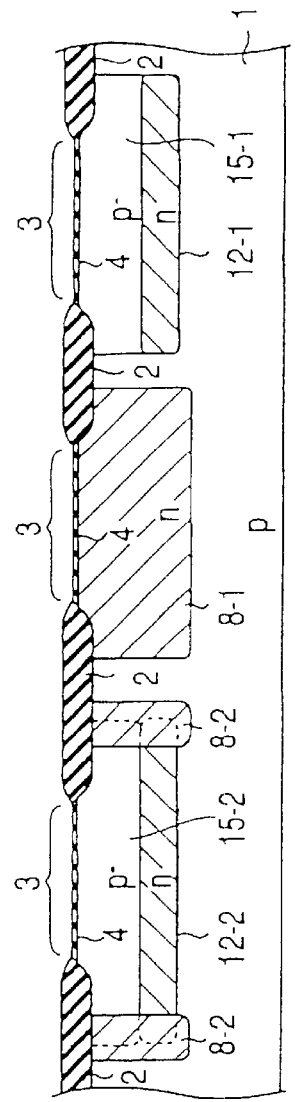
FIG. 19(A)
FIG. 19(B)
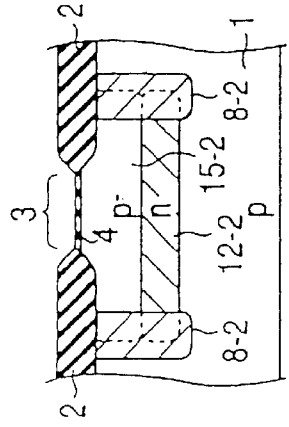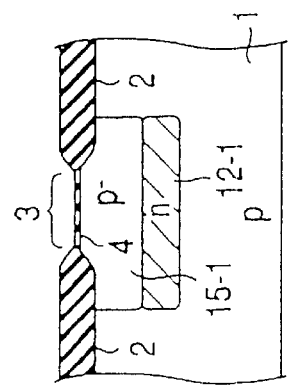
FIG. 19(C)
FIG. 19(D)

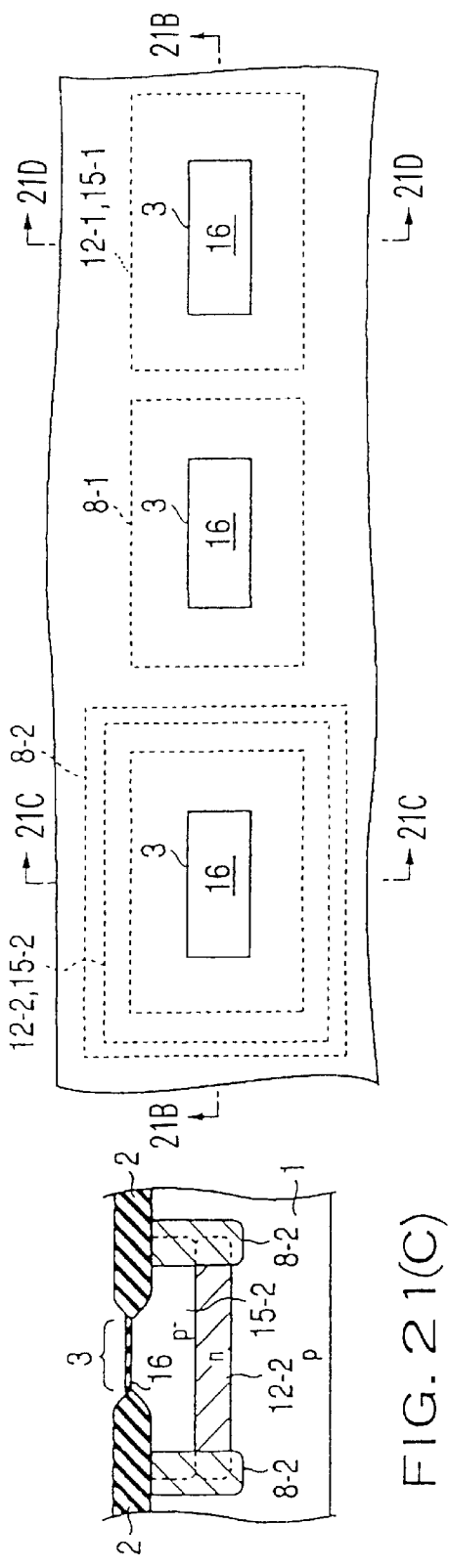
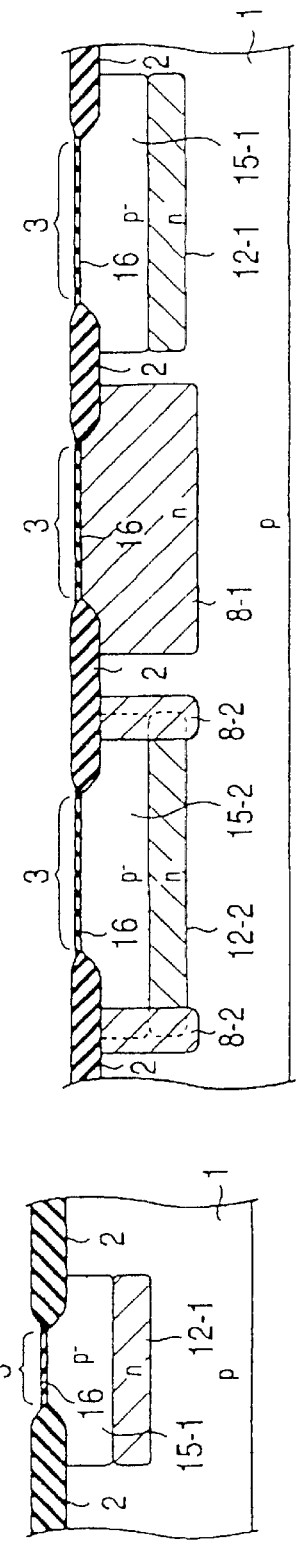
FIG. 21(A)
FIG. 21(B)
FIG. 21(C)
FIG. 21(D)

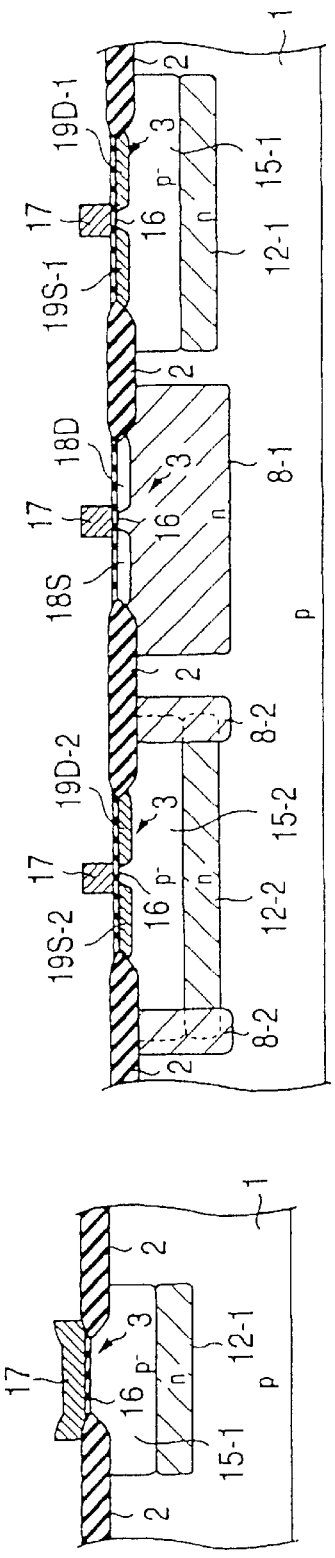
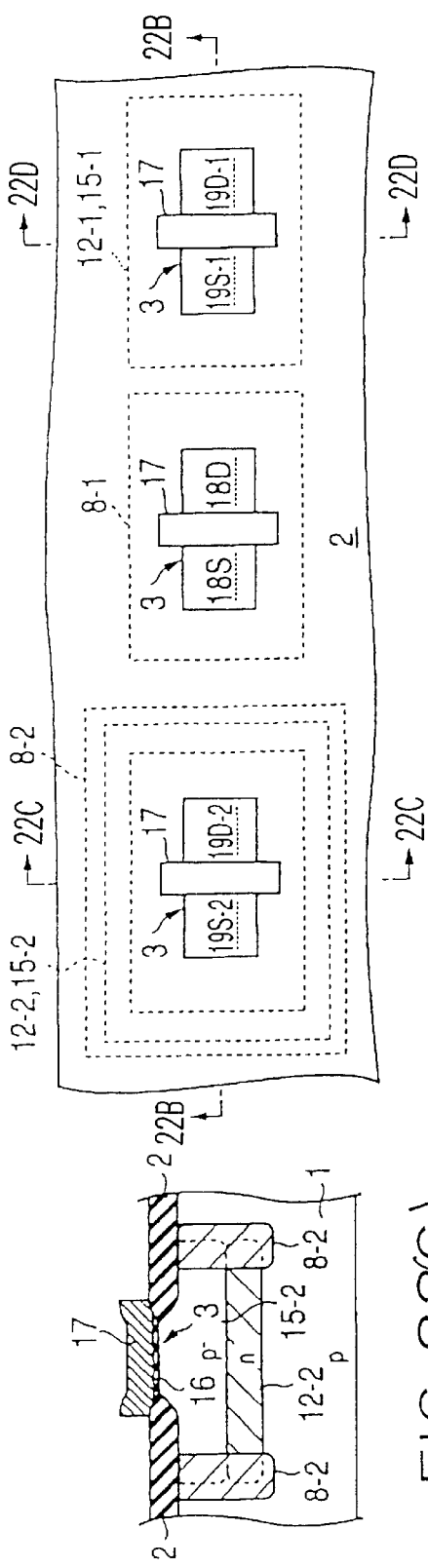
FIG. 22(A)
FIG. 22(B)
FIG. 22(C)
FIG. 22(D)

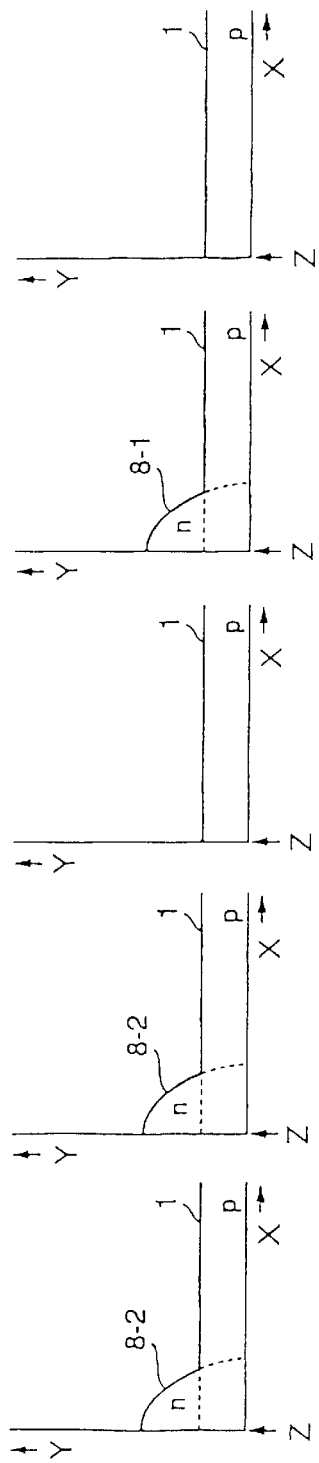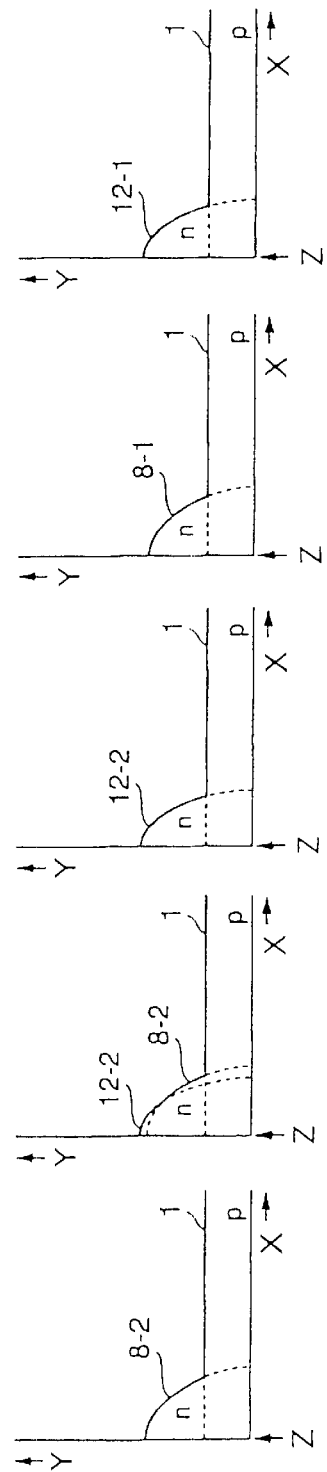

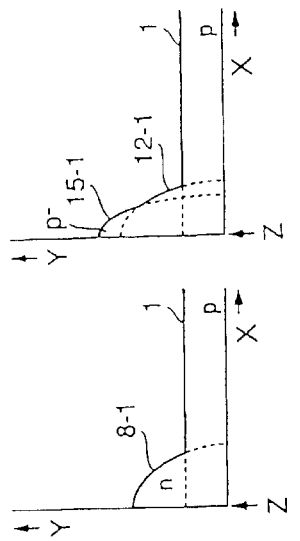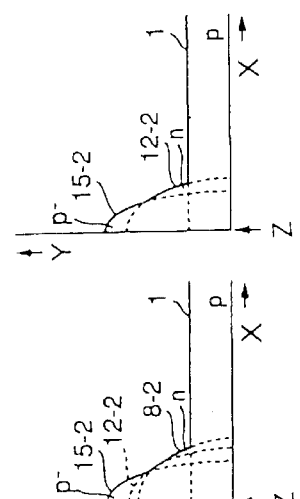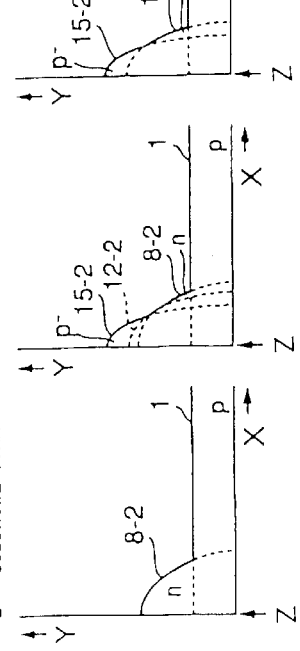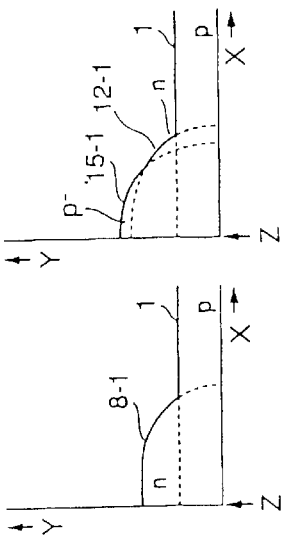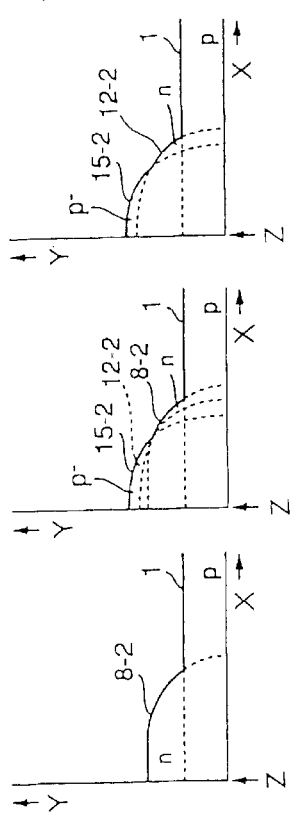

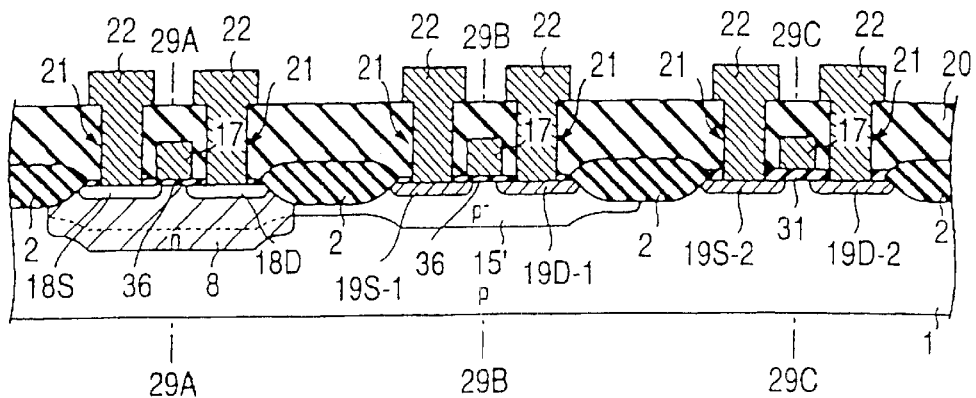
FIG. 28
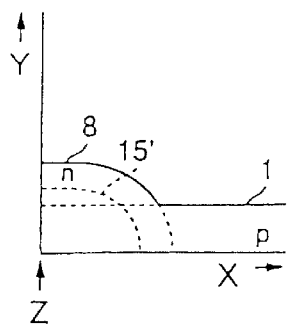 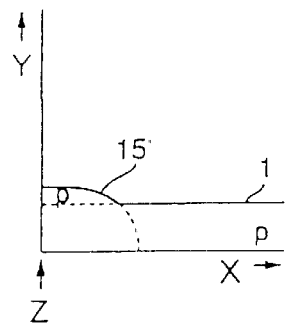 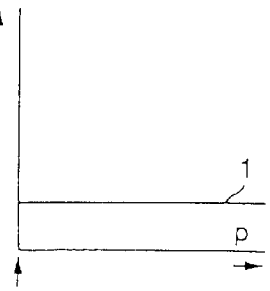
FIG. 29(A)   FIG. 29(B)   FIG. 29(C)

X – DEPTH
Y – IMPURITY PROFILES
Z – SUBSTRATE SURFACE

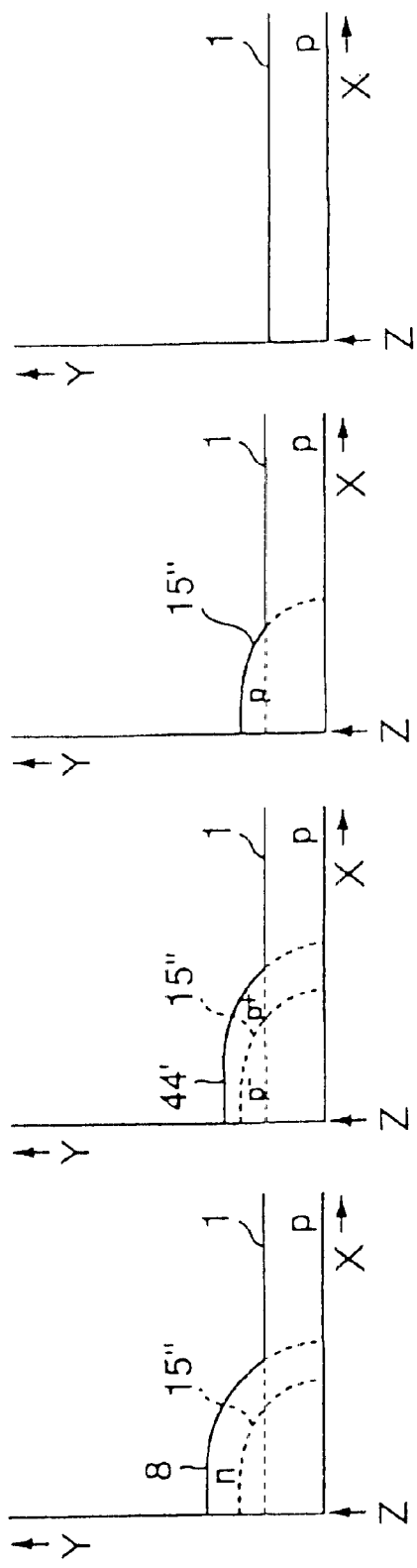

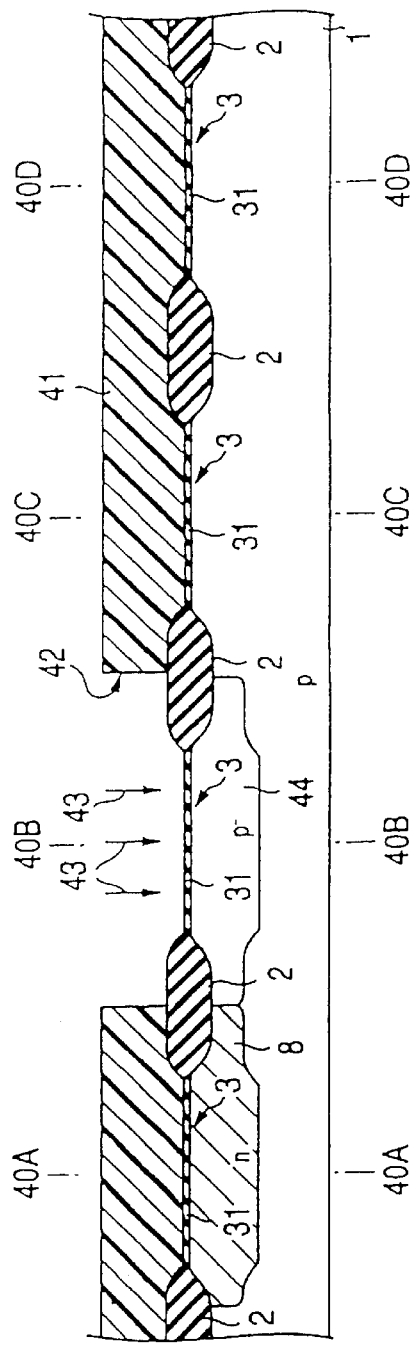
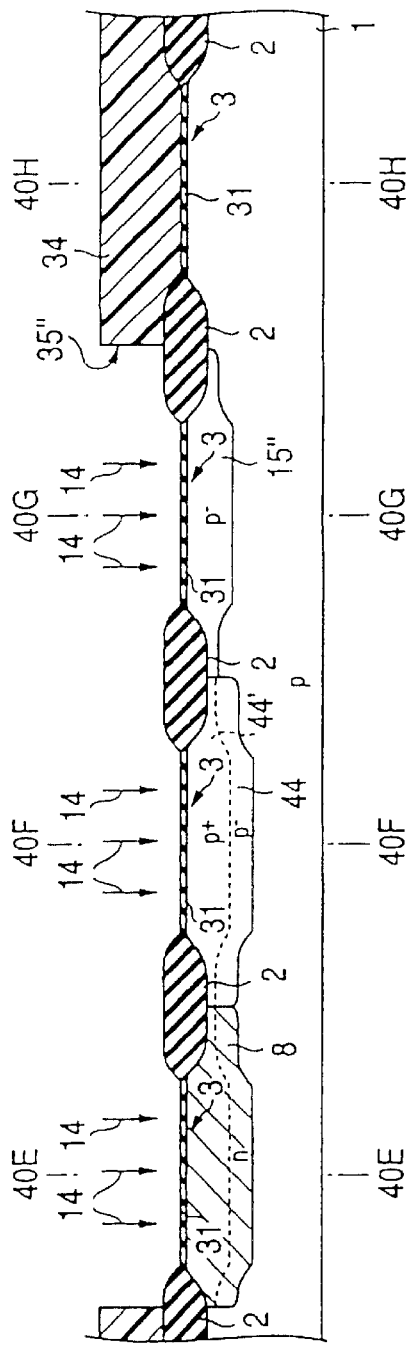
FIG. 36(A)
FIG. 36(B)

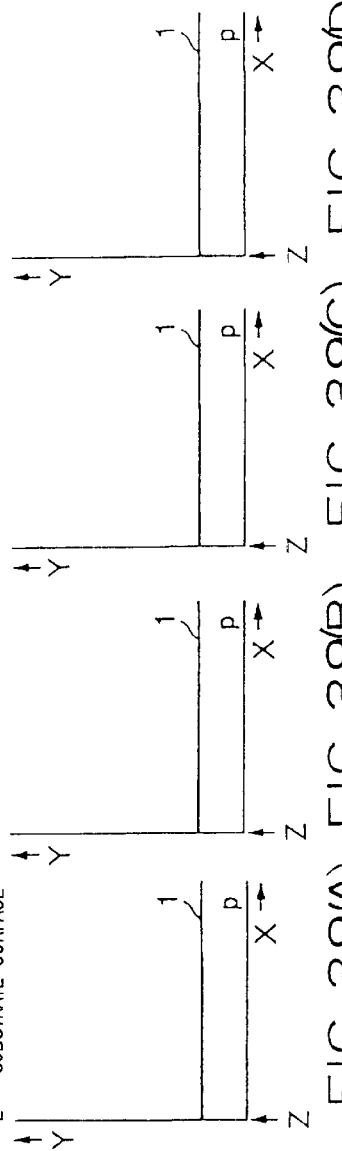
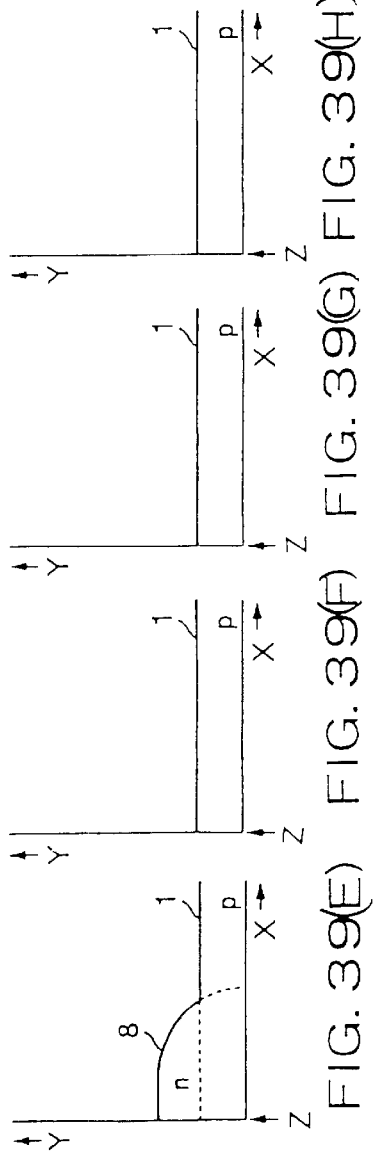

X - DEPTH
Y - IMPURITY PROFILES
Z - SUBSTRATE SURFACE
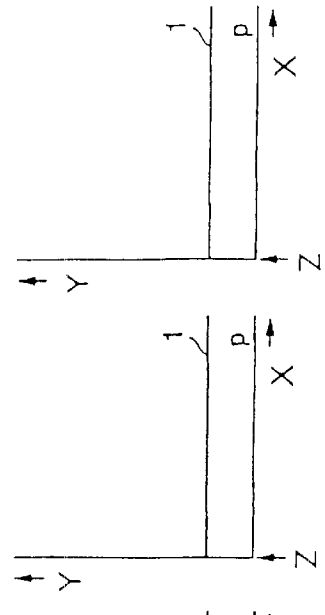
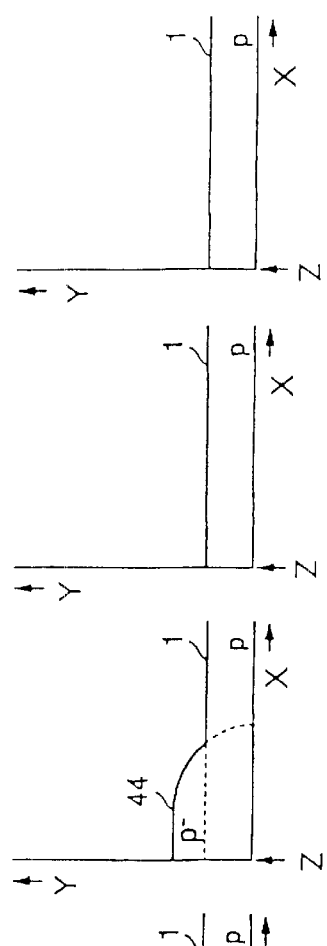
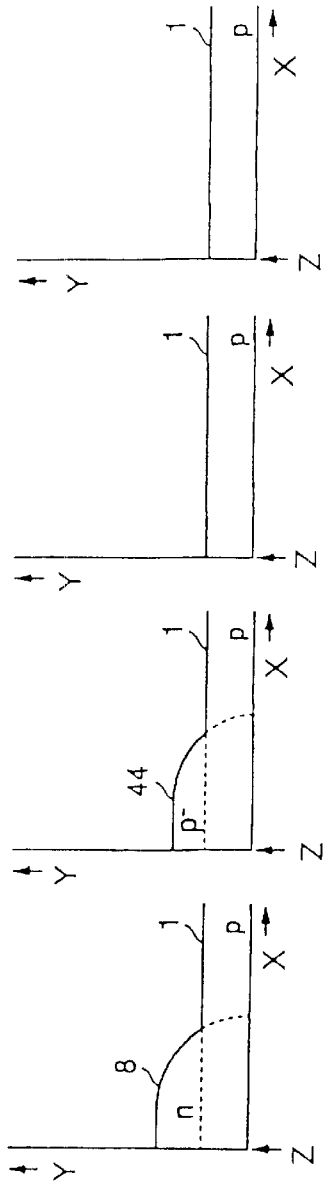
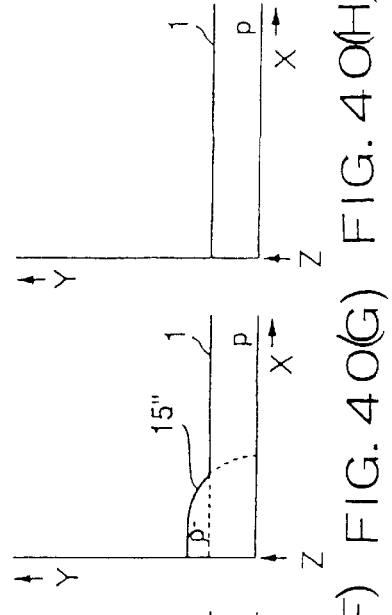
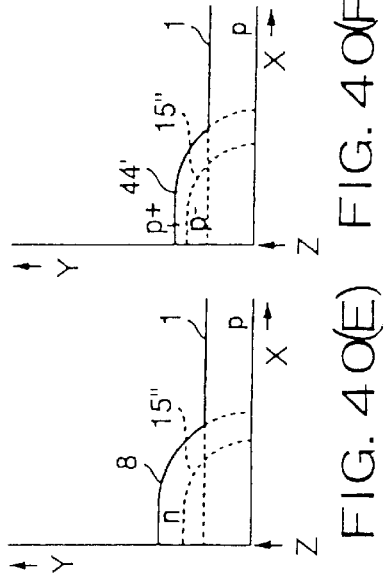
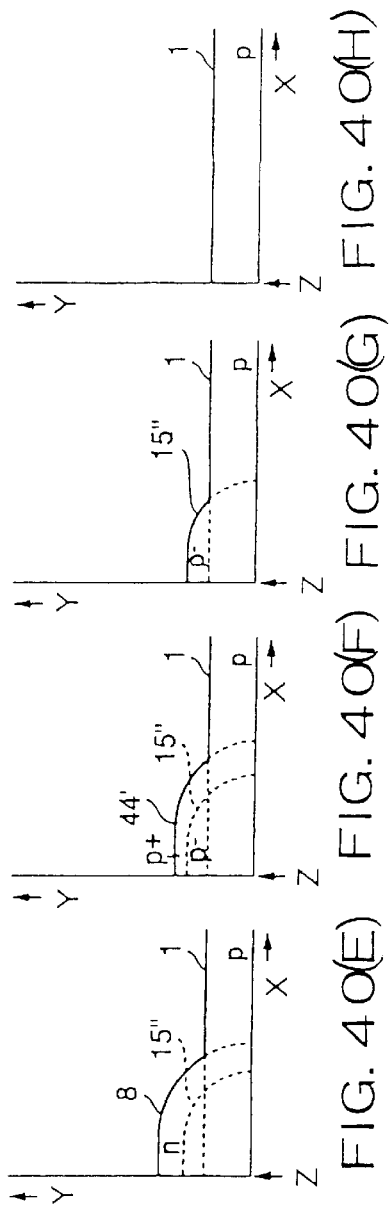

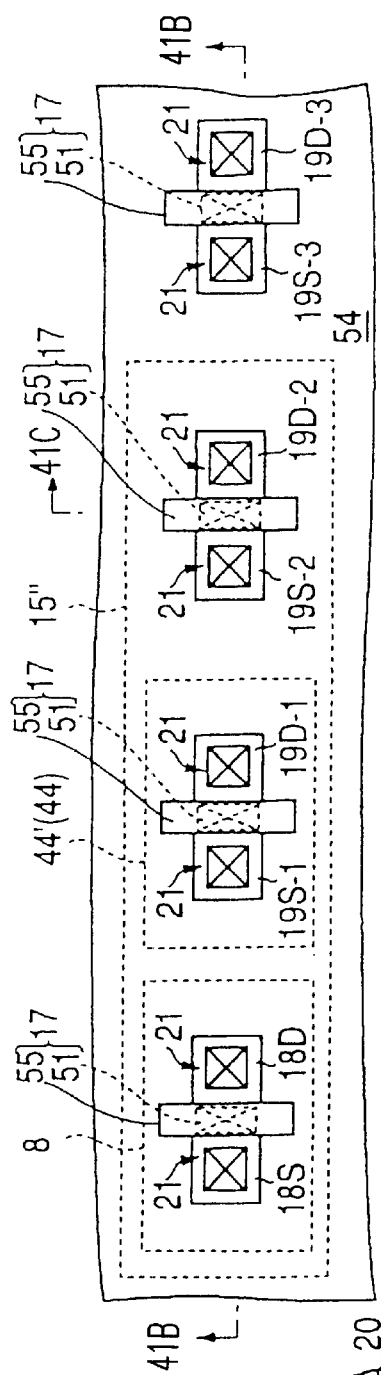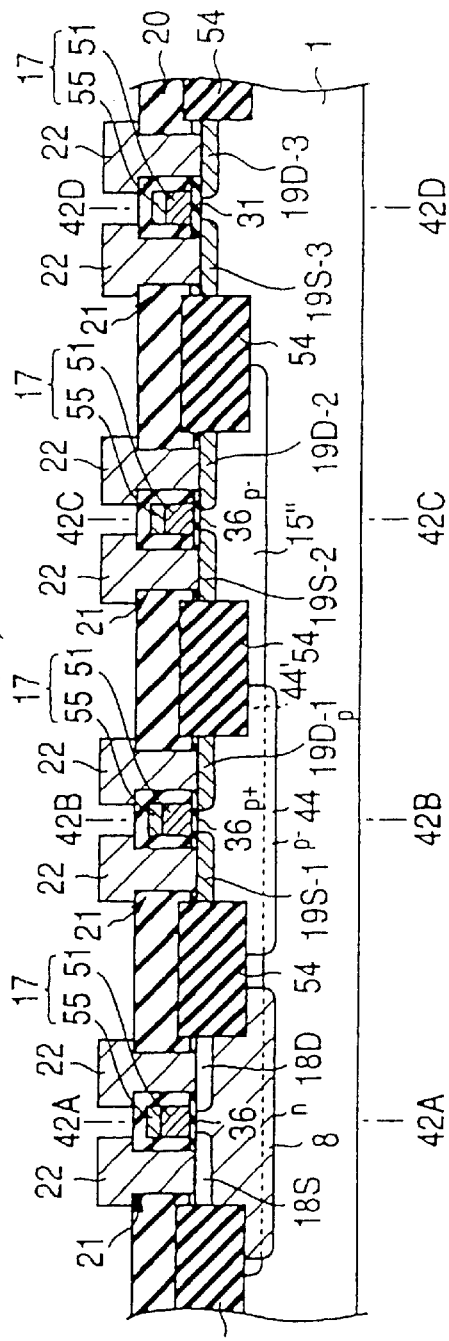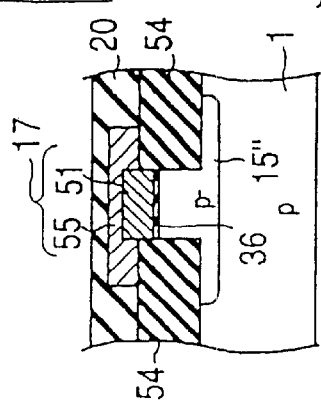
FIG. 41(A)
FIG. 41(B)
FIG. 41(C)

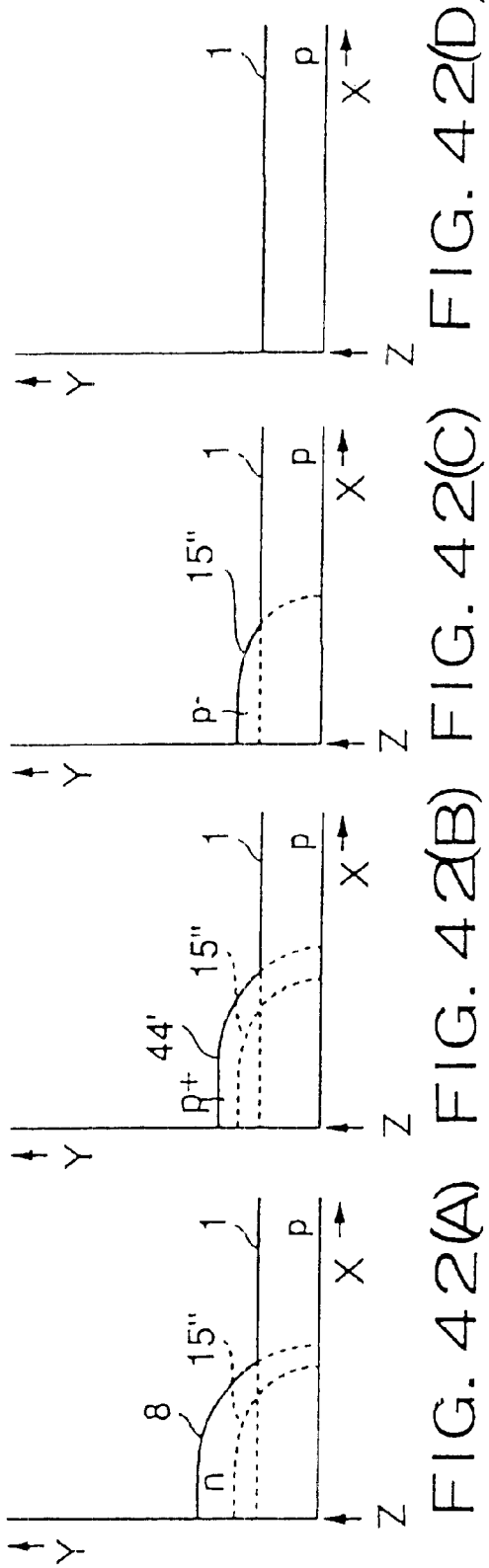

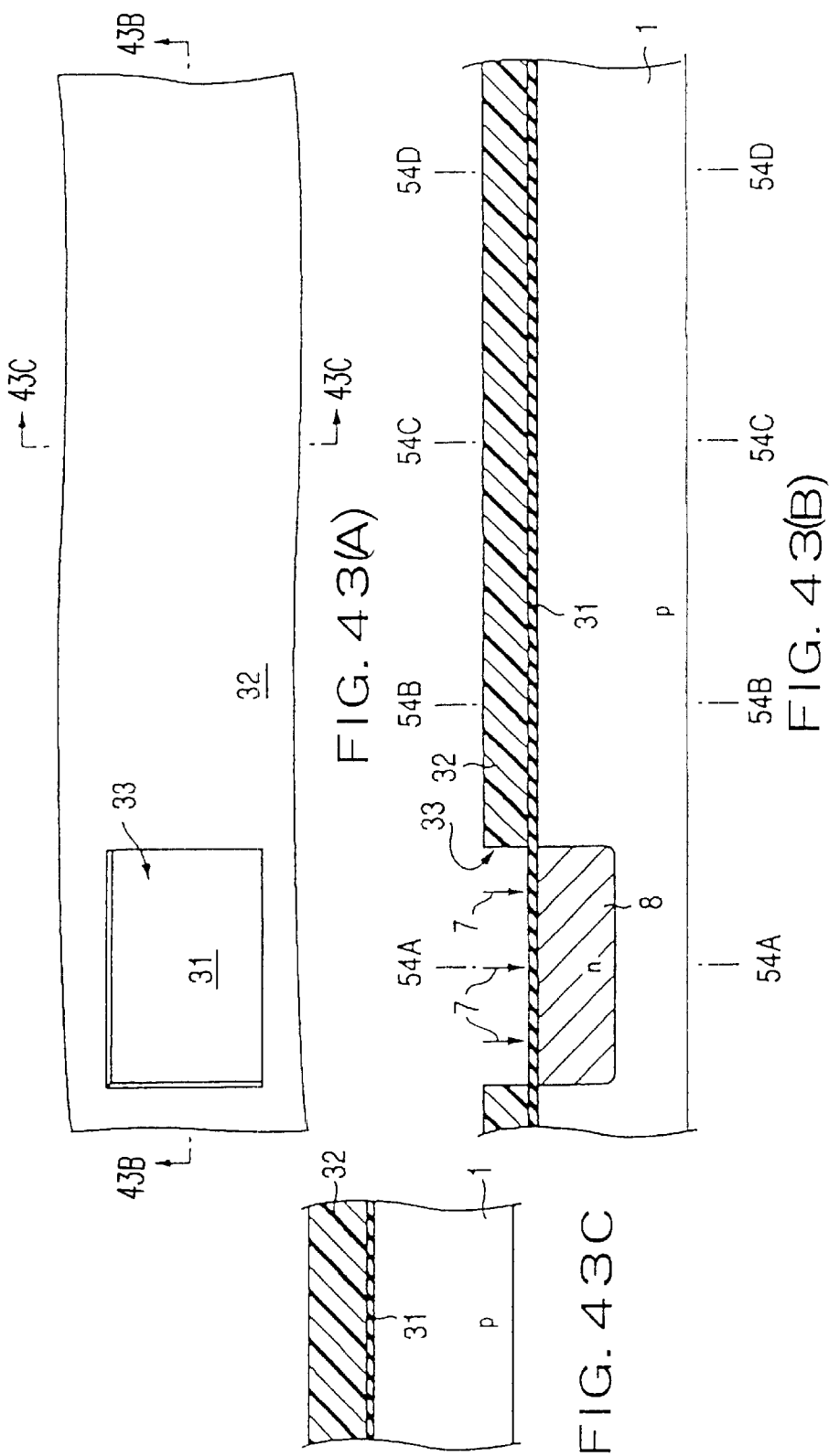

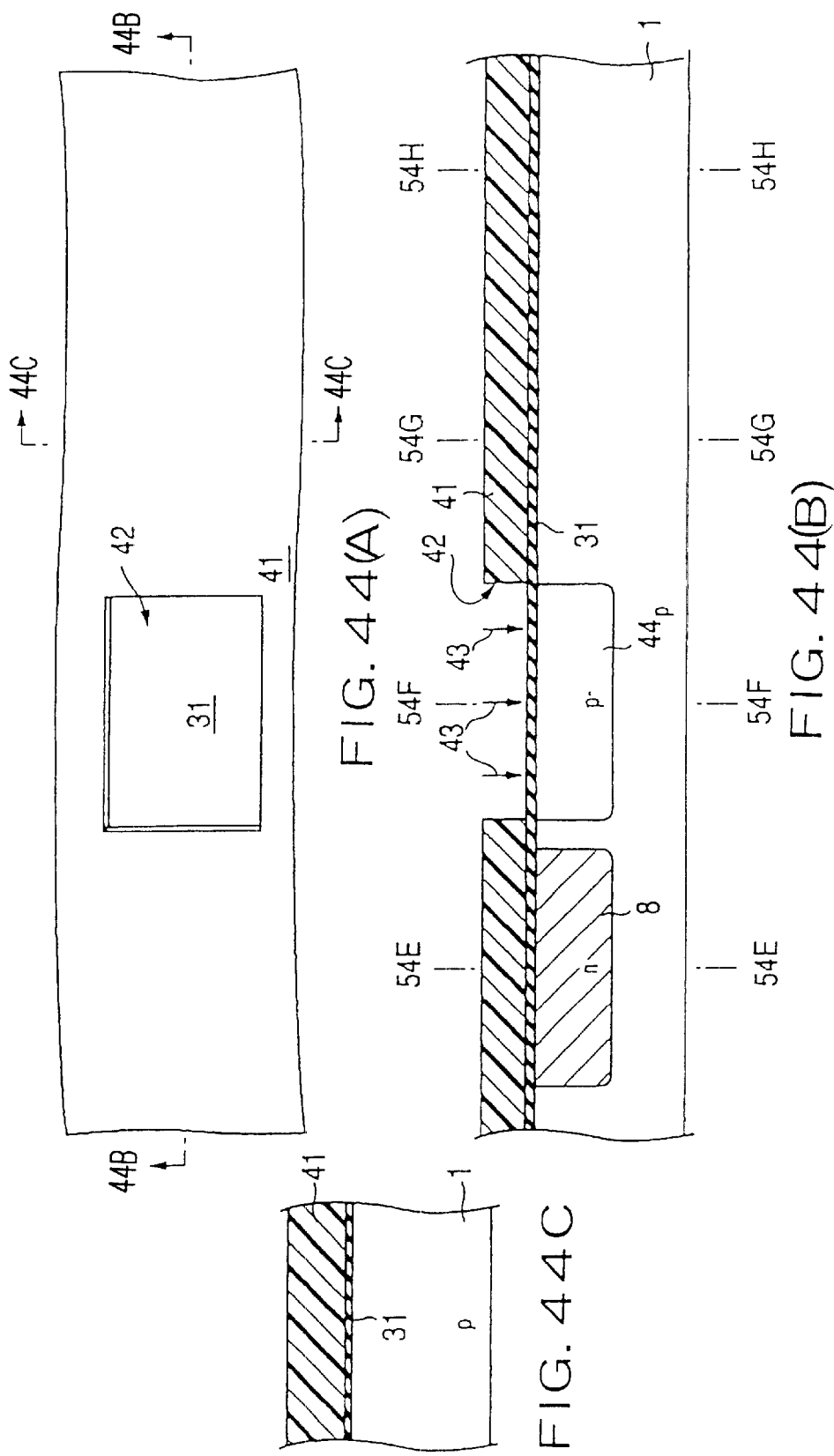

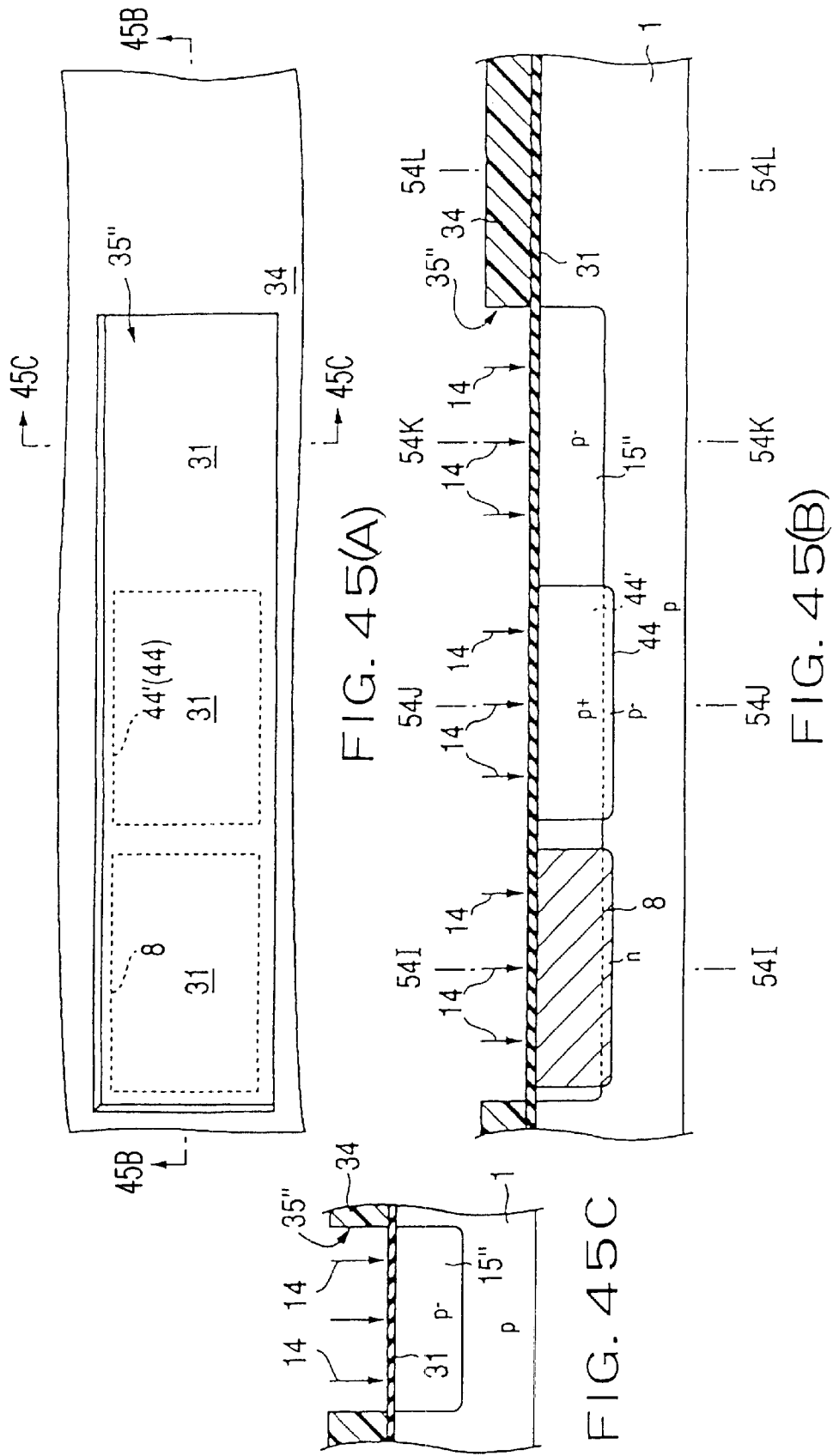

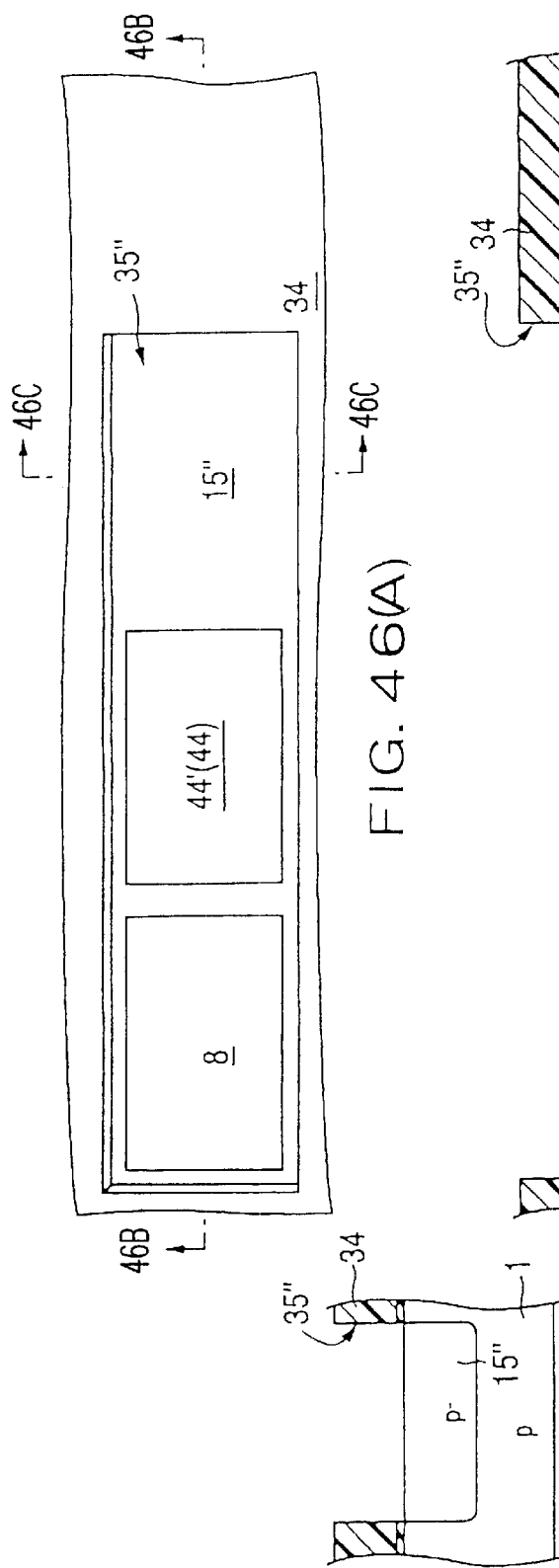
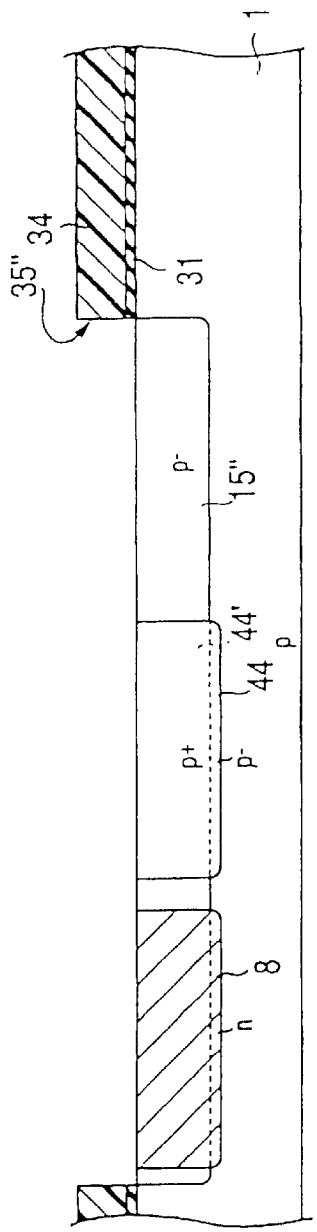

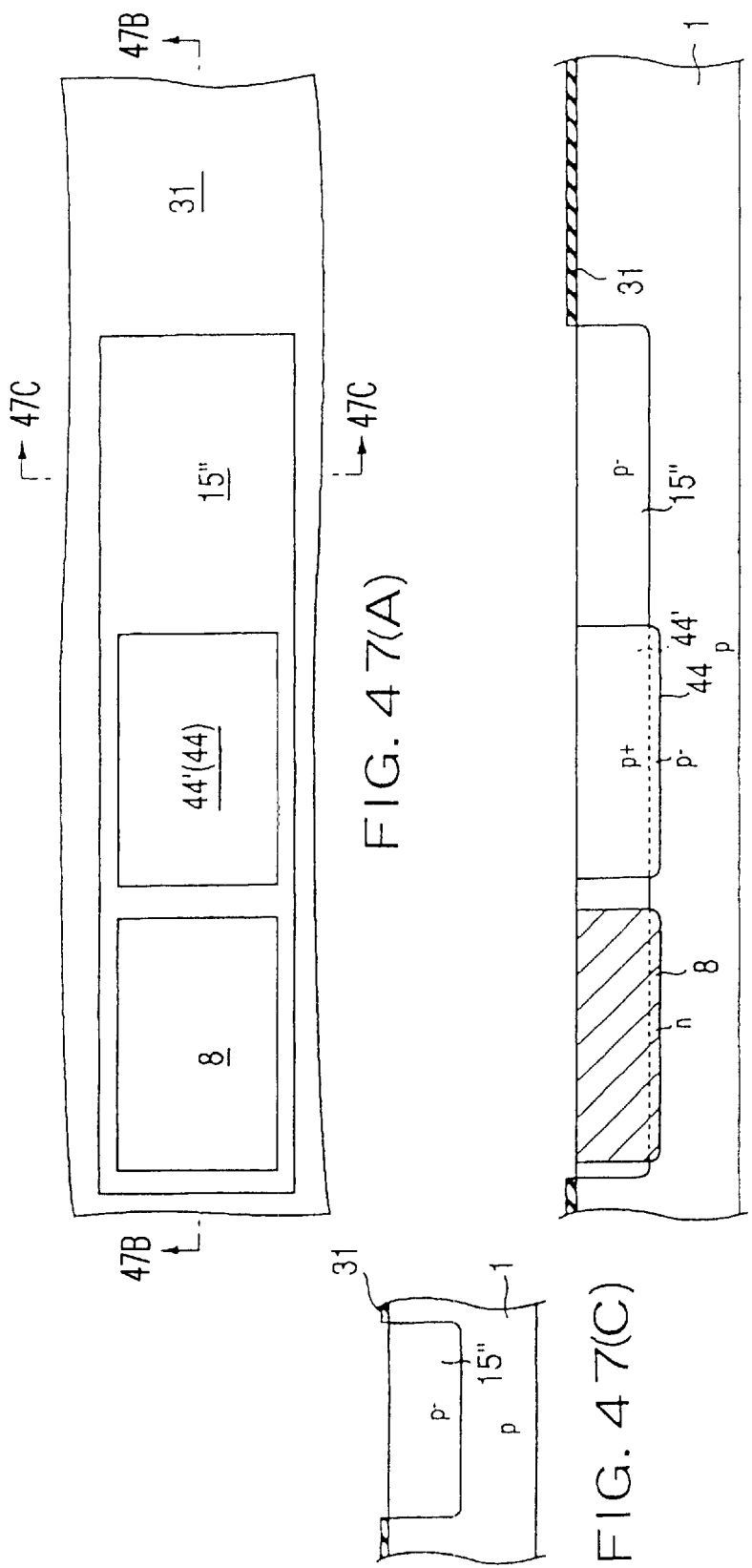

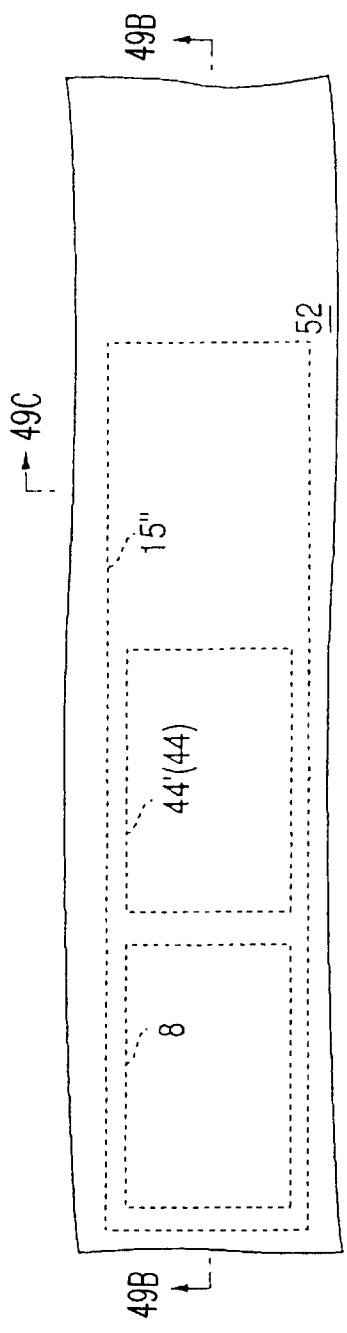
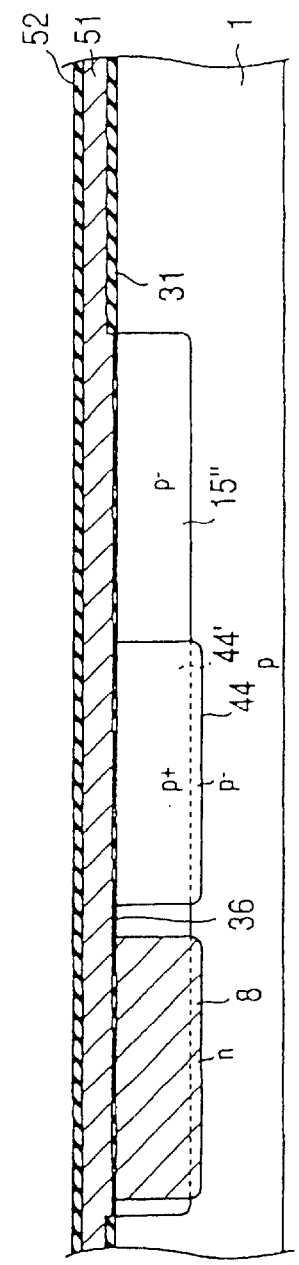
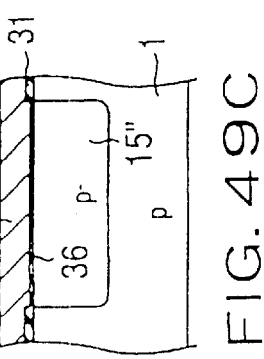
FIG. 49(A)
FIG. 49(B)
FIG. 49C

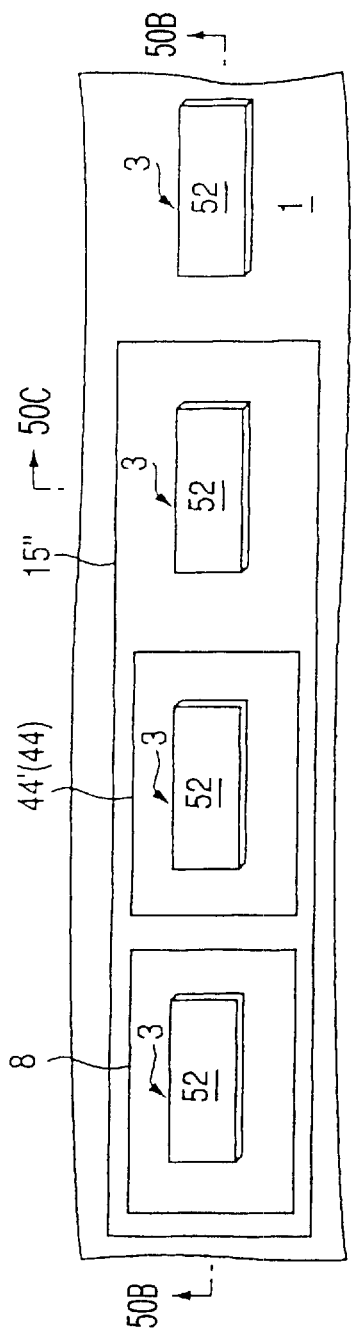
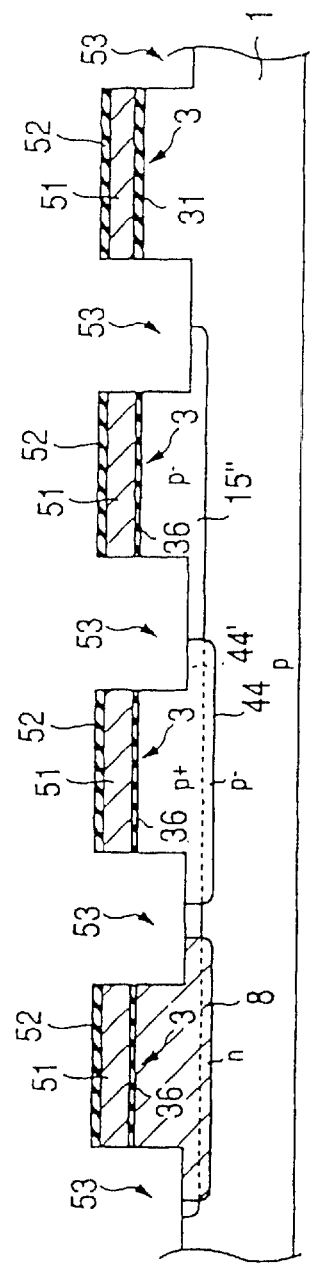
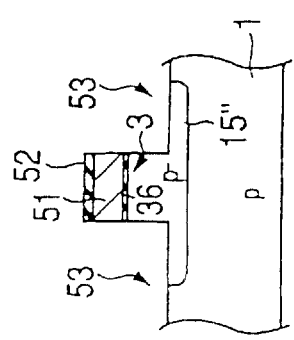
FIG. 50(A)
FIG. 50(B)
FIG. 50(C)

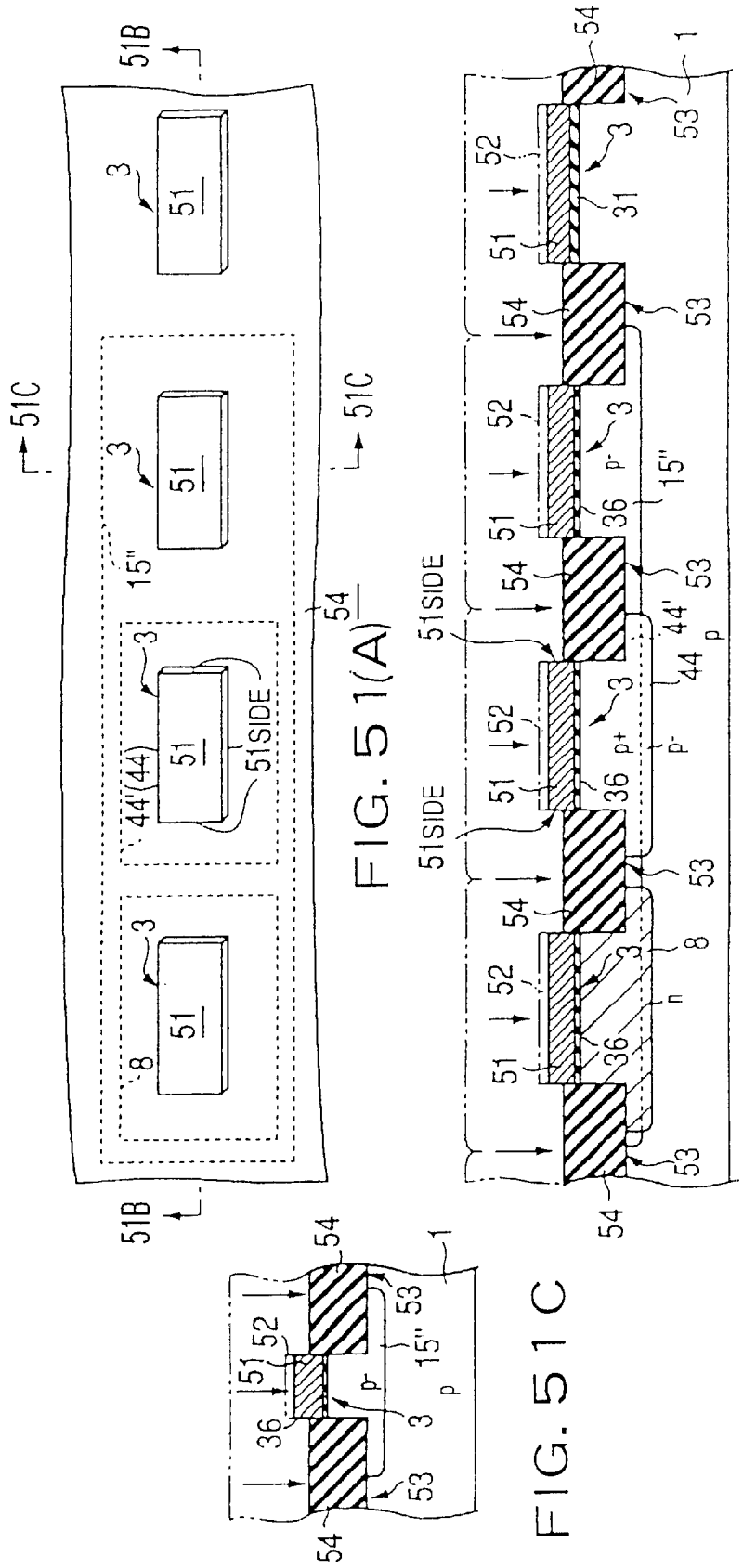

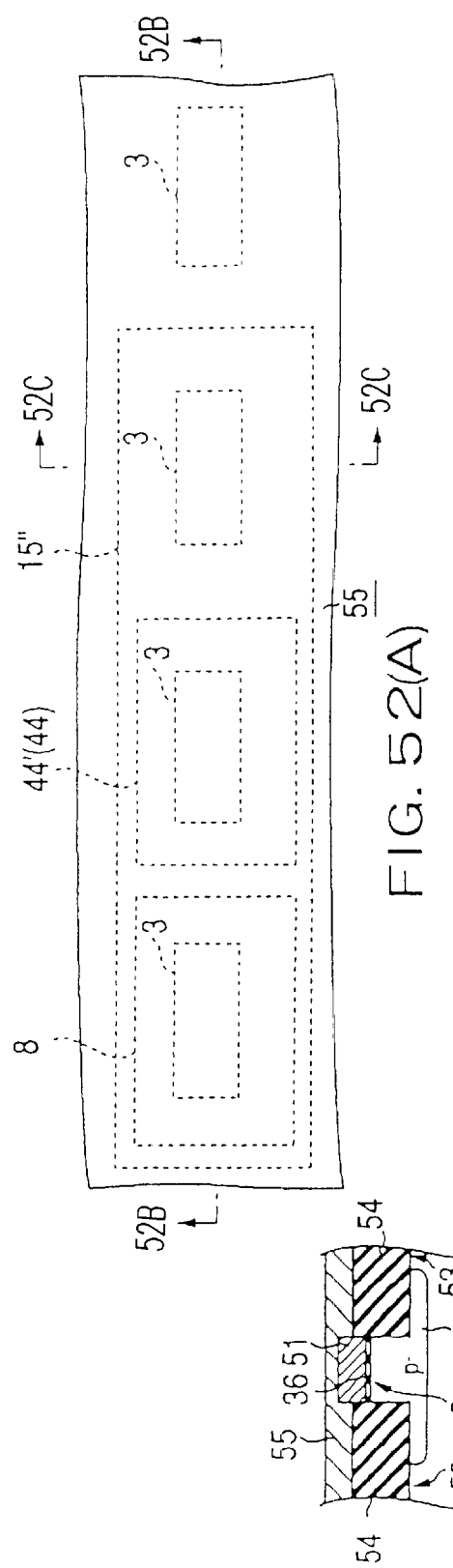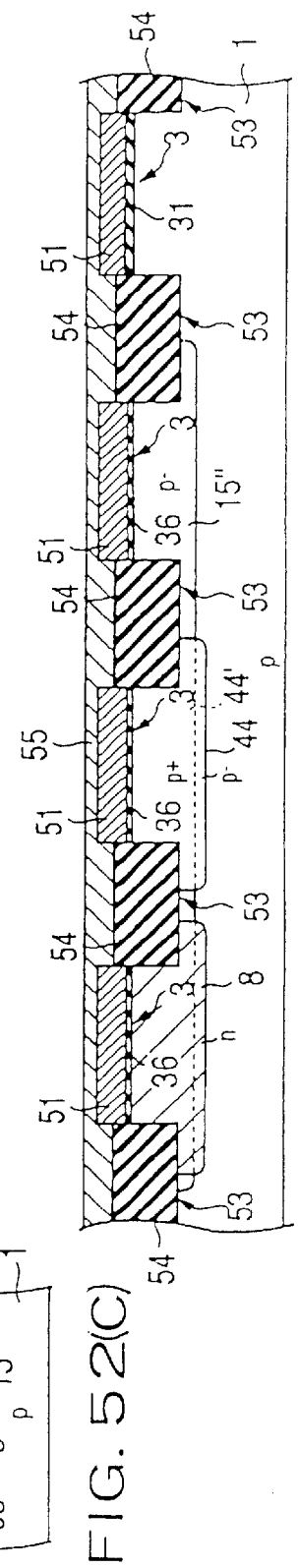
FIG. 52(A)
FIG. 52(B)
FIG. 52(C)

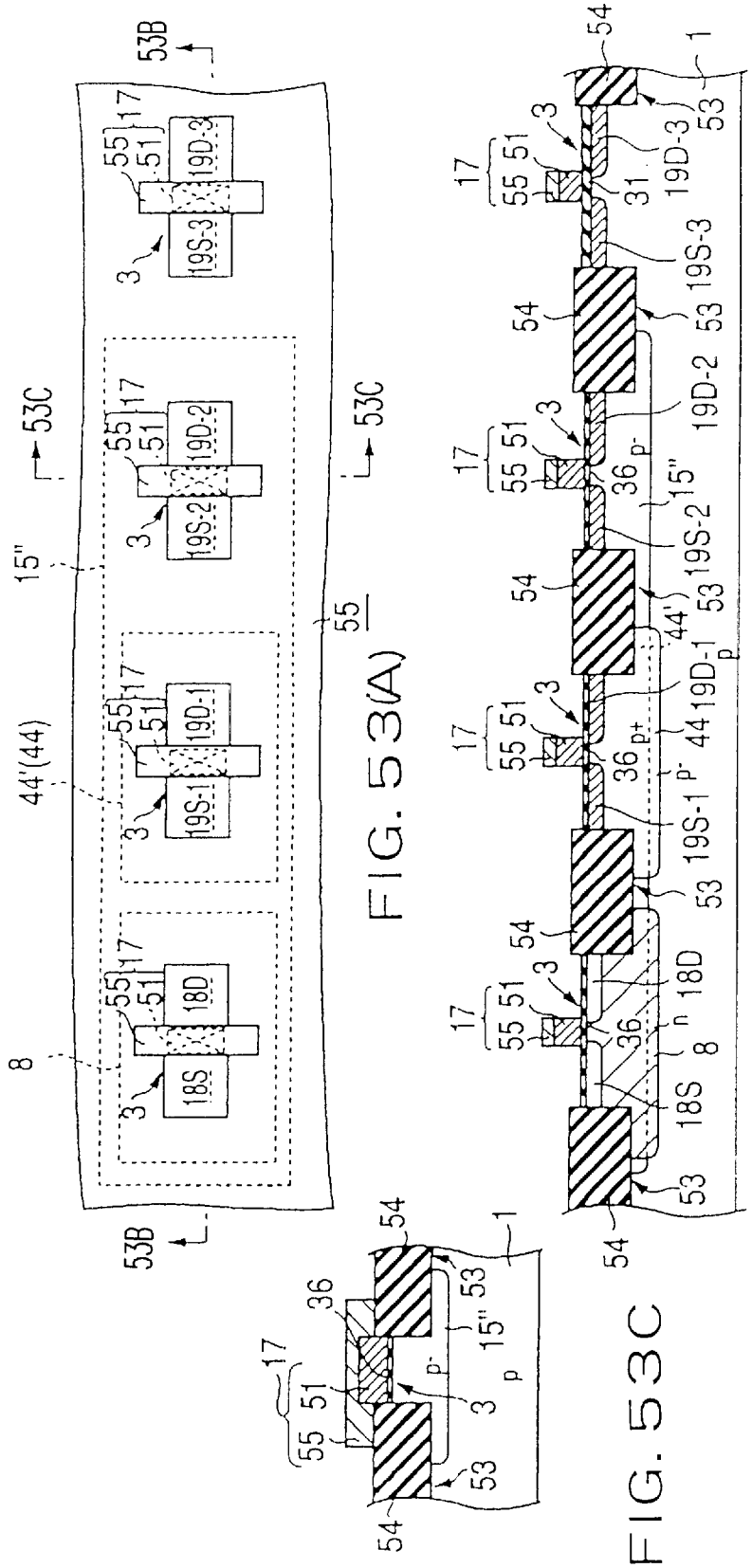

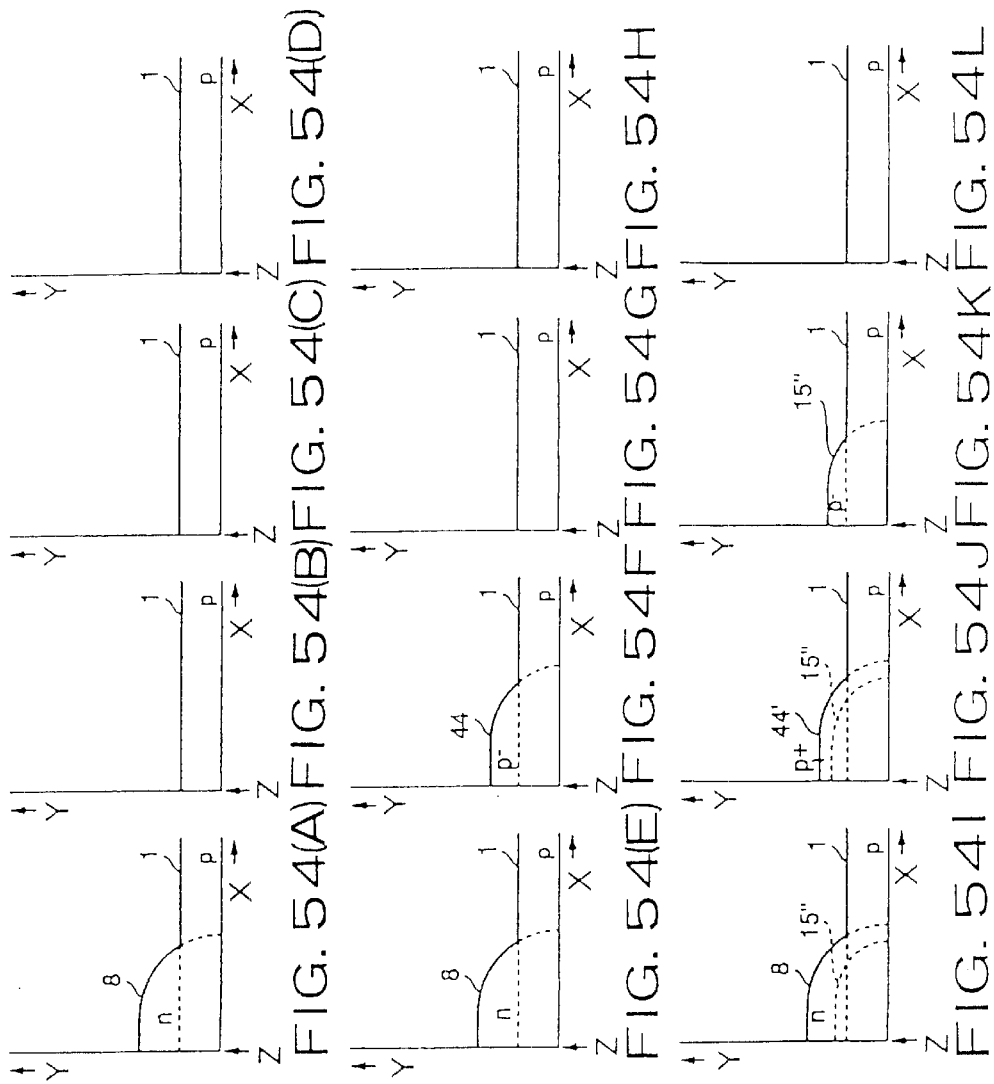

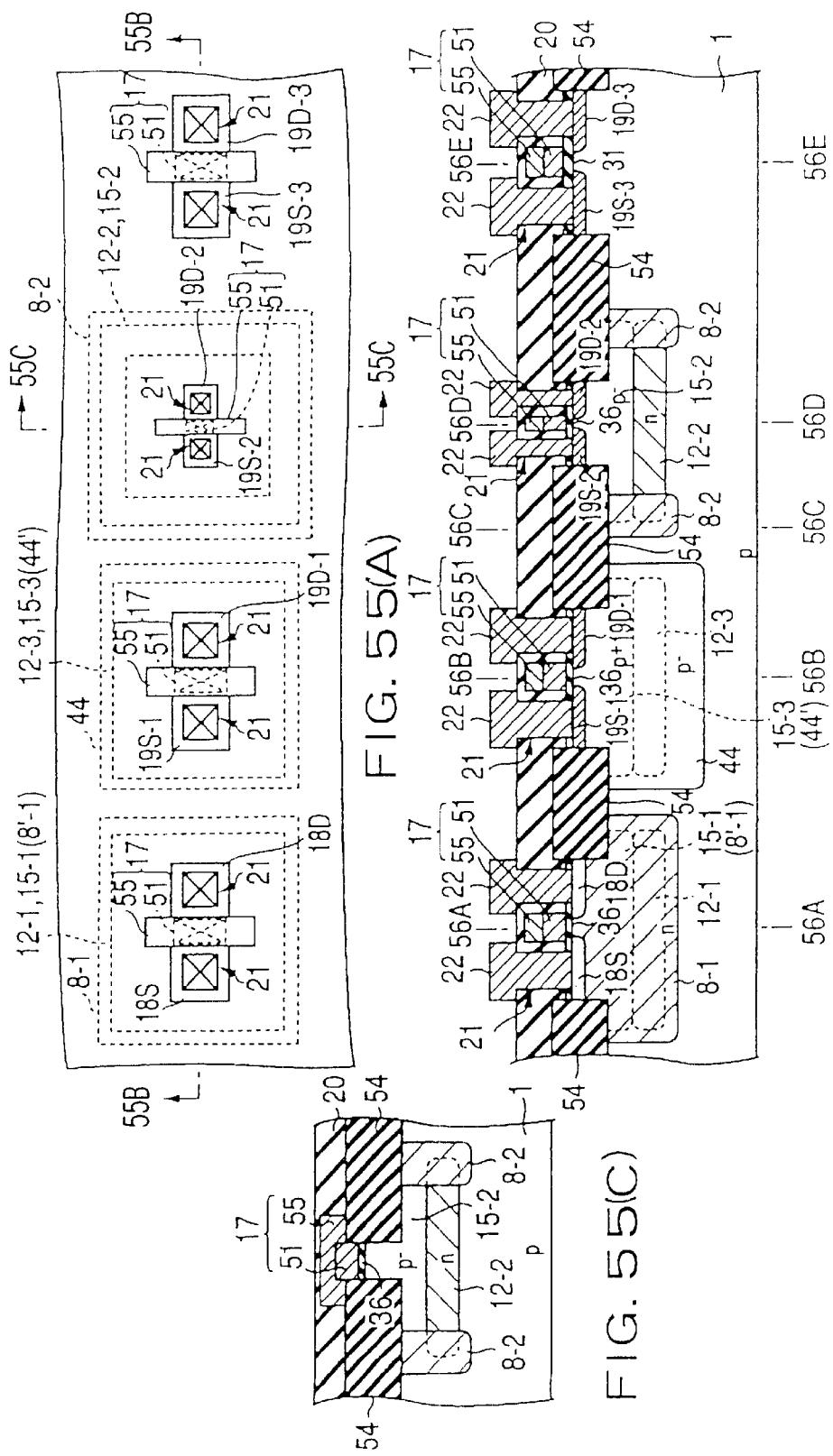

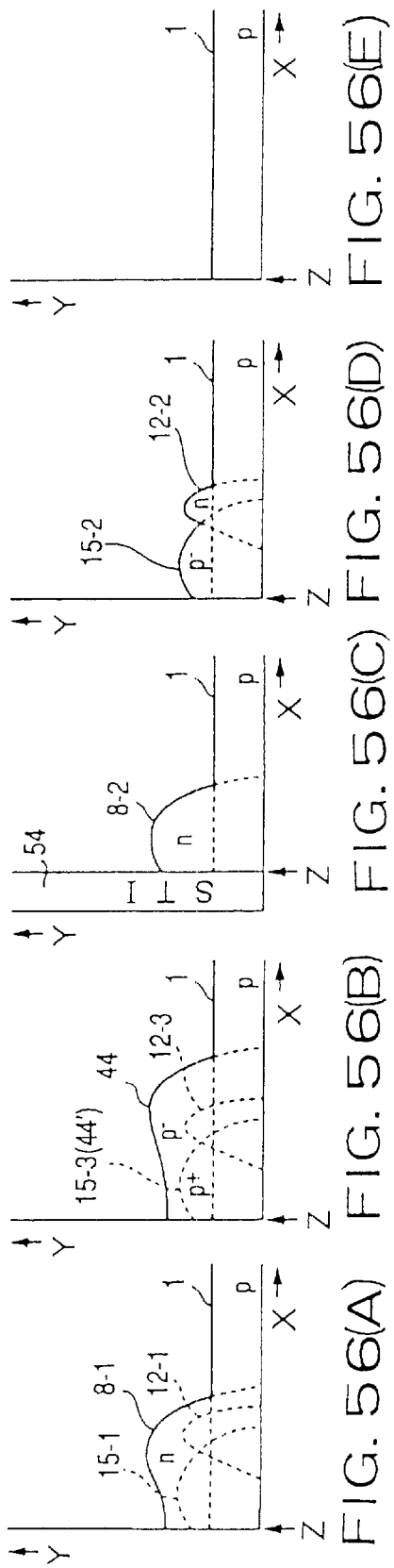

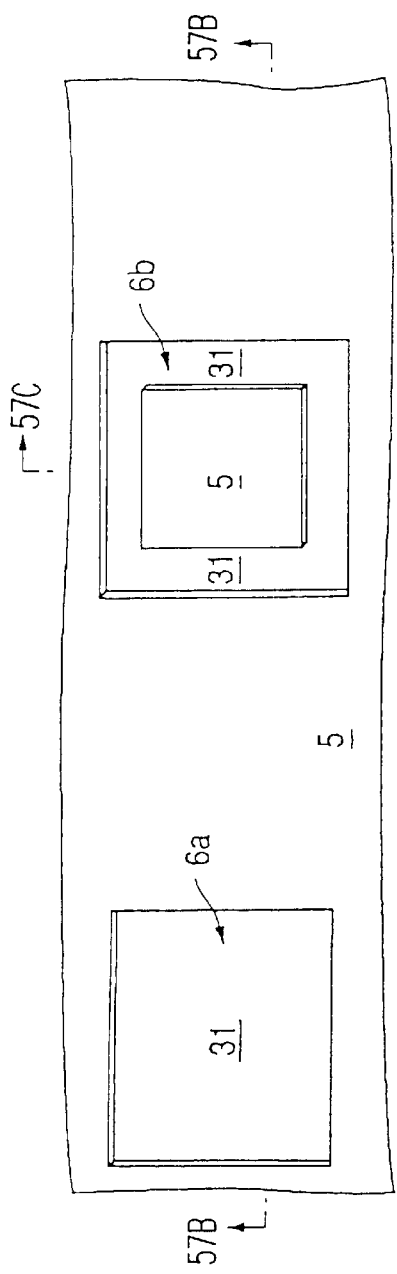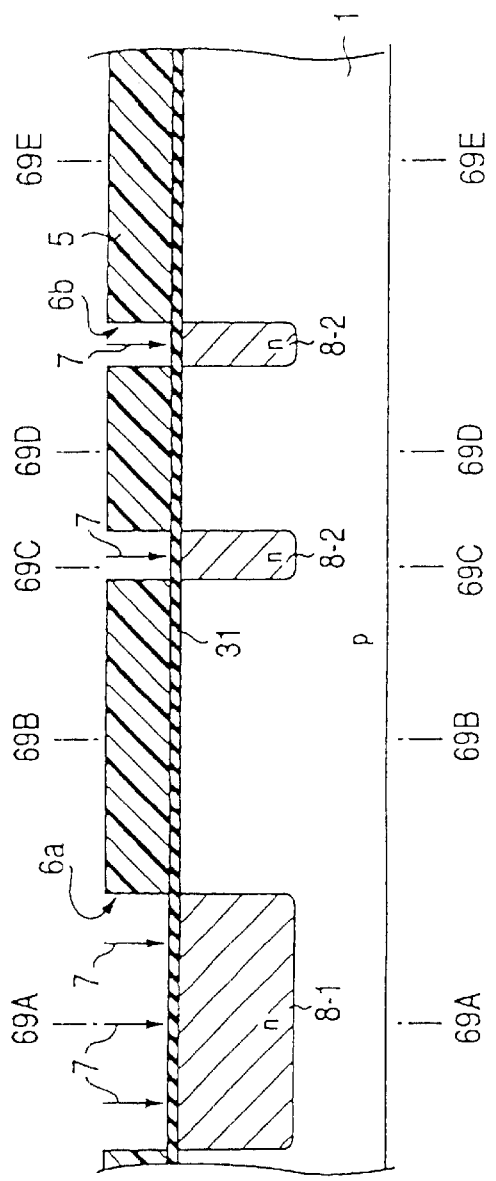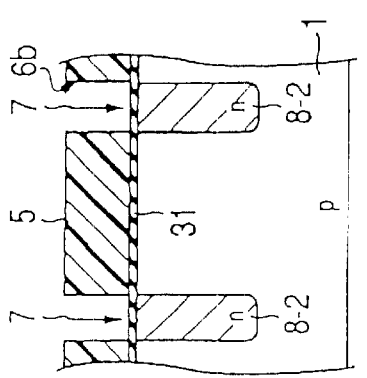
FIG. 57(A)
FIG. 57(B)
FIG. 57(C)

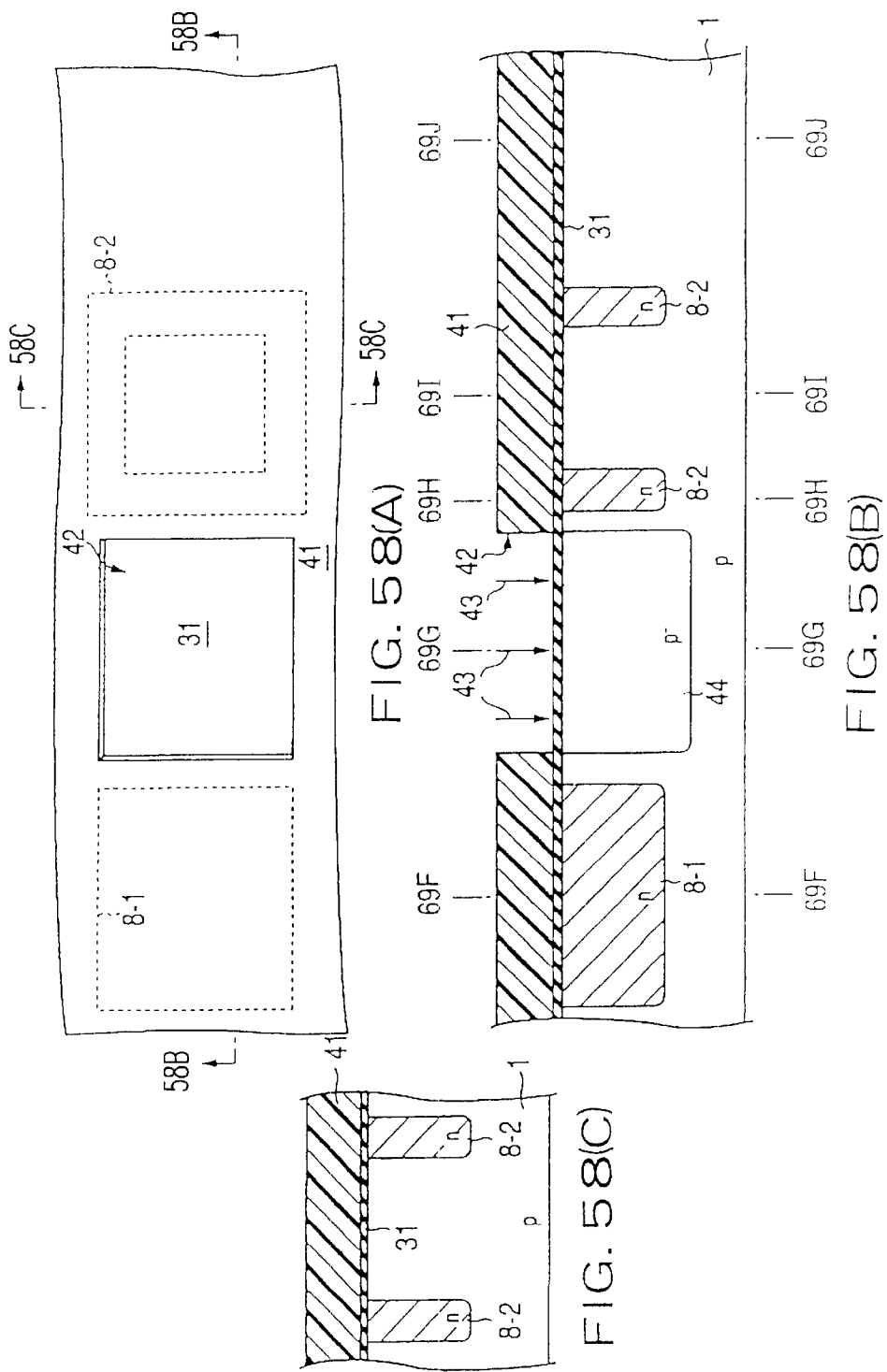

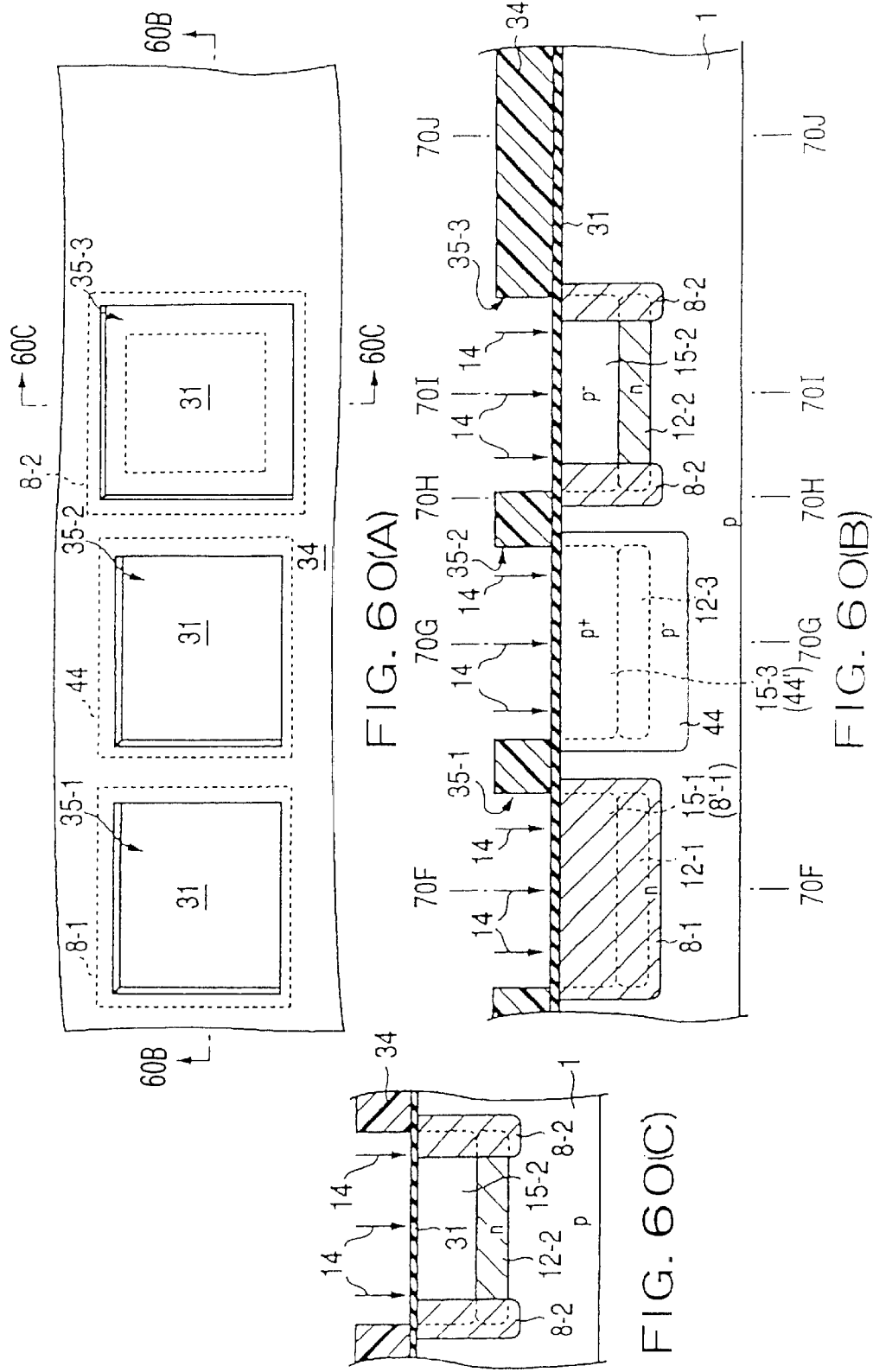

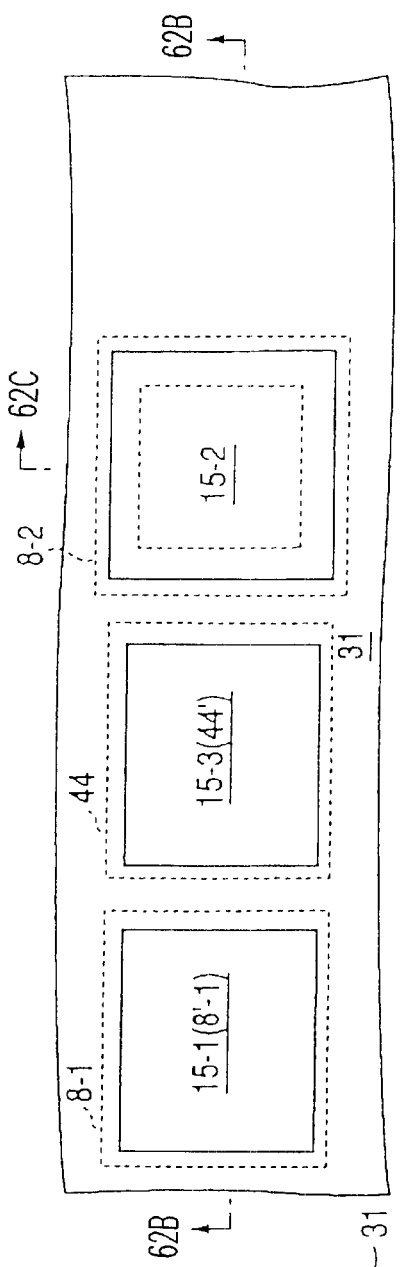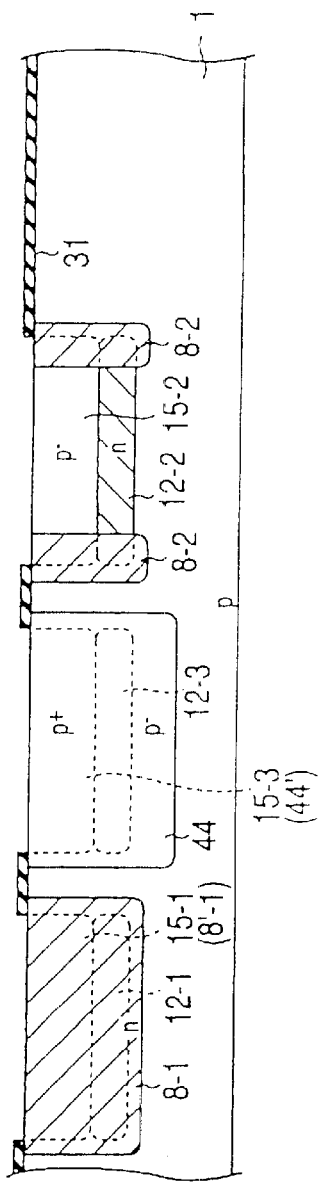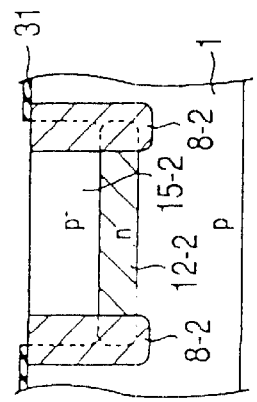

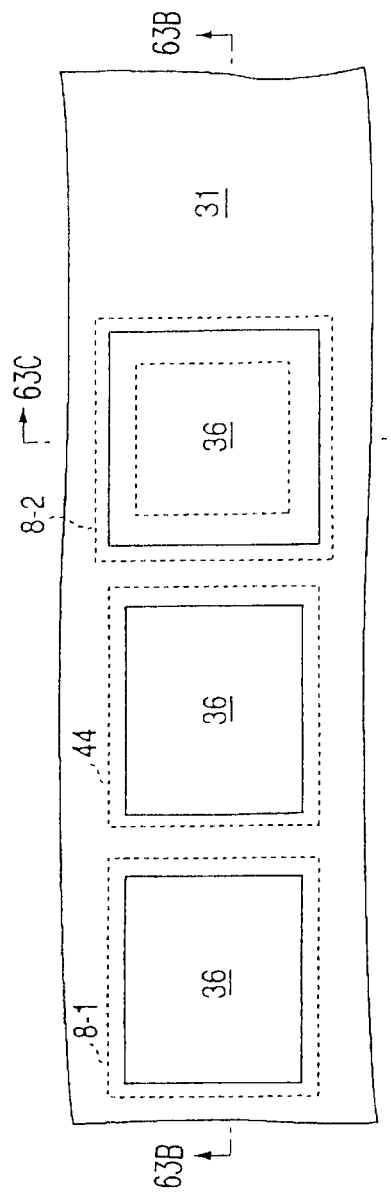
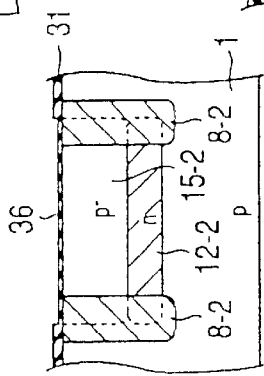
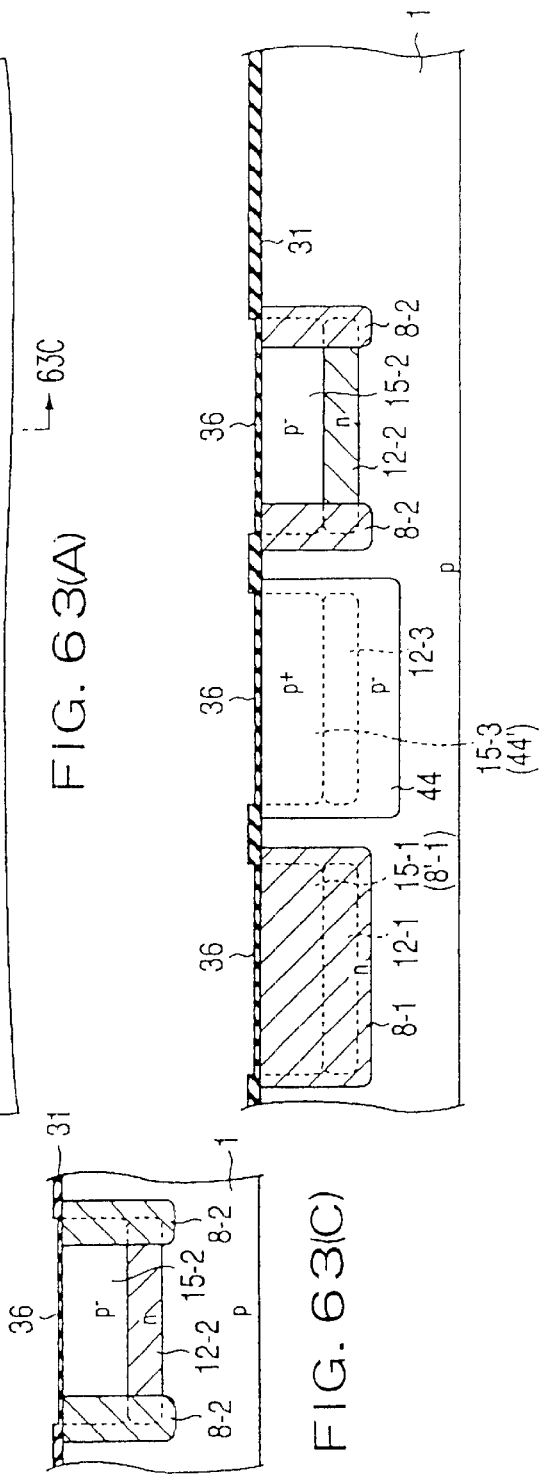
FIG. 63(A)
FIG. 63(C)
FIG. 63(B)

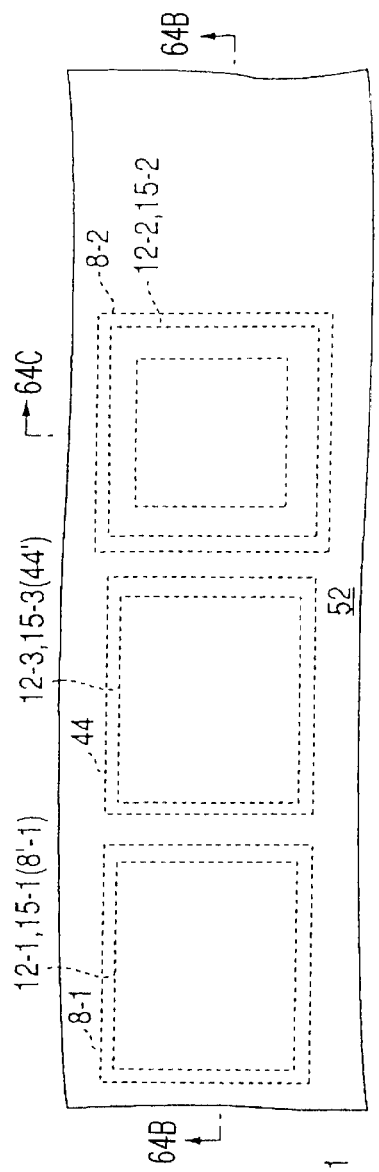
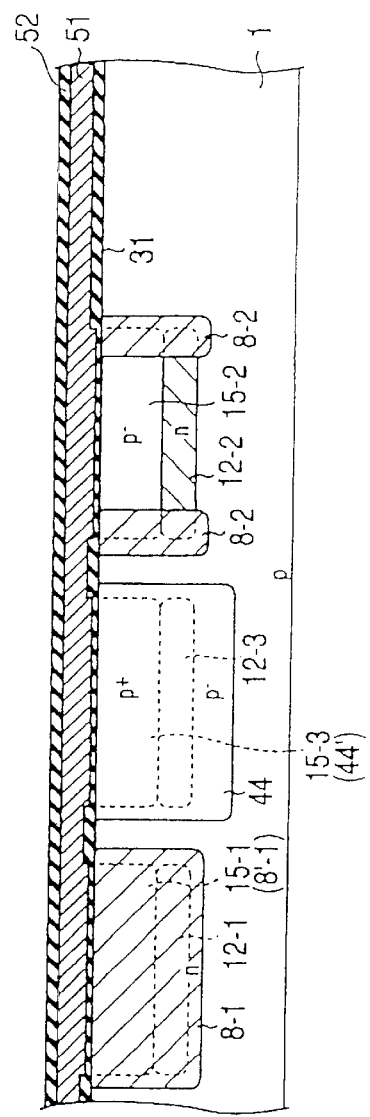
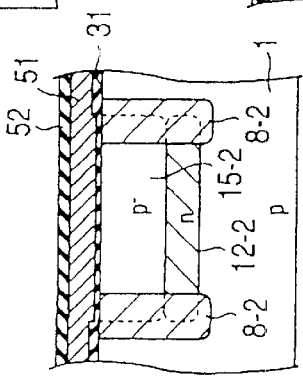
FIG. 64(A)
FIG. 64(B)
FIG. 64(C)

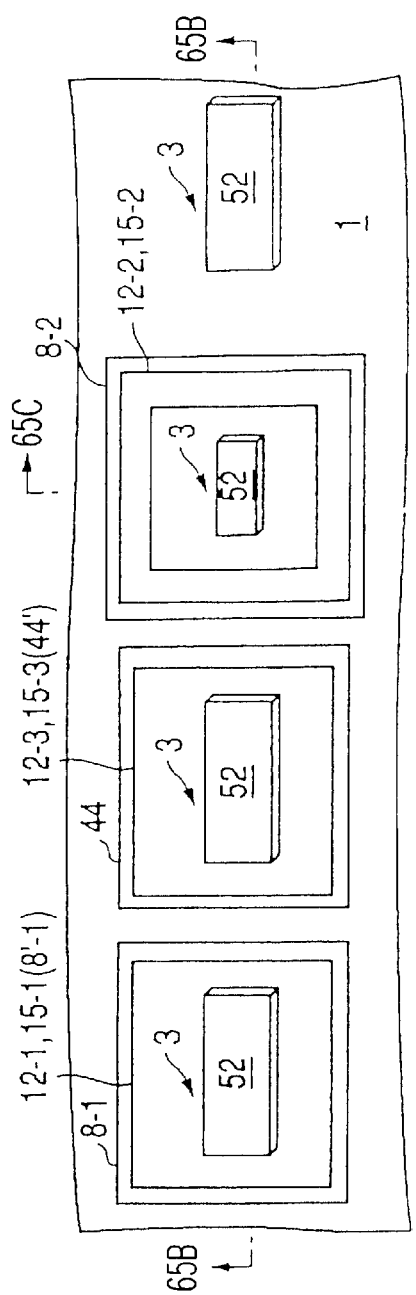
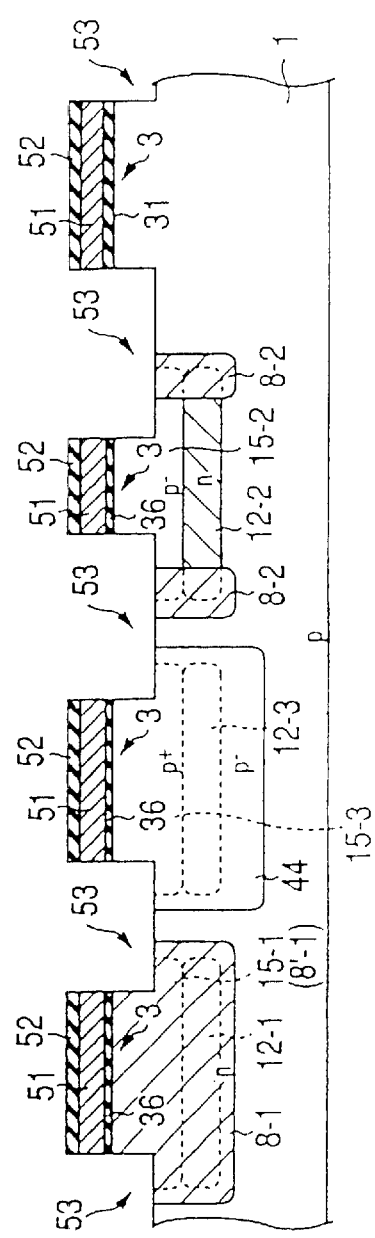
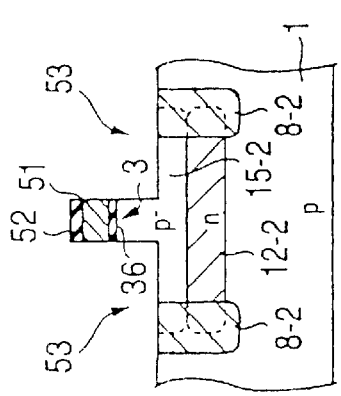
FIG. 65(A)
FIG. 65(B)
FIG. 65(C)

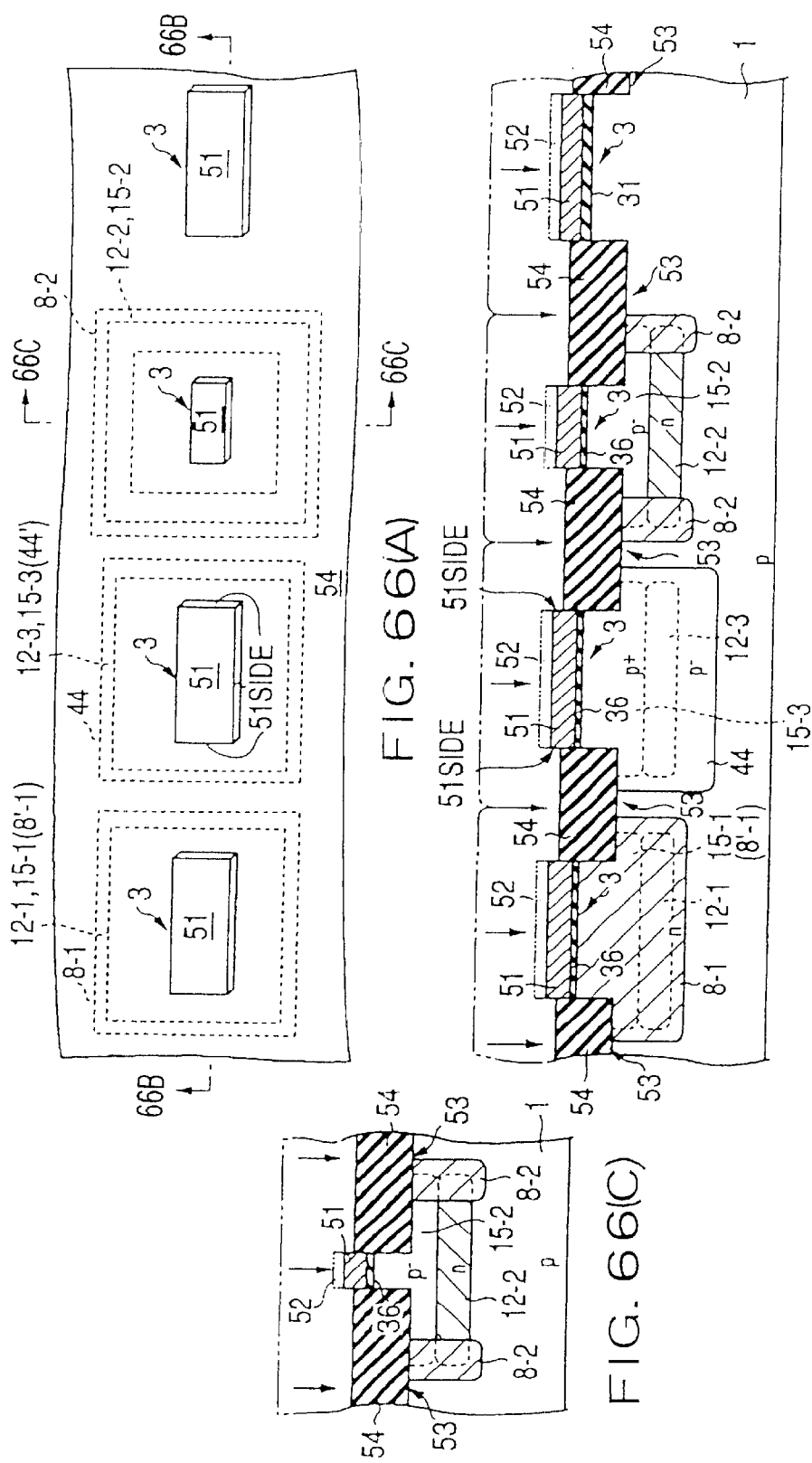

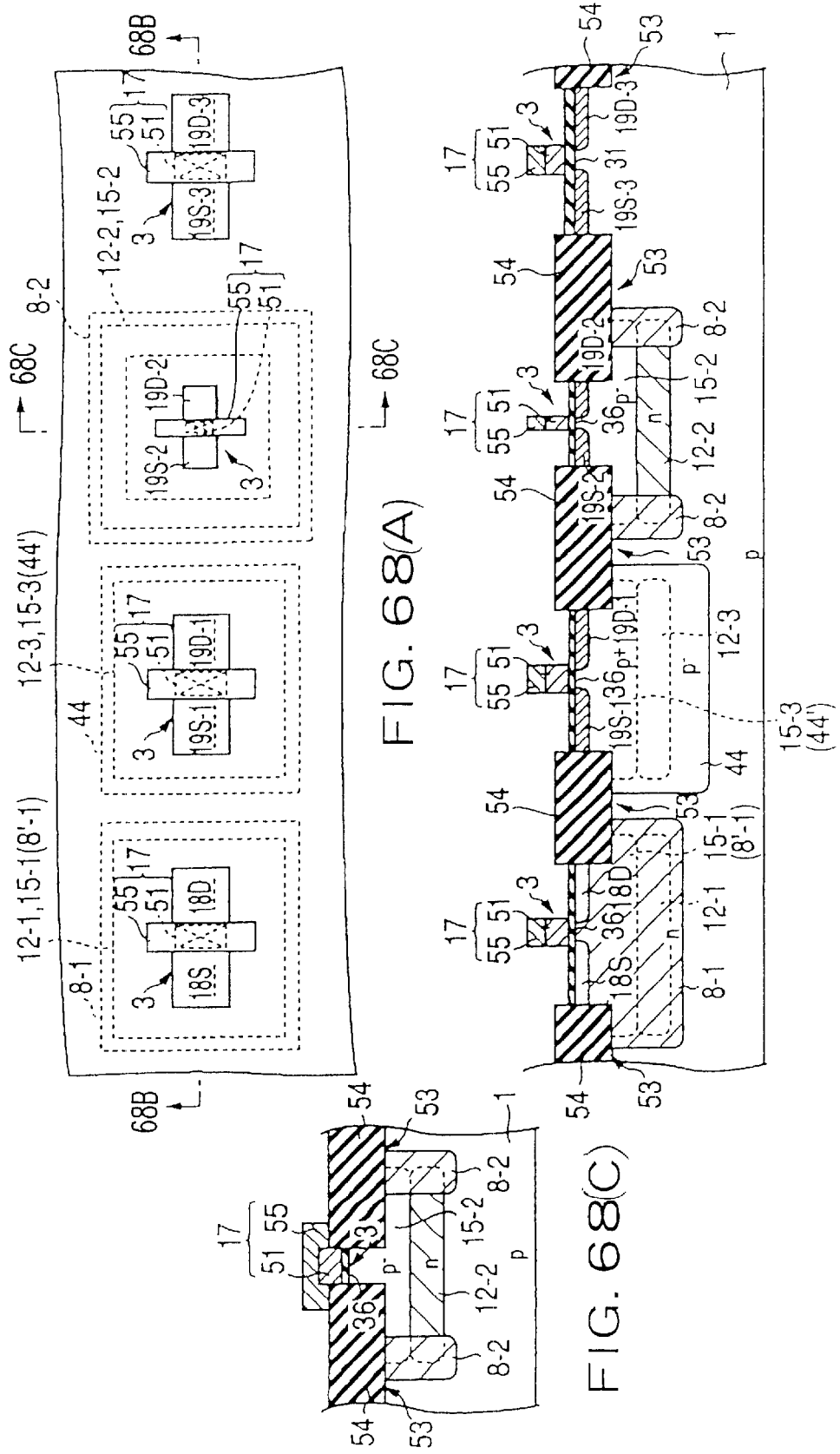

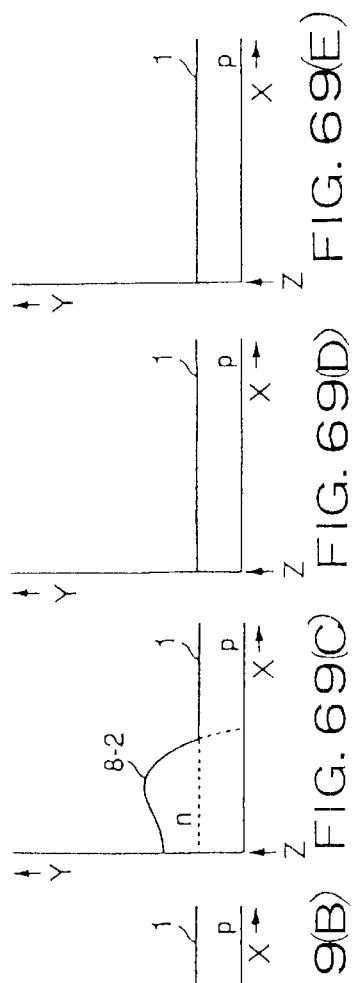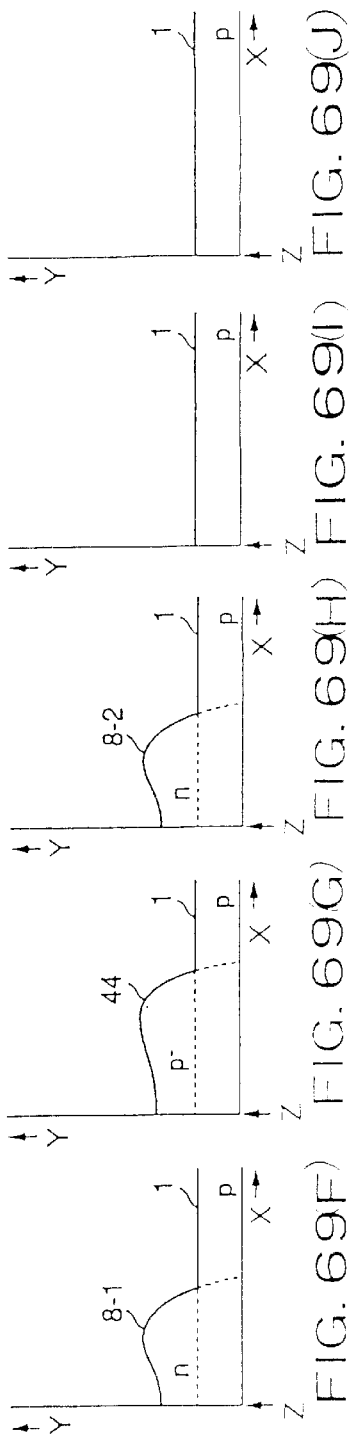

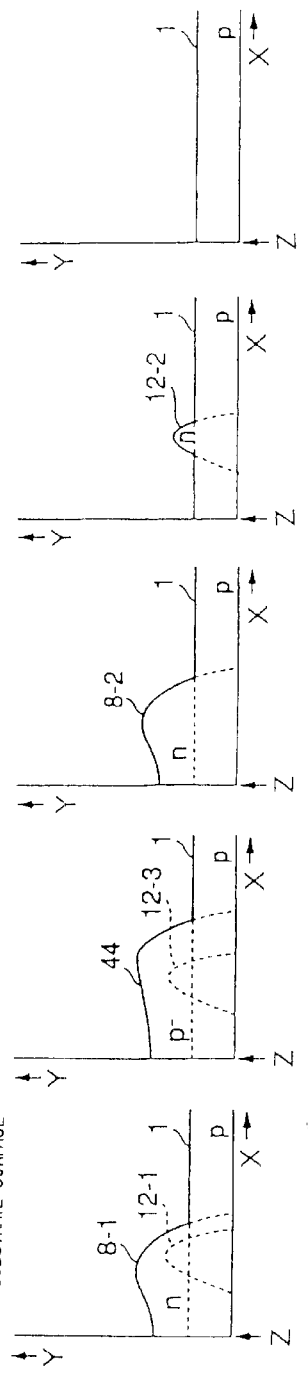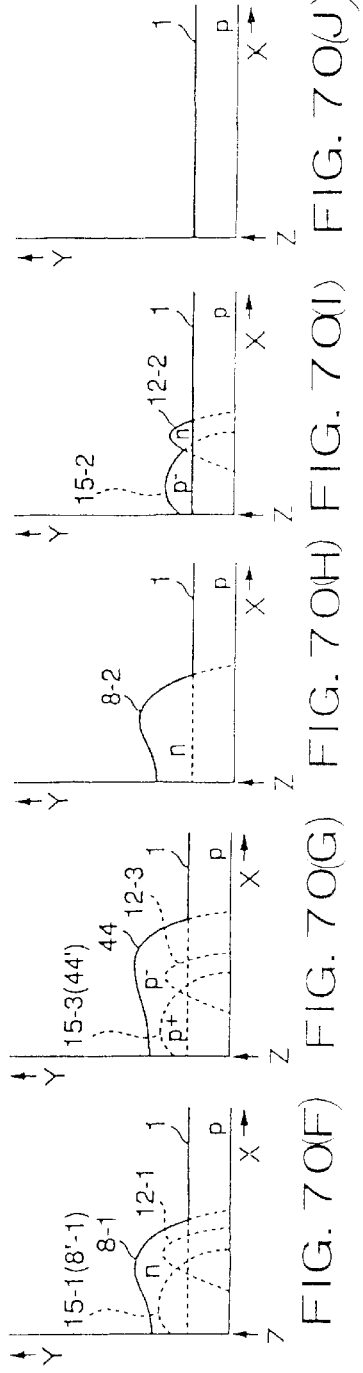

X — DEPTH
Y — IMPURITY PROFILES
Z — SUBSTRATE SURFACE
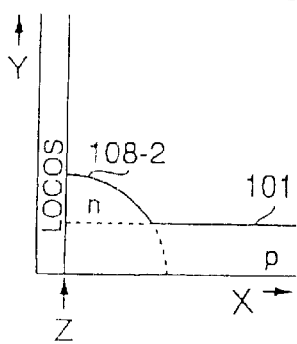 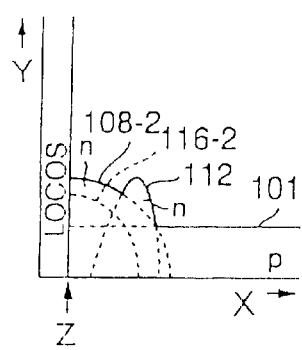 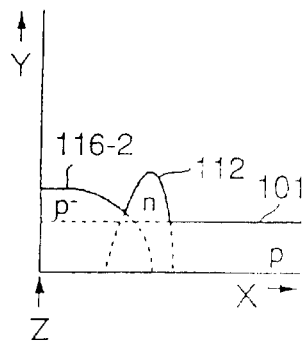
FIG. 73(A)   FIG. 73(B)   FIG. 73(C)
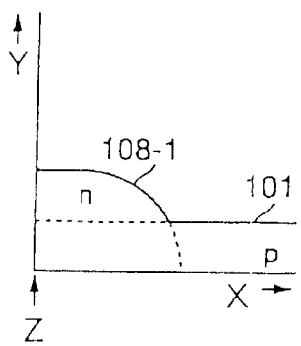 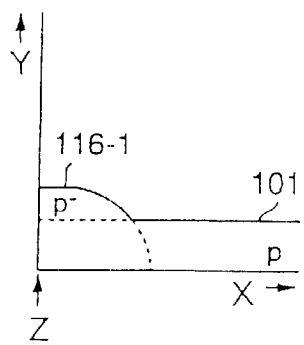
FIG. 73(D)   FIG. 73(E)

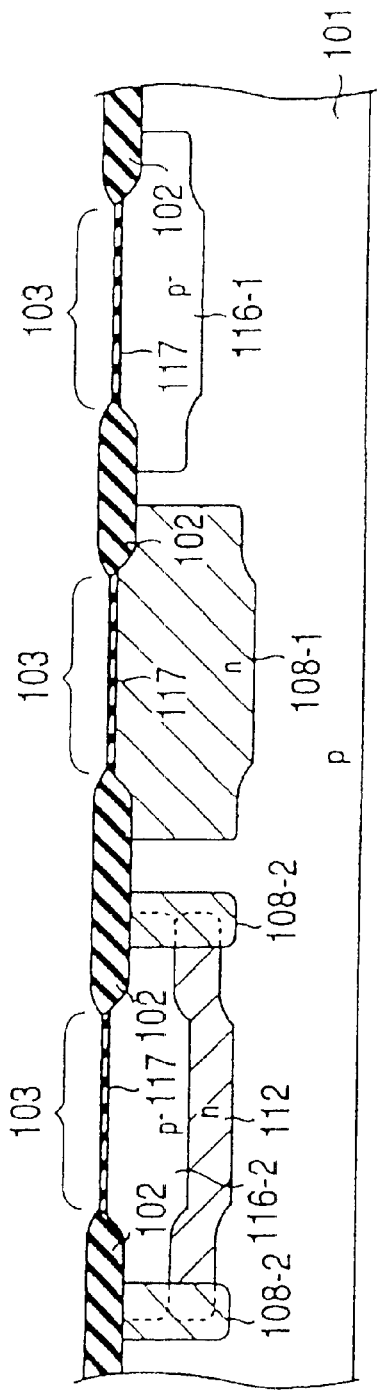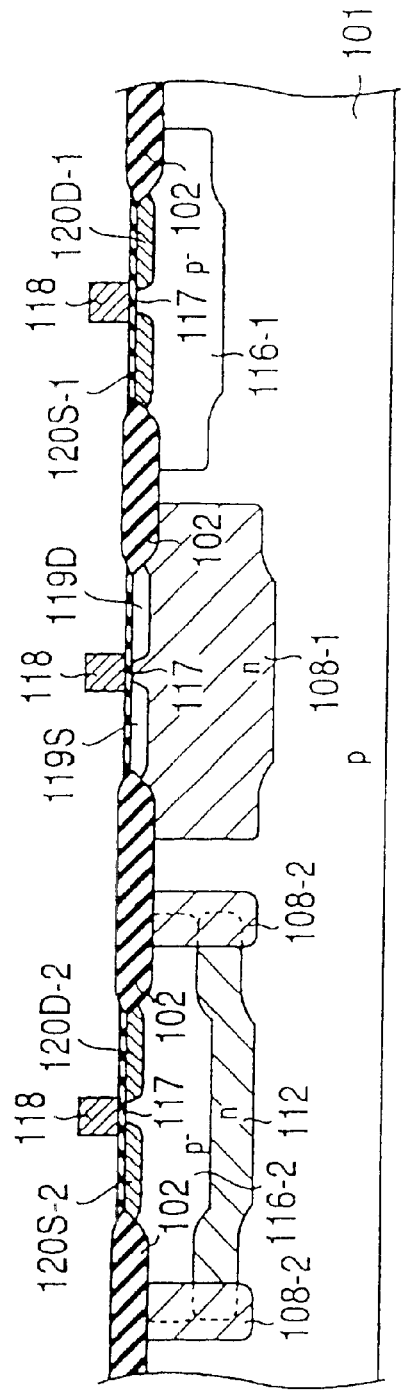
FIG. 76(A)
FIG. 76(B)

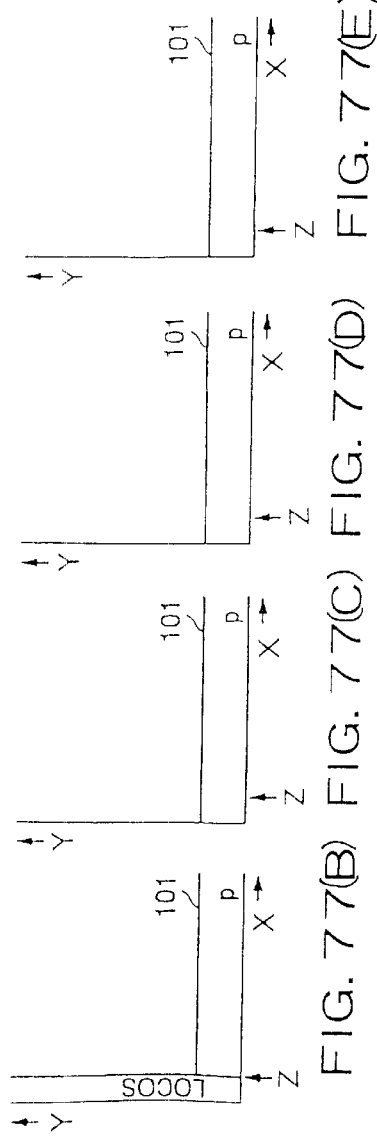
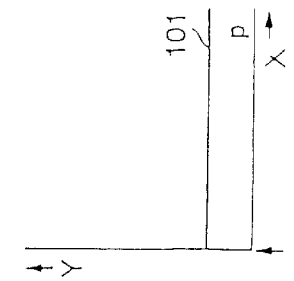
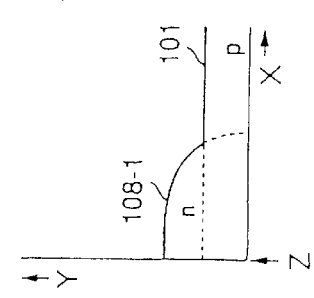
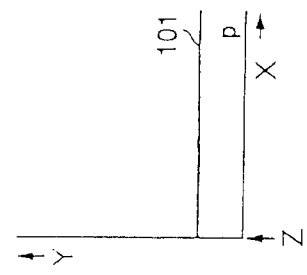
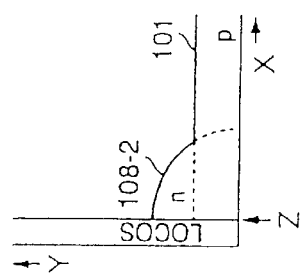
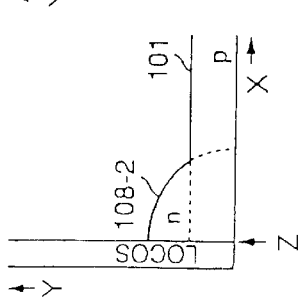

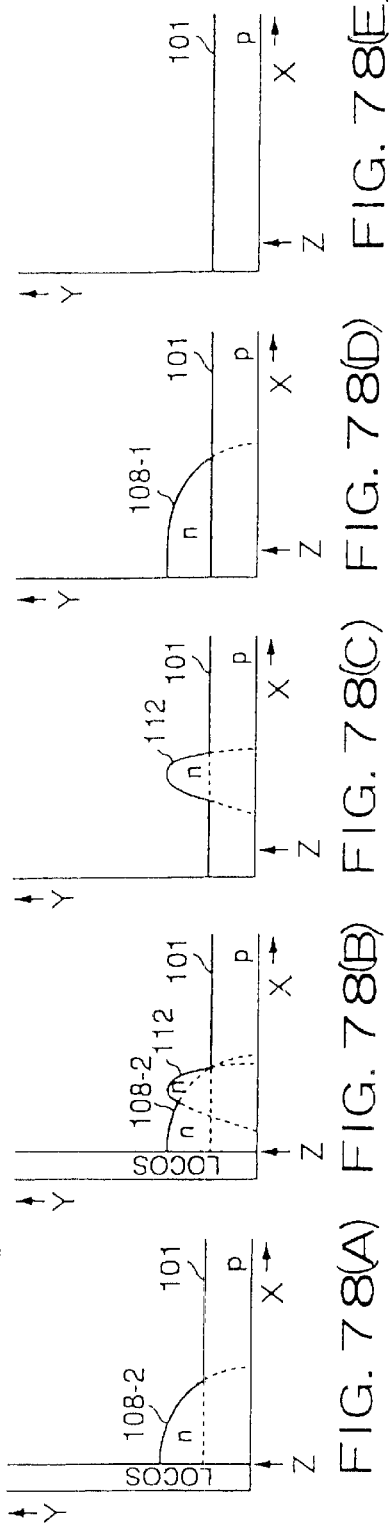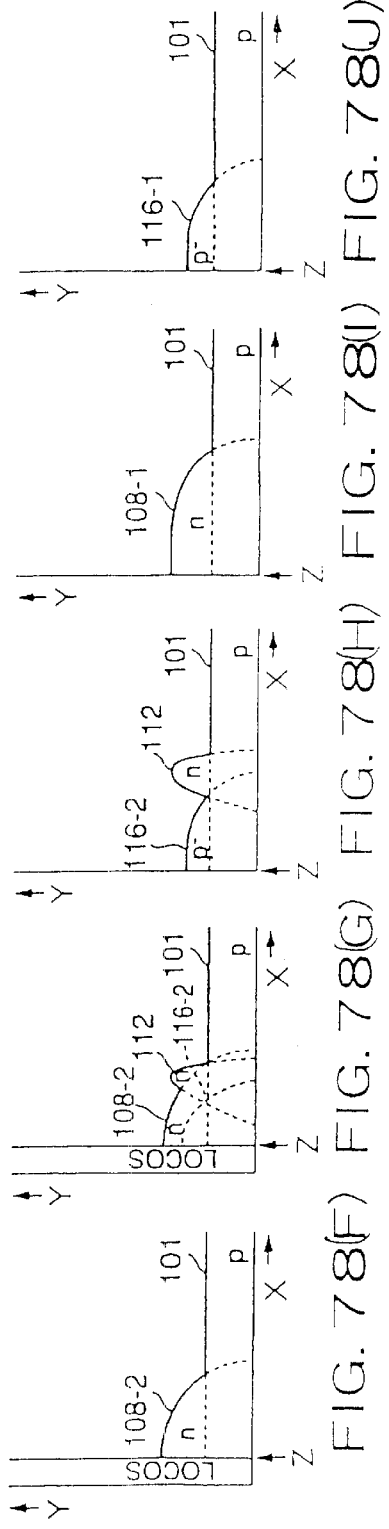

X - DEPTH
Y - IMPURITY PROFILES
Z - SUBSTRATE SURFACE

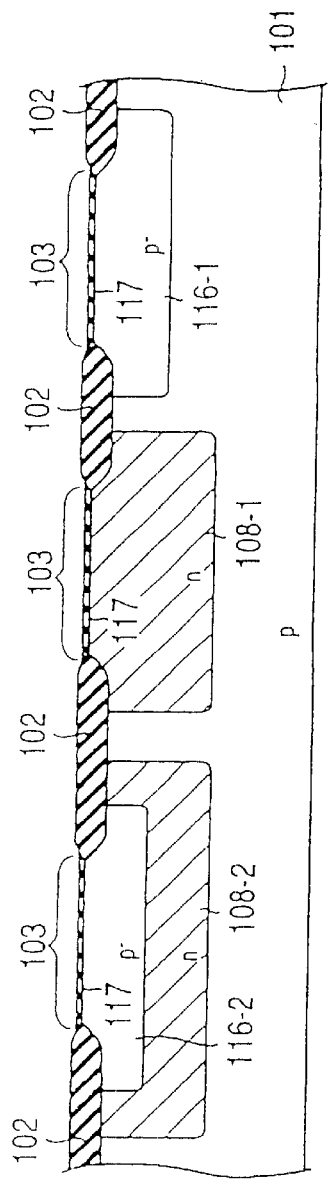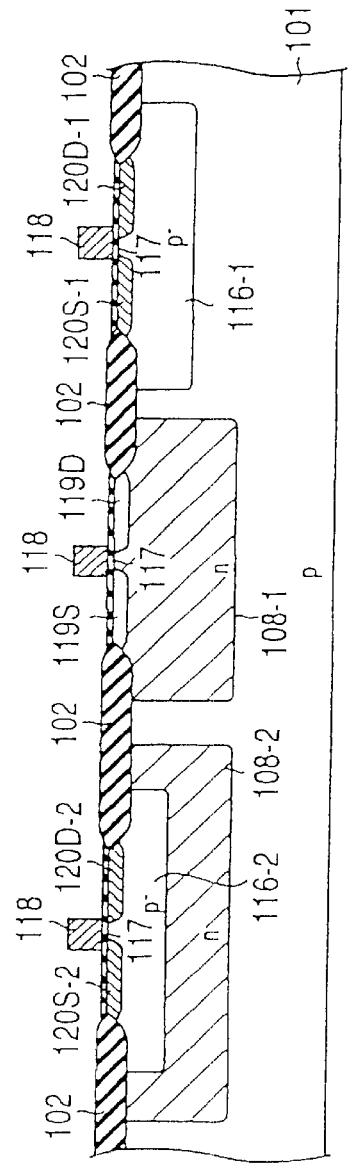
FIG. 83(A)
FIG. 83(B)

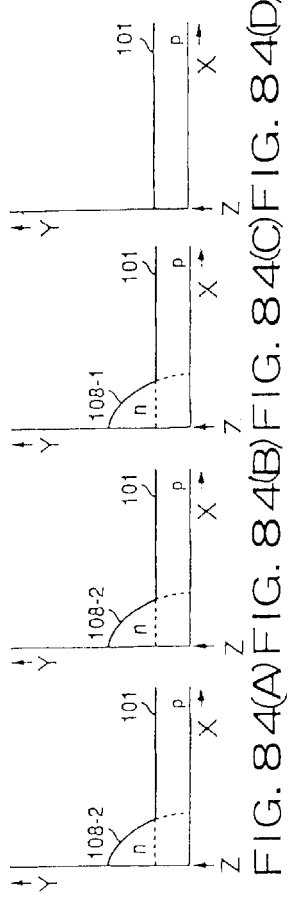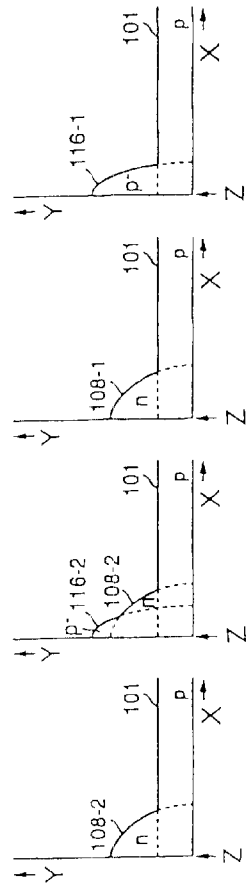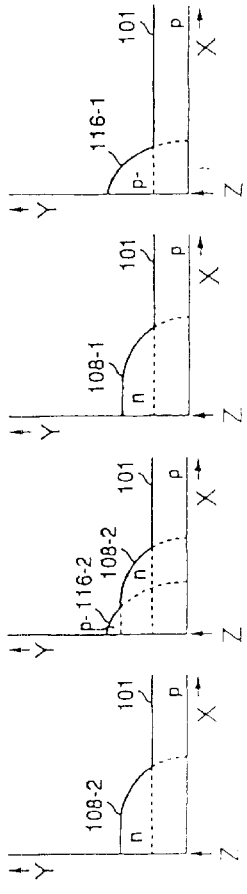

SEMICONDUCTOR INTEGRATED CIRCUIT DEVICE WITH HIGH AND LOW VOLTAGE WELLS

BACKGROUND OF THE INVENTION

1. Field of The Invention

The present invention relates generally to a semiconductor integrated circuit device which has a well having the same conductive type as that of a substrate and being pn-separated from the substrate and which has various gate insulator films having different thickness, and a method for producing the same. More specifically, the invention relates to a technique for reducing the number of masks for use in the production of the semiconductor integrated circuit device.

The present invention also relates generally to a semiconductor integrated circuit device including two kinds of transistors having the same conductive channel. More specifically, the invention relates to a method for producing a semiconductor integrated circuit device, which forms wells for element regions by ion implantation before forming an element isolating insulator film.

2. Related Background Art

A typical CMOS semiconductor integrated circuit device has an n-type well for forming a p-channel MOSFET (which will be hereinafter referred to as a "PMOS"), and a p-type well for forming an n-channel MOSFET (which will be hereinafter referred to as an "NMOS").

Some of such typical CMOS semiconductor integrated circuit devices have a well which is pn-separated from a substrate and which has the same conductive type as that of the substrate. For example, there is a semiconductor integrated circuit device wherein an NMOS, in which a back gate potential is the same as the potential of a p-type substrate, and an NMOS, in which a back gate potential is different from the potential of the p-type substrate, are integrated on the single p-type substrate. In the case of such a semiconductor integrated circuit device, a p-type well pn-separated from the p-type substrate is formed, and an NMOS, in which the back gate potential is different from the p-type substrate, is formed in the p-type well.

FIG. 72 is a sectional view of a semiconductor integrated circuit device having a p-type well which is pn-separated from a p-type substrate. FIGS. 73(A) through 73(E) are profile diagrams showing the distribution of an impurity in a substrate, wherein FIG. 73(A) shows a profile along line 73A—73A in FIG. 72, FIG. 73(B) showing a profile along line 73B—73B in FIG. 72, FIG. 73(C) showing a profile along line 73C—73C in FIG. 72, FIG. 73(D) showing a profile along line 73D—73D in FIG. 72, and FIG. 73(E) showing a profile along line 73E—73E in FIG. 72.

However, in a process for producing a semiconductor integrated circuit device having a p-type well pn-separated from a p-type substrate, it is required to add a photolithography step of forming the p-type well pn-separated from the p-type substrate, to a typical process for producing a semiconductor integrated circuit device. Therefore, the number of masks for use in the photolithography step increases, so that the manufacturing costs increase.

As the prior art of the present invention, a method for producing the semiconductor integrated circuit device shown in FIG. 72 will be described below.

FIGS. 74(A) through 74(C), 75(A) through 75(C) and 76(A) and 76(B) are sectional views showing principal steps of producing the semiconductor integrated circuit device shown in FIG. 72.

First, as shown in FIG. 74(A), an element isolating region 102 is formed on the surface of a p-type silicon substrate 101 by the LOCOS method to define divided element regions 103 on the surface of the substrate 101. Then, the surface of the (silicon) substrate 101 exposed to the element regions 103 is, e.g., thermally oxidized, to form buffer oxide films 104 on the surfaces of the element regions 103. FIGS. 77(A) through 77(E) show impurity profiles in the substrate 101 after the buffer oxide films 4 are formed. FIG. 77(A) shows a profile along line 77A—77A in FIG. 74(A), FIG. 77(B) showing a profile along line 77B—77B in FIG. 74(A), FIG. 77(C) showing a profile along line 77C—77C in FIG. 74(A), FIG. 77(D) showing a profile along line 77D—77D in FIG. 74(A), and FIG. 77(E) showing a profile along line 77E—77E in FIG. 74(A). As shown in FIGS. 77(A) through 77(E), after the buffer oxide films 4 are formed, the conductive impurities in the substrate 101 are only p-type impurities originally contained in the substrate 101.

Then, as shown in FIG. 74(B), a photoresist is applied on the substrate 101 to form a photoresist film 105. Then, holes 106a, 106b are formed in the photoresist film 105 by the photolithography method. The hole 106a is formed so as to correspond to a region wherein an n-type well is formed, and the hole 106b is annularly formed so as to surround a region wherein a p⁻-type well separated from the substrate 101 is formed. Then, using the photoresist film 105 as a mask, an n-type impurity 107 is ion-implanted into the substrate 101. Thus, an n-type well 108-1, and an n-type well 108-2 surrounding a region, in which the p⁻-type well separated from the substrate 101 is formed, are simultaneously formed. FIGS. 77(F) through 77(J) show impurity profiles in the substrate 1 after the n-type wells 108-1 and 108-2 are formed. FIG. 77(F) shows a profile along line 77F—77F in FIG. 74(B), FIG. 77(G) showing a profile along line 77G—77G in FIG. 74(B), FIG. 77(H) showing a profile along line 77H—77H in FIG. 74(B), FIG. 77(I) showing a profile along line 77I—77I in FIG. 74(B), and FIG. 77(J) showing a profile along line 77J—77J in FIG. 74(B). As shown in FIGS. 77(F) through 77(J), the n-type impurity 107 is introduced so that the density thereof is higher than that of the p-type impurity originally contained in the substrate 101, to form the n-type wells 108-1 and 108-2 in the substrate 101.

Then, as shown in FIG. 74(C), after the photoresist film 105 is removed from the substrate 101, a photoresist is applied again to form a photoresist film 109. Then, a hole 110 is formed in the photoresist film 109 by the photolithography method. The hole 110 is formed so as to correspond to a region wherein a p⁻-type well connected to the substrate 101 is formed. Then, using the photoresist film 109 as a mask, an n-type impurity 111 is ion-implanted into the substrate 101. Thus, an embedded n-type well 112 apart from the surface of the substrate 101 is formed in a region surrounded by the n-type well 108-2 of the substrate 1. FIGS. 78(A) through 78(E) show impurity profiles in the substrate 101 after the n-type well 112 is formed. FIG. 78(A) shows a profile along line 78A—78A in FIG. 74(C), FIG. 78(B) showing a profile along line 78B—78B in FIG. 74(C), FIG. 78(C) showing a profile along line 78C—78C in FIG. 74(C), FIG. 78(D) showing a profile along line 78D—78D in FIG. 74(C), and FIG. 78(E) showing a profile along line 78E—78E in FIG. 74(C). As shown in FIGS. 78(A) through 78(E), the n-type impurity 111 is introduced so that the density thereof is higher than that of the p-type impurity originally contained in the substrate 1, to form the embedded n-type well 112 in the substrate 101.

Then, as shown in FIG. 75(A), after the photoresist film 109 is removed from the substrate 101, a photoresist is applied again to form a photoresist film 113 thereon. Then, holes 114-1 and 114-2 are formed in the photoresist film 113 by the photolithography method. The hole 114-1 is formed so as to correspond to a region wherein a p⁻-type well connected to the substrate 101 is formed, and the hole 114-2 is formed so as to correspond to a region wherein p⁻-type well pn-separated from the substrate 101 is formed. Then, using the photoresist film 113 as a mask, a p-type impurity 115 is ion-implanted into the substrate 101. Thus, a p⁻-type well 116-1 is formed in the substrate 101, and a p⁻-type well 116-2 is formed in a region surrounded by the n-type well 108-2 of the substrate 101. The p⁻-type well 116-1 is connected to the substrate 101, and the p⁻-type well 116-2 is pn-separated from the substrate 101. FIGS. 78(F) through 78(J) show impurity profiles in the substrate 1 after the p⁻-type wells 116-1 and 116-2 are formed. FIG. 78(F) shows a profile along line 78F—78F in FIG. 75(A), FIG. 78(G) showing a profile along line 78G—78G in FIG. 75(A), FIG. 78(H) showing a profile along line 78H—78H in FIG. 75(A), FIG. 78(I) showing a profile along line 78I—78I in FIG. 75(A), and FIG. 78(J) showing a profile along line 78J—78J in FIG. 75(A). As shown in FIGS. 78(F) through 78(J), the p-type wells 116-1 and 116-2 are formed by adding the p-type impurity to the originally p-type substrate 101, so that the p-type wells 116-1 and 116-2 have a higher density of p-type impurity than that of the substrate 101.

Then, as shown in FIG. 75(B), the photoresist film 113 is removed from the substrate 101.

Then, as shown in FIG. 75(C), the buffer oxide films 4 are removed. Thus, the surface of the substrate 101 (the surface of each of the n-type well 108-1 and the p⁻-type wells 116-1, 116-2 in this embodiment) is exposed to the element regions 103.

Then, as shown in FIG. 76(A), the surface of the substrate 101 exposed to the element regions 3 is thermally oxidized to form a gate oxide film 117.

Then, as shown in FIG. 76(B), a conductive film serving as a gate electrode of a transistor, e.g., a laminated film of a polycrystalline silicon and tungsten silicide film, is formed on the structure shown in FIG. 76(A). Then, the laminated film is patterned to form a gate electrode 118. Then, in accordance with a well-known method, a p-type impurity for forming a p-type source/drain is ion-implanted into the n-type well 108-1 to form a p-type source region 119S and a p-type drain region 119D. Then, in accordance with a well-known method, an n-type impurity for forming an n-type source/drain is ion-implanted into the p⁻-type wells 116-1 and 116-2 to form n-type source regions 120S-1, 120S-2 and n-type drain regions 120D-1, 120D-2.

Then, as shown in FIG. 72, an interlayer insulator film 121 of, e.g., a CVD oxide film, is formed on the structure shown in FIG. 76(B). Then, contact holes 122, which are communicated with the p-type source/drain regions 119S, 119D and the n-type source/drain regions 120S-1, 120D-1, 120S-2, 120D-2, respectively, are formed in the interlayer insulator film 121. Then, a conductive film serving as a wiring, e.g., an aluminum film, is formed. The aluminum film thus formed is patterned to form a wiring 123.

In such a producing method, it is required to carry out a photolithography step when the n-type wells 108-1 and 108-2 are formed (FIG. 74(B)), when the n-type well 112 is formed (FIG. 74(C)), and when p⁻-type wells 116-1 and 116-2 are formed (FIG. 75(A)). In particular, the step of forming the n-type well 112 shown in FIG. 74(C) is peculiar to the semiconductor integrated circuit device shown in FIG. 72. For that reason, when the semiconductor integrated circuit device shown in FIG. 72 is produced, the number of photolithography steps increases, and the number of masks for use in the photolithography steps increases. Therefore, the manufacturing costs increase in comparison with usual semiconductor integrated circuit devices.

In order to reduce the cost of producing the semiconductor integrated circuit device shown in FIG. 72, there is another producing method as follows.

FIG. 79 is a sectional view of a semiconductor integrated circuit device produced by another producing method. FIGS. 80(A) through 80(D) are profile diagrams showing the distribution of an impurity in a substrate. FIGS. 80(A) through 80(D) are profile diagrams showing the distribution of an impurity in a substrate, wherein FIG. 80(A) shows a profile along line 80A—80A in FIG. 79, FIG. 80(B) showing a profile along line 80B—80B in FIG. 79, FIG. 80(C) showing a profile along line 80C—80C in FIG. 79, and FIG. 80(D) showing a profile along line 80D—80D in FIG. 79.

This producing method will be described below.

FIGS. 81(A) through 81(C), 82(A) and 82(B), and 83(A) and 83(B) are sectional views showing principal steps of producing the semiconductor integrated circuit device shown in FIG. 79.

First, as shown in FIG. 81(A), the surface of a p-type silicon substrate 101 is, e.g., thermally oxidized, to form a buffer oxide film 104 on the surface of the substrate 101. Then, a photoresist is applied on the buffer oxide film 104 to form a photoresist film 105. Then, holes 106a, 106b are formed in the photoresist film 105 by the photolithography method. The hole 106a is arranged so as to correspond to a region wherein an n-type well is formed, and the hole 106b is arranged so as to correspond to a region wherein a p⁻-type well separated from the substrate 101 is formed. Then, using the photoresist film 105 as a mask, an n-type impurity 107 is ion-implanted into the substrate 101. Thus, an n-type impurity injecting regions 108-1, and 108-2 are obtained. FIGS. 84(A) through 84(D) show impurity profiles in the substrate 101 after the n-type impurity 107 is ion-implanted. FIG. 84(A) shows a profile along line 84A—84A in FIG. 81(A), FIG. 84(B) showing a profile along line 84B—84B in FIG. 81(A), FIG. 84(C) showing a profile along line 84C—84C in FIG. 81(A), and FIG. 84(D) showing a profile along line 84D—84D in FIG. 81(A). As shown in FIGS. 84(A) through 84(D), the n-type impurity 107 is injected so that the density thereof is higher than the density of the p-type impurity originally contained in the substrate 101.

Then, as shown in FIG. 81(B), after the photoresist film 105 is removed, a photoresist is applied again to form a photoresist film 113. Then, holes 114-1, 114-2 are formed in the photoresist film 113 by the photolithography method. The hole 114-1 is arranged so as to correspond to a region wherein a p⁻-type well connected to the substrate 101 is formed, and the hole 114-2 is arranged so as to correspond to a region wherein a p⁻-type well pn-separated from the substrate 101 is formed. Then, using the photoresist film 113 as a mask, a p-type impurity 115 is ion-implanted into the substrate 101 and the injecting region 108-2. Thus, p-type impurity injecting regions 116-1, 116-2 are obtained. FIGS. 84(E) through 84(H) show impurity profiles in the substrate 101 after the p-type impurity 115 is ion-implanted. FIG. 84(E) shows a profile along line 84E—84E in FIG. 81(B), FIG. 84(F) showing a profile along line 84F—84F in FIG. 81(B), FIG. 84(G) showing a profile along line 84G—84G in FIG. 81(B), and FIG. 84(H) showing a profile along line 84H—84H in FIG. 81(B). As shown in FIGS. 84(E) through 84(H), the p-type impurity 115 is injected so as to have a higher density and shallower than the n-type impurity 107 contained in the injecting region 108-2.

Then, as shown in FIG. 81(C), the photoresist film 113 is removed. Then, heat treatment is carried out to diffuse/activate the n-type impurity of the injecting regions 108-1, 108-2 and the p-type impurity of the injecting regions 116-1, 116-2. Thus, the injecting regions 108-1, 108-2 become n-type wells 108-1, 108-2, respectively, and the injecting regions 116-1, 116-2 become p⁻-type wells 116-1, 116-2, respectively. FIGS. 84(I) through 84(L) show impurity profiles in the substrate 101 after the heat treatment is carried out. FIG. 84(I) shows a profile along line 84I—84I in FIG. 81(C), FIG. 84(J) showing a profile along line 84J—84J in FIG. 81(C), FIG. 84(K) showing a profile along line 84K—84K in FIG. 81(C), and FIG. 84(L) showing a profile along line 84L—84L in FIG. 81(C). As shown in FIG. 84(I) through 84(L), the p-type well 116-2 is particularly formed only in the n-type well 108-2 and pn-separated from the substrate 101.

Then, as shown in FIG. 82(A), an element isolating region 102 is formed on the surface of the substrate 101 to define divided element regions 103.

Then, as shown in FIG. 82(B), the buffer oxide film 4 is removed. Thus, the surface of the substrate 101 (the surface of each of the n-type well 108-1 and the p⁻-type wells 116-1, 116-2 in this embodiment) is exposed to the element regions 103.

Then, as shown in FIG. 83(A), the surface of the substrate 101 exposed to the element regions 3 is thermally oxidized to form a gate oxide film 117.

Then, as shown in FIG. 83(B), a conductive film serving as a gate electrode of a transistor, e.g., a laminated film of a polycrystalline silicon and tungsten silicide film, is formed on the structure shown in FIG. 83(A). Then, the laminated film is patterned to form a gate electrode 118. Then, in accordance with a well-known method, a p-type impurity for forming a p-type source/drain is ion-implanted into the n-type well 108-1 to form a p-type source region 119S and a p-type drain region 119D. Then, in accordance with a well-known method, an n-type impurity for forming an n-type source/drain is ion-implanted into the p⁻-type wells 116-1 and 116-2 to form n-type source regions 120S-1, 120S-2, 120D-1, 120D-2.

Then, as shown in FIG. 79, an interlayer insulator film 121 of, e.g., a CVD oxide film, is formed on the structure shown in FIG. 83(B). Then, contact holes 122, which are communicated with the p-type source/drain regions 119S, 119D and the n-type source/drain regions 120S-1, 120D-1, 120S-2, 120D-2, respectively, are formed in the interlayer insulator film 121. Then, a conductive film serving as a wiring, e.g., an aluminum film, is formed. The aluminum film thus formed is patterned to form a wiring 123.

According to such another producing method, the n-type well 108-1, the p⁻-type well 116-1 connected to the substrate 101, and the p⁻-type well 116-2 pn-separated from the substrate 102 can be formed by two photolithography steps shown in FIGS. 81(A) and 81(B). Therefore, it is possible to reduce the number of photolithography steps and the number of masks for use in photolithography steps.

However, in order to form the p⁻-type well 116-2 in the n-type well 108-2, the dose of the p-type impurity 115 injected in the step shown in FIG. 81(B) must be set to be higher than the impurity density of the n-type well 108-2. That is, the amount of the p-type impurity 115 for forming the p⁻-type wells 116-1, 116-2 is rate-controlled by the impurity density of the n-type well 108-2. Therefore, there is no degree of freedom in the setting of the impurity density of the p⁻-type wells 116-1 and 116-2.

In addition, although the gate insulator film of a typical semiconductor integrated circuit device usually has one thickness, some of semiconductor integrated circuit devices have various gate insulator films having different thickness. A device of this type is used as, e.g., a semiconductor integrated circuit device wherein a plurality of potentials are applied to a gate of a MOSFET, or the like.

In such a semiconductor integrated circuit device, it is required to carry out a photolithography step in order to obtain various gate insulator films having different thickness. Therefore, the number of masks for use in the photolithography step increases, and the manufacturing costs increase as described above.

As described above, in a semiconductor integrated circuit device having an n-type well, a p-type well connected to a substrate, and a p-type pn-separated from the substrate, there is a problem in that the number of photolithography steps increases and the manufacturing costs increase.

In addition, although there is a method for producing a semiconductor integrated circuit device of this type without increasing the number of photolithography steps, there is a problem in that this method is difficult to freely set the impurity density of a p-type well.

Moreover, in a semiconductor integrated circuit device having various gate insulator films having different thickness, there is a problem in that the number of photolithography steps increases and the manufacturing costs increase.

By the way, most of semiconductor integrated circuits comprise different kinds of transistors. For example, a non-volatile semiconductor memory device, wherein a high voltage must be applied in the writing/erasing in a memory cell, uses a high-voltage transistor, to which a high voltage is applied, in addition to a low-voltage transistor for use in a logic circuit. The high-voltage transistor needs an element region having a lower impurity density than that of an element region for the low-voltage transistor, because of limitations of junction resistance and substrate bias characteristics.

Therefore, for example, when a p-type semiconductor substrate is used, a low-voltage n-channel MOS transistor and a low-voltage p-channel MOS transistor are formed in p-type and n-type wells formed by ion implantation, respectively, and a high-voltage n-channel MOS transistor is formed by using the p-type substrate, in which no well is formed, as an element region as it is.

When the p-type semiconductor substrate is used, the p-type and n-type wells are usually formed by ion implantation after forming an element isolating insulator film. In addition, the circuit region of the high-voltage transistor has a lower impurity density than that of the well region, so that it needs to have a p-type element isolating layer below the element isolating insulator film in order to insure element isolation. The applicant has proposed a technique for forming a p-type element isolating layer, which serves to isolate a high-voltage transistor, at the same time that the ion implantation step for forming the p-type well for a low-voltage transistor is carried out (Japanese Patent Application No. 9-44243).

FIG. 97 shows an example that low-voltage p-channel MOS transistors QP1, QP2, low-voltage n-channel MOS transistors QN1, QN2, and high-voltage n-channel MOS transistors QN3, QN4 are formed on a p⁻-type silicon substrate 1 by a conventional method. An element isolating insulator film 202 is formed by, e.g., the shallow trench isolation (STI) technique, before forming an n-type well 203 and a p-type well 204. That is, a groove is formed in the substrate 201, and the element isolating insulator film 202 is embedded in the groove by the CVD.

After forming the element isolating insulator film 202, ion implantation is carried out to sequentially form the n-type well and the p-type well 204. Directly below the element isolating film 202 adjacent to the high-voltage transistors QN3 and QN4, a p-type element isolating layer 205 is formed by ion implantation simultaneously with the ion implantation process for the p-type well 204.

FIG. 98 shows the ion implantation process for the p-type well 204 and the p-type element isolating layer 205 after forming the element isolating insulator film 202. As shown in the drawing, a resist mask 206 having openings 207a, 207b is patterned in a region wherein the p-type well 204 and the p-type element isolating layer 205 should be formed, by the lithography, and ion implantation is carried out. Since this ion implantation serves to form an impurity layer more deeply than the bottom of the element isolating insulator film 202, ion implantation at a high acceleration voltage is utilized.

As described above, in a conventional method for simultaneously forming a p-type well for a low-voltage transistor circuit and a p-type element isolating layer in a high-voltage transistor circuit region having a lower impurity density than that of the p-type well for the low-voltage transistor circuit after forming an element isolating insulator film, there is the following problem.

As shown in FIG. 98, the ion implantation for the p-type well 204 is carried out via the wide opening 207a including the element region for the n-channel MOS transistors QN1, QN2 and the element isolating region adjacent thereto, whereas the ion implantation for the p-type element isolating layer 205 in the element isolating region adjacent to the high-voltage n-channel MOS transistors QN3, QN4 is carried out via the narrow opening 207b. However, there is usually a step between the element isolating insulator film 202 and the substrate surface of the element region. Because the STI technique carries out the formation of a groove and the embedding of an element isolating insulator film while an element region is covered with a mask (not shown) of a silicon nitride film or the like, and then, removes the mask from the element region. Since such a step exists, it is not easy to form the resist mask 206 having the fine opening 207b at the lithography step.

In addition, in the method for carrying out ion implantation after forming the element isolating insulator film 202, the thickness of the resist must be great in order to obtain a sufficient mask effect for ion implantation since a high acceleration voltage is used. Thus, it is difficult to form the fine opening using the lithography. For these reasons, it is difficult to provide excellent element isolation characteristics in a low impurity density region when the element is scaled down.

Moreover, in the conventional method for forming the well after forming the element isolating insulator film 202, the depths of the element region and element isolating region in the p-type well 204 and n-type well 203 are different from each other as shown in FIGS. 97 and 98. This difference in depth corresponds to the height of the element isolating insulator film 202 projecting from the substrate surface of the element region. Therefore, the lateral resistance of the well increases by the substantial decrease of the thickness of the well in the element isolating region. Consequently, it is difficult to provide a constant potential in the whole well.

SUMMARY OF THE INVENTION

It is therefore an object of the present invention to eliminate the aforementioned problems and to provide a semiconductor integrated circuit device, which has a well having a conductive type different from that of a substrate, a well having the same conductive type as that of the substrate and being connected to the substrate, and a well having the same conductive type as that of the substrate and being pn-separated from the substrate and which can inhibit the increase of the number of photolithography steps and reduce the manufacturing costs while maintaining the advantage of capable of freely setting the impurity density of wells having the same conductive type as that of the substrate, and a method for producing the same.

It is another object of the present invention to provide a semiconductor integrated circuit device which has various gate insulator films having different thickness and which can suppress the increase of the number of photolithography steps and reduce the manufacturing costs, and a method for producing the same.

It is a further object of the present invention to provide a semiconductor integrated circuit device, which has a well having a conductive type different from that of a substrate, a well having the same conductive type as that of the substrate and being connected to the substrate, a well having the same conductive type as that of the substrate and being pn-separated from the substrate, and various gate insulator films having different thickness and which can inhibit the increase of the number of photolithography steps and reduce the manufacturing costs while maintaining the advantage of capable of freely setting the impurity density of wells having the same conductive type as that of the substrate, and a method for producing the same.

It is a still further object of the present invention to provide a semiconductor integrated circuit device having good element isolating characteristics, and a method for producing the same.

In order to accomplish the aforementioned and other objects, according to one aspect of the present invention, a semiconductor integrated circuit device comprises: a semiconductor substrate of a first conductive type; a first semiconductor region which is formed on the semiconductor substrate and which includes an impurity of a second conductive type; a second annular semiconductor region which is formed on the semiconductor substrate and which includes an impurity of the second conductive type; a third embedded semiconductor region which is formed in a region surrounded by the second annular semiconductor region and which includes an impurity of the second conductive type; a fourth embedded semiconductor region which is formed on the semiconductor substrate and which includes an impurity of the second conductive type; a fifth semiconductor region which is formed above the third embedded semiconductor region and which includes an impurity of the first conductive type; a sixth semiconductor region which is formed above the fourth embedded semiconductor region and which includes an impurity of the first conductive type; and a transistor formed in the first, fifth and sixth semiconductor regions.

In the semiconductor integrated circuit device with the above described construction, the fourth embedded semiconductor region including the impurity of the second conductive type is arranged below the sixth preferred embodiment including the impurity of the first conductive type. Consequently, the mask used for introducing the impurity of the first conductive type for forming the fifth and sixth semiconductor regions can be in common with the mask used for introducing the impurity of the second conductive type for forming the third and fourth embedded semiconductor regions. Therefore, in the semiconductor integrated circuit device having the well (the first semiconductor region) having different conductive type from that of the substrate, the well (the sixth semiconductor region) which has the same conductive type as that of the substrate and which is connected to the substrate, the well (the fifth semiconductor region) which has the same conductive type as that of the substrate and which is pn-separated from the substrate, it is possible to suppress the increase the number of photolithography steps.

In addition, the fifth semiconductor region of the first conductive type is formed above the third semiconductor region of the second conductive type so as to correspond to the region surrounded by the second annular semiconductor region of the second conductive type. Consequently, the impurity density can be freely set without being under the influence of the semiconductor region of the second conductive type. Therefore, it is possible to maintain the advantage in that the impurity density of the well (the fifth and sixth semiconductor regions) of the same conductive type as that of the substrate can be freely set.

According to another aspect of the present invention, there is provided a method for producing a semiconductor integrated circuit device, the method comprising the steps of: preparing a semiconductor substrate of a first conductive type; introducing an impurity of a second conductive type, which serves to form a first semiconductor region of the second conductive type and a second annular semiconductor region of the second conductive type, into the semiconductor substrate using a first mask; introducing an impurity of the second conductive type, which serves to form third and fourth embedded semiconductor regions of the second conductive type, into the semiconductor substrate and a region surrounded by the second annular semiconductor region using a second mask; introducing an impurity of the first conductive type, which serves to form fifth and sixth semiconductor regions of the first conductive type, into regions above the third and fourth semiconductor regions using the second mask; and forming a transistor in the first, fifth and sixth semiconductor regions.

According to another aspect of the present invention, there is provided a method for producing a semiconductor integrated circuit device, the method comprising the steps of: forming a first gate insulator film on a semiconductor substrate; introducing a first impurity, which serves to form a first semiconductor region, into the semiconductor substrate using a first mask; introducing a second impurity, which serves to form a second semiconductor region, into the semiconductor substrate using a second mask; removing the first gate insulator film using the second mask; forming a second gate insulator film in a portion, from which the first gate insulator film has been removed, and increasing the thickness of a portion of the first gate insulator film, in which the first gate insulator film has been left; and forming a transistor using the first gate insulator film, and a transistor using the second gate insulator film.

In the above described method for producing the semiconductor integrated circuit device, the same mask (the second mask) is used for introducing the second impurity for forming the second semiconductor region and for removing the first gate insulator film. Therefore, in the semiconductor integrated circuit device having various gate insulator films having different thickness, it is possible to suppress the increase of the number of photolithography steps.

According to another aspect of the present invention, there is provided a method for producing a semiconductor integrated circuit device, the method comprising the steps of: forming a first gate insulator film on a semiconductor substrate; introducing a first impurity, which serves to form a first semiconductor region, into the semiconductor substrate using a first mask; introducing a second impurity, which serves to form a second semiconductor region, into the semiconductor substrate and a region, into which the first impurity has been introduced, using a second mask; removing the first gate insulator film using the second mask; forming a second gate insulator film in a portion, from which the first gate insulator film has been removed, and increasing the thickness of a portion of the first gate insulator film, in which the first gate insulator film has been left; and forming a transistor using the first gate insulator film, and a transistor using the second gate insulator film.

According to another aspect of the present invention, there is provided a method for producing a semiconductor integrated circuit device, the method comprising the steps of: forming a first gate insulator film on a semiconductor substrate; introducing a first impurity, which serves to form a first semiconductor region, into the semiconductor substrate using a first mask; introducing a second impurity, which serves to form a second semiconductor region, into the semiconductor substrate using a second mask; introducing a third impurity, which serves to form a third semiconductor region, into the semiconductor substrate, a region, into which the first impurity has been introduced, and a region, into which the second impurity has been introduced, using a third mask; removing the first gate insulator film using the third mask; forming a second gate insulator film in a portion, from which the first gate insulator film has been removed, and increasing the thickness of a portion of the first gate insulator film, in which the first gate insulator film has been left; and forming a transistor using the first gate insulator film, and a transistor using the second gate insulator film.

According to another aspect of the present invention, there is provided a method for producing a semiconductor integrated circuit device, the method comprising the steps of: forming a first gate insulator film on a semiconductor substrate of a first conductive type; introducing a first impurity of a second conductive type, which serves to form a first semiconductor region of the second conductive type and a second annular semiconductor region of the second conductive type, into the semiconductor substrate using a first mask; introducing a second impurity of the second conductive type, which serves to form third, fourth and fifth embedded semiconductor regions of the second conductive type, into the semiconductor substrate, a region surrounded by the second annular semiconductor region, and a region, into which the first impurity has been introduced, using a second mask; introducing a third impurity of the first conductive type, which serves to form sixth, seventh and eighth semiconductor regions of the first conductive type, into regions above the third, fourth and fifth semiconductor regions, using the second mask; removing the first gate insulator film using the second mask; forming a second gate insulator film in a portion, from which the first gate insulator film has been removed, and increasing the thickness of a portion of the first gate insulator film, in which the first gate insulator film has been left; and forming a transistor using the first gate insulator film, and a transistor using the second gate insulator film.

According to another aspect of the present invention, a semiconductor integrated circuit device comprises; a first gate insulator film formed on a semiconductor substrate of a first conductive type; a first semiconductor region which is formed on the semiconductor substrate and which includes an impurity of a second conductive type; a second annular semiconductor region which is formed on the semiconductor substrate and which includes an impurity of the second conductive type; a third embedded semiconductor region which is formed on the semiconductor substrate and which includes an impurity of the second conductive type; a fourth embedded semiconductor region which is formed in a region surrounded by the second annular semiconductor region and which includes an impurity of the second conductive type; a fifth embedded semiconductor region which is formed in the first semiconductor region and which includes an impurity of the second conductive type; a sixth semiconductor region which is formed above the third semiconductor region and which includes an impurity of the first conductive type; a seventh semiconductor region which is formed above the fourth embedded semiconductor region and which includes an impurity of the first conductive type; an eighth semiconductor region which is formed above the fifth embedded semiconductor region and which includes an impurity of the first conductive type; a second gate insulator film which is thinner than the first gate insulator film formed in the sixth, seventh and eighth semiconductor regions; a transistor using the first gate insulator film; and a transistor using the second gate insulator film.

In the semiconductor integrated circuit device with the above described construction, the third, fourth and fifth embedded semiconductor regions of the second conductive type are arranged below the sixth, seventh and eighth semiconductor regions. In addition, the second gate insulator film, which is thinner than the first gate insulator film, is arranged in the sixth, seventh and eighth semiconductor regions. Consequently, the mask used for introducing the impurity of the first conductive type for forming the sixth, seventh and eighth semiconductor regions, the mask used for introducing the impurity of the second conductive type for forming the third, fourth and fifth embedded semiconductor regions, and the mask used for removing the first gate insulator film can be in common with each other. Therefore, in the semiconductor integrated circuit device having the well (the eighth semiconductor region) of different conductive type from that of the substrate, the well (the sixth semiconductor region) which has the same conductive type as that of the substrate and which is connected to the substrate, the well (the seventh semiconductor region) which has the same conductive type as that of the substrate and which is pn-separated from the substrate, and various gate insulator films having different thickness, it is possible to suppress the increase of the number of photolithography steps.

According to another aspect of the present invention, a semiconductor integrated circuit device comprises: a semiconductor substrate; a first element region of a first conductive type defined in the semiconductor substrate by an element isolating insulator film; a second element region of the first conductive type defined in the semiconductor substrate by the element isolating insulator film, the second element region having a lower impurity density than that of the first element region; first and second transistors of a second conductive channel formed in the first and second element regions, respectively; and an element isolating layer of the first conductive type formed below an element isolating insulator film adjacent to the second element region of the semiconductor substrate, the element isolating layer having an impurity density substantially equal to that of the first element region and a depth substantially equal to that of the first element region from the substrate surface of the first and second element regions.

In this semiconductor integrated circuit device, the semiconductor substrate may have the first conductive type, the first element region may be defined, by the element isolating insulator film, in a first conductive type well formed by ion implantation before forming the element isolating insulator film, and the element isolating layer may be formed at the same time that an ion implantation step of forming the first conductive type well is carried out.

In this semiconductor integrated circuit device, the element isolating insulator film may be embedded in a groove formed in the semiconductor substrate.

In this semiconductor integrated circuit device, a third element region of a second conductive type defined by the element isolating insulator film may be formed in the semiconductor substrate, and a transistor of a first conductive channel may be formed in the third element region.

According to a further aspect of the present invention, there is provided a method for producing a semiconductor integrated circuit device, the method comprising the steps of: forming an ion implantation mask having an opening in first, second and fourth predetermined regions of a semiconductor substrate, among the first predetermined region serving to form therein a first element region of a first conductive type, the second predetermined region serving to form therein an element isolating region adjacent to the first element region, a third predetermined region of the first conductive type serving to form therein a second element region having a lower impurity density than that of the first element region, and the fourth predetermined region serving to form therein an element isolating region adjacent to the second element region; ion-implanting an impurity into the semiconductor substrate via the opening of the ion implantation mask to simultaneously form a first conductive type well in the first element region and the element isolating region adjacent thereto, and an element isolating layer of the first conductive type in the element isolating region adjacent to the second element region; forming an element isolating insulator film in the element isolating region of the semiconductor substrate; and forming first and second transistors of a second conductive channel in the first and second element regions, respectively.

In this producing method, the semiconductor substrate may have the first conductive type, and the step of forming the first conductive type well and the element isolating layer may ion-implant an impurity of the first conductive type more deeply than a bottom of the element isolating insulator film formed thereafter.

According to a still further aspect of the present invention, there is provided a method for producing a semiconductor integrated circuit device, the method comprising: a step of forming a first ion implantation mask having an opening in first, second and fourth predetermined regions of a semiconductor substrate, among the first predetermined region serving to form therein a first element region of a first conductive type, the second predetermined region serving to form therein an element isolating region adjacent to the first element region, a third predetermined region of the first conductive type serving to form therein a second element region having a lower impurity density than that of the first element region, and the fourth predetermined region serving to form therein an element isolating region adjacent to the second element region; a first ion implantation step of ion-implanting an impurity into the semiconductor substrate via the opening of the first ion implantation mask to simultaneously form a first conductive type well in the first element region and the element isolating region adjacent thereto, and an element isolating layer of the first conductive type in the element isolating region adjacent to the second element region; a step of forming a second ion implantation mask having an opening in the third predetermined region of the semiconductor substrate; a second ion implantation step of ion-implanting a first conductive type impurity into the semiconductor substrate via the opening of the second ion implantation mask, at a lower dose than that of the impurity in the first ion implantation step, and more shallowly than the impurity in the first ion implantation step; a step of forming an element isolating insulator film in the element isolating region of the semiconductor substrate; and a step of forming first and second transistors of a second conductive channel in the first and second element regions, respectively.

In this producing method, the first ion implantation step may ion-implant the impurity of the first conductive type more deeply than a bottom of the element isolating insulator film formed thereafter, and the second ion implantation step is a channel ion implantation for controlling a threshold of the second transistor.

In this producing method, the step of forming the element isolating insulator film may have a step of forming a groove in the semiconductor substrate and a step of embedding an element isolating insulator film in the groove.

This producing method may further comprise the steps of: forming an ion implantation mask having an opening in a fifth predetermined region serving to form therein a third element region of a second conductive type and a sixth predetermined region serving to form therein an element isolating region adjacent to the third element region, before forming the element isolating insulator film; ion-implanting a second conductive type impurity into the semiconductor substrate via the opening of the ion implantation mask to form a second conductive type well in the third element region and the element isolating region adjacent thereto; and forming a transistor of a first conductive channel in the second conductive type well after forming the element isolating insulator film.

According to the present invention, the first and second transistors are formed in the first and second element regions which have the same first conductive type and different impurity density, respectively, whereas the element isolating layer of the first conductive type formed in the element isolating region adjacent to the second transistor formed in the second element region of the low impurity density has substantially the same impurity density as that of the first element region, in which the first transistor is formed, and has substantially the same depth from the substrate surface of the element region as that the first element region.

Specifically, this structure is obtained by forming the element isolating layer of the first conductive type in the element isolating region adjacent to the second element region at the same time that the ion implantation step of forming the well of the first conductive type in the region including the first element region is carried out, before forming the element isolating insulator film in the semiconductor substrate. Thus, the second transistor formed in the region of the low impurity density has excellent element isolation characteristics.

In addition, according to the present invention, since the ion implantation for the well of the first conductive type and the element isolating layer of the first conductive type is carried out before forming the element isolating insulator film, there is no step when the ion implantation mask is patterned by the resist. In addition, the thickness of the resist must not be so great unlike the ion implantation carried out after forming the element isolating insulator film. Therefore, it is possible to easily pattern the resist having the fine opening, and it is possible to surely form the element isolating layer in a narrow region via the obtained fine opening.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1(A) is a plan view of the first preferred embodiment of a semiconductor integrated circuit device according to the present invention, and FIGS. 1(B) through 1(D) are sectional views thereof;

FIGS. 2(A) through 2(E) are profile diagrams showing the distribution of an impurity;

FIG. 3(A) is a plan view showing a step of producing the first preferred embodiment of a semiconductor integrated circuit device according to the present invention, and FIGS. 3(B) through 3(D) are sectional views thereof;

FIG. 4(A) is a plan view showing a step of producing the first preferred embodiment of a semiconductor integrated circuit device according to the present invention, and FIGS. 4(B) through 4(D) are sectional views thereof;

FIG. 5(A) is a plan view showing a step of producing the first preferred embodiment of a semiconductor integrated circuit device according to the present invention, and FIGS. 5(B) through 5(D) are sectional views thereof;

FIG. 6(A) is a plan view showing a step of producing the first preferred embodiment of a semiconductor integrated circuit device according to the present invention, and FIGS. 6(B) through 6(D) are sectional views thereof;

FIG. 7(A) is a plan view showing a step of producing the first preferred embodiment of a semiconductor integrated circuit device according to the present invention, and FIGS. 7(B) through 7(D) are sectional views thereof;

FIG. 8(A) is a plan view showing a step of producing the first preferred embodiment of a semiconductor integrated circuit device according to the present invention, and FIGS. 8(B) through 8(D) are sectional views thereof;

FIG. 9(A) is a plan view showing a step of producing the first preferred embodiment of a semiconductor integrated circuit device according to the present invention, and FIGS. 9(B) through 9(D) are sectional views thereof;.

FIG. 10(A) is a plan view showing a step of producing the first preferred embodiment of a semiconductor integrated circuit device according to the present invention, and FIGS. 10(B) through 10(D) are sectional views thereof;

FIGS. 11(A) through 11(J) are profile diagrams showing the distribution of an impurity;

FIG. 13(A) is a plan view of the second preferred embodiment of a semiconductor integrated circuit device according to the present invention, and FIGS. 13(B) through 13(D) are sectional views thereof;

FIGS. 14(A) through 14(E) are profile diagrams showing the distribution of an impurity;

FIG. 15(A) is a plan view showing a step of producing the second preferred embodiment of a semiconductor integrated circuit device according to the present invention, and FIGS. 15(B) through 15(D) are sectional views thereof;

FIG. 17(A) is a plan view showing a step of producing the second preferred embodiment of a semiconductor integrated circuit device according to the present invention, and FIGS. 17(B) through 17(D) are sectional views thereof;

FIG. 18(A) is a plan view showing a step of producing the second preferred embodiment of a semiconductor integrated circuit device according to the present invention, and FIGS. 18(B) through 18(D) are sectional views thereof;

FIG. 19(A) is a plan view showing a step of producing the second preferred embodiment of a semiconductor integrated circuit device according to the present invention, and FIGS. 19(B) through 19(D) are sectional views thereof;

FIG. 21(A) is a plan view showing a step of producing the second preferred embodiment of a semiconductor integrated circuit device according to the present invention, and FIGS. 21(B) through 21(D) are sectional views thereof;

FIG. 22(A) is a plan view showing a step of producing the second preferred embodiment of a semiconductor integrated circuit device according to the present invention, and FIGS. 22(B) through 22(D) are sectional views thereof;

FIGS. 23(A) through 23(J) are profile diagrams showing the distribution of an impurity;

FIGS. 24(A) through 24(J) are profile diagrams showing the distribution of an impurity;

FIG. 28 is a sectional view of the fourth preferred embodiment of a semiconductor integrated circuit device according to the present invention;

FIGS. 29(A) through 29(C) are profile diagrams showing the distribution of an impurity;

FIGS. 34(A) through 34(D) are profile diagrams showing the distribution of an impurity;

FIGS. 36(A) and 36(B) are sectional views showing a step of producing the fifth preferred embodiment of a semiconductor integrated circuit device according to the present invention;

FIGS. 39(A) through 39(H) are profile diagrams showing the distribution of an impurity;

FIGS. 40(A) through 40(H) are profile diagrams showing the distribution of an impurity;

FIG. 41(A) is a plan view of the sixth preferred embodiment of a semiconductor integrated circuit device according to the present invention, and FIGS. 41(B) and 41(C) are sectional views thereof;

FIGS. 42(A) through 42(D) are profile diagrams showing the distribution of an impurity;

FIG. 43(A) is a plan view showing a step of producing the sixth preferred embodiment of a semiconductor integrated circuit device according to the present invention, and FIGS. 43(B) and 43(C) are sectional views thereof;

FIG. 44(A) is a plan view showing a step of producing the sixth preferred embodiment of a semiconductor integrated circuit device according to the present invention, and FIGS. 44(B) and 44(C) are sectional views thereof;

FIG. 45(A) is a plan view showing a step of producing the sixth preferred embodiment of a semiconductor integrated circuit device according to the present invention, and FIGS. 45(B) and 45(C) are sectional views thereof;

FIG. 46(A) is a plan view showing a step of producing the sixth preferred embodiment of a semiconductor integrated circuit device according to the present invention, and FIGS. 46(B) and 46(C) are sectional views thereof;

FIG. 47(A) is a plan view showing a step of producing the sixth preferred embodiment of a semiconductor integrated circuit device according to the present invention, and FIGS. 47(B) and 47(C) are sectional views thereof;

FIG. 49(A) is a plan view showing a step of producing the sixth preferred embodiment of a semiconductor integrated circuit device according to the present invention, and FIGS. 49(B) and 49(C) are sectional views thereof;

FIG. 50(A) is a plan view showing a step of producing the sixth preferred embodiment of a semiconductor integrated circuit device according to the present invention, and FIGS. 50(B) and 50(C) are sectional views thereof;

FIG. 51(A) is a plan view showing a step of producing the sixth preferred embodiment of a semiconductor integrated circuit device according to the present invention, and FIGS. 51(B) and 51(C) are sectional views thereof;

FIG. 52(A) is a plan view showing a step of producing the sixth preferred embodiment of a semiconductor integrated circuit device according to the present invention, and FIGS. 52(B) and 52(C) are sectional views thereof;

FIG. 53(A) is a plan view showing a step of producing the sixth preferred embodiment of a semiconductor integrated circuit device according to the present invention, and FIGS. 53(B) and 53(C) are sectional views thereof;

FIGS. 54(A) through 54(L) are profile diagrams showing the distribution of an impurity;

FIG. 55(A) is a plan view of the seventh preferred embodiment of a semiconductor integrated circuit device according to the present invention, and FIGS. 55(B) and 55(C) are sectional views thereof;

FIGS. 56(A) through 56(E) are profile diagrams showing the distribution of an impurity;

FIG. 57(A) is a plan view showing a step of producing the seventh preferred embodiment of a semiconductor integrated circuit device according to the present invention, and FIGS. 57(B) and 57(C) are sectional views thereof;

FIG. 58(A) is a plan view showing a step of producing the seventh preferred embodiment of a semiconductor integrated circuit device according to the present invention, and FIGS. 58(B) and 58(C) are sectional views thereof;

FIG. 60(A) is a plan view showing a step of producing the seventh preferred embodiment of a semiconductor integrated circuit device according to the present invention, and FIGS. 60(B) and 60(C) are sectional views thereof;

FIG. 62(A) is a plan view showing a step of producing the seventh preferred embodiment of a semiconductor integrated circuit device according to the present invention, and FIGS. 62(B) and 62(C) are sectional views thereof;

FIG. 63(A) is a plan view showing a step of producing the seventh preferred embodiment of a semiconductor integrated circuit device according to the present invention, and FIGS. 63(B) and 63(C) are sectional views thereof;

FIG. 64(A) is a plan view showing a step of producing the seventh preferred embodiment of a semiconductor integrated circuit device according to the present invention, and FIGS. 64(B) and 64(C) are sectional views thereof;

FIG. 65(A) is a plan view showing a step of producing the seventh preferred embodiment of a semiconductor integrated circuit device according to the present invention, and FIGS. 65(B) and 65(C) are sectional views thereof;

FIG. 66(A) is a plan view showing a step of producing the seventh preferred embodiment of a semiconductor integrated circuit device according to the present invention, and FIGS. 66(B) and 66(C) are sectional views thereof;

FIG. 68(A) is a plan view showing a step of producing the seventh preferred embodiment of a semiconductor integrated circuit device according to the present invention, and FIGS. 68(B) and 68(C) are sectional views thereof;

FIGS. 69(A) through 69(J) are profile diagrams showing the distribution of an impurity;

FIGS. 70(A) through 70(J) are profile diagrams showing the distribution of an impurity;

FIGS. 73(A) through 73(E) are profile diagrams showing the distribution of an impurity;

FIGS. 76(A) through 76(B) are sectional views showing principal steps of producing a conventional semiconductor integrated circuit device;

FIGS. 77(A) through 77(J) are profile diagrams showing the distribution of an impurity;

FIGS. 78(A) through 78(J) are profile diagrams showing the distribution of an impurity;

FIGS. 83(A) and 83(B) are sectional views showing principal steps of producing a conventional another semiconductor integrated circuit device;

FIGS. 84(A) through 84(L) are profile diagrams showing the distribution of an impurity;

DESCRIPTION OF THE PREFERRED EMBODIMENTS

Figure 12E:
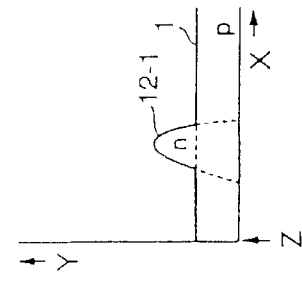
FIGS. 12(A) through 12(J) are profile diagrams showing the distribution of an impurity.

Referring now to the accompanying drawings, the preferred embodiments of the present invention will be described below. Furthermore, throughout the specification, common reference numbers are used for common parts in all of the drawings.

First Preferred Embodiment

FIG. 1 shows the first preferred embodiment of a semiconductor integrated circuit device according to the present invention, wherein FIG. 1(A) is a plan view thereof, FIG. 1(B) being a sectional view taken along line 1B—1B in FIG. 1(A), FIG. 1(C) being a sectional view taken along line 1C—1C in FIG. 1(A), and FIG. 1(D) being a sectional view taken along line 1D—1D in FIG. 1(A). FIG. 2 is a profile diagram showing the distribution of an impurity in a substrate, wherein FIG. 2(A) shows a profile along line 2A—2A in FIG. 1(B), FIG. 2(B) showing a profile along line 2B—2B in FIG. 1(B), FIG. 2(C) showing a profile along line 2C—2C in FIG. 1(B), FIG. 2(D) showing a profile along line 2D—2D in FIG. 1(B), and FIG. 2(E) showing a profile along line 2E—2E in FIG. 1(B).

The first preferred embodiment of a semiconductor integrated circuit device according to the present invention, along with a method for producing the same, will be described below.

FIGS. 3 through 10 show principal steps for producing the first preferred embodiment of a semiconductor integrated circuit device according to the present invention. In FIGS. 3 through 10, (A) is a plan view, (B) being a sectional view taken along line B—B in (A), (C) being a sectional view taken along line C—C in (A), and (D) being a sectional view taken along line D—D in (A).

First, as shown in FIGS. 3(A) through 3(D), an element isolating region 2 is formed on the surface of a p-type silicon substrate 1 to define divided element regions 3. In this preferred embodiment, the element isolating region 2 is a LOCOS film formed by the LOCOS method. Then, the surface of the (silicon) substrate 1 exposed to the element regions 3 is, e.g., thermally oxidized, to form buffer oxide films 4 on the surfaces of the element regions 3. FIGS. 11(A) through 11(E) show impurity profiles in the substrate 1 after the buffer oxide films 4 are formed. FIG. 11(A) shows a profile along line 11A—11A in FIG. 3(B), FIG. 11(B) showing a profile along line 11B—11B in FIG. 3(B), FIG. 11(C) showing a profile along line 11C—11C in FIG. 3(B), FIG. 11(D) showing a profile along line 11D—11D in FIG. 3(B), and FIG. 11(E) showing a profile along line 11E—11E in FIG. 3(B). As shown in FIGS. 11(A) through 11(E), after the buffer oxide films 4 are formed, the conductive impurities in the substrate 1 are only p-type impurities originally contained in the substrate 1.

Then, as shown in FIGS. 4(A) through 4(D), a photoresist is applied on the substrate 1 to form a photoresist film 5. Then, holes 6a, 6b are formed in the photoresist film 5 by the photolithography method. In this preferred embodiment, the hole 6a is formed so as to correspond to a region wherein an n-type well is formed, and the hole 6b is formed so as to surround a region wherein a p$^-$-type well separated from the substrate 1 is formed. Then, using the photoresist film 5 as a mask, an n-type impurity 7 is ion-implanted into the substrate 1. Thus, an n-type well 8-1, and an n-type well 8-2 surrounding the region, in which the p$^-$-type well separated from the substrate 1 is formed, are simultaneously formed. FIGS. 11(F) through 11(J) show impurity profiles in the substrate 1 after the n-type wells 8-1 and 8-2 are formed. FIG. 11(F) shows a profile along line 11F—11F in FIG. 4(B), FIG. 11(G) showing a profile along line 11G—11G in FIG. 4(B), FIG. 11(H) showing a profile along line 11H—11H in FIG. 4(B), FIG. 11(I) showing a profile along line 11I—11I in FIG. 4(B), and FIG. 11(J) showing a profile along line 11J—11J in FIG. 4(B). As shown in FIGS. 11(F) through 11(J), the n-type impurity 7 is introduced into the substrate 1 so that the density thereof is higher than that of the p-type impurity originally contained in the substrate 1, to form the n-type wells 8-1 and 8-2 in the substrate 1. In addition, in this preferred embodiment, after the element isolating region 2 (LOCOS) is formed, the n-type impurity 7 for forming the n-type wells 8-1 and 8-2 is ion-implanted. Therefore, as can be particularly clearly seen from FIG. 4(B), the n-type wells 8-1 and 8-2 below the element isolating region 2 (LOCOS) are shallower than portions below the element regions 3 in accordance with the shape of the cross section of the element isolating region 2.

Figure 12D:
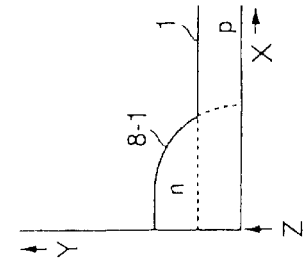
Figure 12C:
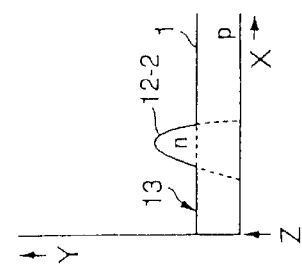
Figure 12B:
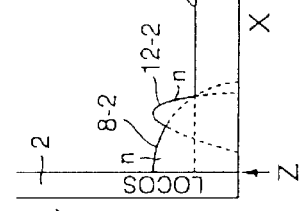
Figure 12A:
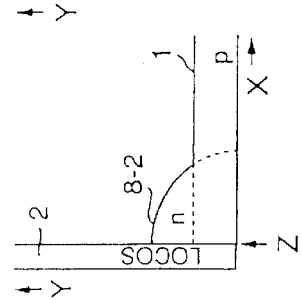

Then, as shown in FIGS. 5(A) through 5(D), after the photoresist film 5 is removed from the substrate 1, a photoresist is applied again to form a photoresist film 9. Then, holes 10a, 10b are formed in the photoresist film 9 by the photolithography method. In this preferred embodiment, the hole 10a is formed so as to correspond to a region wherein a p$^-$-type well connected to the substrate 1 is formed, and the hole 10b is formed so as to correspond to a region wherein a p-type well separated from the substrate 1 is formed. Then, using the photoresist film 9 as a mask, an n-type impurity 11 is ion-implanted into the substrate 1. Thus, embedded n-type wells 12-1 and 12-2 apart from the surface of the substrate 1 are simultaneously formed in a region wherein a p$^-$-type well connected to the substrate 1 is formed, and a region wherein a p$^-$-type well separated from the substrate 1 is formed, respectively. The embedded n-type well 12-2 is formed so as to contact the n-type well. Thus, a p-type region 13, which is pn-separated from the substrate 1 by the n-type well 12-2 and the n-type 8-2, is obtained in the substrate 1. FIGS. 12(A) through 12(E) show impurity profiles in the substrate 1 after the n-type wells 12-1 and 12-2 are formed. FIG. 12(A) shows a profile along line 12A—12A in FIG. 5(B), FIG. 12(B) showing a profile along line 12B—12B in FIG. 5(B), FIG. 12(C) showing a profile along line 12C—12C in FIG. 5(B), FIG. 12(D) showing a profile along line 12D—12D in FIG. 5(B), and FIG. 12(E) showing a profile along line 1E—12E in FIG. 5(B). As shown in FIGS. 12(A) through 12(E), the n-type impurity 11 is introduced into the substrate 1 so that the density thereof is higher than that of the p-type impurity originally contained in the substrate 1, to form the embedded n-type wells 12-1 and 12-2 in the substrate 1. In addition, in this preferred embodiment, after the element isolating region 2 (LOCOS) is formed, the n-type impurity 11 for forming the embedded n-type wells 12-1 and 12-2 is ion-implanted. Therefore, as can be particularly clearly seen from FIG. 5(B), the n-type wells 8-1 and 8-2 below the element isolating region 2 (LOCOS) are shallower than portions below the element regions 3 in accordance with the shape of the cross section of the element isolating region 2.

In addition, in order to form the embedded n-type wells 12-1 and 12-2 apart from the surface of the substrate 1, for example, an acceleration voltage applied when the ion implantation of the n-type impurity 11 is carried out may be higher than an acceleration voltage when the ion implantation of the n-type impurity 7 for forming the n-type wells 8-1 and 8-2 is carried out, so that the n-type impurity 11 may be implanted into a deeper portion of the substrate 1. In addition, the kind of the n-type impurity 11 may be the same as or different from the kind of the n-type impurity 7.

Figure 12J:
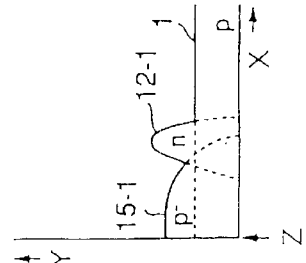
Figure 12I:
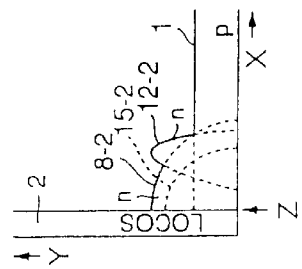
Figure 12H:
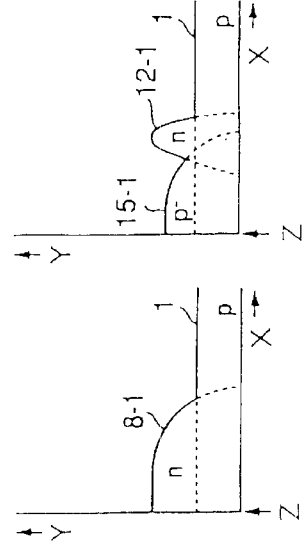
Figure 12G:
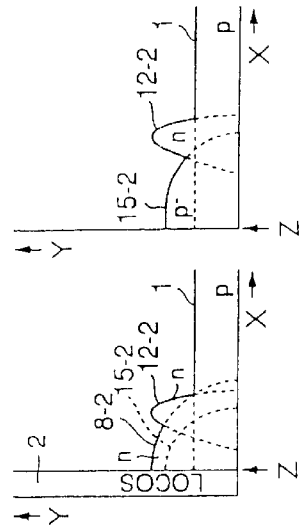
Figure 12F:
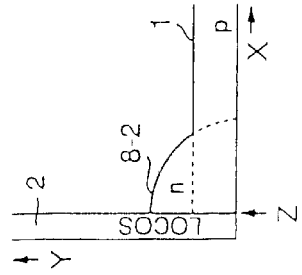

Then, as shown in FIGS. 6(A) through 6(D), subsequently using the photoresist film 9 as a mask without removing the photoresist film 9, a p-type impurity 14 is ion-implanted into the substrate 1. Thus, a p-type well 15-1 connected to the substrate 1, and a p$^-$-type well 15-2 separated from the substrate 1 are simultaneously formed. FIGS. 12(F) through 12(J) show impurity profiles in the substrate 1 after the p$^-$-type wells 15-1 and 15-2 are formed. FIG. 12(F) shows a profile along line 12F—12F in FIG. 6(B), FIG. 12(G) showing a profile along line 12G—12G in FIG. 6(B), FIG. 12(H) showing a profile along line 12H—12H in FIG. 6(B), FIG. 12(I) showing a profile along line 12I—12I in FIG. 6(B), and FIG. 12(J) showing a profile along line 12J—12J in FIG. 6(B). As shown in FIG. 12(F) through 12(J), the p-type impurity 14 is introduced so that the density of the p-type impurity 14 is lower than those of the n-type impurities contained in, e.g., the n-type wells 8-2, 12-1 and 12-2, to form p$^-$-type wells 15-1 and 15-2 in the substrate 1. In addition, in this preferred embodiment, after the element isolating region 2 (LOCOS) is formed, the p-type impurity 14 for forming the p$^-$-type wells 15-1 and 15-2 is ion-implanted. Therefore, as can be particularly clearly seen from FIG. 6(B), the p-type wells 15-1 and 15-2 below the element isolating region 2 (LOCOS) are shallower than portions below the element regions 3 in accordance with the shape of the cross section of the element isolating region 2.

In addition, in order to form the p$^-$-type well 15-2, which is not connected to the substrate 1, in the p-type region 13 (see FIG. 5(B)) which is pn-separated from the substrate 1, for example, an acceleration voltage applied when the ion implantation of the p-type impurity 14 is carried out may be lower than an acceleration voltage when the ion implantation of the n-type impurity 11 for forming the embedded n-type wells 12-1 and 12-2 is carried out, so that the p-type impurity 14 may be implanted into a shallower portion of the substrate 1.

In addition, since the p$^-$-type wells 15-1 and 15-2 are formed by adding the p-type impurity to the originally p-type substrate 1, the density of the p-type impurity thereof is higher than that of the substrate 1.

Moreover, after the ion-implantation of the p-type impurity 14 for forming the p$^-$-type wells 15-1 and 15-2 is carried out, a p-type or n-type for adjusting the threshold voltage of the transistor may be ion-implanted into the substrate 1 subsequently using the photoresist film 9 as a mask without removing the photoresist film 9. Furthermore, the ion-implantation for adjusting the threshold voltage is carried out, if necessary.

Then, as shown in FIGS. 7(A) through 7(D), the photoresist film 9 is removed from the substrate 1.

Then, as shown in FIG. 8(A) through 8(D), the buffer oxide film 4 is removed from the element region 3. Thus, the surface of the substrate 1 (the surface of each of the n-type well 8-1 and the p$^-$-type wells 15-1, 15-2 in this preferred embodiment) is exposed to the element regions 3.

Then, as shown in FIGS. 9(A) through 9(D), the surface of the (silicon) substrate 1 exposed to the element regions 3 is, e.g., thermally oxidized, to form a gate oxide film 16 on the surfaces of the element regions 3.

Then, as shown in FIGS. 10(A) through 10(D), a conductive film, which is used for forming a gate electrode of the transistor, e.g., a laminated film of a polycrystalline silicon and tungsten silicide film, is formed on the structure shown in FIGS. 9(A) through 9(D). Then, the laminated film is patterned to form a gate electrode 17. Then, in accordance with a well-known method, a p-type impurity for forming a p-type source/drain is ion-implanted into the n-type well 8-1 to form a p-type source region 18S and a p-type drain region 18D. Then, in accordance with a well-known method, an n-type impurity for forming an n-type source/drain is ion-implanted into the p-type wells 15-1 and 15-2 to form n-type source regions 19S-1, 19S-2 and n-type drain regions 19D-1, 19D-2.

Then, as shown in FIGS. 1(A) through 1(D), an interlayer insulator film 20 of , e.g., a CVD oxide film, is formed on the structure shown in FIGS. 10(A) through 10(D). Then, contact holes 21, which are communicated with the p-type source/drain regions 18S, 18D, and then-type source/drain regions 19S-1, 19D-1, 19S-2, 19D-2, respectively, are formed in the interlayer insulator film 20. Then, a conductive film, which is used for forming wiring parts, e.g., an aluminum film, is formed. The aluminum film thus formed is patterned to form wiring parts 22. Furthermore, the interlayer insulator film 20 and wiring parts 22 are omitted from FIG. 1(A).

By the above described producing method, the first preferred embodiment of a semiconductor integrated circuit device according to the present invention is completed.

The above described semiconductor integrated circuit device has the embedded n-type well 12-1 below the p$^-$-type well 15-1 connected to the substrate 1. This embedded n-type well 12-1 can be formed by using the same mask as that for the embedded n-type well 12-1 formed below the p$^-$-type well 15-2 separated from the substrate 1. Therefore, the mask for forming the embedded n-type wells 12-1 and 12-2 can be in common with the mask for forming the p$^-$-type wells 15-1 and 15-2. In the above described first preferred embodiment, the photoresist film 9 is the common mask.

Thus, according to the first preferred embodiment of the present invention, it is possible to inhibit the number of photolithography steps from increasing, and it is possible to inhibit the number of masks from increasing. Therefore, it is possible to reduce the manufacturing costs. In addition, since it is possible to inhibit the number of photolithography steps from increasing, it is possible to reduce the manufacturing costs, and it is also possible to inhibit the yield from deteriorating. This also contribute to the reduction of the manufacturing costs.

Moreover, in the first preferred embodiment, there is an advantage in that the impurity density of the p$^-$-type well 15-1 separated from the substrate 1 can be equal to the impurity density of the p⁻-type well 15-1 connected to the substrate 1, or the impurity density of the p-type well 15-2 is not rate-controlled by the n-type well 8-2. That is, "the degree of freedom for density design in wells" can be obtained without increasing the number of masks.

Furthermore, in the first preferred embodiment, while the diffusion/activation of each of the conductive impurities constituting the n-type wells 8-1, 8-2, the embedded n-type wells 12-1, 12-2 and the p⁻-type wells 15-1, 15-2 has been independently carried out, the diffusion/activation of each of the conductive impurities may be carried out by one heat treatment.

Alternatively, after the diffusion/activation of the conductive impurities constituting the n-type wells 8-1, 8-2 is carried out, the diffusion/activation of the conductive impurities constituting the embedded n-type wells 12-1, 12-2 and the p⁻-type wells 15-1, 15-2 may be simultaneously carried out.

Moreover, in the producing method for introducing the conductive impurities, which is used for forming the n-type well 12-2 and the p⁻-type wells 15-1, 15-2, into the substrate 1 after forming the element isolating region 2 as described in this preferred embodiment, there is an advantage in that it is possible to enhance the precision of "alignment" between these wells and the element regions 3, for example.

For example, the element isolating region 2 is formed on the surface of the substrate 1. Therefore, the element isolating region 2 formed on the surface of the substrate 1 can be used as an "alignment mark" of a mask. By using the element isolating region 2 as the "alignment mark", it is possible to very accurately carry out the "alignment" to the element regions 2 with respect to the masks (the photoresist films 5, 9 in the first preferred embodiment) for forming the wells, in comparison with a case where an "alignment mark" is separately formed. Therefore, the first preferred embodiment can be particularly suitably applied to well structures of semiconductor integrated circuit devices where very fine transistors are integrated with a large scale, e.g., memory cell arrays of various semiconductor memories, typically EEPROMs, DRAMs and so forth, and peripheral circuits thereof.

Second Preferred Embodiment

The second preferred embodiment of the present invention is an example of a semiconductor integrated circuit device having the same structure as that of the first preferred embodiment. The difference between the first and second preferred embodiment is that n-type wells 8-1, 8-2, 12-1, 12-2 and p⁻-type wells 15-1, 15-2 are formed before forming an element isolating region 2.

FIG. 13 shows the second preferred embodiment of a semiconductor integrated circuit device according to the present invention, wherein FIG. 13(A) is a plan view thereof, FIG. 13(B) being a sectional view taken along line 13B—13B in FIG. 13(A), FIG. 13(C) being a sectional view taken along line 13C—13C in FIG. 13(A), and FIG. 13(D) being a sectional view taken along line 13D—13D in FIG. 13(A). FIG. 14 is a profile diagram showing the distribution of an impurity in a substrate, wherein FIG. 14(A) shows a profile along line 14A—14A in FIG. 13(B), FIG. 14(B) showing a profile along line 14B—14B in FIG. 13(B), FIG. 14(C) showing a profile along line 14C—14C in FIG. 13(B), FIG. 14(D) showing a profile along line 14D—14D in FIG. 13(B), and FIG. 14(E) showing a profile along line 14E—14E in FIG. 13(B).

The second preferred embodiment of a semiconductor integrated circuit device according to the present invention, along with a method for producing the same, will be described below.

FIGS. 15 through 22 show principal steps for producing the second preferred embodiment of a semiconductor integrated circuit device according to the present invention. In FIGS. 15 through 22, (A) is a plan view, (B) being a sectional view taken along line B—B in (A), (C) being a sectional view taken along line C—C in (A), and (D) being a sectional view taken along line D—D in (A).

First, as shown in FIGS. 15(A) through 15(D), the surface of a p-type silicon substrate 1 is, e.g. thermally oxidized, to form buffer oxide films 4 on the surface of the substrate 1. Then, a photoresist is applied on the buffer oxide film 4 to form a photoresist film 5. Then, holes 6a, 6b are formed in the photoresist film 5 by the photolithography method. In this preferred embodiment, the hole 6a is formed so as to correspond to a region wherein an n-type well is formed, and the hole 6b is formed so as to surround a region wherein a p⁻-type well separated from the substrate 1 is formed. Then, using the photoresist film 5 as a mask, an n-type impurity 7 is ion-implanted into the substrate 1. Thus, the n-type impurity 7 for forming an n-type well 8-1 and an n-type well 8-2, which surrounds a region wherein a p⁻-type well separated from the substrate 1, is introduced into the substrate 1. FIGS. 23(A) through 23(E) show impurity profiles after the n-type impurity 7 for forming the n-type wells 8-1 and 8-2 is introduced into the substrate 1. FIG. 23(A) shows a profile along line 23A—23A in FIG. 15(B), FIG. 23(B) showing a profile along line 23B—23B in FIG. 15(B), FIG. 23(C) showing a profile along line 23C—23C in FIG. 15(B), FIG. 23(D) showing a profile along line 23D—23D in FIG. 15(B), and FIG. 23(E) showing a profile along line 23E—23E in FIG. 15(B). As shown in FIGS. 23(A) through 23(E), the n-type impurity 7 for forming the n-type wells 8-1 and 8-2 is introduced into the substrate 1 so that the density thereof is higher than that of the p-type impurity originally contained in the substrate 1.

Figure 16A:
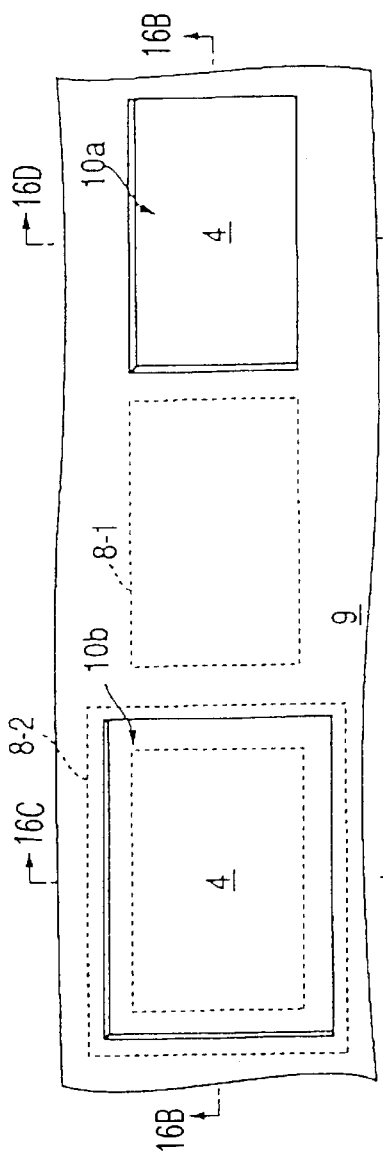
FIG. 16(A) is a plan view showing a step of producing the second preferred embodiment of a semiconductor integrated circuit device according to the present invention.
Figure 16B:
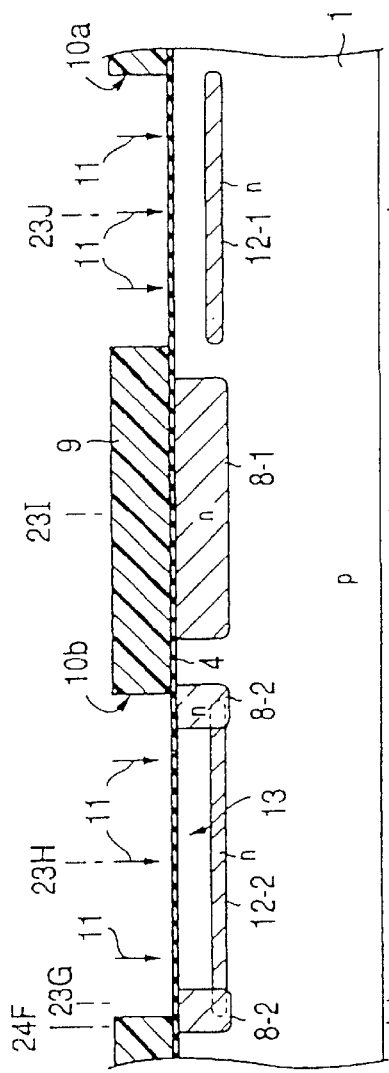
FIGS. 16(B) through 16(D) are sectional views thereof.
Figure 16C:
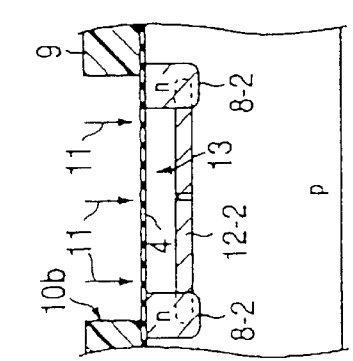
Figure 16D:
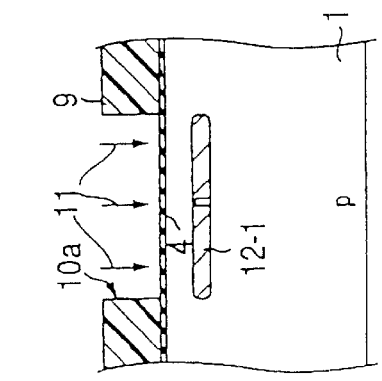
Figure 20A:
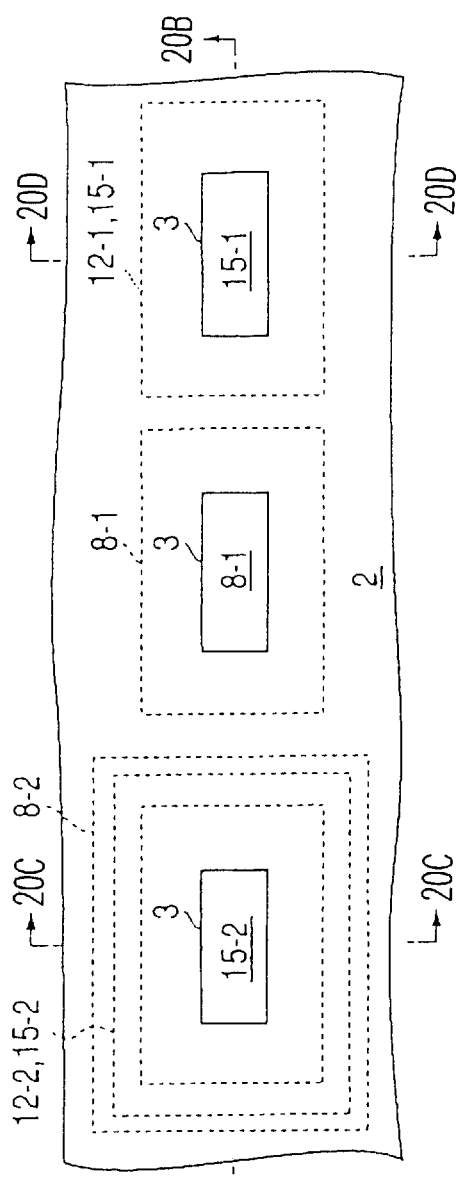
FIG. 20(A) is a plan view showing a step of producing the second preferred embodiment of a semiconductor integrated circuit device according to the present invention.
Figure 20B:
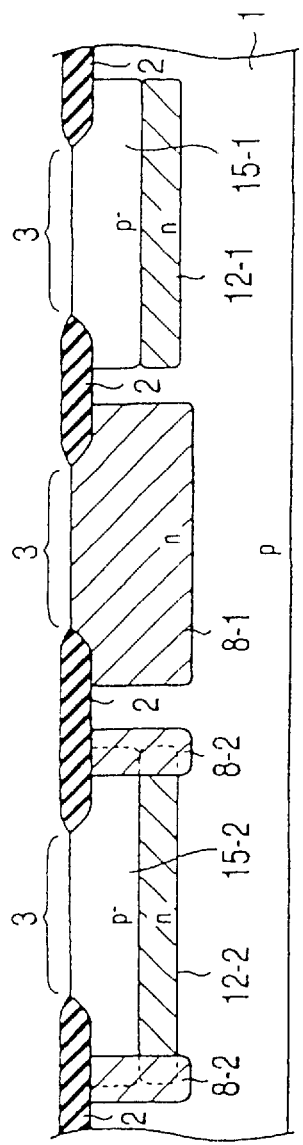
FIGS. 20(B) through 20(D) are sectional views thereof.
Figure 20C:
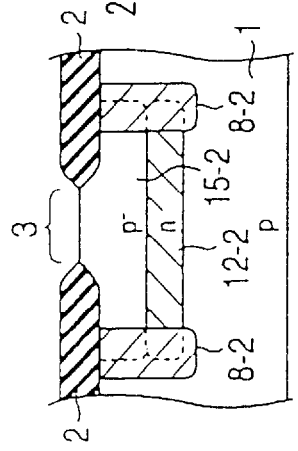
Figure 20D:
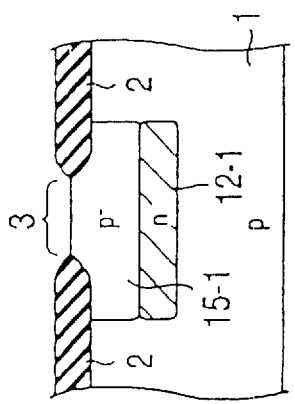

Then, as shown in FIGS. 16(A) through 16(D), after the photoresist film 5 is removed from the substrate 1, a photoresist is applied again to form a photoresist film 9. Then, holes 10a, 10b are formed in the photoresist film 9 by the photolithography method. In this preferred embodiment, the hole 10a is formed so as to correspond to a region wherein a p⁻-type well connected to the substrate 1 is formed, and the hole 10b is formed so as to correspond to a region wherein a p⁻-type well separated from the substrate 1 is formed. Then, using the photoresist film 9 as a mask, an n-type impurity 11 is ion-implanted into the substrate 1. Thus then-type impurity 11 for forming embedded n-type wells 12-1 and 12-2 apart from -the surface of the substrate 1 is introduced into a region wherein a $p^{31}$ type well connected to the substrate 1 is formed, and a region wherein a p⁻-type well separated from the substrate 1 is formed, respectively. FIGS. 23(F) through 23(J) show impurity profiles in the substrate 1 after the n-type impurity 11 for forming the n-type wells 12-1 and 12-2 is introduced. FIG. 23(F) shows a profile along line 23F—23F in FIG. 16(B), FIG. 23(G) showing a profile along line 23G—23G in FIG. 16(B), FIG. 23(H) showing a profile along line 23H—23H in FIG. 16(B), FIG. 23(I) showing a profile along line 23I—23I in FIG. 16(B), and FIG. 23(J) showing a profile along line 23J—23J in FIG. 16(B). As shown in FIGS. 23(F) through 23(J), the n-type impurity 11 for forming the embedded n-type wells 12-1 and 12-2 is introduced into the substrate 1 so that the density thereof is higher than that of the p-type impurity originally contained in the substrate 1. In addition, similar to the first preferred embodiment, in order to form the embedded n-type wells 12-1 and 12-2 apart from the surface of the substrate 1, for example, an acceleration voltage applied when the ion implantation of the n-type impurity 11 is carried out may be higher than an acceleration voltage when the ion implantation of the n-type impurity 7 for forming the n-type wells 8-1 and 8-2 is carried out, so that the n-type impurity 11 may be implanted into a deeper portion of the substrate 1. In addition, the kind of the n-type impurity 11 may be the same as or different from the kind of the n-type impurity 7.

Then, as shown in FIGS. 17(A) through 17(D), subsequently using the photoresist film 9 as a mask without removing the photoresist film 9, a p-type impurity 14 is ion-implanted into the substrate 1. Thus, the p-type impurity 14 for forming a p$^-$-type well 15-1 connected to the substrate 1, and a p$^-$-type well 15-2 separated from the substrate 1 is introduced, respectively. FIGS. 24(A) through 24(E) show impurity profiles after the p-type impurity for forming the p$^-$-type wells 15-1 and 15-2 is introduced into the substrate 1. FIG. 24(A) shows a profile along line 24A—24A in FIG. 17(B), FIG. 24(B) showing a profile along line 24B—24B in FIG. 17(B), FIG. 24(C) showing a profile along line 24C—24C in FIG. 17(B), FIG. 24(D) showing a profile along line 24D—24D in FIG. 17(B), and FIG. 24(E) showing a profile along line 24E—24E in FIG. 17(B). As shown in FIG. 24(A) through 24(E), the p-type impurity 14 for forming the p$^-$-type wells 15-1 and 15-2 is introduced into the substrate 1 so that the density of the p-type impurity 14 is higher than those of the n-type impurities contained in, e.g., the n-type wells 8-2, 15-1 and 15-2, unlike the first preferred embodiment. Of course, the p-type impurity 14 may be introduced into the substrate 1 so that the density of the p-type impurity 14 is lower than those of the n-type impurities contained in the n-type wells 8-2, 15-1 and 15-2, similar to the first preferred embodiment.

In addition, in order to form the p$^-$-type well 15-2, which is not connected to the substrate 1, in the p-type region 13 (see FIG. 17(B)) which is pn-separated from the substrate 1, for example, an acceleration voltage applied when the ion implantation of the p-type impurity 14 is carried out may be lower than an acceleration voltage when the ion implantation of the n-type impurity 11 for forming the embedded n-type wells 12-1 and 12-2 is carried out, so that the p-type impurity 14 may be implanted into a shallower portion of the substrate 1.

In addition, the p-type impurity 14 for forming the p$^-$type wells 15-1 and 15-2 is added to the originally p-type substrate 1. Therefore, the density of the p-type impurity in a region, wherein the p-type impurity 14 is introduced, is higher than that of the substrate 1.

Moreover, after the ion-implantation of the p-type impurity 14 for forming the p$^-$-type wells 15-1 and 15-2 is carried out, a p-type or n-type for adjusting the threshold voltage of the transistor may be ion-implanted into the substrate 1 subsequently using the photoresist film 9 as a mask without removing the photoresist film 9. Furthermore, the ion implantation for adjusting the threshold voltage is carried out, if necessary.

Then, as shown in FIGS. 18(A) through 18(D), after the photoresist film 9 is removed, the substrate 1 is thermally treated to diffuse/activate the n-type impurities 7, 11 and the p-type impurity 14 which have been introduced into the substrate 1, to form n-type wells 8-1, 8-2, 12-1, 12-2 and p-type wells 15-1, 15-2. The embedded n-type well 12-1 is formed apart from the surface of the substrate 1, and the embedded n-type well 12-2 is formed so as to be apart from the surface of the substrate 1 and contact the n-type well 8-2. Thus, a p-type region 13, which is pn-separated from the substrate 1 by the n-type wells 12-2 and 8-2, is formed in the substrate 1. FIGS. 24(F) through 24(J) show impurity profiles in the substrate 1 after the conductive impurities 7, 11 and 14 introduced into the substrate 1 are diffused/activated, respectively. FIG. 24(F) shows a profile along line 24F—24F in FIG. 18(B), FIG. 24(G) showing a profile along line 24G—24G in FIG. 18(B), FIG. 24(H) showing a profile along line 24H—24H in FIG. 18(B), FIG. 24(I) showing a profile along line 24I—24I in FIG. 18(B), and FIG. 24(J) showing a profile along line 24J—24J in FIG. 18(B). As shown particularly in FIGS. 24(G), 24(H) and 24(J), the impurity density in the n-type wells 12-1 and 12-2 is lower than that of the impurity in the p$^-$-type wells 15-1 and 15-2, unlike the first preferred embodiment. However, since the p$^-$-type wells 15-1 and 15-2 are formed at shallower position than those of the n-type wells 12-1 and 12-2, the n-type regions appear in deeper portions of the substrate 1. These n-type regions form the embedded n-type wells 12-1 and 12-2.

In addition, as shown in FIG. 24(G), the impurity density of the p$^-$-type well 15-2 is higher than the impurity density of the n-type well 8-2, and a p-type conductivity is exhibited near the surface of the substrate 1 on a cross section taken along lines 24G—24G in FIG. 18(B). However, as shown in FIG. 24(F), on a cross section taken along line 24F—24F in FIG. 18(B), the p$^-$-type well 15-2 does not exist, and the substrate 1 has an n-type conductivity. Thus, when the impurity density of the p$^-$-type well 15-2 is higher than the impurity density of the n-type well 8-2, if the edge of the p$^-$-type well 15-2 terminates in the n-type well 8-2, the p$^-$-type well 15-2 can be separated from the substrate 1 by a p-n junction.

Therefore, the well structure in the second preferred embodiment is the same as the well structure in the first preferred embodiment.

Then, as shown in FIGS. 19(A) through 19(D), an element isolating region 2 is formed on the surface of the p-type silicon substrate 1 to define divided element regions 3 on the surface of the substrate 1. In this preferred embodiment, the element isolating region 2 is a LOCOS film formed by the LOCOS method.

Then, as shown in FIG. 20(A) through 20(D), the buffer oxide film 4 is removed from the element region 3. Thus, the surface of the substrate 1 (the surface of each of the n-type well 8-1 and the p$^-$-type wells 15-1, 15-2 in this preferred embodiment) is exposed to the element regions 3.

Then, as shown in FIGS. 21(A) through 21(D), the surface of the (silicon) substrate 1 exposed to the element regions 3 is, e.g., thermally oxidized, to form a gate oxide film 16 on the surfaces of the element regions 3.

Then, as shown in FIGS. 22(A) through 22(D), a conductive film, which is used for forming a gate electrode of the transistor, e.g., a laminated film of a polycrystalline silicon and tungsten silicide film, is formed on the structure shown in FIGS. 21(A) through 21(D). Then, the laminated film is patterned to form a gate electrode 17. Then, in accordance with a well-known method, a p-type impurity for forming a p-type source/drain is ion-implanted into the n-type well 8-1 to form a p-type source region 18S and a p-type drain region 18D. Then, in accordance with a well-known method, an n-type impurity for forming an n-type source/drain is ion-implanted into the p$^-$-type wells 15-1 and 15-2 to form n-type source regions 19S-1, 19S-2 and n-type drain regions 19D-1, 19D-2.

Then, as shown in FIGS. 13(A) through 13(D), an interlayer insulator film 20 of, e.g., a CVD oxide film, is formed on the structure shown in FIGS. 22(A) through 22(D). Then, contact holes 21, which are communicated with the p-type source/drain regions 18S, 18D, and the n-type source/drain regions 19S-1, 19D-1, 19S-2, 19D-2, respectively, are formed in the interlayer insulator film 20. Then, a conductive film, which is used for forming wiring parts, e.g., an aluminum film, is formed. The aluminum film thus formed is patterned to form wiring parts 22. Furthermore, the interlayer insulator film 20 and wiring parts 22 are omitted from FIG. 13(A).

By the above described producing method, the second preferred embodiment of a semiconductor integrated circuit device according to the present invention is completed.

Similar to the first preferred embodiment, the above described semiconductor integrated circuit device has the embedded n-type well 12-1 below the p-type well 15-1. This embedded n-type well 12-1 can be formed at the same time that the embedded n-type well 12-1 is formed below the $p^{31}$ type well 15-2. Therefore, the mask for forming the embedded n-type wells 12-1 and 12-2 can be in common with the mask for forming the $p^-$-type wells 15-1 and 15-2.

Therefore, in the second preferred embodiment similar to the first preferred embodiment, there are advantages in that it is possible to reduce the number of masks and it is possible to reduce the manufacturing costs.

Furthermore, in the second preferred embodiment, while the conductive impurities constituting the n-type wells 8-1, 8-1, the embedded n-type wells 12-1, 12-2 and the $p^-$-type well 15-1, 15-2 have been diffused/activated by one heat treatment, the respective conductive impurities may be independently diffused/activated similar to the first preferred embodiment.

In addition, after the conductive impurities constituting the n-type wells 8-1 and 8-2 are diffused/activated, the conductive impurities constituting the embedded n-type wells 12-1, 12-2 and the $p^-$-type wells 15-1, 15-2 may be simultaneously diffused/activated.

Third Preferred Embodiment

In the above described first and second preferred embodiments, different types of wells, i.e., the embedded n-type wells and the p-type wells, have been formed using a common mask to reduce the number of masks and the number of producing steps.

This third preferred embodiment of the present invention is an example of a semiconductor integrated circuit device having gate oxide films having different thickness. In the third preferred embodiment, a common mask is used at a step of forming wells and a step of changing the thickness of gate oxide films to reduce the number of masks and the number of producing steps.

Figure 25:
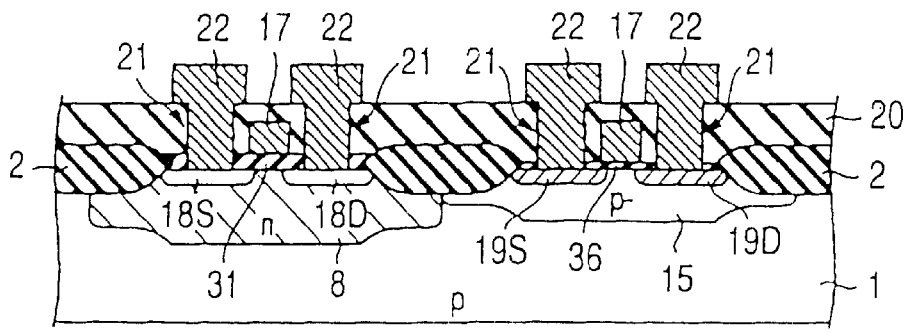
FIG. 25 is a sectional view of the third preferred embodiment of a semiconductor integrated circuit device according to the present invention.

FIG. 25 is a sectional view of the third preferred embodiment of a semiconductor integrated circuit device according to the present invention.

FIGS. 26(A) through 26(C) and FIGS. 27(A) through 27(D) are sectional views showing principal steps of producing the third preferred embodiment of a semiconductor integrated circuit device according to the present invention.

The third preferred embodiment of a semiconductor integrated circuit device according to the present invention, along with a method for producing the same, will be described below.

Figure 26A:
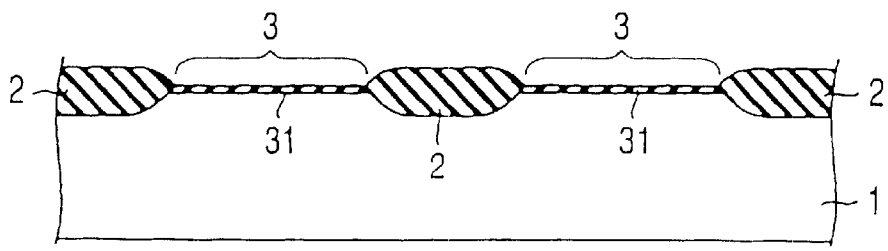
FIGS. 26(A) through 26(C) are sectional views showing a step of producing the third preferred embodiment of a semiconductor integrated circuit device according to the present invention.

First, as shown in FIG. 26(A), an element isolating region 2 is formed on the surface of a p-type silicon substrate 1 to define divided element regions 3. In this preferred embodiment, the element isolating region 2 is a LOCOS film formed by the LOCOS method. Then, the surface of the (silicon) substrate 1 exposed to the element regions 3 is, e.g., thermally oxidized, to form a first oxide film 31 on the surface of the element regions 3.

Figure 26B:
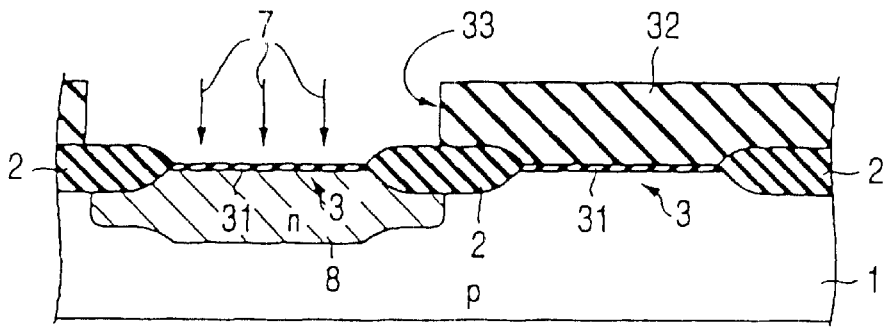

Then, as shown in FIG. 26(B), a photoresist is applied on the substrate 1 to form a photoresist film 32 thereon. Then, a hole 33 is formed in the photoresist film 32 by the photolithography method. In this preferred embodiment, the hole 33 is formed so as to correspond to a region wherein an n-type well is formed. Then, using the photoresist film 32 as a mask, an n-type impurity 7 is ion-implanted into the substrate 1. Thus, an n-type well 8 is formed.

Figure 26C:
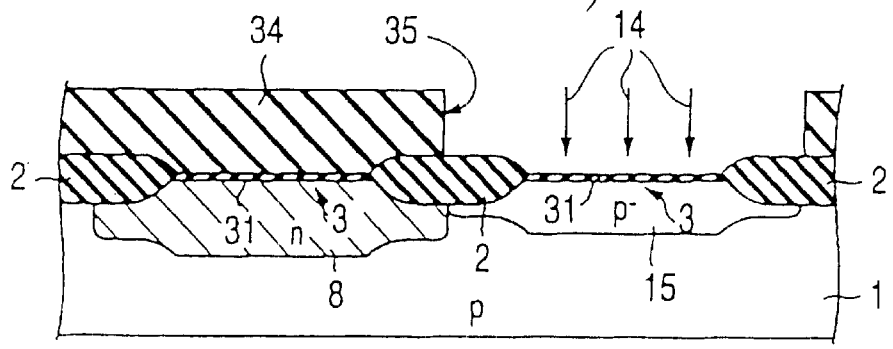

Then, as shown in FIG. 26(C), after the photoresist film 32 is removed from the substrate 1, a photoresist is applied again to form a photoresist film 34. Then, a hole 35 is formed in the photoresist film 34 by the photolithography method. In this preferred embodiment, the hole 35 is formed so as to correspond to a region wherein a $p^-$-type well connected to the substrate 1 is formed. Then, using the photoresist film 34 as a mask, an n-type impurity 14 is ion-implanted into the substrate 1. Thus, a p-type well 15 connected to the substrate 1 is formed.

Since the $p^-$-type well 15 is formed by adding the p-type impurity to the originally p-type substrate 1, the density of the p-type impurity of the p-type well 15 is higher than that of the substrate 1.

Figure 27A:
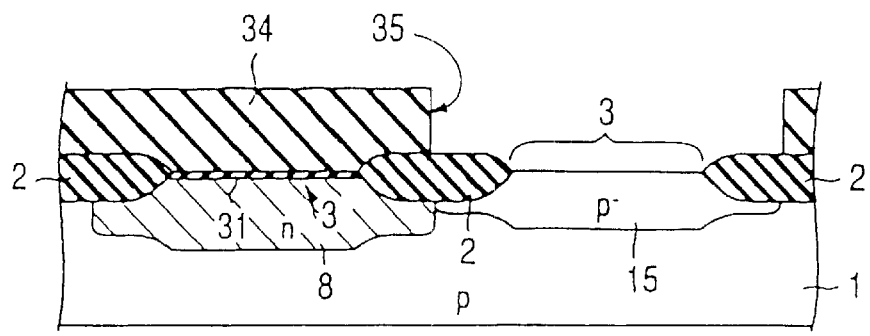
FIGS. 27(A) through 27(D) are sectional views showing a step of producing the third preferred embodiment of a semiconductor integrated circuit device according to the present invention.

Then, as shown in FIG. 27(A), subsequently using the photoresist film 34 as a mask without removing the photoresist film 34, the first gate oxide film 31 is removed from the hole 35. Thus, the surface of the substrate 1 (the p-type well 15 in this preferred embodiment) is exposed to the element regions 3 exposed to the hole 35.

Figure 27B:
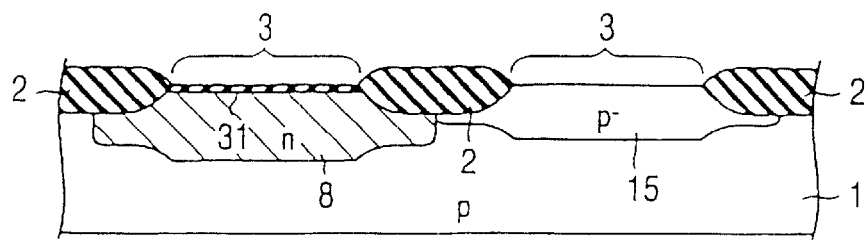

Then, as shown in FIG. 27(B), the photoresist film 34 is removed from the substrate 1.

Figure 27C:
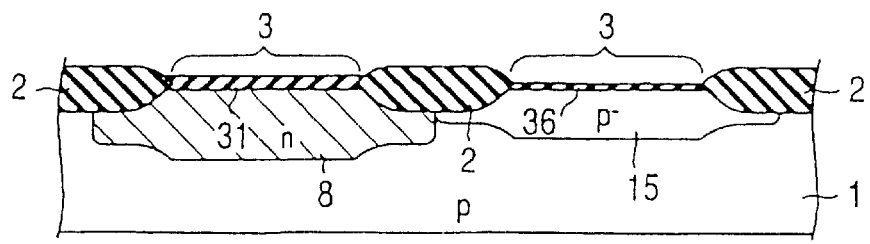

Then, as shown in FIG. 27(C), the surface of the substrate 1 exposed to the element regions 3, i.e., the surface of the $p^-$-type well 15 in this preferred embodiment, is, e.g., thermally oxidized, to form a second gate oxide film 36 on the surface of the element regions 3. At this time, the first gate oxide film 31 is additionally thermally oxidized to increase the thickness thereof. Thus, the thick gate oxide film 31 is formed on the n-type well 8, and the thin gate oxide film 36 is formed on the $p^-$-type well 15.

Figure 27D:
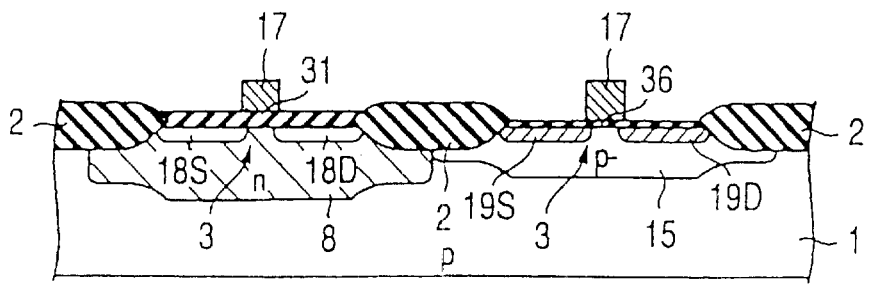

Then, as shown in FIG. 27(D), a conductive film, which is used for forming a gate electrode of the transistor, e.g., a laminated film of a polycrystalline silicon and tungsten silicide film, is formed on the structure shown in FIG. 27(C). Then, the laminated film is patterned to form a gate electrode 17. Then, in accordance with a well-known method, a p-type impurity for forming a p-type source/drain is ion-implanted into the n-type well 8 to form a p-type source region 18S and a p-type drain region 18D. Then, in accordance with a well-known method, an n-type impurity for forming an n-type source/drain is ion-implanted into the $p^-$-type well 15 to form an n-type source region 19S and an n-type drain region 19D.

Then, as shown in FIG. 25, an interlayer insulator film 20 of, e.g., a CVD oxide film, is formed on the structure shown in FIG. 27(D). Then, contact holes 21, which are communicated with the p-type source/drain regions 18S, 18D and the n-type source/drain regions 19S, 19D, respectively, are formed in the interlayer insulator film 20. Then, a conductive film, which is used for forming wiring parts, e.g., an aluminum film, is formed. The aluminum film thus formed is patterned to form wiring parts 22.

By the above described producing method, the third preferred embodiment of a semiconductor integrated circuit device according to the present invention is completed.

In the above described semiconductor integrated circuit device, the first gate oxide film 31 is removed using the mask for forming the p⁻-type well 15. That is, the mask for forming the p⁻-type well 15 can be in common with the mask for forming the thin gate oxide film 36. In this third preferred embodiment, the photoresist film 34 is the common mask.

Therefore, according to the third preferred embodiment similar to the first and second preferred embodiments, there are advantages in that it is possible to reduce the number of masks and it is possible to reduce the manufacturing costs.

Fourth Preferred Embodiment

Similar to the third preferred embodiment, this fourth preferred embodiment of the present invention is an example of a semiconductor integrated circuit device having gate oxide films having different thickness. The difference between the third and fourth preferred embodiments is that thin gate oxide films are formed on both of n-type well and p⁻-type wells, not only on p⁻-type wells.

FIG. 28 is a sectional view of the fourth preferred embodiment of a semiconductor integrated circuit device according to the present invention. FIG. 29 is a profile diagram showing the distribution of an impurity in a substrate, wherein FIG. 29(A) shows a profile along line 29A—29A in FIG. 28, FIG. 29(B) showing a profile along line 29B—29B in FIG. 28, and FIG. 29(C) showing a profile along line 29C—29C in FIG. 28.

The fourth preferred embodiment of a semiconductor integrated circuit device according to the present invention, along with a method for producing the same, will be described below.

FIGS. 30(A) through 30(C) and FIGS. 31(A) through 31(D) are sectional views showing principal steps of producing the fourth preferred embodiment of a semiconductor integrated circuit device according to the present invention.

Figure 30A:
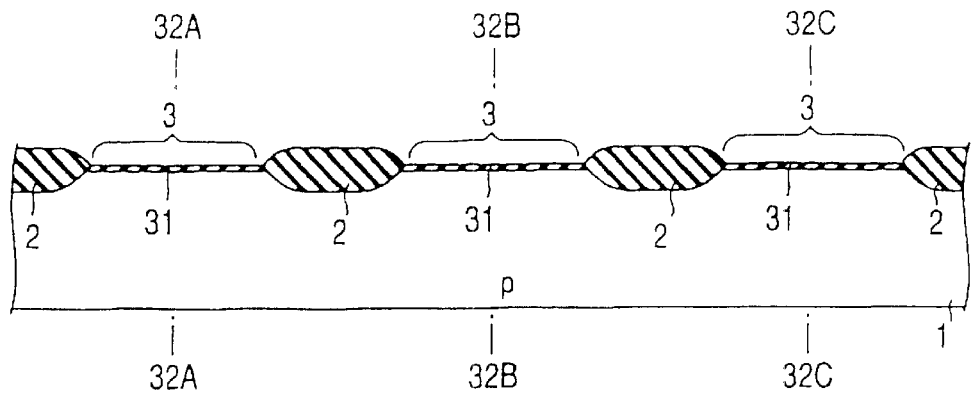
FIGS. 30(A) through 30(C) are sectional views showing a step of producing the fourth preferred embodiment of a semiconductor integrated circuit device according to the present invention.
Figure 32A:
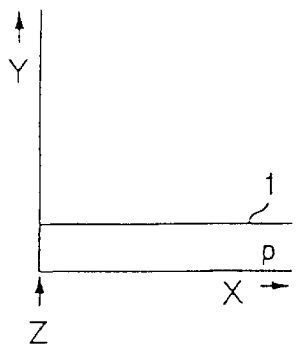
FIGS. 32(A) through 32(I) are profile diagrams showing the distribution of an impurity.
Figure 32B:
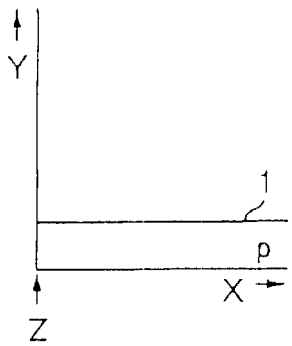
Figure 32C:
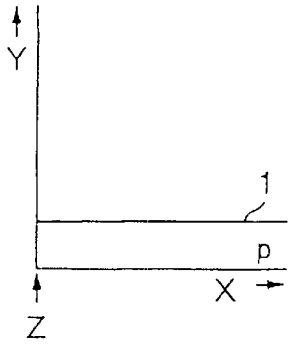

First, as shown in FIG. 30(A), an element isolating region 2 is formed on the surface of a p-type silicon substrate 1 to define divided element regions 3. In this preferred embodiment, the element isolating region 2 is a LOCOS film formed by the LOCOS method. Then, the surface of the (silicon) substrate 1 exposed to the element regions 3 is, e.g., thermally oxidized, to form a first oxide film 31 on the surfaces of the element regions 3. FIGS. 32(A) through 32(C) show impurity profiles in the substrate 1 after the first oxide film 31 is formed. FIG. 32(A) shows a profile along line 32A—32A in FIG. 30(A), FIG. 32(B) showing a profile along line 32B—32B in FIG. 30(A), and FIG. 32(C) showing a profile along line 32C—32C in FIG. 30(A). As shown in FIGS. 32(A) through 32(C), after the first oxide film 31 is formed, the conductive impurities in the substrate 1 are only p-type impurities contained in the substrate 1.

Figure 30B:
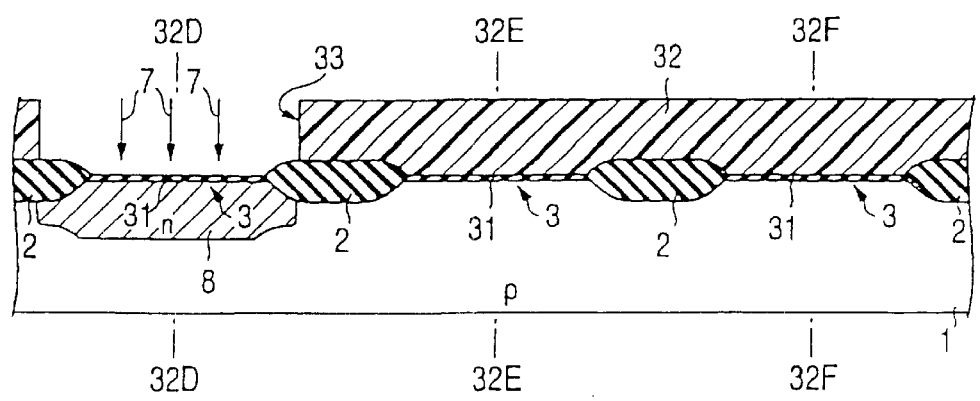
Figure 32D:
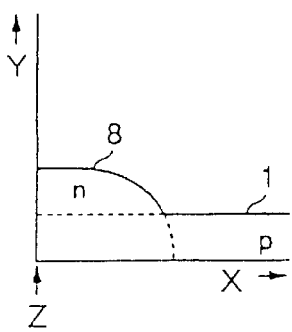
Figure 32E:
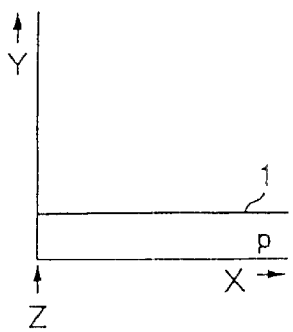
Figure 32F:
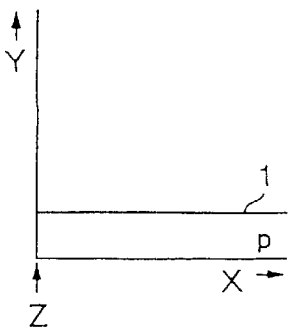

Then, as shown in FIG. 30(B), a photoresist is applied on the substrate 1 to form a photoresist film 32. Then, a hole 33 is formed in the photoresist film 32 by the photolithography method. In this preferred embodiment, the hole 33 is formed so as to correspond to a region wherein an n-type well is formed. Then, using the photoresist film 32 as a mask, an n-type impurity 7 is ion-implanted into the substrate 1. Thus, an n-type well 8 is formed. FIGS. 32(D) through 32(F) show impurity profiles in the substrate 1 after the n-type well 8 is formed. FIG. 32(D) shows a profile along line 32D—32D in FIG. 30(B), FIG. 32(E) showing a profile along line 32E—32E in FIG. 30(B), and FIG. 32(F) showing a profile along line 32F—32F in FIG. 30(B). As shown in FIGS. 32(D) through 32(F), the n-type impurity 7 is introduced into the substrate 1 so that the density thereof is higher than that of the p-type impurity originally contained in the substrate 1, to form the n-type well 8 in the substrate 1. In addition, in this preferred embodiment, after the element isolating region 2 (LOCOS) is formed, the n-type impurity 7 for forming the n-type well 8 is ion-implanted. Therefore, similar to the first preferred embodiment, as can be particularly clearly seen from FIG. 30(B), the n-type well 8 below the element isolating region 2 (LOCOS) is shallower than portions below the element regions 3 in accordance with the shape of the cross section of the element isolating region 2.

Figure 30C:
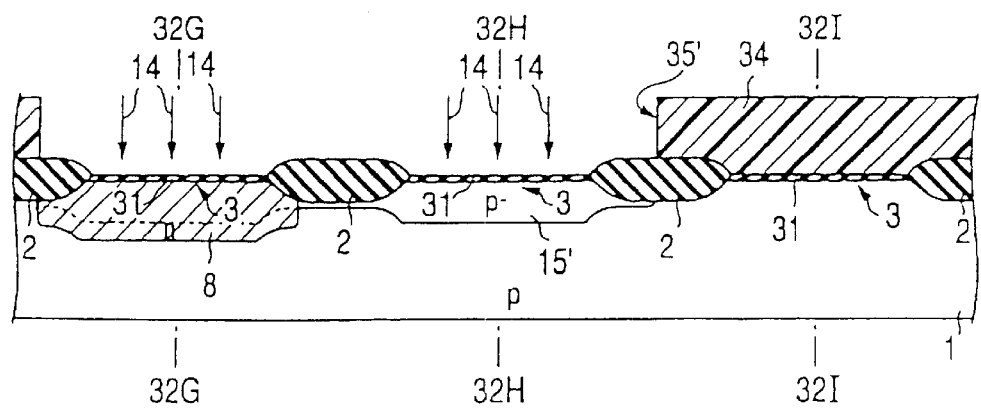
Figure 32G:
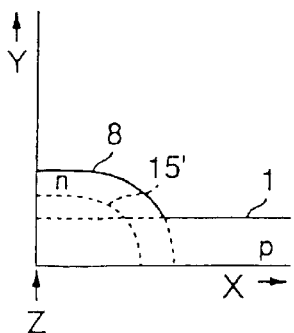
Figure 32H:
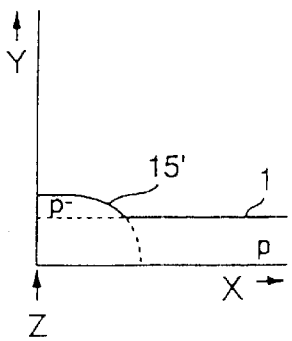
Figure 32I:
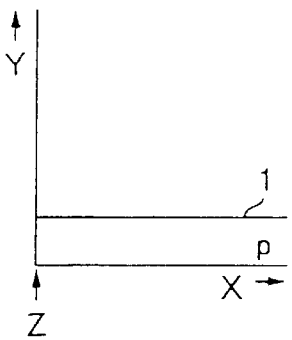

Then, as shown in FIG. 30(C), after the photoresist film 32 is removed from the substrate 1, a photoresist is applied again to form a photoresist film 34. Then, holes 35' are formed in the photoresist film 34 by the photolithography method. In this preferred embodiment, the holes 35' are formed so as to correspond to a region wherein a p-type well connected to the substrate 1 is formed, and a region wherein the n-type well 8 is formed, respectively. Then, using the photoresist film 34 as a mask, a p-type impurity 14 is ion-implanted into the substrate 1. Thus, a p⁻-type well 15' connected to the substrate 1 is formed. FIGS. 32(G) through 32(I) show impurity profiles after the p-type well 15' is formed. FIG. 32(G) shows a profile along line 32G—32G in FIG. 32(C), FIG. 32(H) showing a profile along line 32H—32H in FIG. 30(C), and FIG. 32(I) showing a profile along line 32I—32I in FIG. 30(C). As shown in FIGS. 32(G) through 32(I), the p-type impurity 14 is introduced so as to have a lower density than that of the n-type impurity contained in the substrate 1. Thus, the p⁻-type well 15' is formed so as to extend from the interior of the substrate 1 to the interior of the n-type well 8. In addition, in this preferred embodiment, after the element isolating region 2 (LOCOS) is formed, the p-type impurity 14 for forming the p-type well 15' is ion-implanted. Therefore, as can be particularly clearly seen from FIG. 30(C), the p-type well 15' below the element isolating region 2 (LOCOS) is shallower than portions below the element regions 3 in accordance with the shape of the cross section of the element isolating region 2.

Since the p⁻-type well 15' is formed by adding the p-type impurity to the originally p-type substrate 1, the density of the p-type impurity of the p-type well 15' is higher than that of the substrate 1.

Although the p-type well 15' is also formed in the n-type well 8, the p-type impurity 14 is introduced so as to have a lower density than the density of the n-type impurity contained in the n-type well 8 as described above. Therefore, even if the p⁻-type well 15' is formed in the n-type well 8, the n-type well 8 exhibits a n-type conductivity.

Figure 31A:
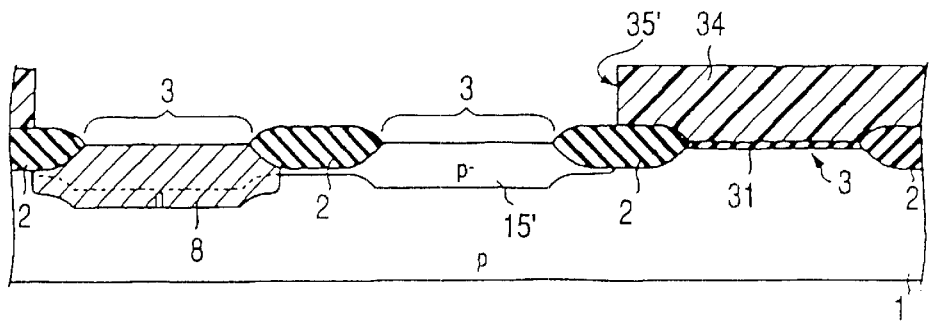
FIGS. 31(A) through 31(D) are sectional views showing a step of producing the fourth preferred embodiment of a semiconductor integrated circuit device according to the present invention.

Then, as shown in FIG. 31(A), subsequently using the photoresist film 34 as a mask without removing the photoresist film 34 from the substrate 1, the first gate oxide film 31 exposed to the holes 35' is removed. Thus, the surface of the substrate 1 (the n-type well 8 and the p⁻-type well 15') is exposed to the element regions 3 exposed to the holes 35'.

Figure 31B:
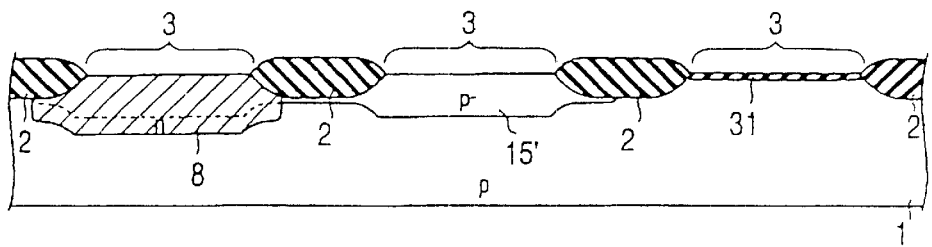

Then, as shown in FIG. 31(B), the photoresist film 34 is removed from the substrate 1.

Figure 31C:
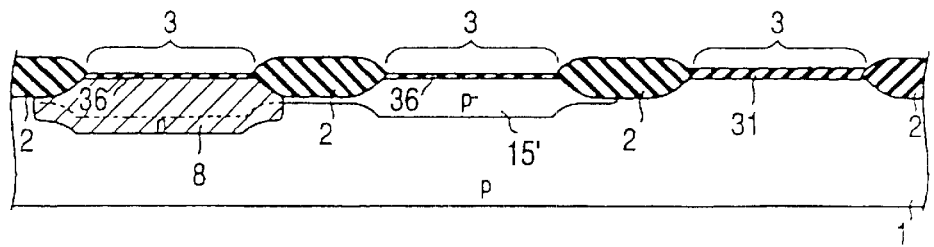

Then, as shown in FIG. 31(C), the surface of the substrate 1 exposed to the element regions 3, i.e., the surface of each of the n-type well 8 and the p-type well 15' in this preferred embodiment, is, e.g., thermally oxidized, to form a second gate oxide film 36 on the surfaces of the element regions 3. At this time, the first gate oxide film 31 is additionally thermally oxidized to increase the thickness thereof. Thus, the thick gate oxide film 31 is formed on the substrate 1, and the thin gate oxide film 36 is formed on the n-type well 8 and the p⁻-type well 15.

Figure 31D:
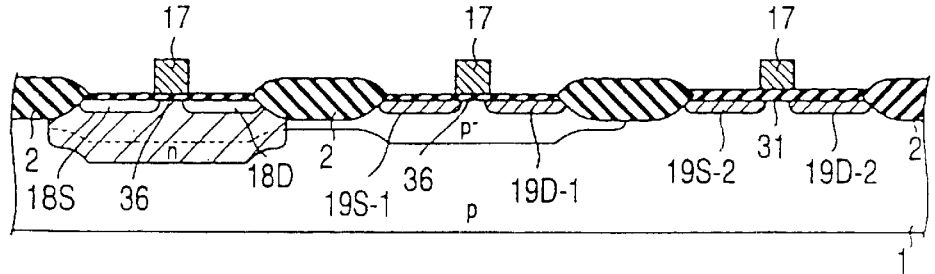

Then, as shown in FIGS. 31(D), a conductive film, which is used for forming a gate electrode of the transistor, e.g., a laminated film of a polycrystalline silicon and tungsten silicide film, is formed on the structure shown in FIG. 31(C). Then, the laminated film is patterned to form a gate electrode 17. Then, in accordance with a well-known method, a p-type impurity for forming a p-type source/drain is ion-implanted into the n-type well 8 to form a p-type source region 18S and a p-type drain region 18D. Then, in accordance with a well-known method, an n-type impurity for forming an n-type source/drain is ion-implanted into the substrate 1 and the p-type well 15' to form n-type source regions 19S-1, 19S-2 and n-type drain regions 19D-1, 19D-2.

Then, as shown in FIG. 28, an interlayer insulator film 20 of, e.g., a CVD oxide film, is formed on the structure shown in FIG. 31(D). Then, contact holes 21, which are communicated with the p-type source/drain regions 18S, 18D, and the n-type source/drain regions 19S-1, 19S-2, 19D-1, 19D-2, respectively, are formed in the interlayer insulator film 20. Then, a conductive film, which is used for forming wiring parts, e.g., an aluminum film, is formed. The aluminum film thus formed is patterned to form wiring parts 22.

By the above described producing method, the fourth preferred embodiment of a semiconductor integrated circuit device according to the present invention is completed.

In the above described semiconductor integrated circuit device, the first gate oxide film 31 is removed using the mask for forming the p-type well 15'. That is, the mask for forming the p-type well 15' can be in common with the mask for forming the thin gate oxide film 36. In this fourth preferred embodiment, the photoresist film 34 is the common mask.

In addition, the p⁻-type well 15' has the p-type impurity, by which the conductivity of the n-type 8 is not inverted. Moreover, the p-type well 15' is formed so as to extend from the interior of a region of the substrate 1, wherein the p⁻-type well 15' is formed, to the interior of the n-type well 8. Therefore, the holes 35' formed in the photoresist 34 for forming the p⁻type well 15' can also be formed above the n-type well 8.

Therefore, the thin gate oxide film 36 can be formed on both of the n-type well 8 and the p⁻-type well 15', not only on the p⁻-type well 15', without increasing the number of masks.

Therefore, according to the fourth preferred embodiment similar to the first through third preferred embodiments, there is an advantage in that it is possible to reduce the number of masks and the manufacturing costs in a semiconductor integrated circuit device having gate oxide films having different thickness.

Fifth Preferred Embodiment

Similar to the fourth preferred embodiment, this fifth preferred embodiment of the present invention is an example of a semiconductor integrated circuit device having gate oxide films having different thickness. The difference between the fourth and fifth preferred embodiments is that a p⁺-type well having a higher impurity density than that of a p⁻-type well is provided and a thin gate oxide film is formed on the p⁺-type well, an n-type well and the p⁻-type well.

Figure 33:
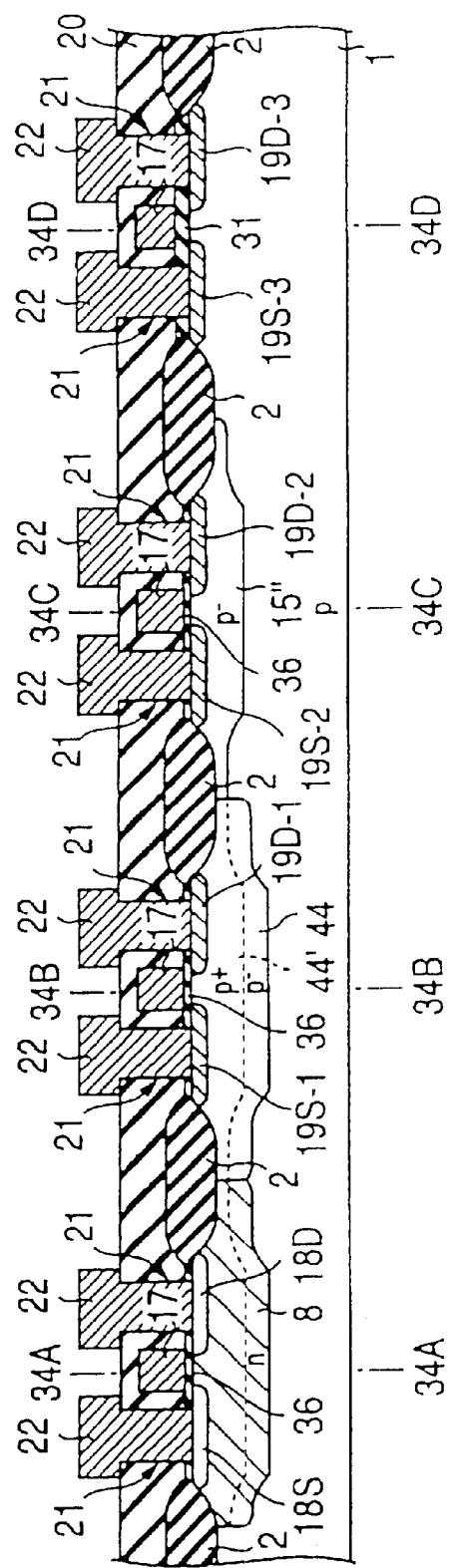
FIG. 33 is a sectional view of the fifth preferred embodiment of a semiconductor integrated circuit device according to the present invention.

FIG. 33 is a sectional view of the fifth preferred embodiment of a semiconductor integrated circuit device according to the present invention. FIG. 34 is a profile diagram showing the distribution of an impurity in a substrate, wherein FIG. 34(A) shows a profile along line 34A—34A in FIG. 33, FIG. 34(B) showing a profile along line 34B—34B in FIG. 33, and FIG. 34(C) showing a profile along line 34C—34C in FIG. 33.

The fifth preferred embodiment of a semiconductor integrated circuit device according to the present invention, along with a method for producing the same, will be described below.

FIGS. 35(A), 35(B) through FIGS. 38(A), 38(B) are sectional views showing principal steps of producing the fifth preferred embodiment of a semiconductor integrated circuit device according to the present invention.

Figure 35A:
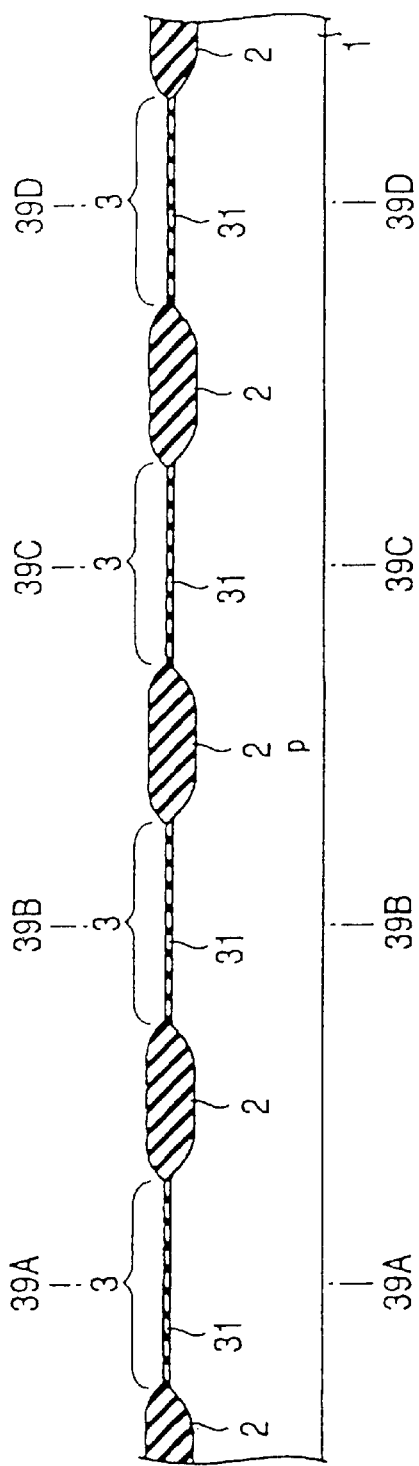
FIGS. 35(A) and 35(B) are sectional views showing a step of producing the fifth preferred embodiment of a semiconductor integrated circuit device according to the present invention.

First, as shown in FIG. 35(A), an element isolating region 2 is formed on the surface of a p-type silicon substrate 1 to define divided element regions 3. In this preferred embodiment, the element isolating region 2 is a LOCOS film formed by the LOCOS method. Then, the surface of the (silicon) substrate 1 exposed to the element regions 3 is, e.g., thermally oxidized, to form a first oxide film 31 on the surfaces of the element regions 3. FIGS. 39(A) through 39(D) show impurity profiles in the substrate 1 after the first oxide film 31 is formed. FIG. 39(A) shows a profile along line 39A—39A in FIG. 35(A), FIG. 39(B) showing a profile along line 39B—39B in FIG. 35(A), FIG. 39(C) showing a profile along line 39C—39C in FIG. 35(A), and FIG. 39(D) showing a profile along line 39D—39D in FIG. 35(A). As shown in FIGS. 39(A) through 39(D), after the first oxide film 31 is formed, the conductive impurities in the substrate 1 are only p-type impurities contained in the substrate 1.

Figure 35B:
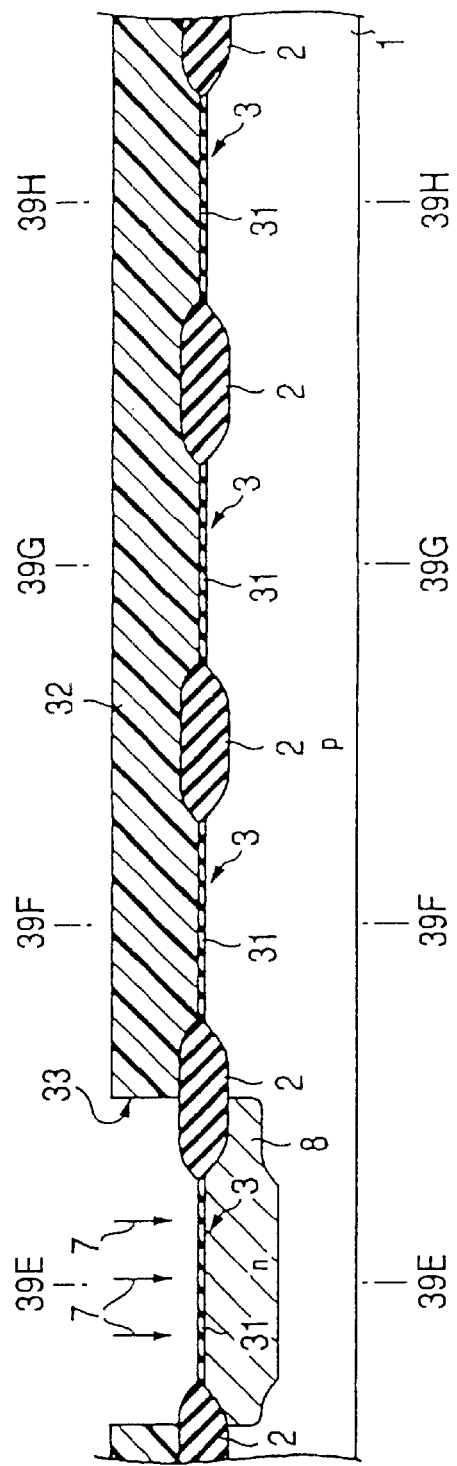

Then, as shown in FIG. 35(B), a photoresist is applied on the substrate 1 to form a photoresist film 32. Then, a hole 33 is formed in the photoresist film 32 by the photolithography method. In this preferred embodiment, the hole 33 is formed so as to correspond to a region wherein an n-type well is formed. Then, using the photoresist film 32 as a mask, an n-type impurity 7 is ion-implanted into the substrate 1. Thus, an n-type well 8 is formed. FIGS. 39(E) through 39(H) show impurity profiles in the substrate 1 after the n-type well 8 is formed. FIG. 39(E) shows a profile along line 39E—39E in FIG. 35(B), FIG. 39(F) showing a profile along line 39F—39F in FIG. 35(B), FIG. 39(G) showing a profile along line 39G—39G in FIG. 35(B), and FIG. 39(H) showing a profile along line 39H—39H in FIG. 35(B). As shown in FIGS. 39(E) through 39(H), the n-type impurity 7 is introduced so that the density thereof is higher than the density of the p-type impurity originally contained in the substrate 1, to form the n-type well 8 in the substrate 1. In addition, in this preferred embodiment, after the element isolating region 2 (LOCOS) is formed, the n-type impurity 7 for forming the n-type well 8 is ion-implanted. Therefore, similar to the first preferred embodiment, as can be particularly clearly seen from FIG. 35(B), the n-type well 8 below the element isolating region 2 (LOCOS) is shallower than portions below the element regions 3 in accordance with the shape of the cross section of the element isolating region 2.

Then, as shown in FIG. 36(A), after the photoresist film 32 is removed from the substrate 1, a photoresist is applied again to form a photoresist film 41. Then, a hole 42 is formed in the photoresist film 41 by the photolithography method. In this preferred embodiment, the hole 42 is formed so as to correspond to a region wherein a high density p⁺-type well connected to the substrate 1 is formed. Then, using the photoresist film 41 as a mask, a p-type impurity 43 is ion-implanted into the substrate 1. Thus, a low density p-type well 44 is first formed. The reason why the low density p⁻-type well 44 is first formed in the region wherein the high density p⁺-type well is formed, is that the high density p⁺-type well is formed by carrying out the ion implantation twice in this preferred embodiment as described later. FIGS. 40(A) through 40(D) show impurity profiles in the substrate 1 after the low density p-type well 44 is formed. FIG. 40(A) shows a profile along line 40A—40A in FIG. 36(A), FIG. 40(B) showing a profile along line 40B—40B in FIG. 36(A), FIG. 40(C) showing a profile along line 40C—40C in FIG. 36(A), and FIG. 40(D) showing a profile along line 40D—40D in FIG. 36(A). As shown in FIGS. 40(A) through 40(D), the p-type impurity 43 is introduced into the substrate 1 to form the p⁻-type well 44. In addition, in this preferred embodiment, after the element isolating region 2 (LOCOS) is formed, the p-type impurity 43 for forming the p⁻-type well 44 is ion-implanted. Therefore, as can be particularly clearly seen from FIG. 36(A), the p⁻-type well 44 below the element isolating region 2 (LOCOS) is shallower than portions below the element regions 3 in accordance with the shape of the cross section of the element isolating region 2.

Since the p⁻-type well 44 is formed by adding the p-type impurity to the originally p-type substrate 1, the density of the p-type impurity of the p⁻-type well 44 is higher than that of the substrate 1.

Then, as shown in FIG. 36(B), after the photoresist film 41 is removed from the substrate 1, a photoresist is applied again to form a photoresist film 34. Then, holes 35" are formed in the photoresist film 34 by the photolithography method. In this preferred embodiment, the holes 35" are formed so as to correspond to a region wherein the low density p⁻-type well connected to the substrate 1 is formed, a region wherein the n-type well 8 is formed, and a region wherein the p⁻-type well 44 is formed, respectively. Then, using the photoresist film 34 as a mask, a p-type impurity 14 is ion-implanted into the substrate 1. Thus, a p⁻-type well 15" connected to the substrate 1 is formed. FIGS. 40(E) through 40(E) show impurity profiles in the substrate 1 after the p-⁻type well 15" is formed. FIG. 40(E) shows a profile along line 40E—40E in FIG. 36(B), FIG. 40(F) showing a profile along line 40F—40F in FIG. 36(B), FIG. 40(G) showing a profile along line 40G—40G in FIG. 36(B), and FIG. 40(H) showing a profile along line 40H—40H in FIG. 36(B). As shown in FIGS. 40(E) through 40(H), the p-type impurity 14 is introduced so as to have a lower density than the density of the n-type impurity contained in the n-type well 8. Thus, the p⁻-type well 15" is formed so as to extend from the interior of the substrate 1 to the interior of the n-type well 8. Moreover, the p⁻-well 15" is also formed in the p⁻-type well 44. Thus, the impurity density of the p⁻-type well 44 increases because the p-type impurity 14 is additionally introduced into the p⁻-type well 44. The reference sign "p⁺" is applied to the density increased portion, which is called a p⁺-type well 44'.

In addition, in this preferred embodiment, after the element isolating region 2 (LOCOS) is formed, the p-type impurity 14 for forming the p-type well 15", is ion-implanted. Therefore, as can be particularly clearly seen from FIG. 36(B), the p-type well 15" below the element isolating region 2 (LOCOS) is shallower than portions below the element regions 3 in accordance with the shape of the cross section of the element isolating region 2.

Since the p⁻-type well 15" is formed by adding the p-type impurity to the originally p-type substrate 1, the density of the p-type impurity of the p⁻-type well 15", is higher than that of the substrate 1.

Although the p⁻-type well 15" is also formed in the n-type well 8, the p-type impurity 14 is introduced so as to have a lower density than the density of the n-type impurity contained in the n-type well 8 as described above. Therefore, even if the p⁻-type well 15" is formed in the n-type well 8, the n-type well 8 exhibits a n-type conductivity similar to the fourth preferred embodiment.

Figure 37A:
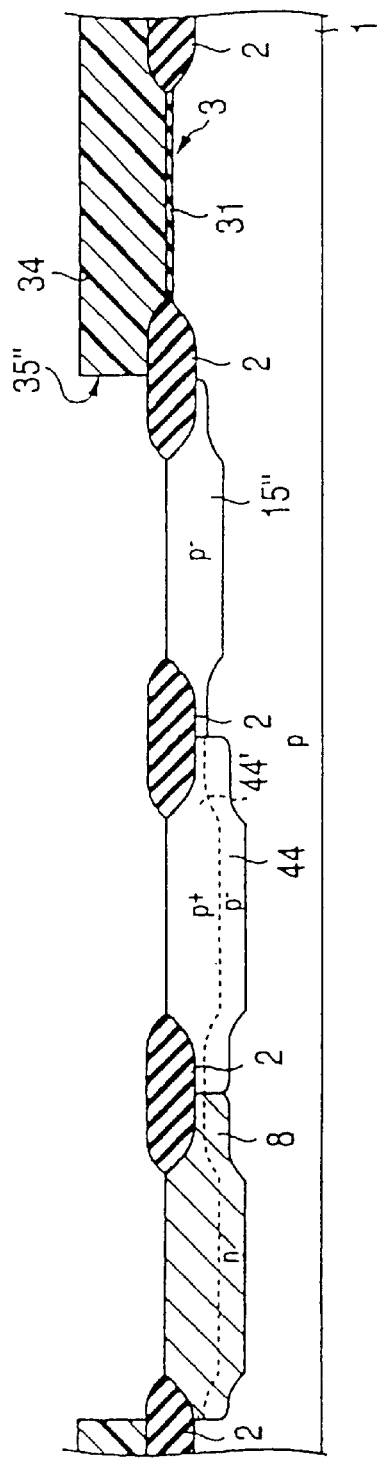
FIGS. 37(A) and 37(B) are sectional views showing a step of producing the fifth preferred embodiment of a semiconductor integrated circuit device according to the present invention.

Then, as shown in FIG. 37(A), subsequently using the photoresist film 34 as a mask without removing the photoresist film 34 from the substrate 1, the first gate oxide film 31 exposed to the holes 35" is removed. Thus, the surface of the substrate 1 (the n-type well 8, the p⁺-type well 44' and the p-type well 15" in this preferred embodiment) is exposed to the element regions 3 exposed to the holes 35".

Figure 37B:
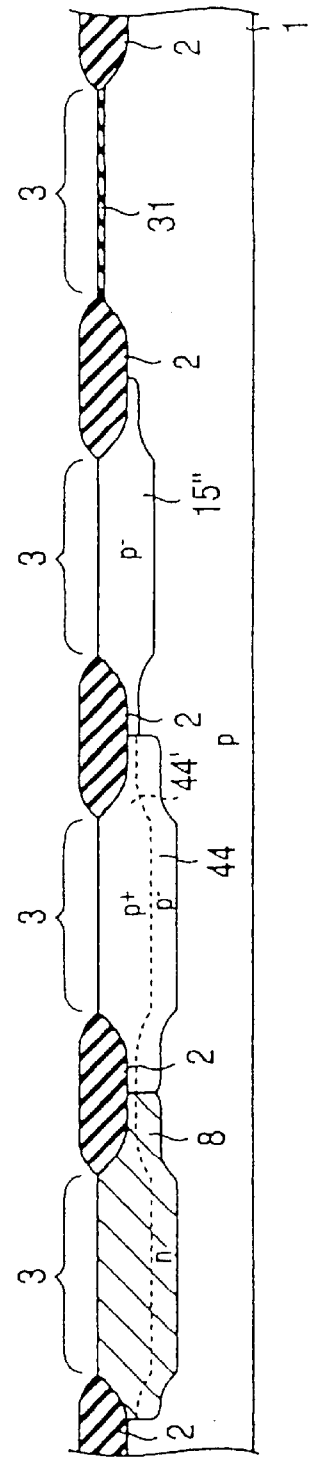

Then, as shown in FIG. 37(B), the photoresist film 34 is removed from the substrate 1.

Figure 38A:
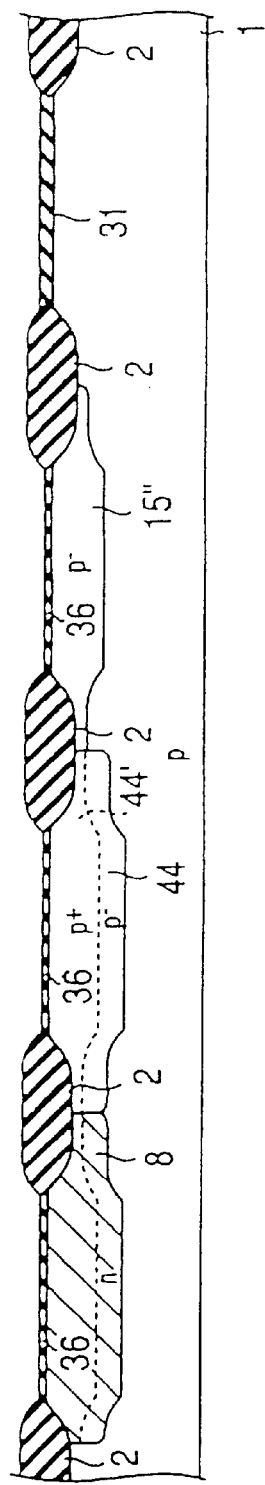
FIGS. 38(A) and 38(B) are sectional views showing a step of producing the fifth preferred embodiment of a semiconductor integrated circuit device according to the present invention.

Then, as shown in FIG. 38(A), the surface of the substrate 1 exposed to the element regions 3 (the surface of each of the n-type well 8, the p⁺-type well 44' and the p-type well 15" in this preferred embodiment) is, e.g., thermally oxidized, to form a second gate oxide film 36 on the surfaces of the element regions 3. At this time, the first gate oxide film 31 is additionally thermally oxidized to increase the thickness thereof. Thus, the thick gate oxide film 31 is formed on the substrate 1. In addition, the thin gate oxide film 36 is formed on the n-type well 8, the p⁺-type well 44' and the p-type well 15".

Figure 38B:
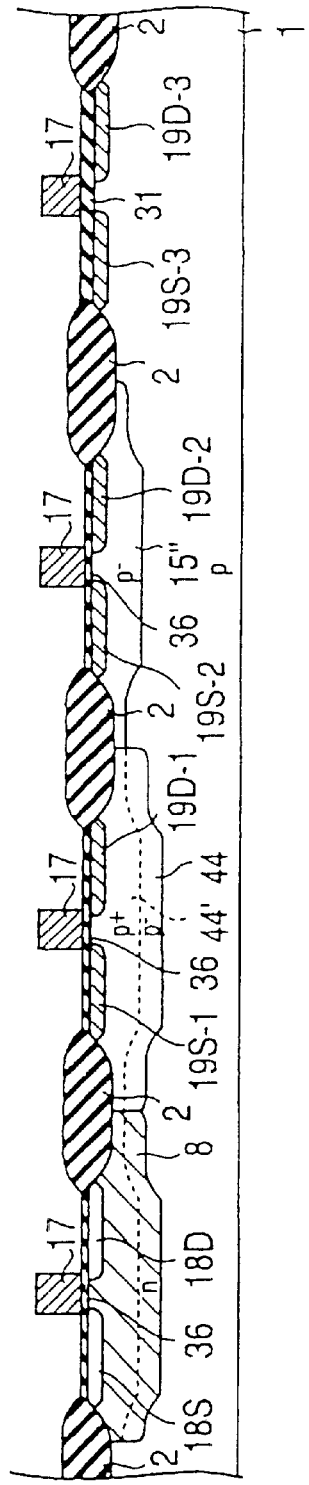

Then, as shown in FIG. 38(B), a conductive film, which is used for forming a gate electrode of the transistor, e.g., a laminated film of a polycrystalline silicon and tungsten silicide film, is formed on the structure shown in FIG. 38(A). Then, the laminated film is patterned to form a gate electrode 17. Then, in accordance with a well-known method, a p-type impurity for forming a p-type source/drain is ion-implanted into the n-type well 8 to form a p-type source region 18S and a p-type drain region 18D. Then, in accordance with a well-known method, an n-type impurity for forming an n-type source/drain is ion-implanted into the substrate 1, the p⁺-type well 44' and the p⁻-type well 15' to form n-type source regions 19S-1 through 19S-3 and n-type drain regions 19D-1 though 19D-3.

Then, as shown in FIG. 33, an interlayer insulator film 20 of, e.g., a CVD oxide film, is formed on the structure shown in FIG. 38(B). Then, contact holes 21, which are communicated with the p-type source/drain regions 18S, 18D and the n-type source/drain regions 19S-1 through 19S-3 and 19D-1 through 19D-3, respectively, are formed in the interlayer insulator film 20. Then, a conductive film, which is used for forming wiring parts, e.g., an aluminum film, is formed. The aluminum film thus formed is patterned to form wiring parts 22.

By the above described producing method, the fifth preferred embodiment of a semiconductor integrated circuit device according to the present invention is completed.

In the above described semiconductor integrated circuit device, the first gate oxide film 31 is removed using the mask for forming the p⁻-type well 15". That is, the mask for forming the p⁻-type well 15", can be in common with the mask for forming the thin gate oxide film 36. In this fifth preferred embodiment, the photoresist film 34 is the common mask.

In addition, similar to the fourth preferred embodiment, the p⁻-type well 15", has the p-type impurity, by which the conductivity of the n-type 8 is not inverted. This p⁻-type well 15" is formed so as to extend from the interior of a region of the substrate 1, wherein the p⁻-type well 15" is formed, to the interior of the n-type well 8 and further to the p⁻-type well 44. Since the p-type impurity 14 constituting the p⁻-type well 15" is additionally introduced into the p⁻-type well 44, the impurity density of the p⁻-type well 44 increases, so that the p⁻-type well 44 is converted into the p⁺-type well 44'. Consequently, the p⁻-type well 15", and the p⁺-type well 44' having a higher impurity density than that of the p⁻-type well 15" are formed in the substrate 1.

Thus, the holes 35" formed in the photoresist 34 for forming the p⁻-type well 15" can also be formed above the n-type well 8 and the p⁻-type well 44. Therefore, the thin gate oxide film 36 can be formed on all of the n-type well 8, the high impurity density p⁺-type well 44, and the p⁻-type well 15" without increasing the number of masks.

Therefore, according to the fifth preferred embodiment similar to the first through fourth preferred embodiments, there is an advantage in that it is possible to reduce the number of masks and the manufacturing costs in a semiconductor integrated circuit device having gate oxide films having different thickness.

Furthermore, in the fifth preferred embodiment, while the holes 35" formed in the photoresist film 34 for forming the p⁻-type well 15" have been also arranged above the n-type well 8, the holes 35" may be arranged only above the region wherein the p⁻-type well 15" is formed and the region wherein the high density p⁺-type well 44' is formed.

Sixth Preferred Embodiment

This sixth preferred embodiment is an example of a semiconductor integrated circuit device having the same gate oxide films and the same well structures as those in the fifth preferred embodiment. The difference between the fifth and sixth preferred embodiments is that the element isolating region is a shallow trench isolation (STI).

FIG. 41 shows the sixth preferred embodiment of a semiconductor integrated circuit device according to the present invention, wherein FIG. 41(A) is a plan view thereof, FIG. 41(B) being a sectional view taken along line 41B—41B in FIG. 41(A), and FIG. 41(C) being a sectional view taken along line 41C—41C in FIG. 41(A). FIG. 42 is a profile diagram showing the distribution of an impurity in a substrate, wherein FIG. 42(A) shows a profile along line 42A—42A in FIG. 41(B), FIG. 42(B) showing a profile along line 42B—42B in FIG. 41(B), FIG. 42(C) showing a profile along line 42C—42C in FIG. 41(B), and FIG. 42(D) showing a profile along line 42D—42D in FIG. 41(B).

The sixth preferred embodiment of a semiconductor integrated circuit device according to the present invention, along with a method for producing the same, will be described below.

FIGS. 43 through 53 show principal steps of producing the sixth preferred embodiment of a semiconductor integrated circuit device according to the present invention. In FIGS. 43 through 53, (A) is a plan view, (B) being a sectional view taken along line B—B in (A), and (C) being a sectional view taken along line C—C in (A).

First, as shown in FIGS. 43(A) through 43(C), the surface of a p-type silicon substrate 1 is, e.g., thermally oxidized, to form a first oxide film 31 on the surface of the substrate 1. Then, a photoresist is applied on the first gate oxide film 31 to form a photoresist film 32. Then, a hole 33 is formed in the photoresist film 32 by the photolithography method. In this preferred embodiment, the hole 33 is formed so as to correspond to a region wherein an n-type well is formed. Then, using the photoresist film 32 as a mask, an n-type impurity 7 is ion-implanted into the substrate 1. Thus, an n-type well 8 is formed. FIGS. 54(A) through 54(D) show impurity profiles after the n-type impurity 7 for forming the n-type well 8 is introduced into the substrate 1. FIG. 54(A) shows a profile along line 54A—54A in FIG. 43(B), FIG. 54(B) showing a profile along line 54B—54B in FIG. 43(B), FIG. 54(C) showing a profile along line 54C—54C in FIG. 43(B), and FIG. 54(D) showing a profile along line 54D—54D in FIG. 43(B). As shown in FIGS. 54(A) through 54(D), the n-type impurity 7 for forming the n-type well 8 is introduced so that the density thereof is higher than the density of the p-type impurity originally contained in the substrate 1.

Then, as shown in FIGS. 44(A) through 44(C), after the photoresist film 32 is removed from the substrate 1, a photoresist is applied again to form a photoresist film 41. Then, a hole 42 is formed in the photoresist film 41 by the photolithography method. In this preferred embodiment, the hole 42 is formed so as to correspond to a region wherein a high density p⁺-type well connected to the substrate 1 is formed. Then, using the photoresist film 41 as a mask, a p-type impurity 43 is ion-implanted into the substrate 1. Thus, a low density p⁻-type well 44 is first formed. The reason why the low density p⁻-type well 44 is first formed in the region wherein the high density p⁺-type well is formed, is that the high density p⁺-type well is formed by carrying out the ion implantation twice in this preferred embodiment as described later. FIGS. 54(E) through 54(H) show impurity profiles after the low density p⁻-type well 44 is formed. FIG. 54(E) shows a profile along line 54E—54E in FIG. 44(B), FIG. 54(F) showing a profile along line 54F—54F in FIG. 44(B), FIG. 54(G) showing a profile along line 54G—54G in FIG. 44(B), and FIG. 54(H) showing a profile along line 54H—54H in FIG. 44(B). As shown in FIGS. 54(E) through 54(H), the p-type impurity 43 is introduced into the substrate 1 to form the p⁻-type well 44 in the substrate 1. Since the p⁻-type well 44 is formed by adding the p-type impurity to the originally p-type substrate 1, the density of the p-type impurity of the p⁻-type well 44 is higher than that of the substrate 1.

Then, as shown in FIGS. 45(A) through 45(C), after the photoresist film 41 is removed from the substrate 1, a photoresist is applied again to form a photoresist film 34. Then, holes 35" are formed in the photoresist film 34 by the photolithography method. In this preferred embodiment, the holes 35" are formed so as to correspond to a region wherein the low density p⁻-type well connected to the substrate 1 is formed, a region wherein the n-type well 8 is formed, and a region wherein the p⁻-type well 44 is formed, respectively. Then, using the photoresist film 34 as a mask, a p-type impurity 14 is ion-implanted into the substrate 1. Thus, a p⁻-type well 15" connected to the substrate 1 is formed. FIGS. 54(I) through 54(L) show impurity profiles after the p⁻type well 15" is formed. FIG. 54(I) shows a profile along line 54I—54I in FIG. 45(B), FIG. 54(J) showing a profile along line 54J—54J in FIG. 45(B), FIG. 54(K) showing a profile along line 54K—54K in FIG. 45(B), and FIG. 54(L) showing a profile along line 54L—54L in FIG. 45(B). As shown in FIGS. 54(I) through 54(L), the p-type impurity 14 is introduced so as to have a lower density than the density of the n-type impurity contained in the n-type well 8. Thus, the p⁻-type well 15" is formed so as to extend from the interior of the substrate 1 to the interior of the n-type well 8. Moreover, the p⁻-well 15" is also formed in the p⁻-type well 44. Thus, the impurity density of the p⁻-type well 44 increases because the p-type impurity 14 is additionally introduced into the p-type well 44. The reference sign "p⁺" is applied to the density increased portion, which is called a p⁺-type well 44'.

In addition, since the p-type well 15" is formed by adding the p-type impurity to the originally p-type substrate 1, the density of the p-type impurity of the p⁻-type well 15", is higher than that of the substrate 1.

Moreover, although the p⁻-type well 15" is also formed in the n-type well 8, the p-type impurity 14 is introduced so as to have a lower density than the density of the n-type impurity contained in the n-type well 8 as described above. Therefore, even if the p⁻-type well 15", is formed in the n-type well 8, the n-type well 8 exhibits a n-type conductivity, similar to the fourth and fifth preferred embodiments.

Then, as shown in FIGS. 46(A) through 46(C), subsequently using the photoresist film 34 as a mask without removing the photoresist film 34 from the substrate 1, the first gate oxide film 31 exposed to the holes 35" is removed. Thus, the surface of the substrate 1 (the n-type well 8, the p⁺-type well 44' and the p⁻-type well 15" in this preferred embodiment) is exposed to the holes 35".

Then, as shown in FIGS. 47(A) through 47(C), the photoresist film 34 is removed from the substrate 1.

Figure 48A:
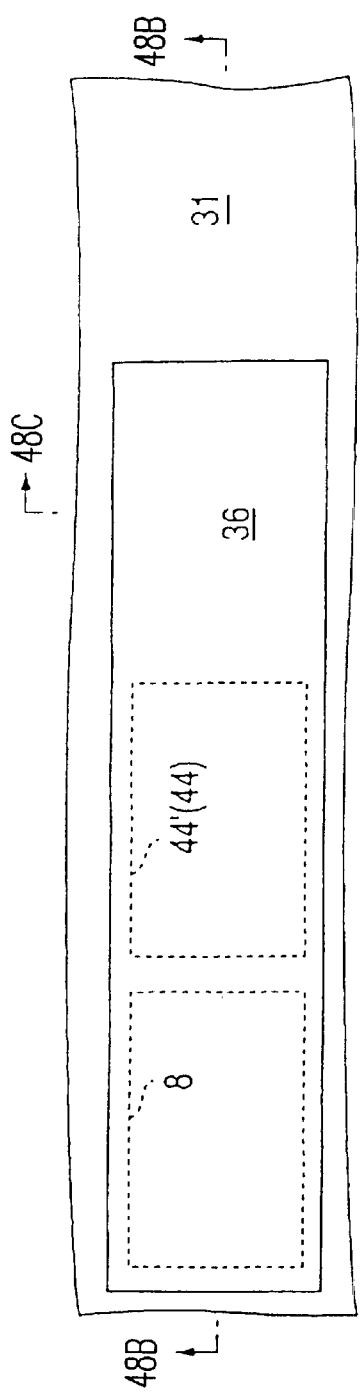
FIG. 48(A) is a plan view showing a step of producing the sixth preferred embodiment of a semiconductor integrated circuit device according to the present invention.
Figure 48B:
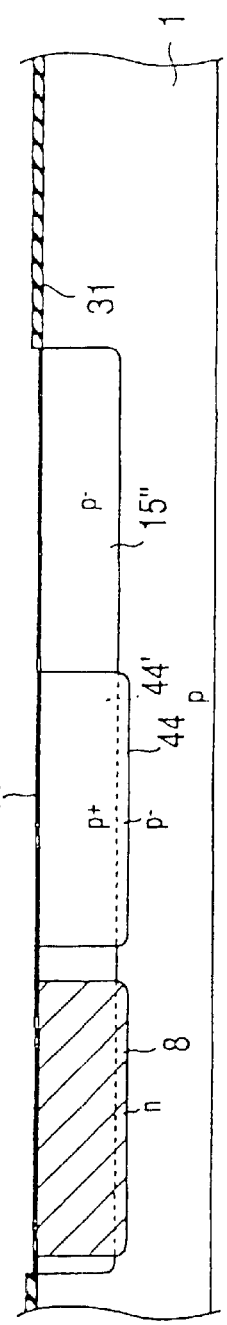
FIGS. 48(B) and 48(C) are sectional views thereof.
Figure 48C:
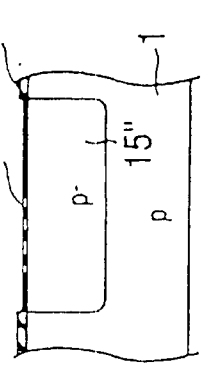

Then, as shown in FIGS. 48(A) through 48(C), the surface of the substrate 1 is, e.g., thermally oxidized, to form a second gate oxide film 36 thereon. In this preferred embodiment, the second gate oxide film 36 is formed on the surfaces of the n-type well 8, the p⁺-type well 44' and the p-type well 15". At this time, the first gate oxide film 31 is additionally thermally oxidized to increase the thickness thereof. Thus, the thick gate oxide film 31 is formed on the substrate 1. In addition, the thin gate oxide film 36 is formed on the n-type well 8, the p⁺-type well 44' and the p⁻-type well 15".

Then, as shown in FIGS. 49(A) through 49(C), a conductive polycrystalline silicon, and, e.g., silicon nitride, are sequentially deposited on the structure shown in FIGS. 48(A) through 48(C) to form a conductive silicon film 51 and a silicon nitride film 52.

Then, as shown in FIG. 50(A) through 50(C), the silicon nitride film 52 is patterned so as to correspond to the pattern of element regions 3. Then, using the patterned silicon nitride film 52 as a mask, the conductive polycrystalline film 51 and the substrate 1 are sequentially etched to form a groove 53 which has a shape corresponding to the pattern of the element isolating region. Thus, island element regions 3 projecting from the substrate 1 are obtained.

Then, as shown in FIGS. 51(A) through 51(C), an insulator film, which is used as an element isolating region, e.g., silicon dioxide, is deposited on the structure shown in FIGS. 50(A) through 50(C), to form a silicon dioxide film. Then, the silicon dioxide film is recessed by the etch back method using the silicon nitride film 52 as a stopper, or by the chemical mechanical polishing (CMP) method, to embed the silicon dioxide film into the groove 53. Thus, an STI type element isolating region 54 is formed.

Furthermore, while the sidewall (51SIDE) of the conductive polycrystalline silicon film 51 has been exposed in this preferred embodiment, it is not always required to expose this side wall.

Then, as shown in FIGS. 52(A) through 52(C), a conductive film serving as a gate electrode of a transistor, e.g., a conductive polycrystalline silicon film 55, is formed on the structure shown in FIGS. 51(A) through 51(C). This conductive polycrystalline silicon film 55 is electrically connected to the conductive polycrystalline silicon film 51 to form a laminated film with the conductive polycrystalline silicon film 51.

Then, as shown in FIGS. 53(A) through 53(C), the laminated film of the polycrystalline silicon films 51 and 53 is patterned to form a gate electrode 17. Then, in accordance with a well-known method, a p-type impurity for forming a p-type source/drain is ion-implanted into the n-type well 8 to form a p-type source region 18S and a p-type drain region 18D. Then, in accordance with a well-known method, an n-type impurity for forming an n-type source/drain is ion-implanted into the substrate 1, the p⁺-type well 44' and the p⁻-type well 15" to form n-type source regions 19S-1 through 19S-3 and n-type drain regions 19D-1 though 19D-3.

Then, as shown in FIGS. 41(A) through 41(C), an interlayer insulator film 20 of, e.g., a CVD oxide film, is formed on the structure shown in FIGS. 53(A) through 53(C). Then, contact holes 21, which are communicated with the p-type source/drain regions 18S, 18D and the n-type source/drain regions 19S-1 through 19S-3 and 19D-1 through 19D-3, respectively, are formed in the interlayer insulator film 20. Then, a conductive film, which is used for forming wiring parts, e.g., an aluminum film, is formed. The aluminum film thus formed is patterned to form wiring parts 22.

By the above described producing method, the sixth preferred embodiment of a semiconductor integrated circuit device according to the present invention is completed.

In the above described semiconductor integrated circuit device, the first gate oxide film 31 is removed using the mask for forming the p⁻-type well 15", similar to the fifth preferred embodiment. That is, the mask for forming the p⁻-type well 15" can be in common with the mask for forming the thin gate oxide film 36.

In addition, similar to the fifth preferred embodiment, the p⁻-type well 15" has the p-type impurity, by which the conductivity of the n-type 8 is not inverted. This p⁻-type well 15", is formed so as to extend from the interior of a region of the substrate 1, wherein the p⁻-type well 15", is formed, to the interior of the n-type well 8 and further to the p⁻-type well 44. Since the p-type impurity 14 constituting the p⁻-type well 15" is additionally introduced into the p⁻-type well 44, the impurity density of the p⁻-type well 44 increases, so that the p⁻-type well 44 is converted into the p⁺-type well 44'. Consequently, the p⁻-type well 15", and the p⁺-type well 44', having a higher impurity density than that of the p⁻-type well 15" are formed in the substrate 1.

Thus, the holes 35" formed in the photoresist 34 for forming the p⁻-type well 15" can also be formed above the n-type well 8 and the p⁻-type well 44. Therefore, the thin gate oxide film 36 can be formed on all of the n-type well 8, the high impurity density p⁺-type well 44' and the p⁻type well 15" without increasing the number of masks.

Therefore, according to the sixth preferred embodiment similar to the first through fifth preferred embodiments, there is an advantage in that it is possible to reduce the number of masks and the manufacturing costs in a semiconductor integrated circuit device having gate oxide films having different thickness.

Furthermore, in the sixth preferred embodiment, while the holes 35" formed in the photoresist film 34 for forming the p⁻-type well 15" have been also arranged above the n-type well 8, the holes 35" may be arranged only above the region wherein the p-type well 15" is formed and the region wherein the high density p⁺-type well 44' is formed.

In addition, the STI type element isolating region 54 described in the sixth preferred embodiment may be applied to any one of the first through fourth preferred embodiments.

Seventh Preferred Embodiment

As described above, the third to sixth embodiments show how to obtain two kinds of oxide films having different thickness. It is also possible to obtain such different thickness oxide films by different processes. That is, in FIGS. 26(C), 30(C), 36(B) and 45(C), instead of removing one kind of oxide film, the manufacturer can implant nitrogen ions into one kind of oxide film and the substrate to reduce the speed of oxide film growth. After this, growth of additional oxide by thermal oxidation grows two kinds of oxide films having different thickness, as is illustrated in FIGS. 27(C), 31(C), 38(A) and 48(B).

This seventh preferred embodiment is an example of a semiconductor integrated circuit device having different gate oxide films similar to the third through sixth preferred embodiment and having a well pn-separated from a substrate 1 similar to the first and second preferred embodiment. Furthermore, an shallow trench isolation (STI) is used as an element isolating region.

FIGS. 55(A) through 55(C) show the seventh preferred embodiment of a semiconductor integrated circuit device according to the present invention, wherein FIG. 55(A) is a plan view thereof, FIG. 55(B) being a sectional view taken along line 55B—55B in FIG. 55(A), and FIG. 55(C) being a sectional view taken along line 55C—55C in FIG. 55(A). FIGS. 56(A) through 56(E) are profile diagrams showing the distribution of an impurity in a substrate, wherein FIG. 56(A) shows a profile along line 56A—56A in FIG. 55(B), FIG. 56(B) showing a profile along line 56B—56B in FIG. 55(B), FIG. 56(C) showing a profile along line 56C—56C in FIG. 55(B), FIG. 56(D) showing a profile along line 56D—56D in FIG. 55(B), and FIG. 55(E) showing a profile along line 56E—56E in FIG. 55(B).

The seventh preferred embodiment of a semiconductor integrated circuit device according to the present invention, along with a method for producing the same, will be described below.

FIGS. 57 through 68 show principal steps of producing the seventh preferred embodiment of a semiconductor integrated circuit device according to the present invention. In FIGS. 57 through 68, (A) is a plan view, (B) being a sectional view taken along line B—B in (A), and (C) being a sectional view taken along line C—C in (A).

First, as shown in FIGS. 57(A) through 57(C), the surface of a p-type silicon substrate 1 is, e.g., thermally oxidized, to form a first oxide film 31 on the surface of the substrate 1. Then, a photoresist is applied on the first gate oxide film 31 to form a photoresist film 5. Then, holes 6a, 6b are formed in the photoresist film 5 by the photolithography method. In this preferred embodiment, the hole 6a is formed so as to correspond to a region wherein an n-type well is formed, and the hole 6b is formed so as to surround a region wherein a p⁻-type well separated from the substrate 1 is formed. Then, using the photoresist film 5 as a mask, an n-type impurity 7 is ion-implanted into the substrate 1. Thus, the n-type impurity for forming an n-type well 8-1, and an n-type well 8-2 surrounding a region, in which the p⁻-type well separated from the substrate 1 is formed, is introduced into the substrate 1. FIGS. 69(A) through 69(E) show impurity profiles after the n-type impurity 7 for forming the n-type wells 8-1, 8-2 is introduced into the substrate 1. FIG. 69(A) shows a profile along line 69A—69A in FIG. 57(B), FIG. 69(B) showing a profile along line 69B—69B in FIG. 57(B), FIG. 69(C) showing a profile along line 69C—69C in FIG. 57(B), FIG. 69(D) showing a profile along line 69D—69D in FIG. 57(B), and FIG. 69(E) showing a profile along line 69E—69E in FIG. 57(B). As shown in FIGS. 69(A) through 69(E), the n-type impurity 7 for forming the n-type wells 8-1, 8-2 is introduced so that the density thereof is higher than the density of the p-type impurity originally contained in the substrate 1.

Then, as shown in FIGS. 58(A) through 58(C), after the photoresist film 5 is removed from the substrate 1, a photoresist is applied again to form a photoresist film 41. Then, a hole 42 is formed in the photoresist film 41 by the photolithography method. In this preferred embodiment, the hole 42 is formed so as to correspond to a region wherein a high density p⁺-type well connected to the substrate 1 is formed. Then, using the photoresist film 41 as a mask, a p-type impurity 43 is ion-implanted into the substrate 1. Thus, a low density p⁻-type well 44 is first formed. The reason why the low density p⁻-type well 44 is first formed in the region wherein the high density p⁺type well is formed, is that the high density p⁺-type well is formed by carrying out the ion implantation twice in this preferred embodiment as described later. FIGS. 69(F) through 69(J) show impurity profiles after the low density p⁻-type well 44 is formed. FIG. 69(F) showing a profile along line 69F—69F in FIG. 58(B), FIG. 69(G) showing a profile along line 69G—69G in FIG. 58(B), FIG. 69(H) showing a profile along line 69H—69H in FIG. 58(B), FIG. 69(I) showing a profile along line 69I—69I in FIG. 58(B), and FIG. 69(J) shows a profile along line 69J—69J in FIG. 58(B). As shown in FIGS. 69(F) through 69(J), the p-type impurity 43 is introduced into the substrate 1 to form the p⁻-type well 44 in the substrate 1. Since the p⁻-type well 44 is formed by adding the p-type impurity to the originally p-type substrate 1, the density of the p-type impurity of the p⁻-type well 44 is higher than that of the substrate 1.

Figures 59A, 59B, 59C:
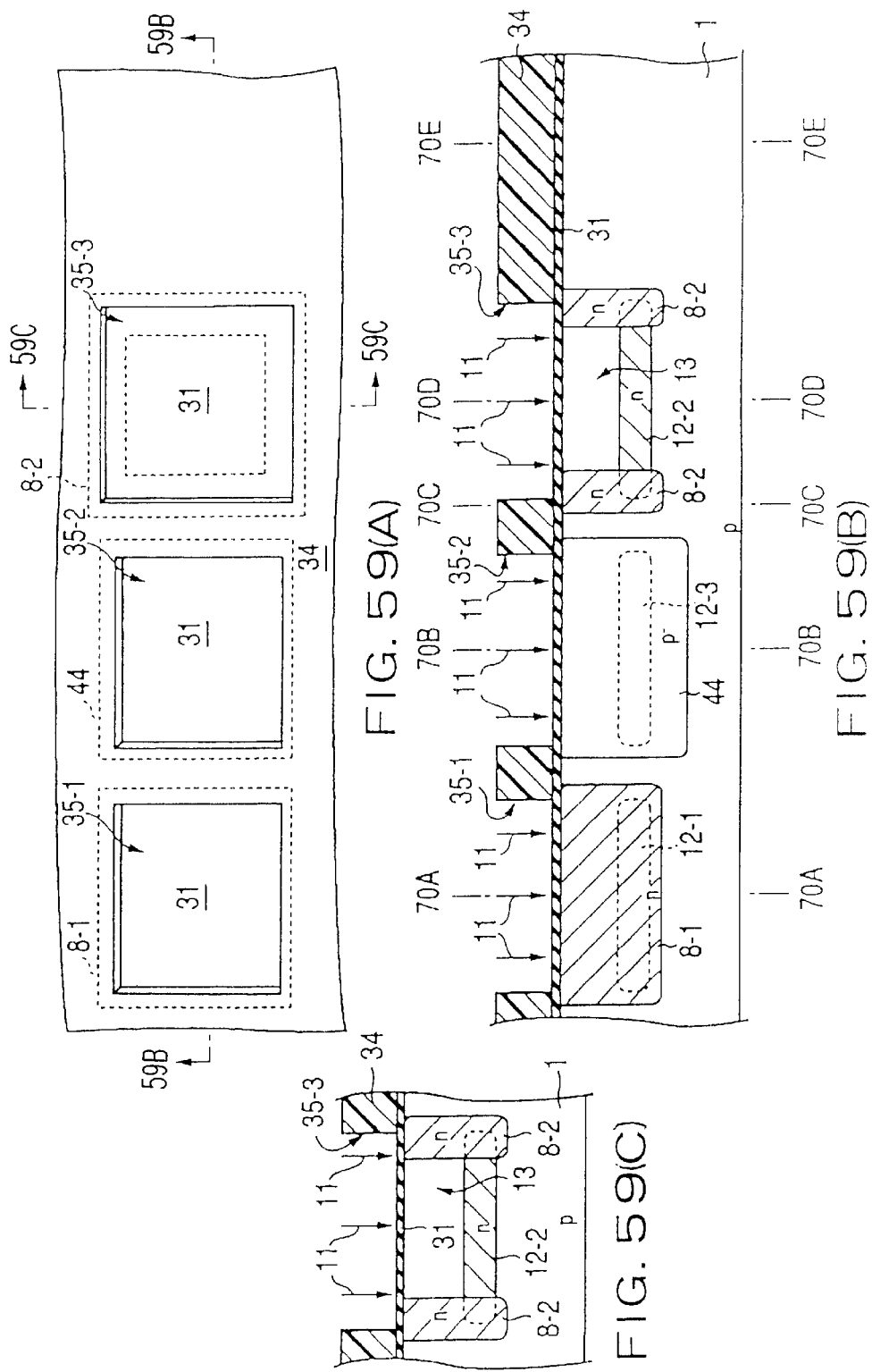
FIG. 59(A) is a plan view showing a step of producing the seventh preferred embodiment of a semiconductor integrated circuit device according to the present invention.
FIGS. 59(B) and 59(C) are sectional views thereof.

Then, as shown in FIGS. 59(A) through 59(C), after the photoresist film 41 is removed from the substrate 1, a photoresist is applied again to form a photoresist film 34 Then, holes 35-1, 35-2, 35-3 are formed in the photoresist film 34 by the photolithography method. In this preferred embodiment, the hole 35-1 is formed so as to correspond to a region a region wherein the n-type well 8 is formed, the hole 35-2 is formed so as to correspond to a region wherein the p⁻-type well 44 is formed, and the hole 35-3 is formed so as to correspond to a region wherein a p⁻-type well pn-separated from the substrate 1 is formed, respectively. Then, using the photoresist film 34 as a mask, an n-type impurity 11 is ion-implanted into the substrate 1. FIGS. 70(A) through 70(E) show impurity profiles after the n-type impurity 11 is introduced into the substrate 1. FIG. 70(A) shows a profile along line 70A—70A in FIG. 59(B), FIG. 70(B) showing a profile along line 70B—70B in FIG. 59(B), FIG. 70(C) showing a profile along line 70C—70C in FIG. 59(B), FIG. 70(D) showing a profile along line 70D—70D in FIG. 59(B), and FIG. 70(E) showing a profile along line 70E—70E in FIG. 59(B). As shown in FIGS. 70(A) through 70(E), the n-type impurity 11 is introduced so that the density thereof is higher than the density of the p-type impurity originally contained in the substrate 1, to form an embedded n-type well 12-2 in the substrate 1. Thus, a region 13 pn-separated from the substrate 1 by the n-type well 8-2 and the embedded n-type well 12-2 is formed in the substrate 1. In addition, in this preferred embodiment, the n-type impurity 11 is introduced so as to have a lower density than the density of the p-type impurity contained in the p⁻-type well 44. Therefore, an embedded well 12-3 formed in the p⁻-type well 44 has a p-type conductivity. In addition, the n-type impurity 11 serves to add the n-type impurity to the n-type wells 8-1, 8-2. Therefore, an embedded well 12-1 formed in the n-type well 8-1 is a region having a high density of n-type impurity.

Then, as shown in FIGS. 60(A) through 60(C), subsequently using the photoresist film 34 as a mask without removing the photoresist film 34, a p-type impurity 14 is ion-implanted into the substrate 1. FIGS. 70(F) through 70(J) show impurity profiles after the p-type impurity 14 is introduced into the substrate 1. FIG. 70(F) shows a profile along line 70F—70F in FIG. 60(B), FIG. 70(G) showing a profile along line 70G—70G in FIG. 60(B), FIG. 70(H) showing a profile along line 70H—70H in FIG. 60(B), FIG. 70(I) showing a profile along line 70I—70I in FIG. 60(B), and FIG. 70(J) showing a profile along line 70J—70J in FIG. 60(B). As shown in FIGS. 70(F) through 70(J), the n-type impurity 14 is introduced so that the density thereof is higher than those of the n-type impurities contained in the n-type wells 8-1 and 8-2. Thus, a well 15-1 formed in the n-type well 8-1 exhibits an n-type conductivity. In addition, a part of the n-well 8-1, wherein the well 15-1 is formed, serves as a well 8'-1 wherein the density of effective n-type impurity decreases. In addition, a well 15-3 is formed in the $p^-$-type well 44 by additionally introducing a p-type impurity into the $p^-$-type well 44. Therefore, a part of the $p^-$-type well 44, wherein the well 15-3 is formed, is a high density $p^+$-type well 44'. Moreover, a well 15-2 is formed in the p-type substrate 1 by additionally introducing a p-type impurity into the substrate 1. Therefore, the $p^-$-type well 15-2 is formed in the region 13.

Figure 61A:
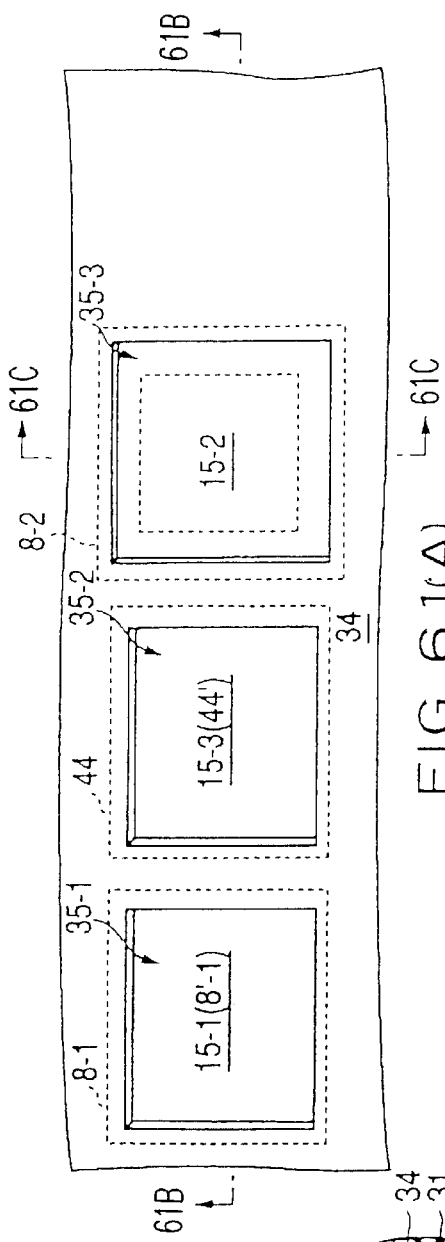
FIG. 61(A) is a plan view showing a step of producing the seventh preferred embodiment of a semiconductor integrated circuit device according to the present invention.
Figure 61B:
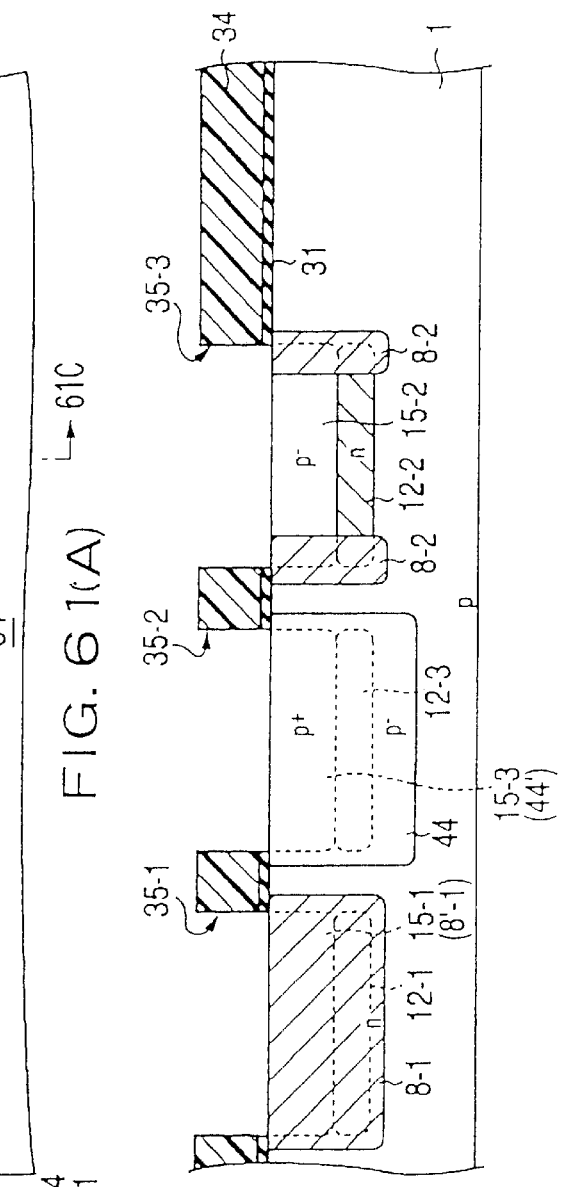
FIGS. 61(B) and 61(C) are sectional views thereof.
Figure 61C:
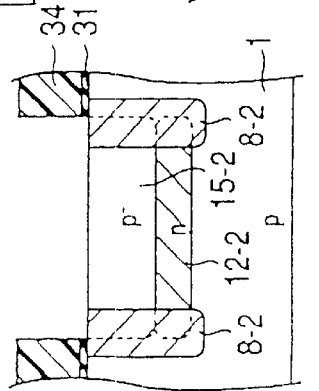

Then, as shown in FIGS. 61(A) through 61(C), subsequently using the photoresist film 34 as a mask without removing the photoresist film 34 from the substrate 1, the first gate oxide film 34 exposed to the holes 35-1 through 35-3 is removed. Thus, parts of the surface of the substrate 1, i.e., the well 15-1 (the n-type well 8'-1), the $p^-$-type well 15-2 and the well 15-3 ($p^+$-type well 44') in this preferred embodiment, are exposed to the holes 35-1 through 35-3, respectively.

Then, as shown in FIGS. 62(A) through 62(C), the photoresist film 34 is removed from the substrate 1.

Then, as shown in FIGS. 63(A) through 63(C), the surface of the substrate 1 is, e.g., thermally oxidized, to form a second gate oxide film 36 thereon. In this preferred embodiment, the second gate oxide film 36 is formed on the surfaces of the well 15-1 (the n-type well 8'-1), the $p^-$-type well 15-2 and the well 15-3 (the $p^+$-type well 44'). At this time, the first gate oxide film 31 is additionally thermally oxidized to increase the thickness thereof. Thus, the thick gate oxide film 31 is formed on the substrate 1. In addition, the thin gate oxide film 36 is formed on the well 15-1 (the n-type well 8'-1), the $p^-$-type well 15-2 and the well 15-3 (the $p^+$-type well 44').

Then, as shown in FIGS. 64(A) through 64(C), a conductive polycrystalline silicon, and, e.g., silicon nitride, are sequentially deposited on the structure shown in FIGS. 63(A) through 63(C) to form a conductive silicon film 51 and a silicon nitride film 52.

Then, as shown in FIG. 65(A) through 65(C), the silicon nitride film 52 is patterned so as to correspond to the pattern of element regions 3. Then, using the patterned silicon nitride film 52 as a mask, the conductive polycrystalline film 51 and the substrate 1 are sequentially etched to form a groove 53 which has a shape corresponding to the pattern of the element isolating region. Thus, island element regions 3 projecting from the substrate 1 are obtained.

Then, as shown in FIG. 66(A) through 66(C), an insulator film, which is used as an element isolating region, e.g., silicon dioxide, is deposited on the structure shown in FIGS. 65(A) through 65(C), to form a silicon dioxide film. Then, the silicon dioxide film is recessed by the etch back method using the silicon nitride film 52 as a stopper, or by the chemical mechanical polishing (CMP) method, to embed the silicon dioxide film into the groove 53. Thus, an STI type element isolating region 54 is formed.

Furthermore, while the side wall (51SIDE) of the conductive polycrystalline silicon film 51 has been exposed in this preferred embodiment, it is not always required to expose this side wall.

Figure 67A:
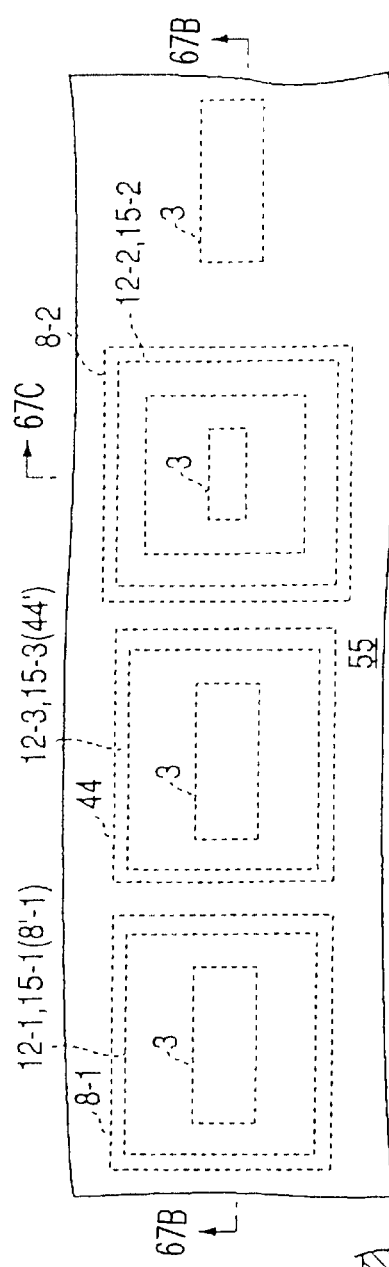
FIG. 67(A) is a plan view showing a step of producing the seventh preferred embodiment of a semiconductor integrated circuit device according to the present invention.
Figure 67C:
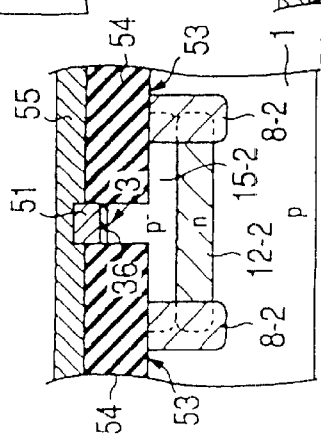
FIGS. 67(B) and 67(C) are sectional views thereof.
Figure 67B:
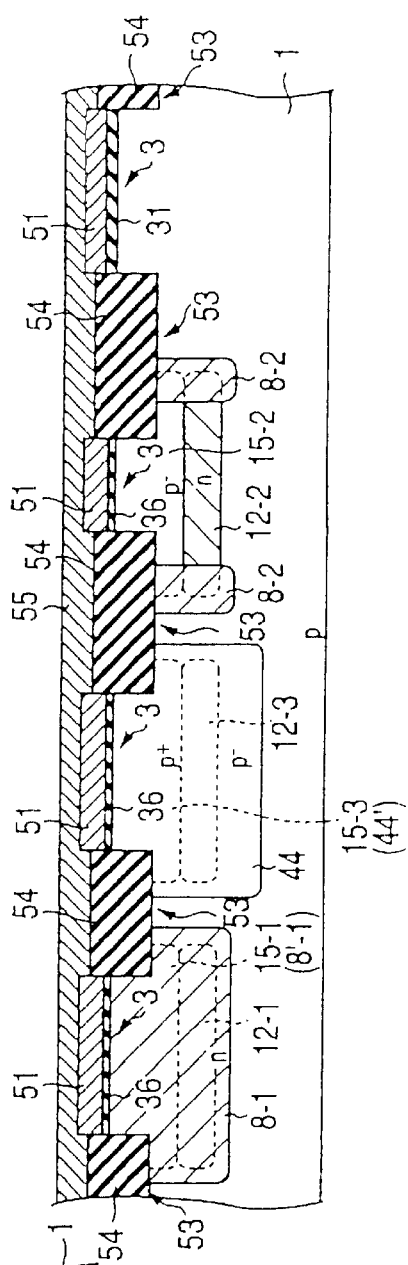

Then, as shown in FIGS. 67(A) through 67(C), a conductive film serving as a gate electrode of a transistor, e.g., a conductive polycrystalline silicon film 55, is formed on the structure shown in FIGS. 66(A) through 66(C). This conductive polycrystalline silicon film 55 is electrically connected to the conductive polycrystalline silicon film 51 to form a laminated film with the conductive polycrystalline silicon film 51.

Then, as shown in FIGS. 68(A) through 68(C), the laminated film of the polycrystalline silicon films 51 and 53 is patterned to form a gate electrode 17. Then, in accordance with a well-known method, a p-type impurity for forming a p-type source/drain is ion-implanted into the n-type well 8 to form a p-type source region 18S and a p-type drain region 18D. Then, in accordance with a well-known method, an n-type impurity for forming an n-type source/drain is ion-implanted into the substrate 1, the $p^+$-type well 44' and the $p^-$-type well 15'' to form n-type source regions 19S-1 through 19S-3 and n-type drain regions 19D-1 though 19D-3.

Then, as shown in FIGS. 55(A) through 55(C), an interlayer insulator film 20 of, e.g., a CVD oxide film, is formed on the structure shown in FIGS. 68(A) through 68(C). Then, contact holes 21, which are communicated with the p-type source/drain regions 18S, 18D and the n-type source/drain regions 19S-1 through 19S-3 and 19D-1 through 19D-3, respectively, are formed in the interlayer insulator film 20. Then, a conductive film, which is used for forming wiring parts, e.g., an aluminum film, is formed. The aluminum film thus formed is patterned to form wiring parts 22.

By the above described producing method, the seventh preferred embodiment of a semiconductor integrated circuit device according to the present invention is completed.

In the above described semiconductor integrated circuit device, the embedded wells 12-1 through 12-3 are arranged below the wells 15-1 through 15-3. The embedded wells 12-1 through 12-3 can be formed using the same mask as that for the wells 15-1 through 15-3. Moreover, the first gate oxide film 31 is removed using the mask for forming the wells 15-1 through 15-3.

Thus, according to the seventh preferred embodiment, the mask for forming the embedded wells 12-1 through 12-3, the mask for forming the wells 15-1 through 15-3, and the mask for forming the thin gate oxide film 36 can be a common mask.

Therefore, according to the seventh preferred embodiment, there is an advantage in that it is possible to reduce the number of masks and the manufacturing costs in a semiconductor integrated circuit device which has different gate oxide films and the $p^-$-type well 15-3 pn-separated from the substrate 1.

Furthermore, in the seventh preferred embodiment, while the hole 35-1 formed in the photoresist film 34 has been also arranged above the n-type well 8-1, the hole 35-1 may be arranged only above the region wherein the $p^-$-type well 15-3 is formed and the region wherein the high density $p^+$-type well 44' is formed.

In addition, the $p^-$-type well 44 may be formed only if necessary.

Moreover, the STI type element isolating region 54 described in the seventh preferred embodiment may be substituted for the LOCOS type element isolating region 2 in any one of the first through fifth preferred embodiments.

Eighth Preferred Embodiment

This eighth preferred embodiment is an example of a transistor which is formed in a p⁻-type well 15-2 pn-separated from a substrate 1.

Figure 71:
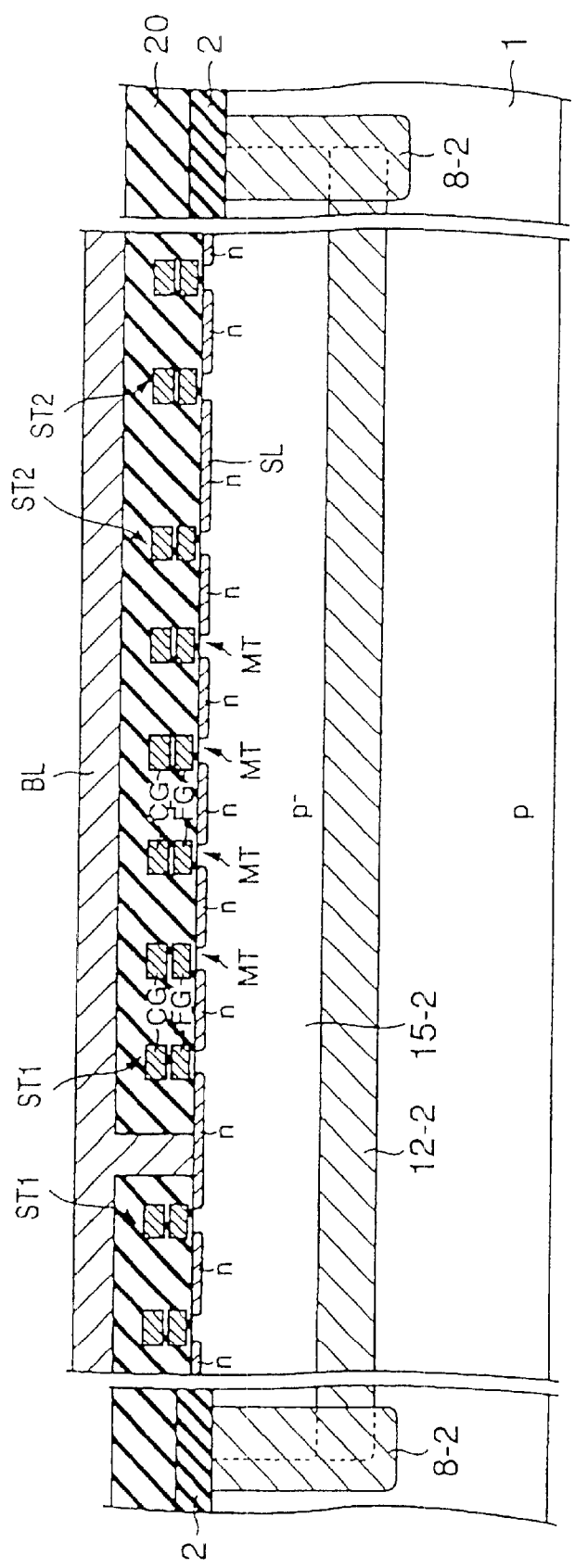
FIG. 71 is a sectional view of the eighth preferred embodiment of a semiconductor integrated circuit device according to the present invention.
Figure 72:
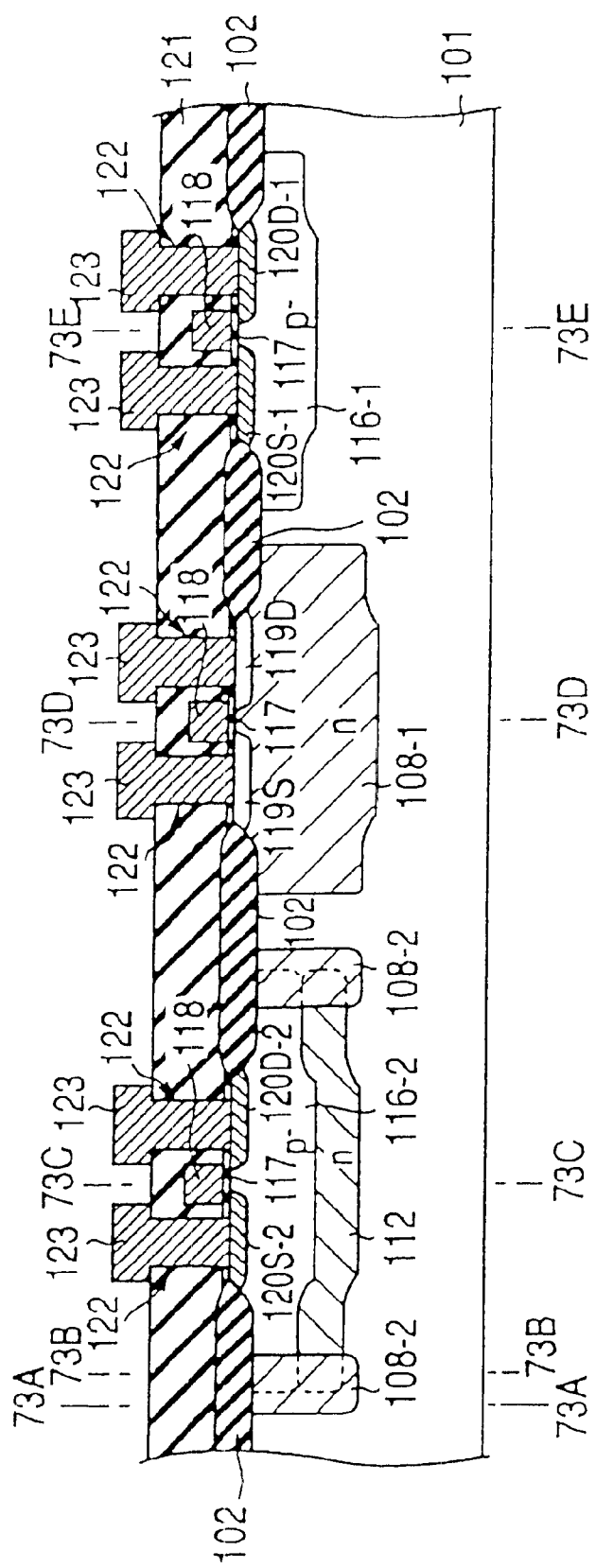
FIG. 72 is a sectional view of a conventional semiconductor integrated circuit device.
Figure 74A:
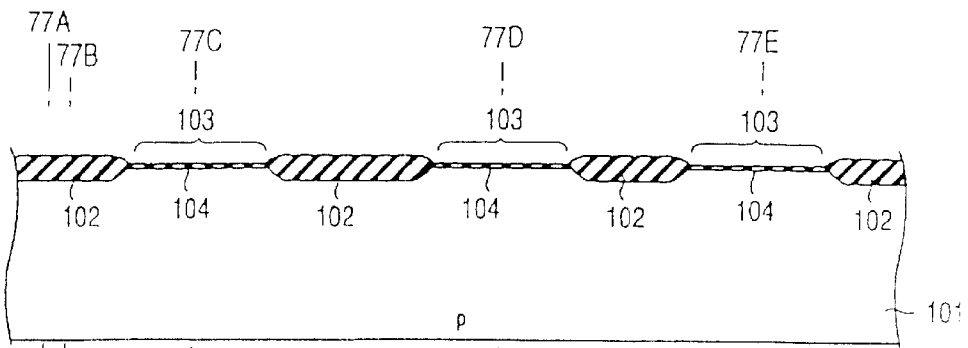
FIGS. 74(A) through 74(C) are sectional views showing principal steps of producing a conventional semiconductor integrated circuit device.
Figure 74B:
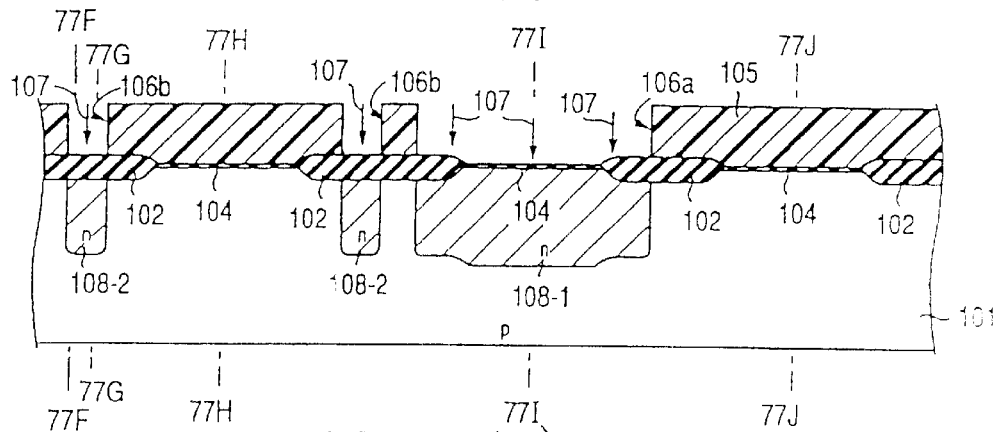
Figure 74C:
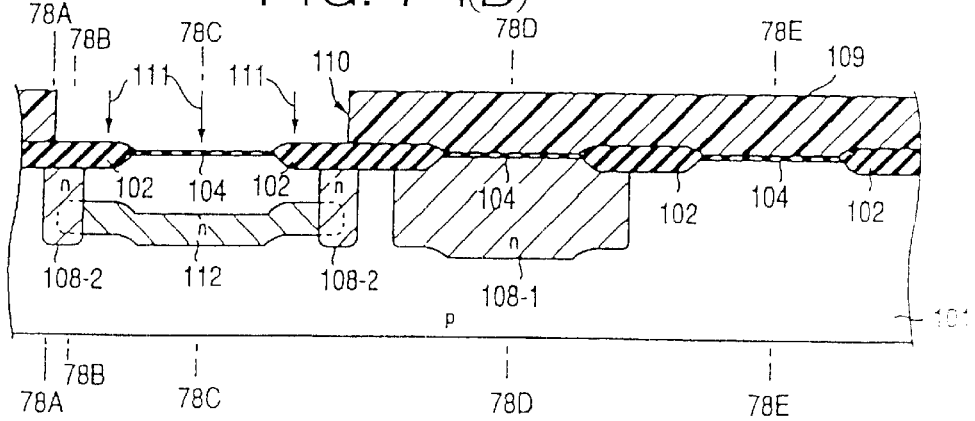
Figure 75A:
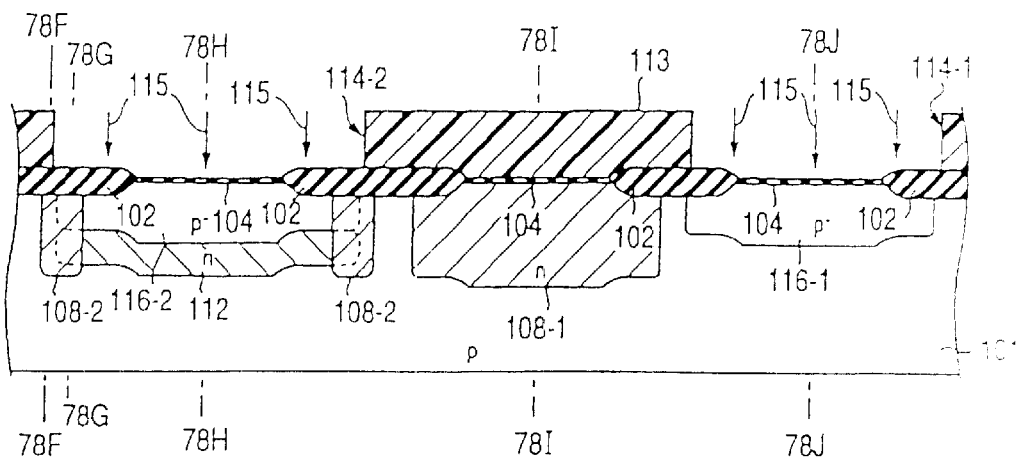
FIGS. 75(A) through 75(C) are sectional views showing principal steps of producing a conventional semiconductor integrated circuit device.
Figure 75B:
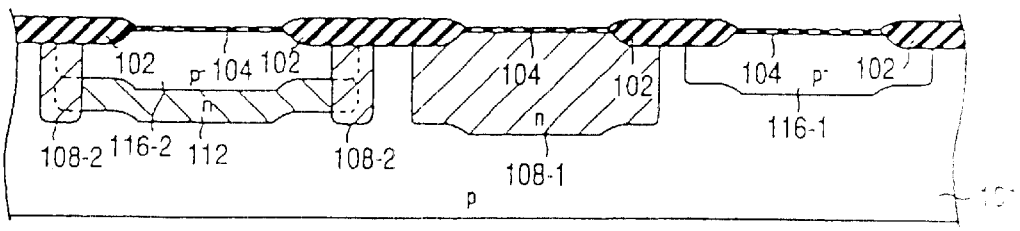
Figure 75C:
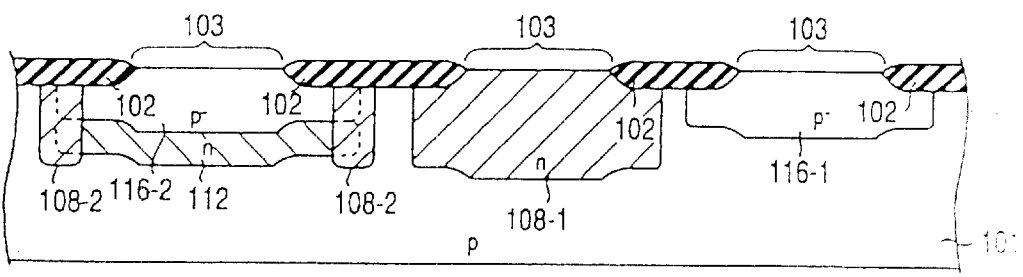
Figure 79:
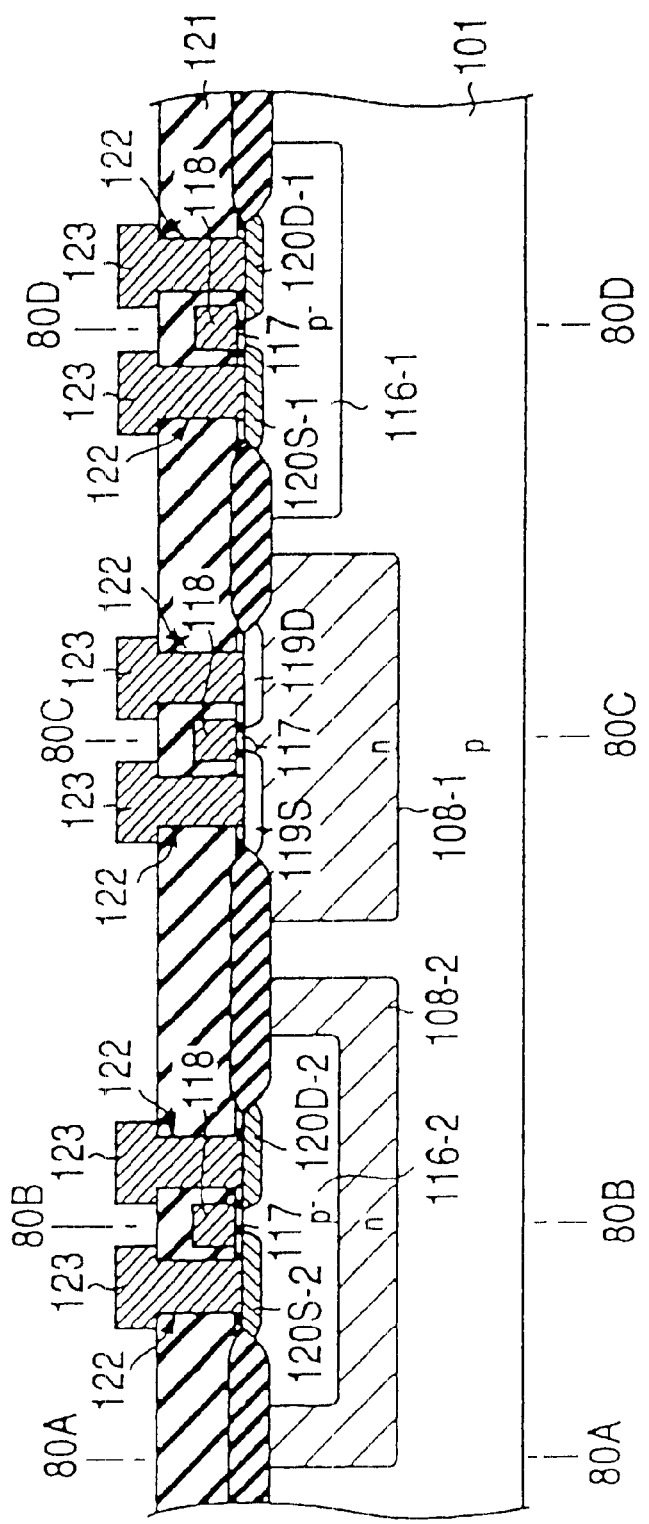
FIG. 79 is a sectional view of a conventional another semiconductor integrated circuit device.
Figure 80A:
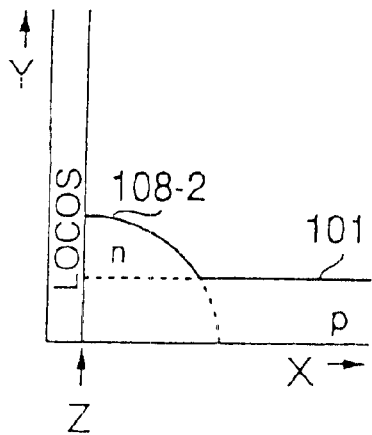
FIGS. 80(A) through 80(D) are profile diagrams showing the distribution of an impurity.
Figure 80B:
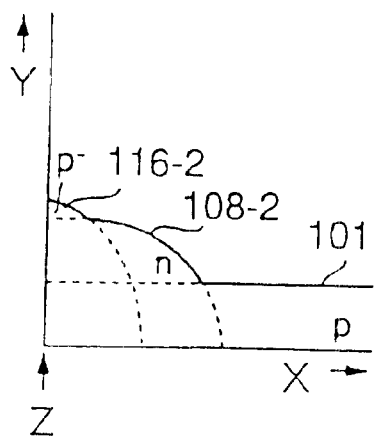
Figure 80C:
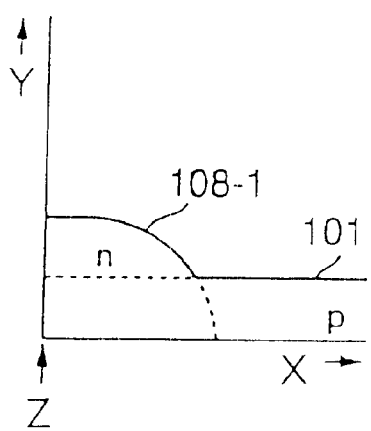
Figure 80D:
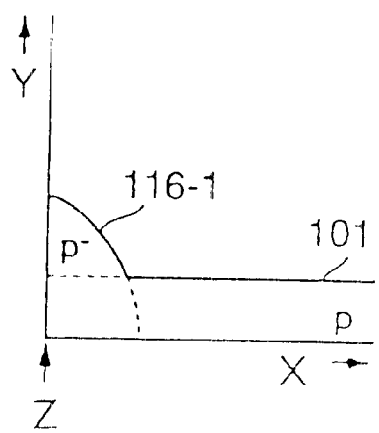
Figure 81A:
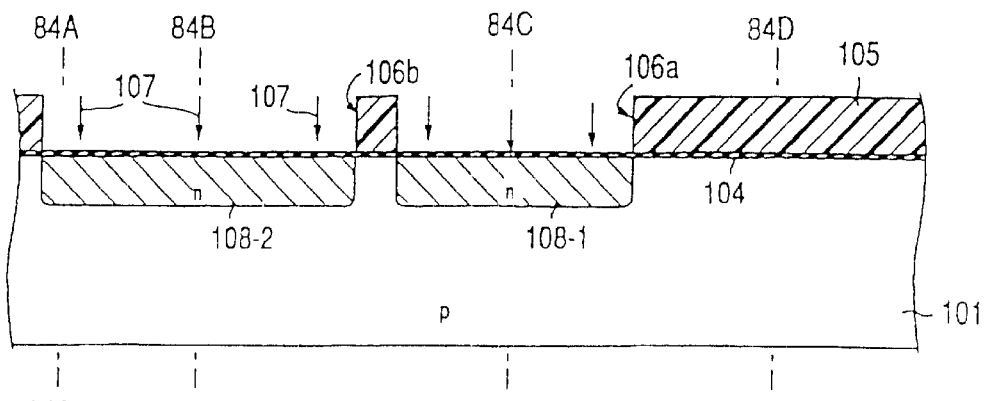
FIGS. 81(A) through 81(C) are sectional views showing principal steps of producing a conventional another semiconductor integrated circuit device.
Figure 81B:
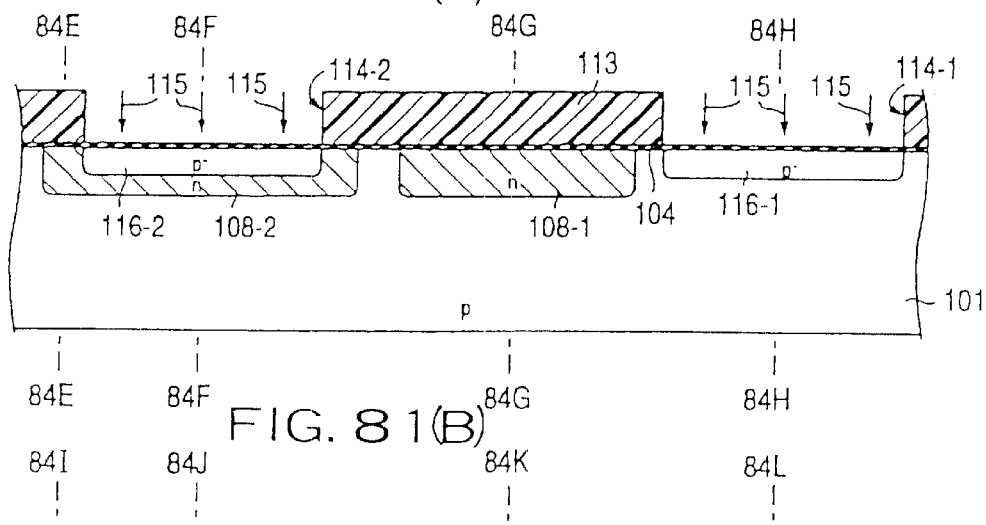
Figure 81C:
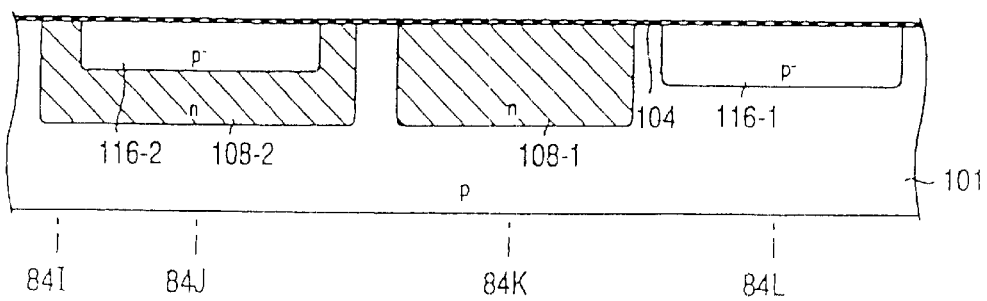
Figure 82A:
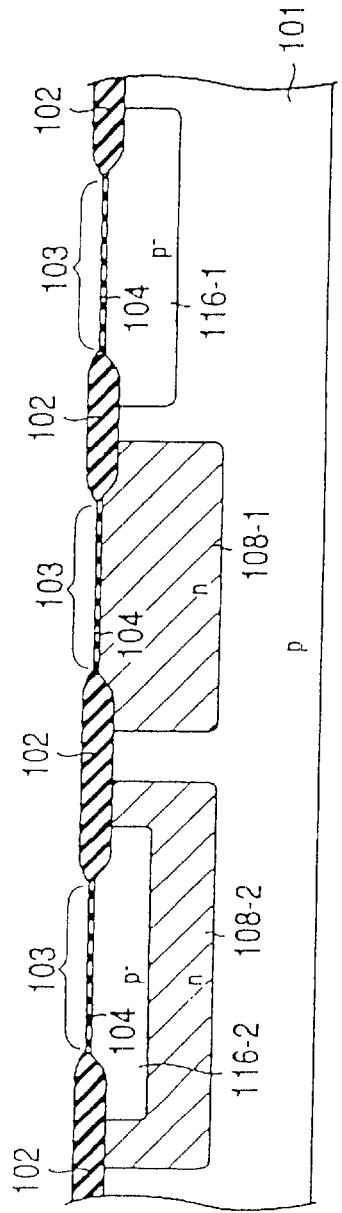
FIGS. 82(A) and 82(B) are sectional views showing principal steps of producing a conventional another semiconductor integrated circuit device.
Figure 82B:
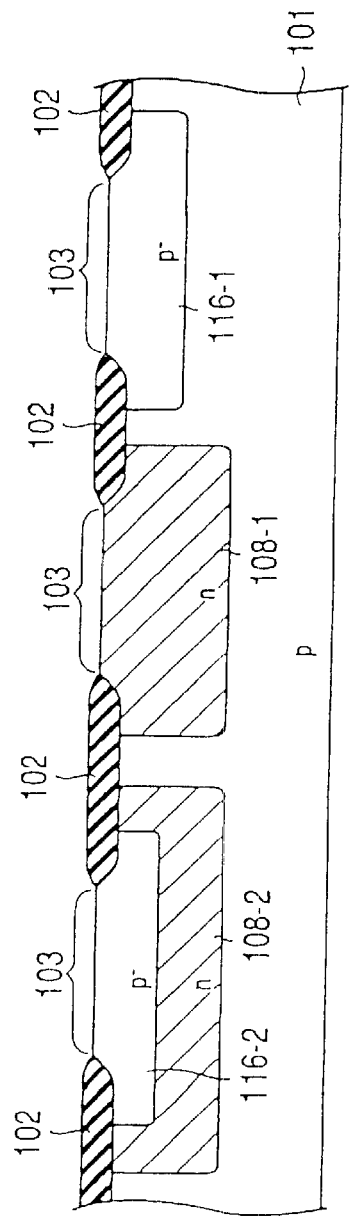

FIG. 71 is a sectional view of the eighth preferred embodiment of a semiconductor integrated circuit device according to the present invention.

As shown in FIG. 71, the example of the transistor formed in the p⁻-type well 15-2 is a non-volatile memory cell transistor MT for use in an EEPROM or the like. This non-volatile memory cell transistor MT has a floating gate FG for accumulating electrons. The threshold voltage of the non-volatile memory cell transistor MT varies in accordance with the amount of electrons accumulated in the floating gate FG. The non-volatile memory cell transistor MT is designed to be turned "ON" or "OFF" to store binary or more data therein when a predetermined readout voltage is applied to a control gate CG.

When data are erased, a large potential difference is applied between the control gate CG and its back gate, i.e., a p⁻-type well 15-2, so that the p⁻-type well 15-2 has a positive potential. Thus, the electrons are drawn from the floating gate FG to the p⁻-type well 15-2. At this time, since a very high potential is applied to the p⁻-type well 15-2, the p⁻-type well 15-2 should be separated from the substrate 1. Because the potential of the p⁻-type well 15-2 can be selectively higher than the potential of the substrate 1.

Thus, the transistor formed in the p⁻-type well 15-2 pn-separated from the substrate 1 preferably operates its back gate at a potential which is different from the potential of the substrate 1 (usually, circuit ground potential VSS), e.g., as a non-volatile memory cell transistor MT.

Furthermore, FIG. 71 shows a NAND type EEPROM wherein units (NAND cells), each of which has non-volatile memory cell transistors MT serially connected between selecting gate transistors ST1 and ST2, are serially connected between a source line SL and a bit line BL. Of course, the present invention can be also applied to other types of EEPROMs than the NAND type EEPROM.

In addition, a transistor for operating the potential of the back gate as a potential different from the potential of the substrate 1, other than the non-volatile memory cell transistor, may be formed in the p-type well 15-2.

As described above, according to the present invention, it is possible to provide a semiconductor integrated circuit device, which has a well having a conductive type different from that of a substrate, a well having the same conductive type as that of the substrate and being connected to the substrate, and a well having the same conductive type as that of the substrate and being pn-separated from the substrate and which can inhibit the increase of the number of photolithography steps and reduce the manufacturing costs while maintaining the advantage of capable of freely setting the impurity density of wells having the same conductive type as that of the substrate, and a method for producing the same.

In addition, it is possible to provide a semiconductor integrated circuit device which has various gate insulator films having different thickness and which can suppress the increase of the number of photolithography steps and reduce the manufacturing costs, and a method for producing the same.

Moreover, it is possible to provide a semiconductor integrated circuit device, which has a well having a conductive type different from that of a substrate, a well having the same conductive type as that of the substrate and being connected to the substrate, a well having the same conductive type as that of the substrate and being pn-separated from the substrate, and various gate insulator films having different thickness and which can inhibit the increase of the number of photolithography steps and reduce the manufacturing costs while maintaining the advantage of capable of freely setting the impurity density of wells having the same conductive type as that of the substrate, and a method for producing the same.

Ninth Preferred Embodiment

Figure 85:
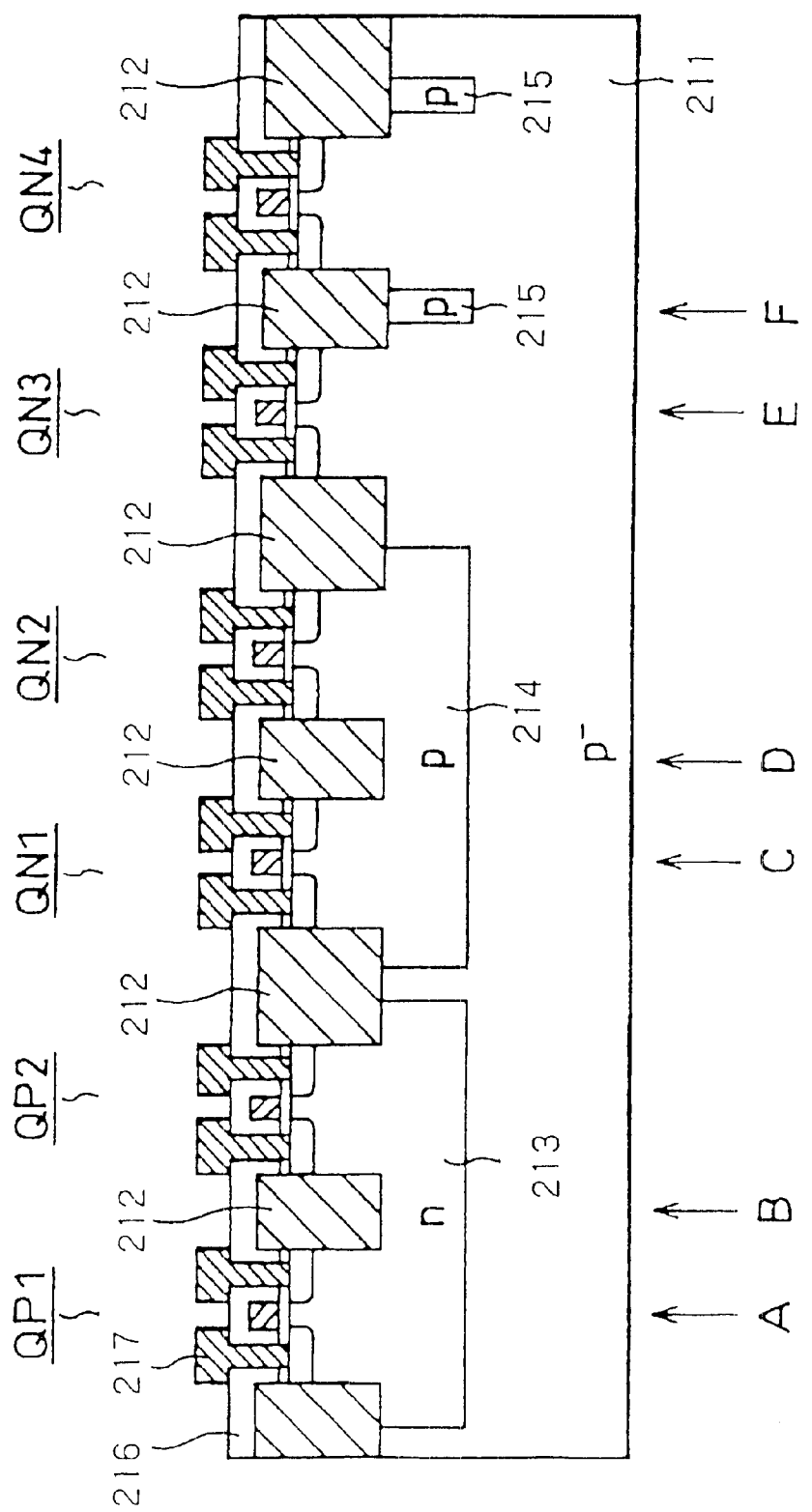
FIG. 85 is a sectional view of the ninth preferred embodiment of a semiconductor integrated circuit device according to the present invention.
Figure 86A:
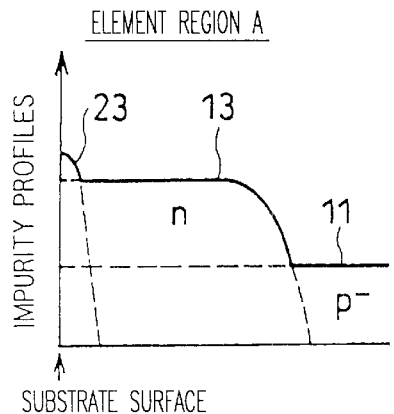
FIGS. 86(A) through 86(F) are diagrams showing impurity profiles in various parts of the semiconductor integrated circuit device in the ninth preferred embodiment.
Figure 86B:
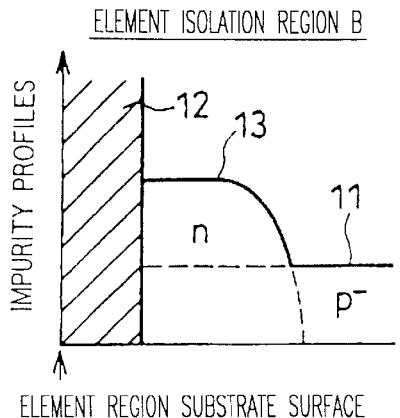
Figure 86C:
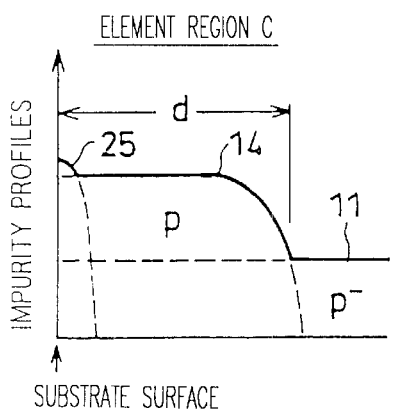
Figure 86D:
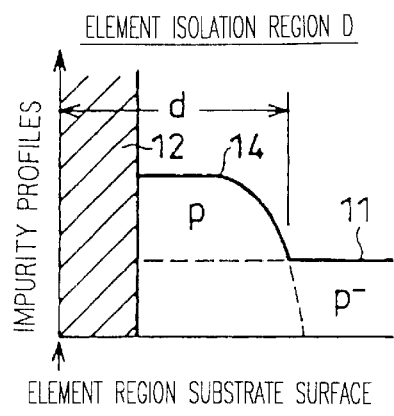
Figure 86E:
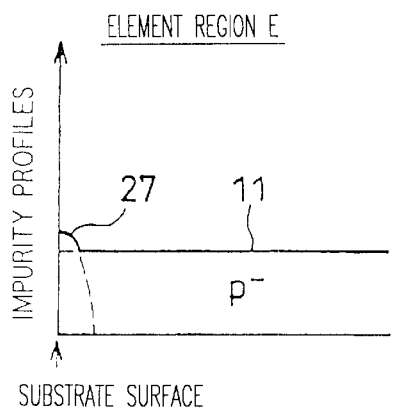
Figure 86F:
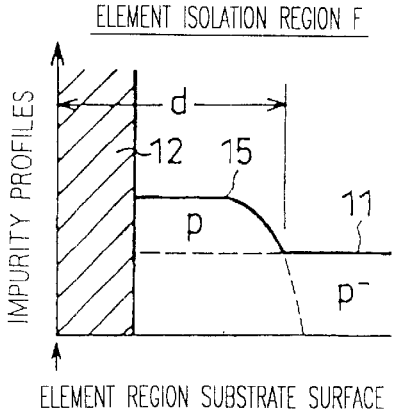
Figure 97:
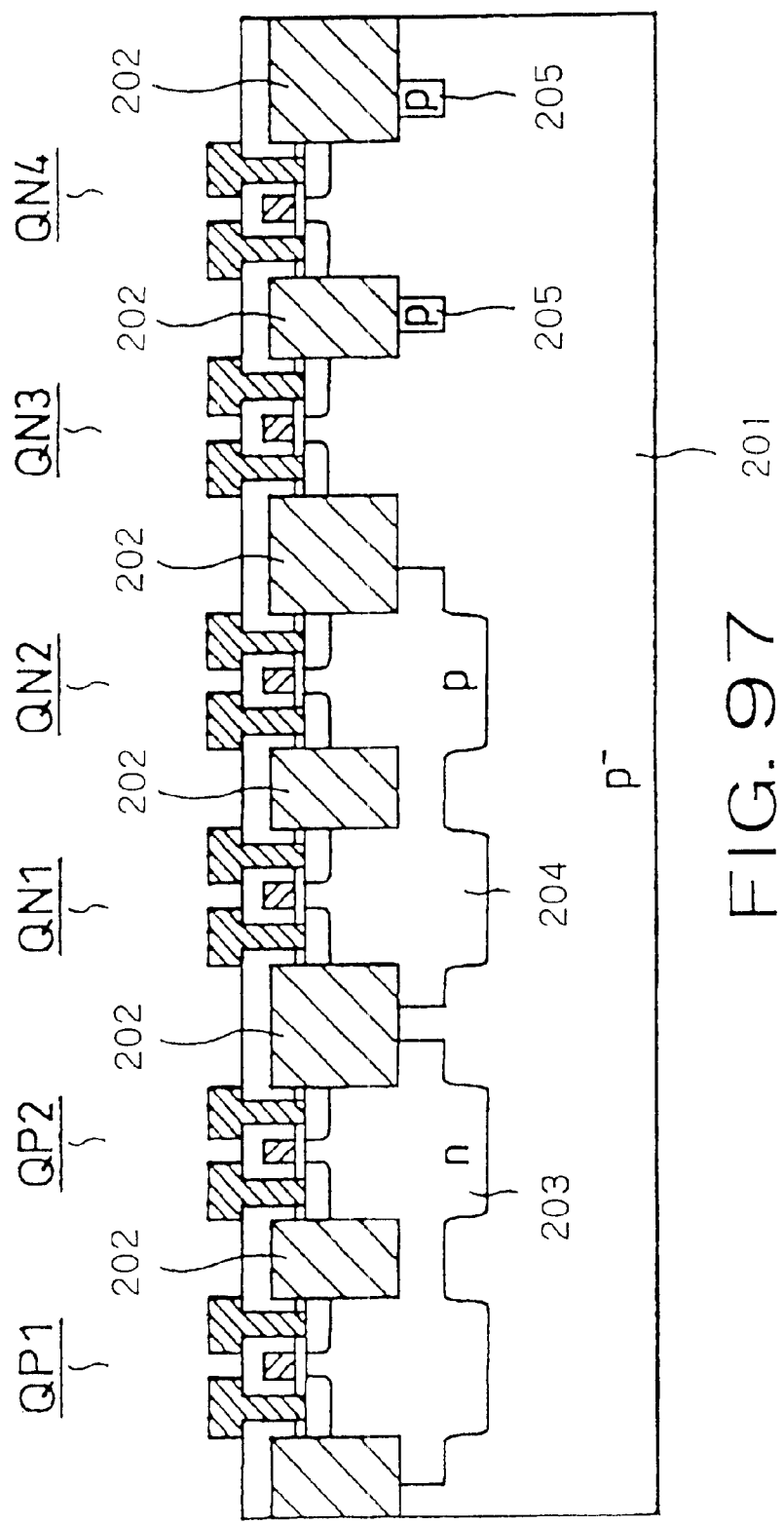
FIG. 97 is a sectional view of a conventional semiconductor integrated circuit structure.
Figure 98:
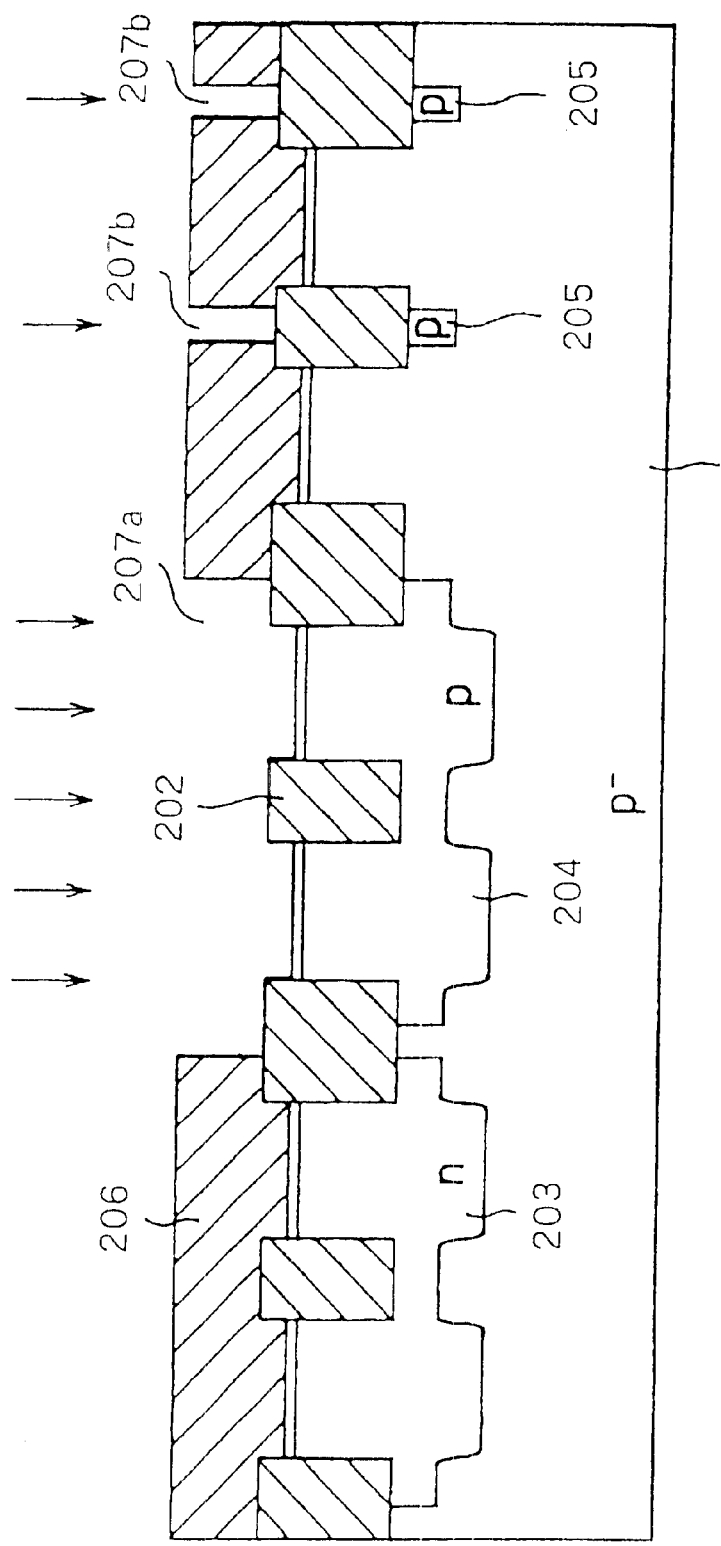
FIG. 98 is a sectional view showing an ion implantation step for a p-type well and an element isolating layer in the conventional semiconductor integrated circuit structure.

FIG. 85 shows a preferred embodiment of an integrated circuit structure according to the present invention. This figure corresponds to FIG. 97, and shows a structure wherein low-voltage n-channel MOS transistors QN1, QN2, low-voltage p-channel MOS transistors QP1, QP2, and high-voltage n-channel MOS transistors QN3, QN4 are formed on a p⁻-type silicon substrate 211.

The first n-channel MOS transistors QN1, QN2 are formed in a p-type well 214 formed in the silicon substrate 211 by ion implantation, and the second n-channel MOS transistors QN3, QN4 are formed in the silicon substrate 211, which has a lower impurity density than that of the p-type well 214. The p-type well 214 is formed so as to have a substantially constant depth in a range which includes an element region, in which the first MOS transistors QN1, QN2 are formed, and a region directly below an element isolating insulator film 212 adjacent to the element region.

In addition, a p-type element isolating layer 215 is formed directly below the element isolating insulator film 212 adjacent to the element region for the second MOS transistors QN3, QN4. The p-type element isolating layer 215 and the p-type well 14 have substantially the same depth from the substrate surface of the element region serving as a reference position, and have substantially the same impurity density. Because the p-type well 214 and the p-type element isolating layer 215 are formed by the same ion implantation step before forming the element isolating insulator film 212 as described in detail later.

In FIG. 85, low-voltage p-channel MOS transistors QP1, QP2 are formed in an n-type well 213, in addition to the above described transistors.

FIG. 86 shows impurity profiles in an element region A in the n-type well 213, an element isolating region B adjacent thereto, an element region C in the p-type well 214, an element isolating region D adjacent thereto, an element region E for the high-voltage transistor circuit, and the element isolating region F adjacent thereto, which are shown in FIG. 85.

As shown in FIG. 86, the p-type well 214 formed in the element region C, in which the MOS transistors QN1, QN2 are formed, and in the element isolating region D adjacent thereto, has a constant depth d from the substrate surface in the element region, and the element isolating layer 215 in the element isolating region F adjacent to the element region E, in which the MOS transistors QN3, QN4 are formed, also has the same depth d.

Referring to FIGS. 87 through 95, a process for producing the ninth preferred embodiment of an integrated circuit according to the present invention will be described below.

Figure 87:
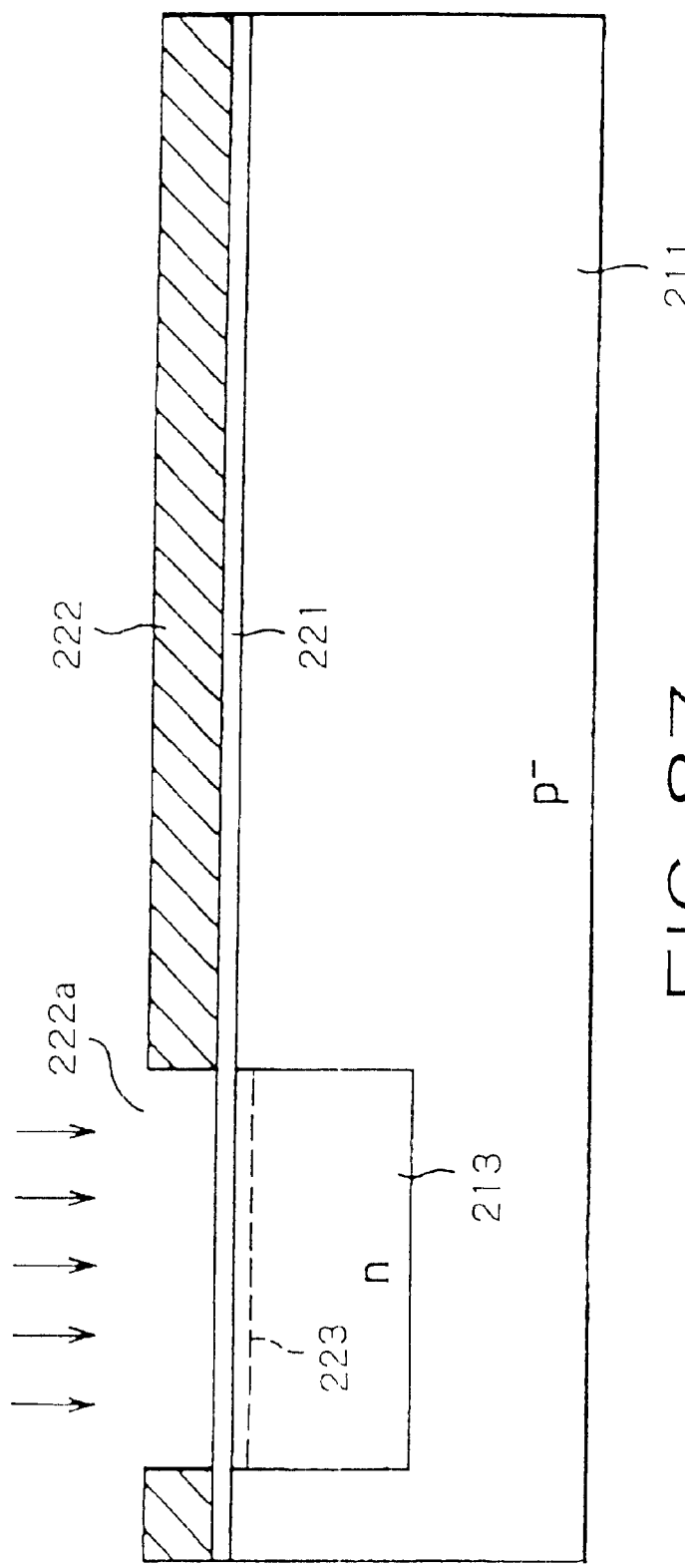
FIG. 87 is a sectional view showing a step of forming an n-type well in the ninth preferred embodiment.

First, as shown in FIG. 87, a buffer oxide film 221 is formed on a silicon substrate 211, and a resist mask 226 serving as an ion implantation mask is formed thereon by the lithography. The resist mask 222 has an opening 222a in a predetermined region, in which an n-type well 213 will be formed later, i.e., in a predetermined region including an element region A and an element isolating region B adjacent thereto. The n-type well 213 is formed by ion-implanting an n-type impurity via the opening 222a.

Then, using the same resist mask 222, a p-type impurity is ion-implanted in order to adjust the threshold values of p-channel MOS transistors QP1, QP2, which will be formed later. Specifically, in this preferred embodiment, a p-type layer 223 for causing the MOS transistors QP1, QP2 to be embedded channel type MOS transistors is formed on the surface portion by ion implantation. However, this channel ion implantation step is carried out, if necessary.

Figure 88:
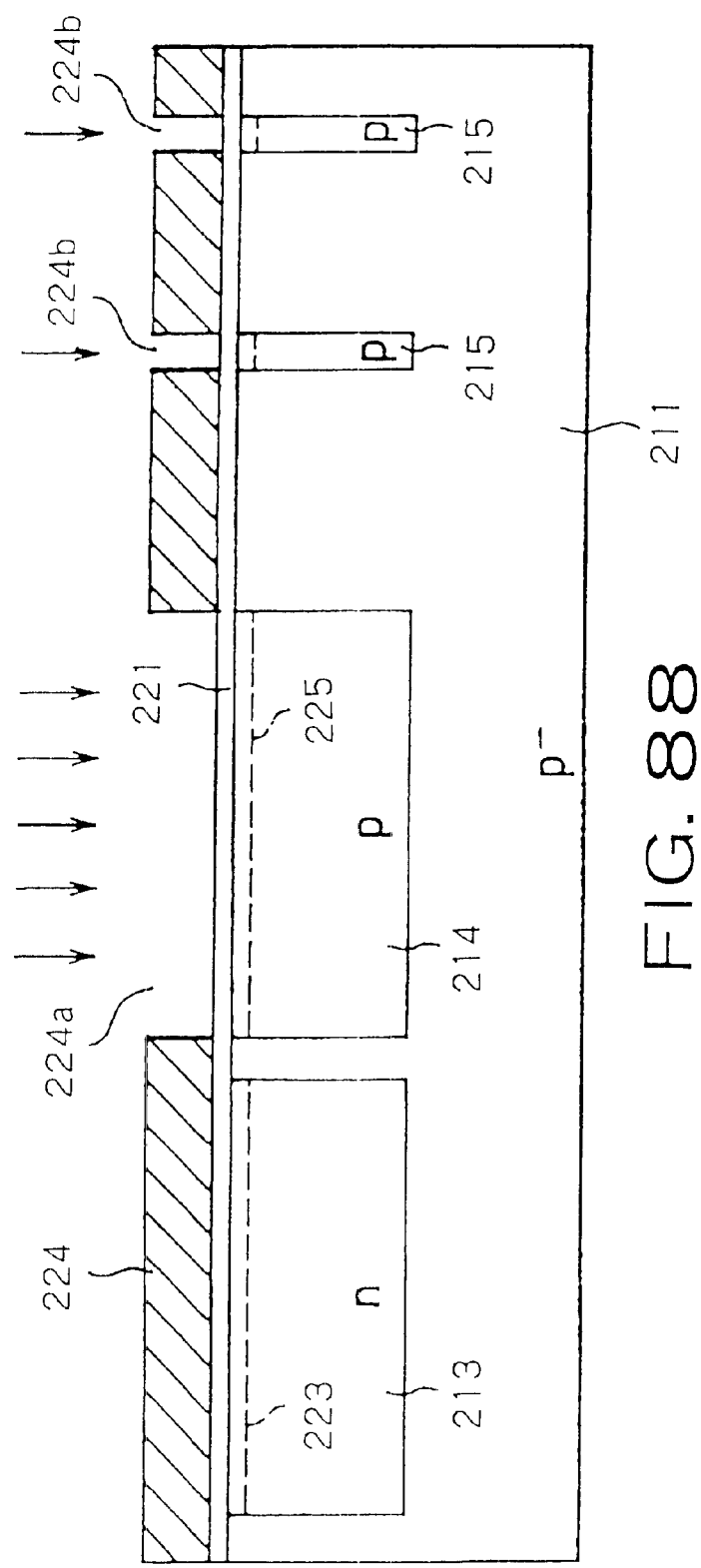
FIG. 88 is a sectional view showing a step of forming a p-type well and a p-type element isolating layer in the ninth preferred embodiment.

Then, after removing the resist mask 222, a resist is applied again to carry out the lithography to pattern a resist mask 224 serving as an ion implantation mask for forming a p-type well and a p-type element isolating layer 215 as shown in FIG. 88. The resist mask 224 has an opening 224a in a region, in which the p-type well 214 will be formed (i.e., a predetermined region for an element region C, in which transistors QN1, QN2 will be formed, and an element isolating region D adjacent thereto), and an opening 224b in a region, in which the element isolating layer 215 will be formed (i.e., a predetermined region for an element isolating region F adjacent to transistors QN3, QN4). The p-type well 214 and the p-type element isolating layer 215 are simultaneously formed by ion-implanting a p-type impurity via the openings 224a, 224b.

Moreover, in order to adjust the threshold values of the MOS transistors QN1, QN2 which will be formed in the p-type well 214, a p-type impurity is ion-implanted into the surface portion using the same resist mask 224 to form a p-type layer 225. This channel ion implantation step is also carried out, if necessary.

The lithography of the resist mask 224 shown in FIG. 88 is carried out on the substrate surface, on which no element isolating insulator film is formed and which has no step. In addition, although the p-type well 214 and the element isolating layer 215 must be formed below an element isolating insulator film which will be formed later, the element isolating insulator film has not yet been formed, so that the acceleration voltage for ion implantation can be lower than that in the conventional method. Therefore, the resist mask 224 can be thinner than that in the conventional method. For these reasons, the lithography for forming the fine opening 224b for forming the element isolating layer 215 can be simply and surely carried out.

Figure 89:
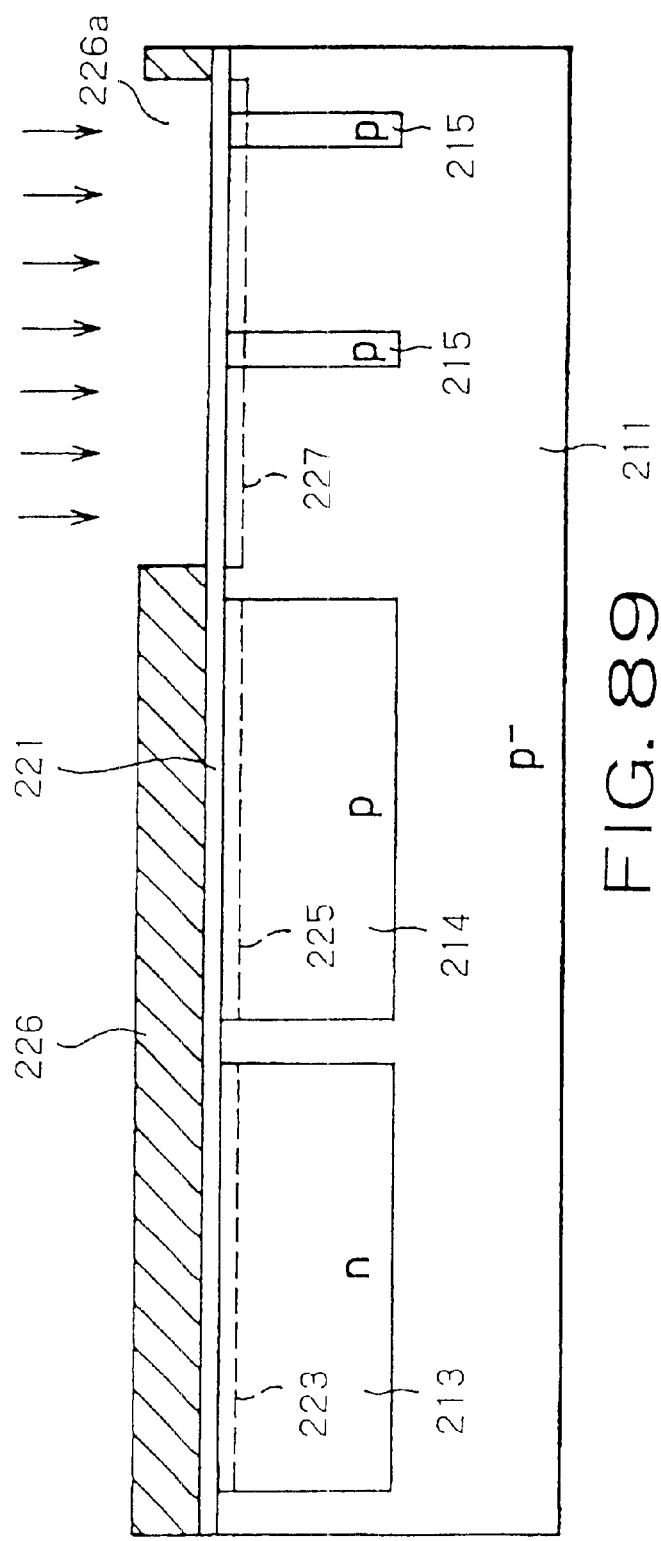
FIG. 89 is a sectional view showing a channel ion implantation step for a high-voltage transistor in the ninth preferred embodiment.

Then, the resist mask 224 is removed, and a resist mask 226 is formed again as shown in FIG. 89. This resist mask 226 is an ion implantation mask for adjusting the threshold values of the high-voltage MOS transistors QN3, QN4, and has an opening 226a in an element region E for the MOS transistors QN3, QN4 and in an element isolating region F adjacent thereto. Using this resist mask 226, a p-type impurity is ion-implanted to form a p-type layer 227 on the surface portion. This channel ion implantation is carried out at a lower dose and lower acceleration voltage than those in the ion implantation for the p-type well 214 and the p-type element isolating layer 215. However, it is not always required to carry out this channel ion implantation step, and it is carried out, if necessary. The resist mask for this channel ion implantation must not always have the opening in the element isolating region F as long as it has the opening in the element region E.

Figure 90:
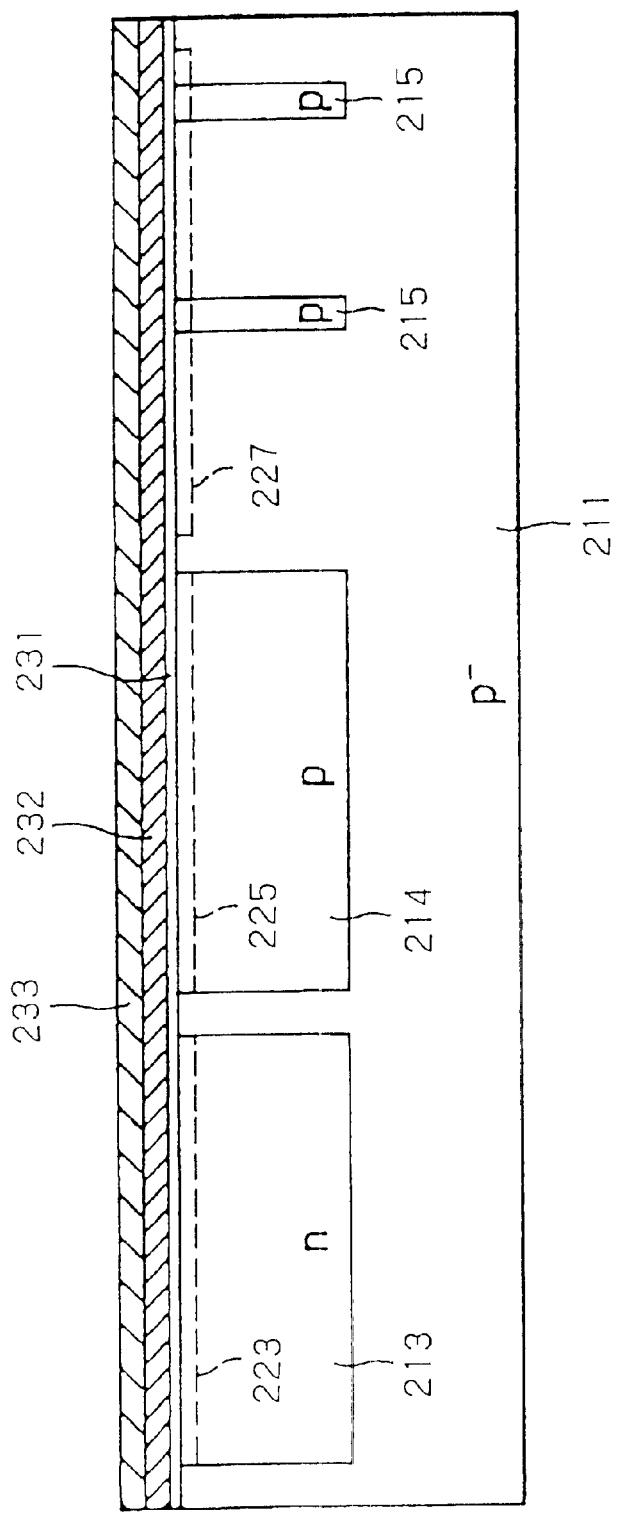
FIG. 90 is a sectional view showing a step of forming a gate oxide film, a polycrystalline silicon film and a silicon nitride film in the ninth preferred embodiment.

Then, after the resist mask 226 is removed, the heat treatment for activating the implanted impurity is carried out. Then, after the buffer oxide film 221 is etched to be removed, a gate oxide film 231 is formed by the thermal oxidation as shown in FIG. 90, and a conductive polycrystalline silicon film 232, which will be formed as a gate electrode, is deposited. Moreover, a silicon nitride film 233, which will serve as a mask material at an element isolating step, is deposited.

Figure 91:
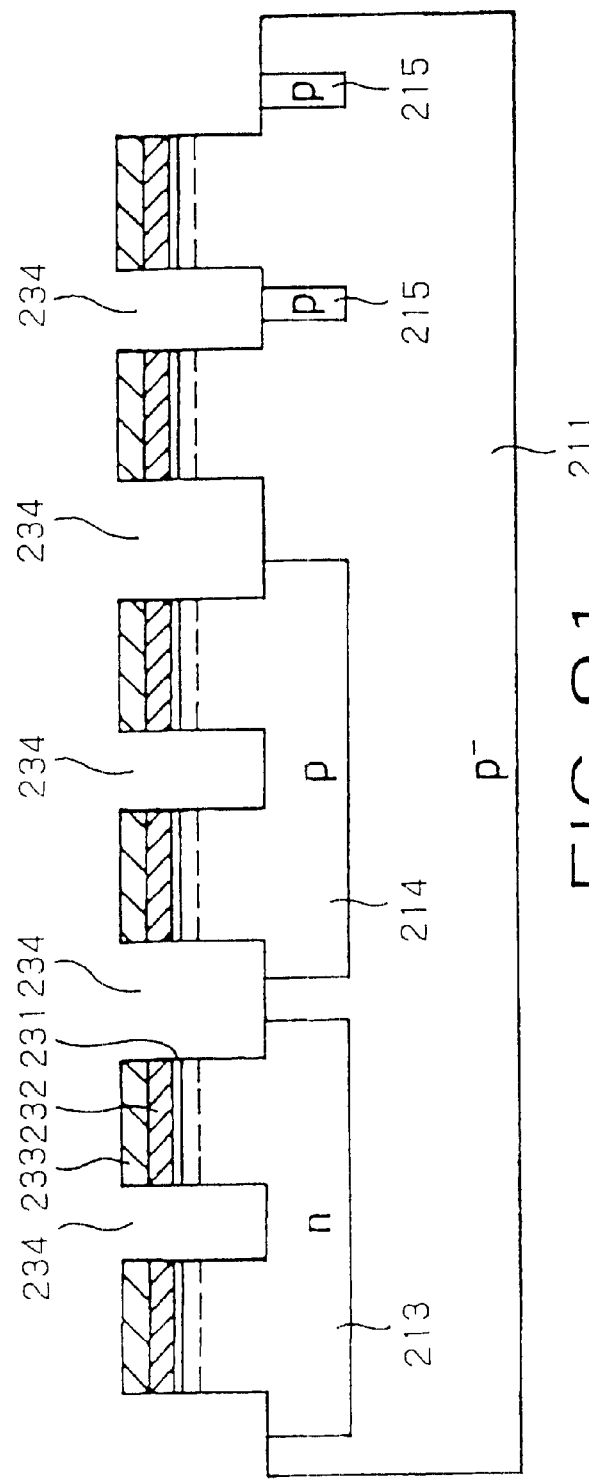
FIG. 91 is a sectional view showing a step of forming an element isolating groove in the ninth preferred embodiment.

Thereafter, as shown in FIG. 91, the silicon nitride film 233 is patterned to sequentially etch the polycrystalline silicon film 232, the gate oxide film 231 and the substrate 211 by the RIE using the silicon nitride film 233 as a mask, to form grooves 234 for element isolation. Thus, element regions are formed so as to project from the substrate 211.

Figure 92:
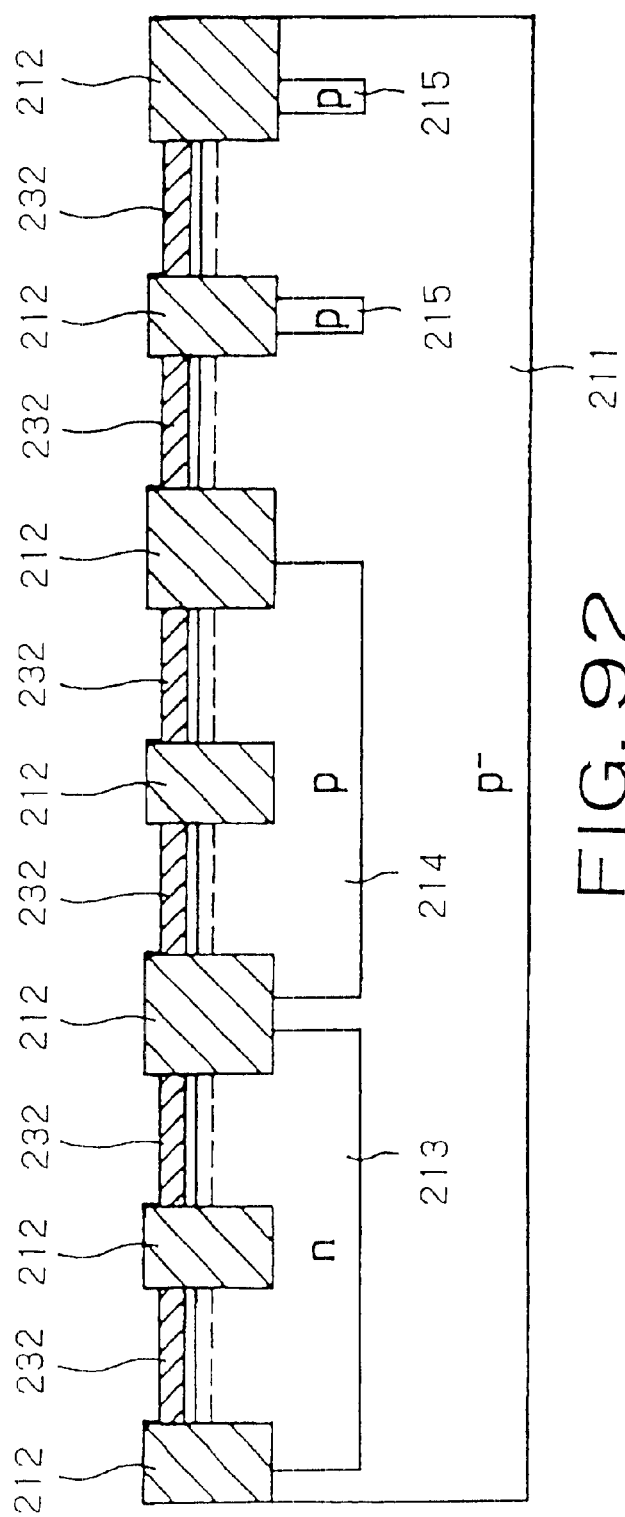
FIG. 92 is a sectional view showing a step of embedding an element isolating insulator film in the ninth preferred embodiment.

Then, for example, a silicon oxide film is deposited by the CVD. This silicon oxide film is recessed by the etch back or the CMP treatment using the silicon nitride film 233 as a stopper to be embedded in the grooves 234 so as to be flat. The silicon oxide film thus embedded serves as an element isolating insulator films 212 as shown in FIG. 92. Then, the silicon nitride film 233 is removed.

Figure 93:
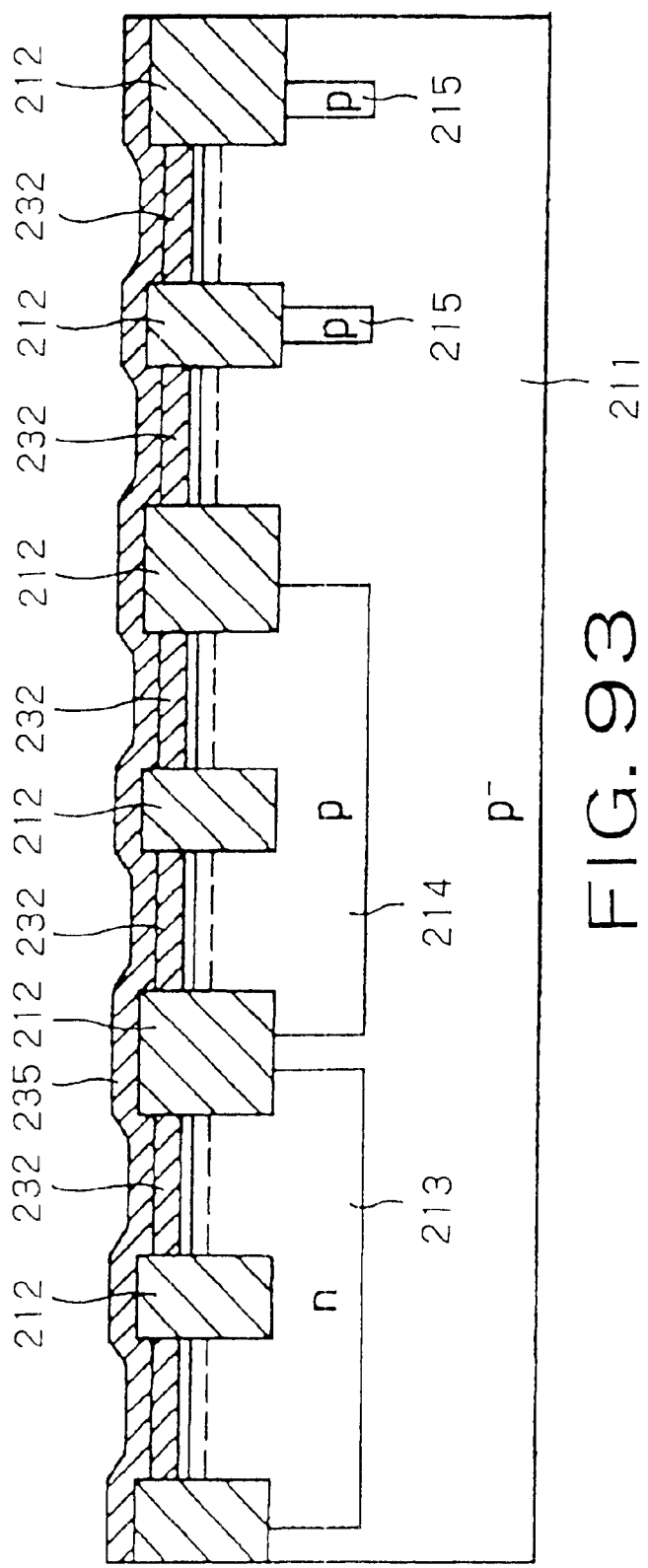
FIG. 93 is a sectional view showing a step of accumulating a polycrystalline silicon film in the ninth preferred embodiment.
Figure 94:
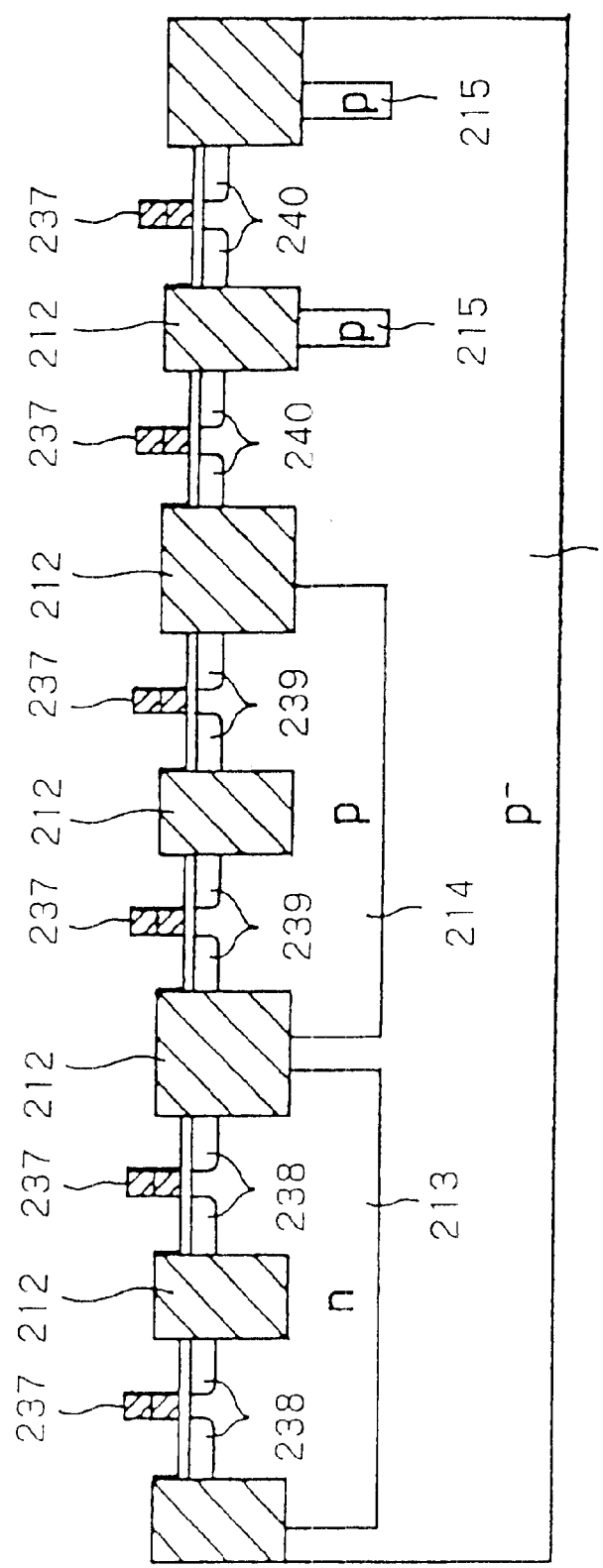
FIG. 94 is a sectional view showing a step of patterning an gate electrode in the ninth preferred embodiment.

Then, as shown in FIG. 93, a conductive polycrystalline silicon film 235, which will be associated with the polycrystalline silicon film 232 to form a gate electrode, is deposited. Then, these polycrystalline silicon films 235, 232 are patterned to form gate electrodes 237. Subsequently, ion implantation is carried out in the respective element regions to form p-type layers 238 and n-type layers 239, 240 which will serve to form sources and drains. Then, as shown in FIG. 85, an interlayer insulator film 216 is deposited by the CVD, and contact holes are formed therein to form wiring elements 217 of Al or the like connected to the sources and drains. Thereafter, steps of depositing passivation films (not show) and so forth are carried out to complete an integrated circuit device.

Furthermore, in this preferred embodiment, the high-voltage MOS transistors QN3, QN4 have the same conditions, except that the element regions of the transistors QN3, QN4 have lower impurity densities than those of the low-voltage MOS transistors QN1, QN2. However, the thickness of the gate oxide film and the channel length may be different if necessary.

As described above, in this preferred embodiment, the lithography for patterning the resist mask 224 for forming the p-type well 214 and the p-type element isolating layer 15 is carried out on the flat substrate surface, on which the element isolating insulator film has not yet been formed. In addition, the ion implantation in the p-type well 214 and the element isolating layer 215 can be carried out at a lower acceleration voltage than that when it is carried out after the element isolating film is formed. Therefore, the resist mask 224 can be thinner than that in the conventional method, and the lithography for forming the fine opening for forming the element isolating layer 215 can be easily carried out.

In addition, as shown in FIG. 86, the depth of the element isolating layer in the element isolating region F from the substrate surface of the element region is the same depth d as those of the element region C and element isolating region D in the p-type well 214. Therefore ,the high-voltage MOS transistors QN3, QN4 formed in the substrate region of a low impurity density have excellent isolation characteristics.

Moreover, since the element isolating regions B, D in the n-type well 213 and p-type well 214 are formed so as to have the same depths as those of the element regions A, C from the substrate surface, the n-type well 213 and p-type well 214 have a smaller lateral resistance than that in the conventional method for carrying out ion implantation via the element isolating insulator film. Thus, the potentials of the wells can be surely fixed.

Tenth Preferred Embodiment

Figure 95:
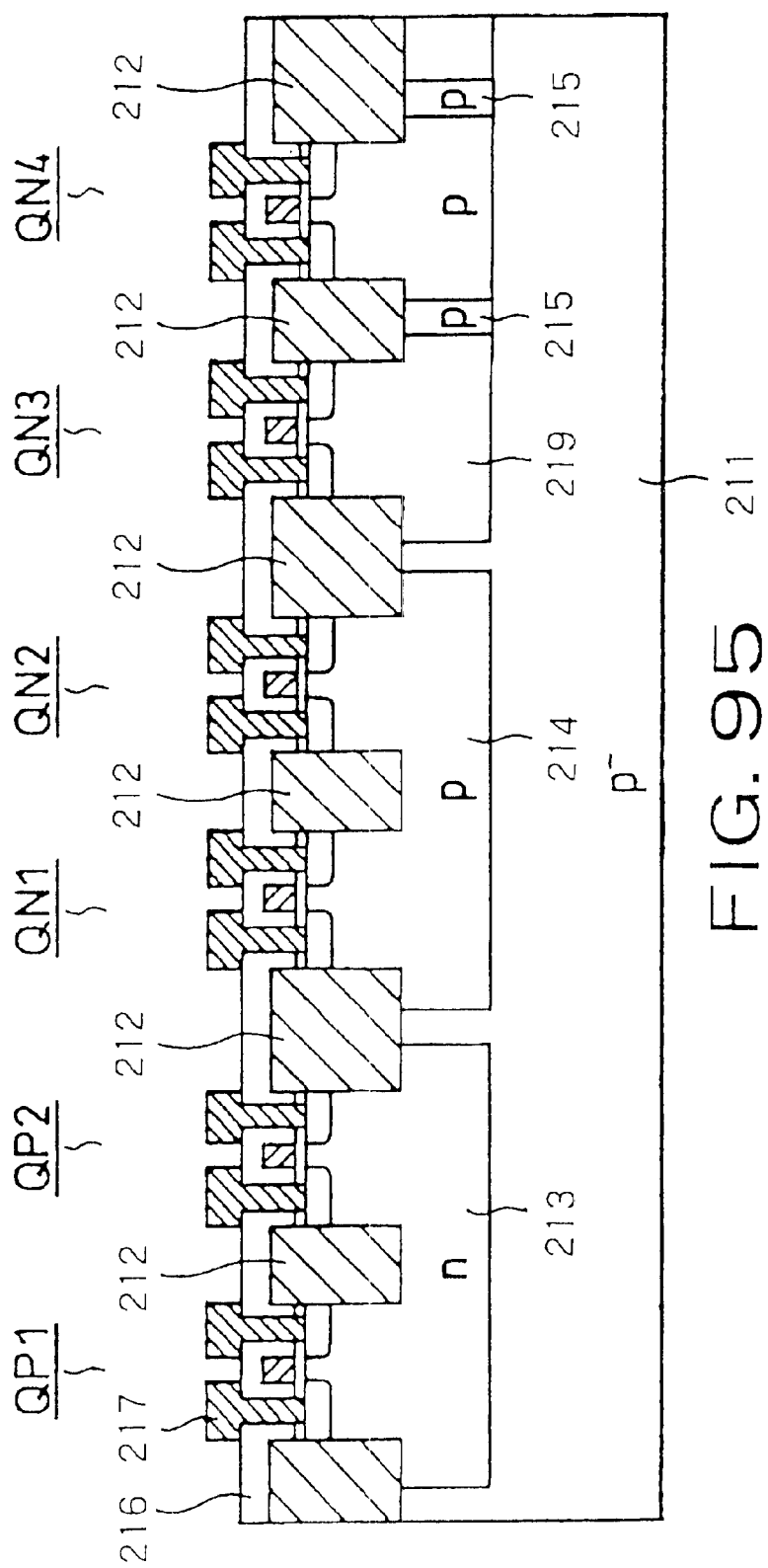
FIG. 95 is a sectional view of the tenth preferred embodiment of an integrated circuit structure according to the present invention.

FIG. 95 shows the tenth preferred embodiment of an integrated circuit device according to the present invention so as to correspond to FIG. 85. In this preferred embodiment, a p-type well 219 is formed in an element region, in which high-voltage MOS transistors QN3, QN4 will be formed, and in an element isolating region adjacent thereto. This p-type well 219 is formed by ion implantation before forming an element isolating insulator film 212. However, the p-type well 219 has a lower impurity density than that of a p-type well 214 for forming low-voltage MOS transistors QN1, QN2.

Thus, even if the p-type well is formed in the high-voltage MOS transistor region, the same advantages as those in the preceding preferred embodiment can be obtained by forming a p-type well 214 and a p-type element isolating layer 215 in the same ion implantation step.

Eleventh Preferred Embodiment

Figure 96:
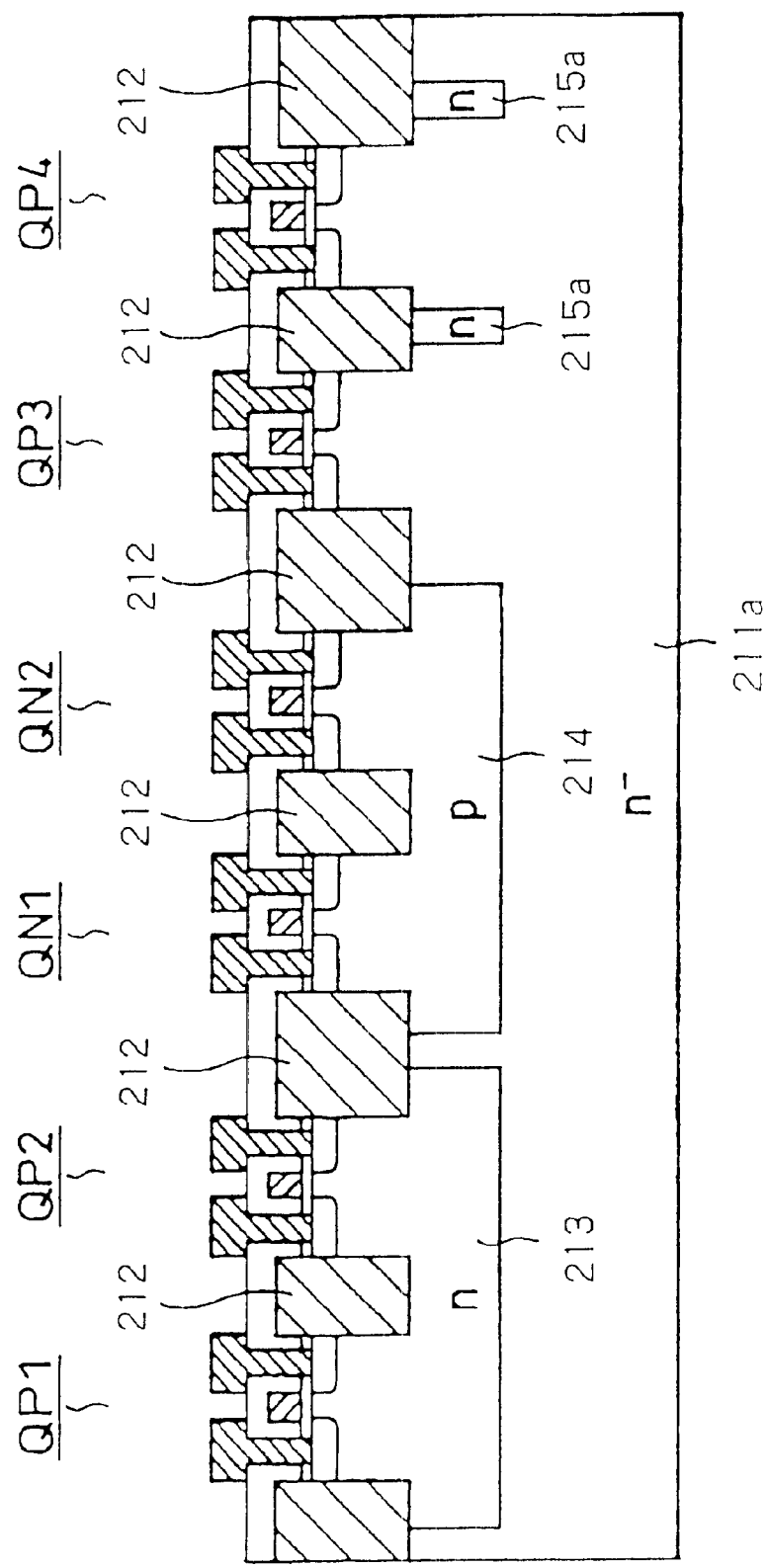
FIG. 96 is a sectional view of the eleventh preferred embodiment of an integrated circuit structure according to the present invention.

FIG. 96 shows a further preferred embodiment of an integrated circuit device according to the present invention so as to correspond to FIG. 85. In this preferred embodiment, an $n^-$-type silicon substrate 11a is substituted for the $p^-$-type silicon substrate 211 to form high-voltage p-channel MOS transistor QP3, QP4 in the substrate region.

In this preferred embodiment, an n-type element isolating layer 215a is formed in an element isolating region adjacent to MOS transistors QP3, QP4. Before forming an element isolating insulator film 212, the n-type element isolating layer 215a is formed by ion-implanting an n-type impurity at the same time that the n-type impurity is ion-implanted into an n-type well 213, in which low-voltage p-channel MOS transistors QP1, QP2 will be formed. Thus, the depth of the n-type element isolating layer 215a from the substrate surface of the element region is substantially the same as that of the n-type well 213.

That is, the relationships of density, depth and so forth between the n-type well 213 and the n-type element isolating layer 215a, and the forming steps thereof are basically the same as the relationships between the p-type well 214 and the p-type element isolating layer 215 and so forth. Thus, also according to this preferred embodiment, the same advantages as those of the preceding preferred embodiments can be obtained.

The present invention should not be limited to the above described ninth through eleventh preferred embodiments. For example, while the element isolating insulator film has been the embedded insulator film of the STI, the present invention may be applied to a case where an element isolating insulator film formed by the LOCOS method is used.

As described above, according to the present invention, when first and second transistors are formed in first and second element regions which have the same conductive type and different impurity density, if an element isolating layer of a first conductive type in an element isolating region adjacent to the second transistor formed in the second element region of a low impurity density, and a well of a first conductive type including the first element region, in which the first transistor is formed, are simultaneously formed, it is possible to easily carry out the lithography for an ion implantation mask, so that the transistor formed in the second element region of the low impurity density can have excellent element isolating characteristics.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claim is:

1. A semiconductor integrated circuit device comprising:
   a semiconductor substrate of a first conductive type;
   a first semiconductor region which is formed on said semiconductor substrate and which includes an impurity of a second conductive type;
   a second annular semiconductor region which is formed on said semiconductor substrate and which includes an impurity of the second conductive type;
   a third embedded semiconductor region which is formed in a region surrounded by said second annular semiconductor region and which includes an impurity of the second conductive type;
   a fourth embedded semiconductor region which is formed on said semiconductor substrate and which includes an impurity of the second conductive type;
   a fifth semiconductor region which is formed above said third embedded semiconductor region and which includes an impurity of the first conductive type;
   a sixth semiconductor region which is formed above said fourth embedded semiconductor region and which includes an impurity of the first conductive type; and
   a transistor formed in said first, fifth and sixth semiconductor regions.

2. A semiconductor integrated circuit device as set forth in claim 1, wherein said first, fifth and sixth semiconductor regions are isolated by element isolating regions, respectively.

3. A semiconductor integrated circuit device comprising;
   a first gate insulator film formed on a semiconductor substrate of a first conductive type;
   a first semiconductor region which is formed on said semiconductor substrate and which includes an impurity of a second conductive type;
   a second annular semiconductor region which is formed on said semiconductor substrate and which includes an impurity of the second conductive type;
   a third embedded semiconductor region which is formed on said semiconductor substrate and which includes an impurity of the second conductive type;
   a fourth embedded semiconductor region which is formed in a region surrounded by said second annular semiconductor region and which includes an impurity of the second conductive type;
   a fifth embedded semiconductor region which is formed in said first semiconductor region and which includes an impurity of the second conductive type;
   a sixth semiconductor region which is formed above said third semiconductor region and which includes an impurity of the first conductive type;
   a seventh semiconductor region which is formed above said fourth embedded semiconductor region and which includes an impurity of said first conductive type;

an eighth semiconductor region which is formed above said fifth embedded semiconductor region and which includes an impurity of said first conductive type;

a second gate insulator film which is thinner than said first gate insulator film formed in said sixth, seventh and eighth semiconductor regions;

a transistor using said first gate insulator film; and a transistor using said second gate insulator film.

4. A semiconductor integrated circuit device comprising:

a semiconductor substrate;

a first element region of a first conductive type defined in said semiconductor substrate by an element isolating insulator film;

a second element region of the first conductive type defined in said semiconductor substrate by said element isolating insulator film, said second element region having a lower impurity density than that of said first element region;

first and second transistors of a second conductive channel formed in said first and second element regions, respectively; and an element isolating layer of the first conductive type formed below an element isolating insulator film adjacent to said second element region of said semiconductor substrate, said element isolating layer having an impurity density substantially equal to that of said first element region and a depth substantially equal to that of said first element region from the substrate surface of said first and second element regions.

5. A semiconductor integrated circuit device as set forth in claim 4, wherein said semiconductor substrate has the first conductive type, said first element region is defined, by said element isolating insulator film, in a first conductive type well formed by ion implantation before forming said element isolating insulator film, and said element isolating layer is formed at the same time that an ion implantation step of forming said first conductive type well is carried out.

6. A semiconductor integrated circuit device as set forth in claim 4, wherein said element isolating insulator film is embedded in a groove formed in said semiconductor substrate.

7. A semiconductor integrated circuit device as set forth in claim 4, wherein a third element region of a second conductive type defined by said element isolating insulator film is formed in said semiconductor substrate, and a transistor of a first conductive channel is formed in said third element region.

8. A semiconductor integrated circuit device comprising:

a semiconductor substrate of first conductive type;

a first well of a first conductive type defined in said semiconductor substrate by an element isolating insulator film;

a second well of the first conductive type defined in said semiconductor substrate by said element isolating insulator film, said second element region having a lower impurity density than that of said substrate and said first well;

first and second transistors of a second conductive channel formed in said first and second wells, respectively; and an element isolating layer of the first conductive type formed below an element isolating insulator film adjacent to said second well of said semiconductor substrate, said element isolating layer having an impurity density substantially equal to that of said first well and a depth substantially equal to that of said first well from the substrate surface of said first and second wells.

9. A semiconductor integrated circuit device comprising:

a semiconductor substrate of second conductive type;

an well of a second conductive type defined in said semiconductor substrate by an element isolating insulator film;

an element region of the second conductive type defined in said semiconductor substrate by said element isolating insulator film;

first and second transistors of a first conductive channel formed in said first and second wells, respectively; and an element isolating layer of the second conductive type formed below an element isolating insulator film adjacent to said element region of said semiconductor substrate, said element isolating layer having an impurity density substantially equal to that of said well and a depth substantially equal to that of said well from the substrate surface.

* * * * *